US012157296B2

(12) United States Patent
Yokokawa et al.

(10) Patent No.: US 12,157,296 B2
(45) **Date of Patent: *Dec. 3, 2024**

(54) ON-PRESS DEVELOPMENT TYPE LITHOGRAPHIC PRINTING PLATE PRECURSOR, METHOD FOR PREPARING LITHOGRAPHIC PRINTING PLATE, AND LITHOGRAPHIC PRINTING METHOD

(71) Applicant: FUJIFILM Corporation, Tokyo (JP)

(72) Inventors: Natsumi Yokokawa, Shizuoka (JP); Kazuaki Enomoto, Shizuoka (JP); Akinori Fujita, Shizuoka (JP); Yusuke Namba, Shizuoka (JP); Akira Sakaguchi, Shizuoka (JP); Akira Yamamoto, Shizuoka (JP); Ichiro Koyama, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 343 days.

This patent is subject to a terminal disclaimer.

(21) Appl. No.: 17/646,071

(22) Filed: Dec. 27, 2021

(65) Prior Publication Data

US 2022/0118753 A1 Apr. 21, 2022

Related U.S. Application Data

(63) Continuation of application No. PCT/JP2020/025413, filed on Jun. 26, 2020.

(30) Foreign Application Priority Data

Jun. 28, 2019 (JP) ................................ 2019-122479
Aug. 30, 2019 (JP) ................................ 2019-158812

(Continued)

(51) Int. Cl.
*B41C 1/10* (2006.01)
*G03F 7/029* (2006.01)

(Continued)

(52) U.S. Cl.
CPC ............ *B41C 1/1008* (2013.01); *G03F 7/029* (2013.01); *G03F 7/033* (2013.01); *G03F 7/11* (2013.01);

(Continued)

(58) Field of Classification Search
CPC ........................................................ B41C 1/10
See application file for complete search history.

(56) References Cited

U.S. PATENT DOCUMENTS 4,923,781 A 5/1990 Fujikura et al.
5,885,746 A 3/1999 Iwai et al.

(Continued)

FOREIGN PATENT DOCUMENTS

EP 3 991 984 A1 5/2022
EP 3 991 985 A1 5/2022

(Continued)

OTHER PUBLICATIONS

Office Action issued Jun. 28, 2022 in Japanese Application No. 2021-528298.

(Continued)

*Primary Examiner* — Chanceity N Robinson
(74) *Attorney, Agent, or Firm* — Sughrue Mion, PLLC

(57) ABSTRACT

An on-press development type lithographic printing plate precursor having a support and an image-recording layer on the support, in which the image-recording layer contains an infrared absorber, a polymerization initiator, a polymerizable compound, and a color-developing substance precursor, and in a case where the image-recording layer is exposed to an infrared laser having a wavelength of 830 nm at an energy density of 110 mJ/cm$^2$, a loss of ethylenically unsaturated bonds in an exposed area in the image-recording layer is 10% to 40% of ethylenically unsaturated bonds in a non-exposed area in the image-recording layer, and a method for (Continued)

preparing a lithographic printing plate or a lithographic printing method using the on-press development type lithographic printing plate precursor.

22 Claims, 7 Drawing Sheets

(30) Foreign Application Priority Data

| | | |
|---|---|---|
| Sep. 18, 2019 | (JP) | 2019-169808 |
| Sep. 30, 2019 | (JP) | 2019-180573 |
| Jan. 31, 2020 | (JP) | 2020-015681 |

(51) Int. Cl.
*G03F 7/033* (2006.01)
*G03F 7/11* (2006.01)

(52) U.S. Cl.
CPC ...... *B41C 2210/04* (2013.01); *B41C 2210/08* (2013.01); *B41C 2210/22* (2013.01)

(56) References Cited

U.S. PATENT DOCUMENTS

| | | | | |
|---|---|---|---|---|
| 2009/0269699 | A1 | 10/2009 | Munnelly et al. | |
| 2010/0055414 | A1 | 3/2010 | Tao et al. | |
| 2010/0316850 | A1 | 12/2010 | Tao et al. | |
| 2014/0349234 | A1* | 11/2014 | Tsushima | G03F 7/0758 430/284.1 |
| 2017/0123315 | A1 | 5/2017 | Mizuno et al. | |
| 2018/0356730 | A1 | 12/2018 | Inasaki et al. | |
| 2019/0187557 | A1 | 6/2019 | Ochimizu et al. | |
| 2019/0232703 | A1 | 8/2019 | Kudo | |
| 2020/0041899 | A1 | 2/2020 | Ishiji et al. | |
| 2020/0117086 | A1 | 4/2020 | Nogoshi et al. | |
| 2020/0147951 | A1* | 5/2020 | Enomoto | C09B 11/22 |
| 2020/0353741 | A1 | 11/2020 | Araki | |

FOREIGN PATENT DOCUMENTS

| | | | | |
|---|---|---|---|---|
| JP | 63-137226 | A | 6/1988 | |
| JP | 8-240908 | A | 9/1996 | |
| JP | 2011-095365 | A | 5/2011 | |
| JP | 2012-501878 | A | 1/2012 | |
| JP | 2012-529669 | A | 11/2012 | |
| JP | 6461447 | B1 | 1/2019 | |
| WO | 2016/027886 | A1 | 2/2016 | |
| WO | 2017/141882 | A1 | 8/2017 | |
| WO | 2018/043125 | A1 | 3/2018 | |
| WO | 2019/004471 | A1 | 1/2019 | |
| WO | 2019/013268 | A1 | 1/2019 | |
| WO | WO-2019021828 | A1 * | 1/2019 | B41C 1/1008 |
| WO | 2019/150788 | A1 | 8/2019 | |

OTHER PUBLICATIONS

Extended European Search Report dated Aug. 26, 2022 from the European Patent Office in EP Application No. 20832188.5.

Office Action dated Sep. 13, 2022 from the Japanese Patent Office in JP Application No. 2021-528298.

International Search Report dated Sep. 24, 2020, issued by the International Searching Authority in application No. PCT/JP2020/025413.

Written Opinion dated Sep. 24, 2020, issued by the International Searching Authority in application No. PCT/JP2020/025413.

International Preliminary Report on Patentability dated Dec. 28, 2021, issued by the International Bureau in application No. PCT/JP2020/025413.

Office Action issued Mar. 20, 2024 in Chinese Application No. 202080047471.1.

European Office Action dated Feb. 8, 2024 in Application No. 20 832 188.5.

* cited by examiner

ON-PRESS DEVELOPMENT TYPE LITHOGRAPHIC PRINTING PLATE PRECURSOR, METHOD FOR PREPARING LITHOGRAPHIC PRINTING PLATE, AND LITHOGRAPHIC PRINTING METHOD

CROSS-REFERENCE TO RELATED APPLICATIONS

This application is a Continuation of International Application No. PCT/JP2020/025413 filed on Jun. 26, 2020, which claims priority to Japanese Patent Application No. 2019-122479 filed on Jun. 28, 2019, Japanese Patent Application No. 2019-158812 filed on Aug. 30, 2019, Japanese Patent Application No. 2019-169808 filed on Sep. 18, 2019, Japanese Patent Application No. 2019-180573 filed on Sep. 30, 2019, and Japanese Patent Application No. 2020-015681 filed on Jan. 31, 2020. The entire contents of these applications are incorporated herein by reference.

BACKGROUND OF THE INVENTION

1. Field of the Invention

The present disclosure relates to an on-press development type lithographic printing plate precursor, a method for preparing a lithographic printing plate, and a lithographic printing method.

2. Description of the Related Art

Generally, a lithographic printing plate consists of a lipophilic image area that receives ink in a printing process and a hydrophilic non-image area that receives dampening water. Lithographic printing is a method exploiting the mutual repulsion of water and oil-based ink, in which the lipophilic image area and the hydrophilic non-image area of a lithographic printing plate are used as an ink-receiving portion and a dampening water-receiving portion (non-ink-receiving portion) respectively, the adhesiveness of ink is varied within the surface of the lithographic printing plate so that only the image area receives the ink, and then printing is performed by the transfer of the ink to a printing substrate such as paper.

In the related art, in order to prepare this lithographic printing plate, a lithographic printing plate precursor (PS plate) has been widely used which is obtained by providing a lipophilic photosensitive resin layer (image-recording layer) on a hydrophilic support. Generally, a lithographic printing plate is obtained by a plate making method of exposing a lithographic printing plate precursor through an original picture such as a lith film, then keeping a portion of an image-recording layer that will be an image area while removing other unnecessary portions of the image-recording layer by dissolving such portions in an alkaline developer or an organic solvent, and forming a non-image area by exposing the hydrophilic surface of a support.

In response to the intensifying interest in the global environment, an environmental issue of waste liquid generated by wet treatments such as a development treatment has gathered more attention.

Regarding the environmental issue described above, an attempt is made to simplify development or plate making or to remove treatments. As one of simple preparation methods, a method called "on-press development" is being carried out. That is, in this method, after being exposed, a lithographic printing plate precursor is immediately mounted on a printer without being developed as in the related art, and an unnecessary portion of the image-recording layer is removed at an early stage of the ordinary printing step.

In the present disclosure, a lithographic printing plate precursor that can be used for such on-press development is called "on-press development type lithographic printing plate precursor"

Examples of the lithographic printing plate precursors in the related art include those described in WO2019/004471A or JP2012-529669A.

WO2019/004471A describes a lithographic printing plate precursor having an image-recording layer on a hydrophilic support, in which the image-recording layer contains an infrared absorbing colorant that decomposes by the exposure to infrared and a color developing agent that develops color due to the exposure to infrared.

JP2012-529669A describes a negative tone operating image-forming element including a substrate and an image forming layer on the substrate, in which the image-forming layer contains a component that can have free radical polymerization, an initiator composition that can produce enough radicals to initiate the polymerization of the component that can have free radical polymerization in a case where the image-forming layer is exposed to radiation for forming an image, a radiation absorbing compound, one or more polymer binders, and a hydrophobic polymer core and a hydrophilic polymer shell covalently bonded with the polymer core and having one or more amphoteric ionic functional groups, and a content of core-shell particles in the image-recording layer is at least 5% by mass.

SUMMARY OF THE INVENTION

There is a demand for a lithographic printing plate with which printing can be performed on a large number of sheets (hereinafter, this property will be also called "printing durability").

Particularly, in recent years, as a printing ink, an ink that is cured by the irradiation with ultraviolet rays (UV) (also called ("ultraviolet-curable ink or UV ink") has been frequently used.

Being able to dry instantly, the UV ink has high productivity. Furthermore, because the UV ink contains a small amount of solvents or contains no solvent, environmental pollution is likely to be reduced. In addition, the UV ink makes it possible to form an image without performing heat drying or by reducing the time of heat drying. Therefore, the UV ink has advantages such as being applicable to printing on a wide variety of objects.

Accordingly, a lithographic printing plate precursor that can provide a lithographic printing plate exhibiting excellent printing durability even in a case where the UV ink is used is considered to be very useful in industry.

As a result of intensive studies, the inventors of the present invention have found that the lithographic printing plate precursor described in WO2019/004471A or JP2012-529669A provides a lithographic printing plate that exhibits insufficient printing durability particularly in a case where a UV ink is used as ink.

An object to be solved by one embodiment of the present disclosure is to provide an on-press development type lithographic printing plate precursor making it possible to obtain a lithographic printing plate that exhibits excellent printing durability even in a case where a UV ink is used.

An object of another embodiment of the present disclosure is to provide a method for preparing a lithographic printing plate or a lithographic printing method using the on-press development type lithographic printing plate precursor.

Means for achieving the above objects include the following aspects.

<1> An on-press development type lithographic printing plate precursor having a support and an image-recording layer on the support, in which the image-recording layer contains an infrared absorber, a polymerization initiator, a polymerizable compound, and a color-developing substance precursor, and in a case where the image-recording layer is exposed to an infrared laser having a wavelength of 830 nm at an energy density of 110 mJ/cm$^2$, a loss of ethylenically unsaturated bonds in an exposed area in the image-recording layer is 10% to 40% of ethylenically unsaturated bonds in a non-exposed area in the image-recording layer.

<2> An on-press development type lithographic printing plate precursor having a support and an image-recording layer on the support, in which the image-recording layer contains an infrared absorber, a polymerization initiator, a polymerizable compound, and a color-developing substance precursor, and in a case where the image-recording layer is exposed to an infrared laser having a wavelength of 830 nm at an energy density of 110 mJ/cm$^2$, a consumption of the polymerizable compound in an exposed area in the image-recording layer is 40% to 95% of the polymerizable compound in a non-exposed area in the image-recording layer.

<3> An on-press development type lithographic printing plate precursor having a support and an image-recording layer on the support, in which the image-recording layer contains an infrared absorber, a polymerization initiator, a polymerizable compound, and a color-developing substance precursor and satisfies Expression N.

$$0.6 \leq NC/NC0 \leq 1.0 \qquad \text{Expression N}$$

In Expression N, NC represents UV printing durability of the image-recording layer, and NC0 represents the number of printed sheets showing UV printing durability of a layer which is the same as the image-recording layer except that the color-developing substance precursor has been removed from the layer.

<4> The on-press development type lithographic printing plate precursor described in any one of <1> to <3>, in which a hydrogen abstraction enthalpy of all hydrogen atoms present in a molecule of the color-developing substance precursor is −6.5 kcal/mol or more.

<5> The on-press development type lithographic printing plate precursor described in any one of <1> to <4>, in which the color-developing substance precursor does not have a structure in which a hydrogen atom is directly bonded to a nitrogen atom.

<6> The on-press development type lithographic printing plate precursor described in any one of <1> to <5>, in which the color-developing substance precursor is an acid color-developing agent.

<7> The on-press development type lithographic printing plate precursor described in any one of <1> to <6>, in which the polymerization initiator includes an electron-donating polymerization initiator and an electron-accepting polymerization initiator.

<8> The on-press development type lithographic printing plate precursor described in <7>, in which HOMO of the infrared absorber—HOMO of the electron-donating polymerization initiator is 0.70 eV or less.

<9> The on-press development type lithographic printing plate precursor described in any one of <1> to <8>, in which the polymerizable compound includes a polymerizable compound having 7 or more functional groups.

<10> The on-press development type lithographic printing plate precursor described in any one of <1> to <9>, in which the polymerizable compound includes a polymerizable compound having 10 or more functional groups.

<11> The on-press development type lithographic printing plate precursor described in any one of <1> to <10>, in which the polymerizable compound includes a compound having an ethylenically unsaturated bond valence of 5.0 mmol/g or more.

<12> The on-press development type lithographic printing plate precursor described in <11>, in which the compound having an ethylenically unsaturated bond valence of 5.0 mmol/g or more is a compound represented by Formula (I).

$$X\text{—}(Y)_n \qquad \text{Formula (I):}$$

In Formula (I), X represents an n-valent organic group having a hydrogen bonding group, Y represents a monovalent group having 2 or more ethylenically unsaturated groups, n represents an integer of 2 or more, and molecular weight of X/(molecular weight of Y×n) is 1 or less.

<13> The on-press development type lithographic printing plate precursor described in <11> or <12>, in which the compound having an ethylenically unsaturated bond valence of 5.0 mmol/g or more has at least one kind of structure selected from the group consisting of an adduct structure, a biuret structure, and an isocyanurate structure.

<14> The on-press development type lithographic printing plate precursor described in any one of <1> to <13>, in which the polymerizable compound includes a compound having 1 or 2 ethylenically unsaturated groups.

<15> The on-press development type lithographic printing plate precursor described in any one of <1> to <14>, in which the image-recording layer further contains addition polymerization-type resin particles having a dispersible group, and the dispersible group includes a group represented by Formula Z.

$$*\text{-Q-W—Y} \qquad \text{Formula Z}$$

In Formula Z, Q represents a divalent linking group, W represents a divalent group having a hydrophilic structure or a divalent group having a hydrophobic structure, Y represents a monovalent group having a hydrophilic structure or a monovalent group having a hydrophobic structure, either W or Y has a hydrophilic structure, and * represents a binding site with other structures.

<16> The on-press development type lithographic printing plate precursor described in any one of <1> to <15>, in which the image-recording layer further contains a polymer having a constitutional unit formed of an aromatic vinyl compound, and the infrared absorber includes an infrared absorber that decomposes by exposure to infrared.

<17> The on-press development type lithographic printing plate precursor described in any one of <1> to <16>, in which the image-recording layer further contains thermoplastic resin particles.

<18> The on-press development type lithographic printing plate precursor described in any one of <1> to <15>, in which the color-developing substance precursor has a xanthene structure.

<19> The on-press development type lithographic printing plate precursor described in any one of <1> to <18>, in which the color-developing substance precursor is a compound represented by any of Formula (Le-1) to Formula (Le-3).

(Le-1)

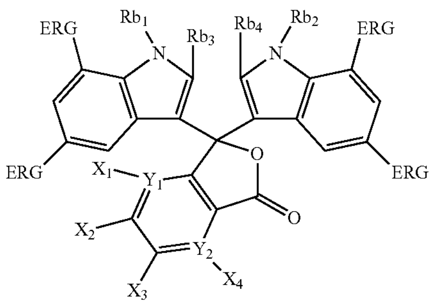

(Le-2)

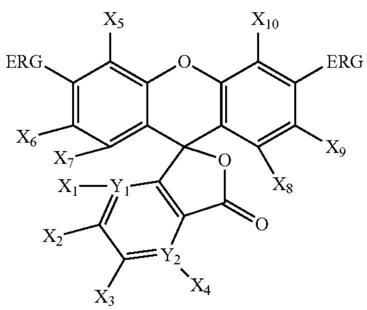

(Le-3)

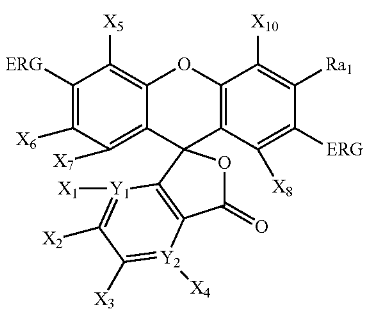

In Formula (Le-1) to Formula (Le-3), ERGs each independently represent an electron donating group, $X_1$ to $X_4$ each independently represent a hydrogen atom, a halogen atom, or dialkylanilino group, $X_5$ to $X_{10}$ each independently represent a hydrogen atom, a halogen atom, or a monovalent organic group, $Y_1$ and $Y_2$ each independently represent C or N, $X_1$ does not exist in a case where $Y_1$ is N, $X_4$ does not exist in a case where $Y_2$ is N, $Ra_1$ represents a hydrogen atom, an alkyl group, or an alkoxy group, and $Rb_1$ to $Rb_4$ each independently represent an alkyl group or an aryl group.

<20> The on-press development type lithographic printing plate precursor described in any one of <1> to <19>, in which the color-developing substance precursor is a compound represented by any of Formula (Le-4) to Formula (Le-6).

(Le-4)

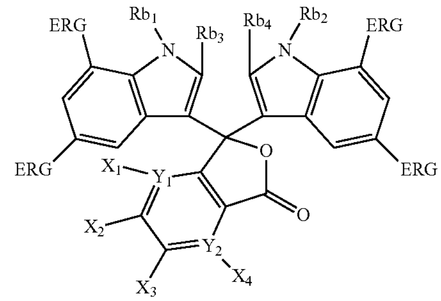

(Le-5)

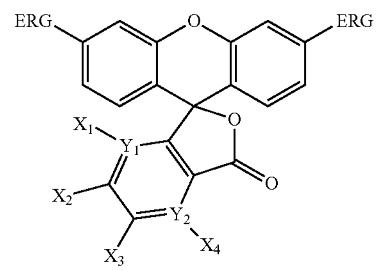

(Le-6)

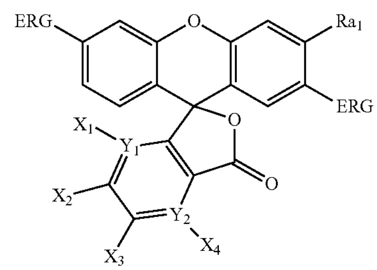

In Formula (Le-4) to Formula (Le-6), ERGs each independently represent an electron donating group, $X_1$ to $X_4$ each independently represent a hydrogen atom, a halogen atom, or dialkylanilino group, $Y_1$ and $Y_2$ each independently represent C or N, $X_1$ does not exist in a case where $Y_1$ is N, $X_4$ does not exist in a case where $Y_2$ is N, $Ra_1$ represents a hydrogen atom, an alkyl group, or an alkoxy group, and $Rb_1$ to $Rb_4$ each independently represent an alkyl group or an aryl group.

<21> The on-press development type lithographic printing plate precursor described in any one of <1> to <20>, in which the color-developing substance precursor is a compound represented by any of Formula (Le-7) to Formula (Le-9).

(Le-7)

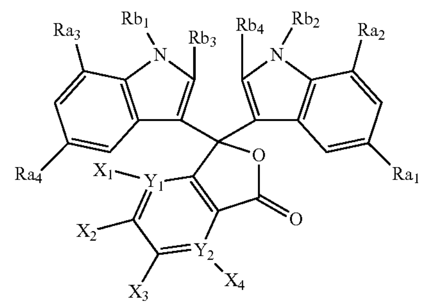

-continued (Le-8)

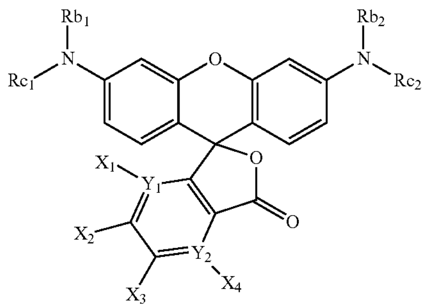

(Le-9)

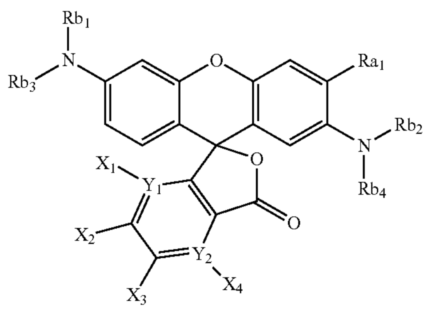

In Formula (Le-7) to Formula (Le-9), $X_1$ to $X_4$ each independently represent a hydrogen atom, a halogen atom, or a dialkylanilino group, $Y_1$ and $Y_2$ each independently represent C or N, $X_1$ does not exist in a case where $Y_1$ is N, $X_4$ does not exist in a case where $Y_2$ is N, $Ra_1$ to $Ra_4$ each independently represent a hydrogen atom, an alkyl group, or an alkoxy group, $Rb_1$ to $Rb_4$ each independently represent an alkyl group or an aryl group, and $Rc_1$ and $Rc_2$ each independently represent an aryl group.

<22> The on-press development type lithographic printing plate precursor described in any one of <1> to <21>, in which the color-developing substance precursor includes a compound represented by Formula (Le-A) or Formula (Le-B).

(Le-A)

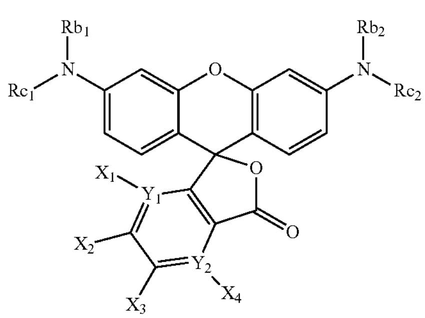

-continued (Le-B)

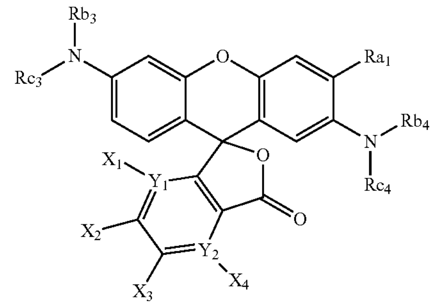

In Formula (Le-A) and Formula (Le-B), $X_1$ to $X_4$ each independently represent a hydrogen atom, a halogen atom, or a dialkylanilino group, $Y_1$ and $Y_2$ each independently represent C or N, $X_1$ does not exist in a case where $Y_1$ is N, $X_4$ does not exist in a case where $Y_2$ is N, $Ra_1$ represents a hydrogen atom, an alkyl group, or an alkoxy group, $Rb_1$ to $Rb_4$ each independently represent an alkyl group or an aryl group, $Rc_1$ and $Rc_2$ each independently represent an alkyl group, and $Rc_1$ and $Rc_4$ each independently represent an alkyl group or an aryl group.

<23> The on-press development type lithographic printing plate precursor described in <19>, in which the color-developing substance precursor includes a compound represented by Formula (Le-2).

<24> The on-press development type lithographic printing plate precursor described in <20>, in which the color-developing substance precursor includes a compound represented by Formula (Le-5).

<25> The on-press development type lithographic printing plate precursor described in <21>, in which the color-developing precursor includes a compound represented by Formula (Le-8).

<26> The on-press development type lithographic printing plate precursor described in <22>, in which the color-developing precursor includes a compound represented by the Formula (Le-A).

<27> The on-press development type lithographic printing plate precursor described in any one of <1> to <26>, in which the polymerization initiator includes an electron-accepting polymerization initiator, and the electron-accepting polymerization initiator includes a compound represented by Formula (II).

(II)

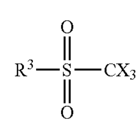

In Formula (II), X represents a halogen atom, and $R^3$ represents an aryl group.

<28> The on-press development type lithographic printing plate precursor described in any one of <1> to <27>, in which the image-recording layer further contains polyvinyl acetal as a binder polymer.

<29> The on-press development type lithographic printing plate precursor described in any one of <1> to <28>, in which the image-recording layer further contains a fluoroaliphatic group-containing copolymer.

<30> The on-press development type lithographic printing plate precursor described in <29>, in which the fluoroaliphatic group-containing copolymer has a constitutional unit formed of a compound represented by any of Formula (F1) or Formula (F2).

(F1)

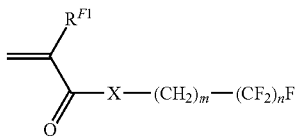

(F2)

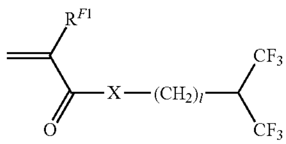

In Formula (F1) and Formula (F2), $R^{F1}$ each independently represents a hydrogen atom or a methyl group, X each independently represents an oxygen atom, a sulfur atom, or —N($R^{F2}$)—, m represents an integer of 1 to 6, n represents an integer of 1 to 10, l represents an integer of 0 to 10, and $R^{F2}$ represents a hydrogen atom or an alkyl group having 1 to 4 carbon atoms.

<31> The on-press development type lithographic printing plate precursor described in <30>, in which the fluoroaliphatic group-containing copolymer further has a constitutional unit formed of at least one kind of compound selected from the group consisting of poly(oxyalkylene) acrylate and poly(oxyalkylene) methacrylate.

<32> The on-press development type lithographic printing plate precursor described in any one of <1> to <31>, further having an overcoat layer on the image-recording layer.

<33> The on-press development type lithographic printing plate precursor described in <32>, in which the overcoat layer contains a hydrophobic polymer.

<34> The on-press development type lithographic printing plate precursor described in <32> or <33>, in which the overcoat layer contains a color-developing substance precursor.

<35> The on-press development type lithographic printing plate precursor described in <34>, in which the color-developing substance precursor in the overcoat layer is an infrared absorber.

<36> The on-press development type lithographic printing plate precursor described in <34> or <35>, in which the color-developing substance precursor in the overcoat layer includes a decomposable compound that decomposes due to exposure to infrared.

<37> The on-press development type lithographic printing plate precursor described in any one of <1> to <36>, in which the support has an aluminum plate and an anodic oxide film of aluminum disposed on the aluminum plate, the anodic oxide film is at a position closer to a side of the image-recording layer than the aluminum plate and has micropores extending in a depth direction from a surface of the anodic oxide film on the side of the image-recording layer, an average diameter of the micropores within the surface of the anodic oxide film is more than 10 nm and 100 nm or less, and in the L*a*b* color space, a value of brightness L* of the surface of the anodic oxide film on the side of the image-recording layer is 70 to 100.

<38> The on-press development type lithographic printing plate precursor described in <37>, in which the micropores are each composed of a large diameter portion that extends to a position at a depth of 10 nm to 1,000 nm from the surface of the anodic oxide film and a small diameter portion that is in communication with a bottom portion of the large diameter portion and extends to a position at a depth of 20 nm to 2,000 nm from a communication position, an average diameter of the large diameter portion within the surface of the anodic oxide film is 15 nm to 100 nm, and an average diameter of the small diameter portion at the communication position is 13 nm or less.

<39> The on-press development type lithographic printing plate precursor described in any one of <1> to <38>, in which a molar absorption coefficient ε of a color-developing substance generated from the color-developing substance precursor is 35,000 to 200,000.

<40> The on-press development type lithographic printing plate precursor described in any one of <1> to <39>, in which a ring-opening rate of the color-developing substance precursor calculated by the following equation is 40 mol % to 99 mol %.

Ring-opening rate=molar absorption coefficient of the color-developing substance precursor to which 1 molar equivalent of acid is added/molar absorption coefficient ε of the color-developing substance precursor×100

<41> The on-press development type lithographic printing plate precursor described in any one of <1> to <40>, in which a color-developing substance generated from the color-developing substance precursor has a maximum absorption wavelength of 500 nm to 650 nm in a wavelength region of 380 nm to 750 nm.

<42> A method for preparing a lithographic printing plate, including a step of exposing the on-press development type lithographic printing plate precursor described in any one of <1> to <41> in the shape of an image, and a step of supplying at least one material selected from the group consisting of a printing ink and dampening water on a printer so as to remove the image-recording layer in a non-image area.

<43> A lithographic printing method including a step of exposing the on-press development type lithographic printing plate precursor described in any one of <1> to <41> in the shape of an image, a step of supplying at least one material selected from the group consisting of a printing ink and dampening water on a printer so as to remove the image-recording layer in a non-image area and to prepare a lithographic printing plate, and a step of performing printing by using the obtained lithographic printing plate.

According to one embodiment of the present disclosure, it is possible to provide an on-press development type lithographic printing plate precursor from which a lithographic printing plate exhibiting excellent printing durability even in a case where a UV ink is used is obtained.

According to another embodiment of the present disclosure, it is possible to provide a method for preparing a lithographic printing plate or a lithographic printing method in which the on-press development type lithographic printing plate precursor is used.

Description of the Preferred Embodiments

Figure 1:
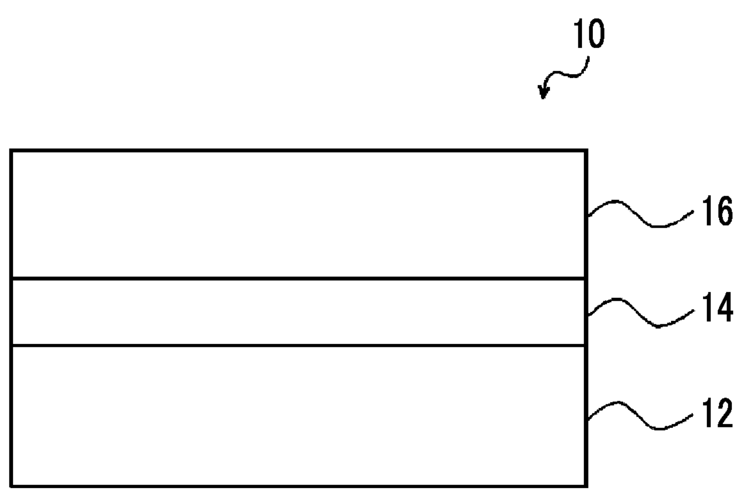
FIG. 1 is a schematic cross-sectional view of an embodiment of a lithographic printing plate precursor of the present disclosure.

Hereinafter, the contents of the present disclosure will be specifically described. The following constituents will be described on the basis of typical embodiments of the present disclosure, but the present disclosure is not limited to such embodiments.

In the present specification, a numerical range expressed using "to" includes numerical values listed before and after "to" as the lower limit and the upper limit.

In addition, in the present specification, in a case where there is no description regarding whether a group (atomic group) is substituted or unsubstituted, such a group includes both a group having no substituent and a group having a substituent. For example, "alkyl group" includes not only an alkyl group having no substituent (unsubstituted alkyl group) but also an alkyl group having a substituent (substituted alkyl group).

In the present specification, "(meth)acryl" is a term used to explain a concept including both the acryl and methacryl, and "(meth)acryloyl" is a term used to explain a concept including both the acryloyl and methacryloyl.

In addition, the term "step" in the present specification means not only an independent step but also a step that cannot be clearly differentiated from other steps as long as the intended goal of the step is achieved. In the present disclosure, "% by mass" has the same definition as "% by weight", and "part by mass" has the same definition as "part by weight".

In the present disclosure, unless otherwise specified, as each component contained in a composition or each constitutional unit contained in a polymer, one kind of component or one kind of constitutional unit may be used alone, or two or more kinds of components or two or more kinds of constitutional units may be used in combination.

Furthermore, in the present disclosure, in a case where there is a plurality of substances corresponding to each component in a composition, or in a case where there is a plurality of constitutional units corresponding to each constitutional unit in a polymer, unless otherwise specified, the amount of each component in the composition or the amount of each constitutional unit in the polymer means the total amount of the plurality of corresponding substances present in the composition or the total amount of the plurality of corresponding constitutional units present in the polymer.

In the present disclosure, a combination of two or more preferred aspects is a more preferred aspect.

In addition, in the present disclosure, unless otherwise specified, each of the weight-average molecular weight (Mw) and number-average molecular weight (Mn) is a molecular weight that is detected using a gel permeation chromatography (GPC) analysis device using TSKgel GMHxL, TSKgel G4000HxL, and TSKgel G2000HxL (trade names, manufactured by Tosoh Corporation) as columns, tetrahydrofuran (THF) as a solvent, and a differential refractometer, and expressed in terms of polystyrene as a standard substance.

In the present disclosure, the term "lithographic printing plate precursor" refers not only to a lithographic printing plate precursor but also to a key plate precursor. In addition, the term "lithographic printing plate" refers not only to a lithographic printing plate prepared by performing operations such as exposure and development as necessary on a lithographic printing plate precursor but also to a key plate. The key plate precursor is not necessarily subjected to the operations such as exposure and development. The key plate refers to a lithographic printing plate precursor to be mounted on a plate cylinder that is not used, in a case where monochromatic or dichromatic printing is carried out on a part of paper during, for example, color newspaper printing.

In the present disclosure, "*" in a chemical structural formula represents a position binding to another structure.

Hereinafter, the present disclosure will be specifically described.

(On-Press Development Type Lithographic Printing Plate Precursor)

A first embodiment of the on-press development type lithographic printing plate precursor according to the present disclosure (simply called "lithographic printing plate precursor" as well) has a support and an image-recording layer on the support, in which the image-recording layer contains an infrared absorber, a polymerization initiator, a polymerizable compound, and a color-developing substance precursor, and in a case where the image-recording layer is exposed to an infrared laser having a wavelength of 830 nm at an energy density of 110 $mJ/cm^2$, a loss of ethylenically unsaturated bonds in an exposed area in the image-recording layer is 10% to 40% of ethylenically unsaturated bonds in a non-exposed area in the image-recording layer.

A second embodiment of the on-press development type lithographic printing plate precursor according to the present disclosure has a support and an image-recording layer on the support, in which the image-recording layer contains an infrared absorber, a polymerization initiator, a polymerizable compound, and a color-developing substance precursor, and in a case where the image-recording layer is exposed to an infrared laser having a wavelength of 830 nm at an energy density of 110 $mJ/cm^2$, a consumption of the polymerizable compound in an exposed area in the image-recording layer is 40% to 95% of the polymerizable compound in a non-exposed area in the image-recording layer.

A third embodiment of the on-press development type lithographic printing plate precursor according to the present disclosure has a support and an image-recording layer on the support, in which the image-recording layer contains an infrared absorber, a polymerization initiator, a polymerizable compound, and a color-developing substance precursor and satisfies Expression N.

$$0.6<NC/NC0\leq 1.0 \quad \text{Expression N}$$

In Expression N, NC represents the UV printing durability of the image-recording layer, and NC0 represents the UV printing durability of a layer which is the same as the image-recording layer except that the color-developing substance precursor has been removed from the layer.

In a case where a term such as "on-press development type lithographic printing plate precursor according to the present disclosure" or "lithographic printing plate precursor according to the present disclosure" is simply mentioned in the present specification, unless otherwise specified, the term refers to all of the first embodiment, the second embodiment, and the third embodiment. Furthermore, in a case where a term such as "image-recording layer" is simply mentioned, unless otherwise specified, the term refers to the image-recording layer of all of the first embodiment, the second embodiment, and the third embodiment, or the like.

In addition, the on-press development type lithographic printing plate precursor according to the present disclosure is preferably a negative tone lithographic printing plate precursor.

The lithographic printing plate precursor in the related art described in WO2019/004471A or JP2012-529669A exhibits its insufficient printing durability in a case where a UV ink is used.

As a result of intensive studies, the inventors of the present invention have found that it is possible to provide a lithographic printing plate precursor from which a lithographic printing plate exhibiting excellent printing durability even in a case where a UV ink is used is obtained.

The detailed mechanism that brings about the aforementioned effect is unclear, but is assumed to be as below.

In a negative tone lithographic printing plate, a degree of crosslinking of a film in an exposed portion is a factor that determines printing durability. A loss indicates the degree of crosslinking of the exposed portion. The higher the loss, the higher the printing durability.

In addition, all compounds that do not have an ethylenically unsaturated group can cause the deterioration of printing durability. Some of the compounds are highly likely to deteriorate printing durability while others are less likely to deteriorate printing durability, depending on whether or not the compounds are likely to inhibit a radical polymerization reaction in the image-recording layer of the lithographic printing plate precursor. Particularly, a low-molecular-weight compound, especially a colorant or a color-developing substance precursor is likely to inhibit the radical polymerization reaction and deteriorates printing durability. In a case where the color-developing substance precursor is used, stoppage of radicals is suppressed, and high printing durability can be obtained.

Furthermore, in a case where a loss of ethylenically unsaturated bonds in the image-recording layer is 10% to 40%, a consumption of the polymerizable compound in the image-recording layer is 40% to 95%, or the image-recording layer satisfies Expression N, printing durability, particularly printing durability exhibited in a case where a UV ink is used is further improved.

A lithographic printing plate with which printing can be performed on a large number of sheets is described as "excellent in printing durability". The printing durability exhibited in a case where a UV ink is used is also described as "UV printing durability".

Hereinafter, each of the constituents of the lithographic printing plate precursor according to the present disclosure will be specifically described.

<Image-Recording Layer>

The lithographic printing plate precursor according to the present disclosure has an image-recording layer formed on a support.

The image-recording layer in the present disclosure includes an infrared absorber, a polymerization initiator, a polymerizable compound, and a color-developing substance precursor.

The image-recording layer used in the present disclosure is preferably a negative tone image-recording layer and more preferably a water-soluble or water-dispersible negative tone image-recording layer.

In the lithographic printing plate precursor according to the present disclosure, from the viewpoint of on-press developability, a non-exposed portion of the image-recording layer is preferably removable by at least any of dampening water or printing ink.

In the first embodiment of the on-press development type lithographic printing plate precursor according to the present disclosure, in a case where the image-recording layer is exposed to an infrared laser having a wavelength of 830 nm at an energy density of 110 mJ/cm$^2$, a loss of ethylenically unsaturated bonds in an exposed area in the image-recording layer is 10% to 40% of ethylenically unsaturated bonds in a non-exposed area in the image-recording layer. In a case where the loss is within the above range, UV printing durability, visibility, and the surface condition of the lithographic printing plate precursor are excellent.

In the second or third embodiment of the on-press development type lithographic printing plate precursor according to the present disclosure, from the viewpoint of UV printing durability, visibility, and the surface condition of the lithographic printing plate precursor, in a case where the image-recording layer is exposed to an infrared laser having a wavelength of 830 nm at an energy density of 110 mJ/cm$^2$, the loss of ethylenically unsaturated bonds in an exposed area in the image-recording layer is preferably 10% to 40% of ethylenically unsaturated bonds in a non-exposed area in the image-recording layer.

In the first embodiment of the on-press development type lithographic printing plate precursor according to the present disclosure, from the viewpoint of UV printing durability, visibility, and the surface condition of the lithographic printing plate precursor, the loss of ethylenically unsaturated bonds is preferably 13% to 40%, and more preferably 15% to 30%.

In the second or third embodiment of the on-press development type lithographic printing plate precursor according to the present disclosure, from the viewpoint of UV printing durability, visibility, and the surface condition of the lithographic printing plate precursor, an absolute value of a difference of the loss of ethylenically unsaturated bonds is more preferably 13% to 40%, and particularly preferably 15% to 30%.

The following method is performed to measure the loss of ethylenically unsaturated bonds in an exposed area in the image-recording layer with respect to ethylenically unsaturated bonds in a non-exposed area in the image-recording layer that is obtained in a case where the image-recording layer is exposed to an infrared laser having a wavelength of 830 nm at an energy density of 110 mJ/cm$^2$.

By using a Fourier transform infrared spectrophotometer (FT-IR), a peak surface area (relative value) of stretching resulting from a C═C group at around 700 cm$^{-1}$ relative to a reference peak (peak that does not shift before and after exposure as appropriate, although it depends on the material of the plate).

For a solid exposed portion formed by exposure performed under the same conditions as those in the NC/NC0 measurement method, which will be described later, and a non-exposed portion, the aforementioned peak surface area is determined, the area of the exposed portion is subtracted from the area of the non-exposed portion, and the result is adopted as the loss of ethylenically unsaturated bonds.

In the second embodiment of the on-press development type lithographic printing plate precursor according to the present disclosure, in a case where the image-recording layer is exposed to an infrared laser having a wavelength of 830 nm at an energy density of 110 mJ/cm$^2$, a consumption of the polymerizable compound in an exposed area in the image-recording layer is 40% to 95% of the polymerizable compound in a non-exposed area in the image-recording layer. In a case where the loss is within the above range, UV printing durability, visibility, and the surface condition of the lithographic printing plate precursor are excellent.

In the first or third embodiment of the on-press development type lithographic printing plate precursor according to the present disclosure, from the viewpoint of UV printing durability, visibility, and the surface condition of the lithographic printing plate precursor, in a case where the image-recording layer is exposed to an infrared laser having a wavelength of 830 nm at an energy density of 110 mJ/cm$^2$, the consumption of the polymerizable compound in an exposed area in the image-recording layer is preferably 40% to 95% of the polymerizable compound in a non-exposed area in the image-recording layer.

In the second embodiment of the on-press development type lithographic printing plate precursor according to the present disclosure, from the viewpoint of UV printing durability, visibility, and the surface condition of the lithographic printing plate precursor, the ratio of the ethylenically unsaturated bond equivalent is preferably 40% to 70%, and more preferably 45% to 65%.

In the first or third embodiment of the on-press development type lithographic printing plate precursor according to the present disclosure, from the viewpoint of UV printing durability, visibility, and the surface condition of the lithographic printing plate precursor, the ratio of the ethylenically unsaturated bond equivalent is more preferably 40% to 70%, and particularly preferably 45% to 65%.

The following method is performed to measure the consumption of the polymerizable compound in an exposed area in the image-recording layer with respect to the polymerizable compound in a non-exposed area in the image-recording layer that is obtained in a case where the image-recording layer is exposed to an infrared laser having a wavelength of 830 nm at an energy density of 110 mJ/cm$^2$.

Exposure is performed under the same conditions as those in the NC/NC0 measurement method that will be described later, thereby obtaining a solid exposed portion and a non-exposed portion. The non-exposed portion and the exposed portion are cut, the obtained 50 cm$^2$ coating film is immersed in 1 mL of tetrahydrofuran (THF) and irradiated with ultrasonic waves so that the polymerizable compound is eluted, and the area is measured by high performance liquid chromatography (HPLC). The ratio of area of the polymerizable compound detected from the exposed portion/area of the polymerizable compound detected from the non-exposed portion is calculated and adopted as the consumption of the polymerizable compound.

—Expression N—

The image-recording layer in the third embodiment of the on-press development type lithographic printing plate precursor according to the present disclosure satisfies Expression N. In a case where this aspect is adopted, UV printing durability, visibility, and the surface condition of the lithographic printing plate precursor are excellent.

From the viewpoint of UV printing durability, visibility, and the surface condition of the lithographic printing plate precursor, it is preferable that the image-recording layer in the first or second embodiment of the one-press development type lithographic printing plate precursor according to the present disclosure satisfy Expression N.

$$0.6 \leq NC/NC0 \leq 1.0 \qquad \text{Expression N}$$

In Expression N, NC represents the number of printed sheets showing UV printing durability of the image-recording layer, and NC0 represents the number of printed sheets showing UV printing durability of a layer which is the same as the image-recording layer except that the color-developing substance precursor has been removed from the layer.

The values of NC and NC0 are measured by the following method.

The lithographic printing plate precursor is exposed using Luxel PLATESETTER T-6000111 manufactured by FUJIFILM Corporation equipped with an infrared semiconductor laser, at an exposure amount of 110 mJ/cm$^2$. The exposure image includes a solid image and a 50% halftone dot chart of a 20 μm dot FM screen, and a non-image area.

The obtained lithographic printing plate precursor having undergone exposure is mounted on a plate cylinder of a printer LITHRONE26 manufactured by KOMORI Corporation, without being subjected to a development treatment. A water supply roller for the plate cylinder is decelerated 5%, and then on-press development is performed using dampening water containing Ecolity-2 (manufactured by FUJIFILM Corporation)/tap water=2/98 (volume ratio) and a UV ink (T&K UV OFS K-HS black GE-M (manufactured by T&K TOKA CO., LTD.) by supplying the dampening water and the ink according to the standard automatic printing start method of LITHRONE26. Thereafter, printing is performed on 50,000 sheets of TOKUBISHI art paper (manufactured by MITSUBISHI PAPER MILLS LIMITED., ream weight: 76.5 kg) at a printing rate of 10,000 sheets/hour.

As the number of printed sheets increases, the image-recording layer gradually wears out, and the ink receiving properties deteriorate. As a result, the ink density on the printing paper decreases. The area ratio of the FM screen 3% halftone dots in the printed matter is measured using X-Rite (manufactured X-Rite, Incorporated.). When the measured area ratio is 5% lower than the area ratio measured after 100 sheets are printed, the number of prints at that point in time was adopted as the number of sheets of completely printed paper and used for evaluating UV printing durability (NC).

Likewise, a plate that does not contain a color-developing substance precursor is prepared, and number of sheets printed from plate containing color-developing substance precursor (NC)/number of sheets printed from plate containing no color-developing substance precursor (NC0) is calculated.

From the viewpoint of UV printing durability, visibility, and the surface condition of the lithographic printing plate precursor, the image-recording layer in the third embodiment of the on-press development type lithographic printing plate precursor according to the present disclosure preferably satisfies Expression N1, more preferably satisfies Expression N2, and particularly preferably satisfies Expression N3.

From the viewpoint of UV printing durability, visibility, and the surface condition of the lithographic printing plate precursor, the image-recording layer in the first or second embodiment of the on-press development type lithographic printing plate precursor according to the present disclosure more preferably satisfies Expression N1, even more preferably satisfies Expression N2, and particularly preferably satisfies Expression N3.

$$0.75 \leq NC/NC0 \leq 1.0 \qquad \text{Expression N1}$$

$$0.85 \leq NC/NC0 \leq 1.0 \qquad \text{Expression N2}$$

$$0.90 \leq NC/NC0 \leq 1.0 \qquad \text{Expression N3}$$

From the viewpoint of UV printing durability, visibility, and the surface condition of the lithographic printing plate precursor, the value of NC in the image-recording layer of the on-press development type lithographic printing plate precursor according to the present disclosure is preferably 25,000 or more, more preferably 40,000 or more, and particularly preferably 47,000 or more.

Hereinafter, each of the components contained in the image-recording layer will be specifically described.

—Color-Developing Substance Precursor—

The image-recording layer contains a color-developing substance precursor.

From the viewpoint of color developability, the color-developing substance precursor preferably includes an acid color-developing agent. Furthermore, from the viewpoint of color developability, the color-developing substance precursor preferably includes a leuco compound.

"Color-developing substance precursor" used in the present disclosure means a compound that develops or removes color by a stimulus such as light or acid and thus changes the color of the image-recording layer. Furthermore, "acid color-developing agent" means a compound that develops or removes color by being heated in a state of accepting an electron accepting compound (for example, a proton of an acid or the like) and thus changes the color of the image-recording layer. The acid color-developing agent is particularly preferably a colorless compound which has a partial skeleton such as lactone, lactam, sultone, spiropyran, an ester, or an amide and allows such a partial skeleton to rapidly open the ring or to be cleaved when coming into contact with an electron accepting compound.

From the viewpoint of UV printing durability, the hydrogen abstraction enthalpy of all hydrogen atoms present in a molecule of the color-developing substance precursor is preferably −6.5 kcal/mol or more, more preferably −4.0 kcal/mol or more, even more preferably −2.0 kcal/mol or more, and particularly preferably −2.0 kcal/mol to 50 kcal/mol.

The higher the hydrogen abstraction enthalpy, the further the hydrogen atoms are inhibited from being abstracted from the color-developing substance precursor by a polymerization initiation species such as radicals, and the further the polymerization reaction is prolonged. Therefore, curing properties are excellent, and printing durability, particularly, UV printing durability is further improved.

In the present disclosure, the hydrogen abstraction enthalpy of all hydrogen atoms present in a molecule of the color-developing substance precursor is calculated by the following method.

Regarding a reaction with propagating radicals caused by hydrogen abstraction, the enthalpy of each of the reactant and product is calculated using Gaussian16 as a calculation program at a level of density functional theory (B3LYP/6-31+G**). The solvent effect (solvent:methanol) is examined by the SCRF method. By finding the difference in the enthalpy between the reactant and the product, a reaction enthalpy is calculated.

More specifically, the hydrogen abstraction enthalpy is calculated as follows. In the following chemical reaction formula, for each of the propagating radical, LeucoDye-H, hydrogenated propagating radical, and LeucoDye-radical, modeling is carried out using Gaussian pre/post software GaussView6. #p opt b31yp/6-31+g (d, p) scrf=(solvent=methanol) is specified as a calculation condition, charge 0 multiplicity 2 is set for the radical, and charge 0 multiplicity 1 is set for substances other than the radical. #p is specified for detailed logging output, and may not be specified.

From the energy (unit:hartree) of the structure optimized by performing calculation, the enthalpy of formation of the reactant (sum of the energy of the propagating radical and LeucoDye-H) and the enthalpy of formation of the product (sum of the energy of the hydrogenated propagating radical and LeucoDye-radical) are calculated. The enthalpy of formation of the reactant is subtracted from the enthalpy of formation of the product, and the result is adopted as the hydrogen abstraction enthalpy. The unit is converted as 1 hartree=627.51 kcal/mol.

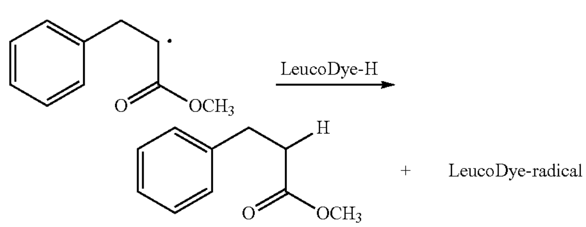

For example, the hydrogen abstraction enthalpy for each hydrogen atom of the following compound is as follows.

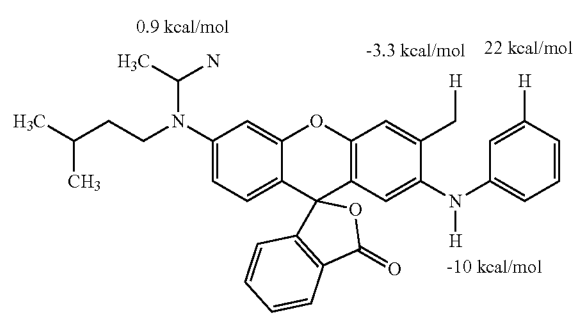

From the viewpoint of UV printing durability, it is preferable that the color-developing substance precursor do not have a structure in which a hydrogen atom is directly bonded to a nitrogen atom.

The structure in which a hydrogen atom is directly bonded to a nitrogen atom (N—H structure) is a structure in which a hydrogen abstraction reaction readily occurs by a radical or the like. In a case where the color-developing substance precursor is a compound that does not have such a structure, the hydrogen atom abstraction from the color-developing substance precursor is inhibited, and the polymerization reaction is prolonged. Therefore, excellent curing properties are obtained, and printing durability, particularly, UV printing durability is further improved.

Particularly, from the viewpoint of color developability, the color developing agent used in the present disclosure is preferably at least one kind of compound selected from the group consisting of a spiropyran compound, a spirooxazine compound, a spirolactone compound, and a spirolactam compound.

From the viewpoint of visibility, the hue of the colorant after color development is preferably green, blue, or black.

Furthermore, from the viewpoint of color developability, visibility of exposed portions, and UV printing durability, the acid color-developing agent is preferably a leuco colorant.

The leuco colorant is not particularly limited as long as it has a leuco structure. The leuco colorant preferably has a spiro structure, and more preferably has a spirolactone ring structure.

From the viewpoint of color developability, visibility of exposed portions, and UV printing durability, the leuco colorant preferably has a phthalide structure or a fluoran structure.

Furthermore, from the viewpoint of color developability, visibility of exposed portions, and UV printing durability, the leuco colorant having the phthalide structure or the fluoran structure is preferably a compound represented by any of Formula (Le-1) to Formula (Le-3), and more preferably a compound represented by Formula (Le-2).

(Le-1)

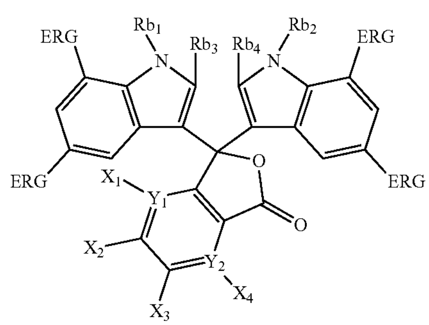

(Le-2)

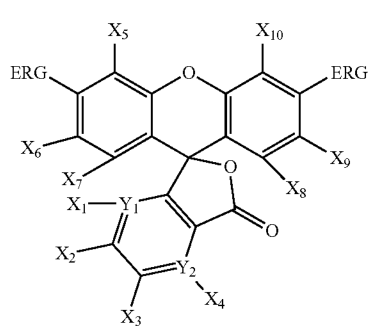

-continued (Le-3)

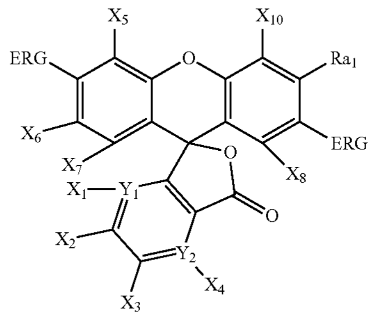

In Formula (Le-1) to Formula (Le-3), ERGs each independently represent an electron donating group, $X_1$ to $X_4$ each independently represent a hydrogen atom, a halogen atom, or dialkylanilino group, $X_5$ to $X_{10}$ each independently represent a hydrogen atom, a halogen atom, or a monovalent organic group, $Y_1$ and $Y_2$ each independently represent C or N, $X_1$ does not exist in a case where $Y_1$ is N, $X_4$ does not exist in a case where $Y_2$ is N, $Ra_1$ represents a hydrogen atom, an alkyl group, or an alkoxy group, and $Rb_1$ to $Rb_4$ each independently represent an alkyl group or an aryl group.

As the electron donating group represented by ERG in Formula (Le-1) to Formula (Le-3), from the viewpoint of color developability, visibility of the exposed portions, and UV printing durability, an amino group, an alkylamino group, an arylamino group, a dialkylamino group, a monoalkyl monoarylamino group, a diarylamino group, an alkoxy group, an aryloxy group or an alkyl group is preferable, an amino group, alkylamino group, arylamino group, dialkylamino group, monoalkyl monoarylamino group, diarylamino group, alkoxy group, or an aryloxy group is more preferable, a monoalkyl monoarylamino group or a diarylamino group is even more preferable, and a monoalkyl monoarylamino group is particularly preferable.

From the viewpoint of color developability, visibility of exposed portions, and UV printing durability, $X_1$ to $X_4$ in Formula (Le-1) to Formula (Le-3) preferably each independently represent a hydrogen atom or a chlorine atom, and more preferably each independently represent a hydrogen atom.

From the viewpoint of color developability, visibility of exposed portions, and UV printing durability, $X_5$ to $X_{10}$ in Formula (Le-2) or Formula (Le-3) preferably each independently represent a hydrogen atom, a halogen atom, an alkyl group, an aryl group, an amino group, an alkylamino group, an arylamino group, a dialkylamino group, a monoalkyl monoarylamino group, a diarylamino group, a hydroxyl group, an alkoxy group, an aryloxy group, an acyl group, an alkoxycarbonyl group, an aryloxycarbonyl group, or an cyano group, more preferably each independently represent a hydrogen atom, a halogen atom, an alkyl group, an aryl group, an alkoxy group, or an aryloxy group, even more preferably each independently represent a hydrogen atom, a halogen atom, an alkyl group, or an aryl group, and particularly preferably each independently represent a hydrogen atom.

From the viewpoint of color developability, visibility of exposed portions, and UV printing durability, it is preferable that at least one of $Y_1$ or $Y_2$ in Formula (Le-1) to Formula (Le-3) be C, and it is more preferable that both of $Y_1$ and $Y_2$ be C.

From the viewpoint of color developability, visibility of exposed portions, and UV printing durability, $Ra_1$ in Formula (Le-1) to Formula (Le-3) is preferably an alkyl group or an alkoxy group, more preferably an alkoxy group, and particularly preferably a methoxy group.

From the viewpoint of color developability and visibility of exposed portions, $Rb_1$ to $Rb_4$ in Formula (Le-1) to Formula (Le-3) preferably each independently represent a hydrogen atom or an alkyl group, more preferably each independently represent an alkyl group, and particularly preferably each independently represent a methyl group.

From the viewpoint of color developability, visibility of exposed portions, and UV printing durability, the leuco colorant having a phthalide structure or a fluoran structure is more preferably a compound represented by any of Formula (Le-4) to Formula (Le-6), and even more preferably a compound represented by Formula (Le-5).

(Le-4)

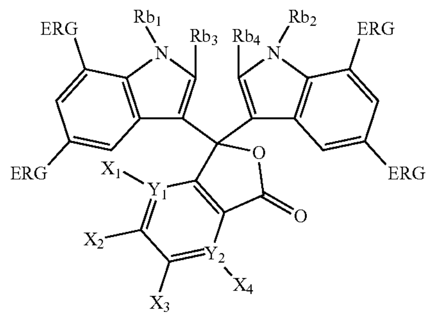

(Le-5)

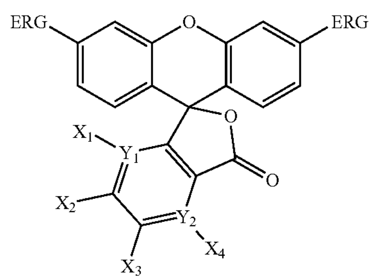

(Le-6)

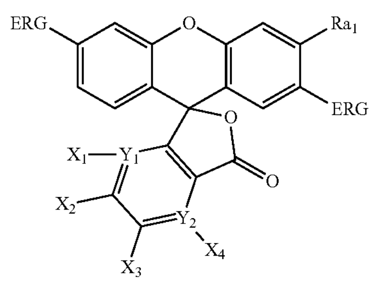

In Formula (Le-4) to Formula (Le-6), ERG each independently represents an electron donating group, $X_1$ to $X_4$ each independently represent a hydrogen atom, a halogen atom, or a dialkylanilino group, $Y_1$ and $Y_2$ each independently represent C or N, $X_1$ does not exist in a case where $Y_1$ is N, $X_4$ does not exist in a case where $Y_2$ is N, $Ra_1$ represents a hydrogen atom, an alkyl group, or an alkoxy group, and $Rb_1$ to $Rb_4$ each independently represent an alkyl group or an aryl group.

ERG, $X_1$ to $X_4$, $Y_1$, $Y_2$, $Ra_1$, and $Rb_1$ to $Rb_4$ in Formula (Le-4) to Formula (Le-6) have the same definitions as ERG, $X_1$ to $X_4$, $Y_1$, $Y_2$, $Ra_1$, and $Rb_1$ to $Rb_4$ in Formula (Le-1) to Formula (Le-3) respectively, and preferred aspects thereof are also the same.

From the viewpoint of color developability, visibility of exposed portions, and UV printing durability, the leuco colorant having a phthalide structure or a fluoran structure is more preferably a compound represented by any of Formula (Le-7) to Formula (Le-9), and particularly preferably a compound represented by Formula (Le-8).

(Le-7)

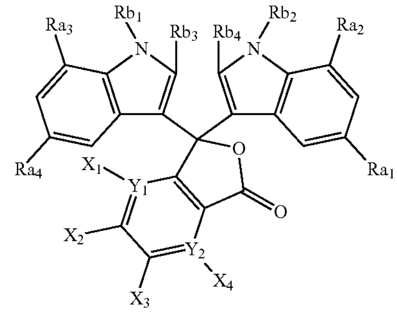

(Le-8)

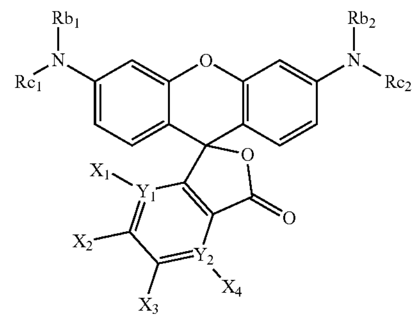

(Le-9)

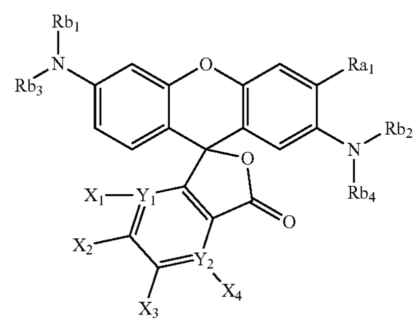

In Formula (Le-7) to Formula (Le-9), $X_1$ to $X_4$ each independently represent a hydrogen atom, a halogen atom, or a dialkylanilino group, $Y_1$ and $Y_2$ each independently represent C or N, $X_1$ does not exist in a case where $Y_1$ is N, $X_4$ does not exist in a case where $Y_2$ is N, $Ra_1$ to $Ra_4$ each independently represent a hydrogen atom, an alkyl group, or an alkoxy group, $Rb_1$ to $Rb_4$ each independently represent an alkyl group or an aryl group, and $Rc_1$ and $Rc_2$ each independently represent an aryl group.

$X_1$ to $X_4$, $Y_1$, and $Y_2$ in Formula (Le-7) to Formula (Le-9) have the same definition as $X_1$ to $X_4$, $Y_1$, and $Y_2$ in Formula (Le-1) to Formula (Le-3) respectively, and preferred aspects thereof are also the same.

From the viewpoint of color developability, visibility of exposed portions, and UV printing durability, $Ra_1$ to $Ra_4$ in Formula (Le-7) to Formula (Le-9) preferably each independently represent an alkyl group or an alkoxy group, more preferably each independently represent an alkoxy group, and particularly preferably each independently represent a methoxy group.

From the viewpoint of color developability, visibility of exposed portions, and UV printing durability, $Rb_1$ to $Rb_4$ in Formula (Le-7) to Formula (Le-9) preferably each independently represent an alkyl group or an aryl group substituted with an alkoxy group, more preferably each independently represent an alkyl group, and particularly preferably each independently represent a methyl group.

From the viewpoint of color developability, visibility of exposed portions, and UV printing durability, $Rc_1$ and $Rc_2$ in Formula (Le-8) preferably each independently represent a phenyl group or an alkylphenyl group, and more preferably each independently represent a phenyl group.

In Formula (Le-8), from the viewpoint of color developability, visibility of exposed portions, and UV printing durability, $X_1$ to $X_4$ preferably each represent a hydrogen atom, and $Y_1$ and $Y_2$ preferably each represent C.

Furthermore, from the viewpoint of color developability, visibility of exposed portions, and UV printing durability, in Formula (Le-8), $Rb_1$ and $Rb_2$ preferably each independently represent an alkyl group or an aryl group substituted with an alkoxy group.

The alkyl group in Formula (Le-1) to Formula (Le-9) may be linear or branched or may have a ring structure.

The number of carbon atoms in the alkyl group in Formula (Le-1) to Formula (Le-9) is preferably 1 to 20, more preferably 1 to 8, even more preferably 1 to 4, and particularly preferably 1 or 2.

The number of carbon atoms in the aryl group in Formula (Le-1) to Formula (Le-9) is preferably 6 to 20, more preferably 6 to 10, and particularly preferably 6 to 8.

Each of the groups in Formula (Le-1) to Formula (Le-6), such as a monovalent organic group, an alkyl group, an aryl group, a dialkylanilino group, an alkylamino group, and an alkoxy group, may have a substituent. Examples of the substituent include an alkyl group, an aryl group, a halogen atom, an amino group, an alkylamino group, an arylamino group, a dialkylamino group, a monoalkyl monoarylamino group, a diarylamino group, a hydroxyl group, an alkoxy group, an aryloxy group, an acyl group, an alkoxycarbonyl group, an aryloxycarbonyl group, a cyano group, and the like. These substituents may be further substituted with these substituents.

Each of the groups in Formula (Le-7) to Formula (Le-9), such as an alkyl group, an aryl group, a dialkylanilino group, and an alkoxy group, may have a substituent. Examples of the substituent include an alkyl group, an aryl group, a halogen atom, a dialkylamino group, a monoalkyl monoarylamino group, a diarylamino group, a hydroxyl group, an alkoxy group, an aryloxy group, an acyl group, an alkoxycarbonyl group, an aryloxycarbonyl group, a cyano group, and the like. These substituents may be further substituted with these substituents.

From the viewpoint of UV printing durability, visibility, and the surface condition of the lithographic printing plate precursor, the color-developing substance precursor preferably has a xanthene structure.

Furthermore, from the viewpoint of UV printing durability, visibility, and the surface condition of the lithographic printing plate precursor, the color-developing substance precursor preferably includes a compound represented by Formula (Le-A) or Formula (Le-B), and more preferably includes a compound represented by Formula (Le-A).

(Le-A)

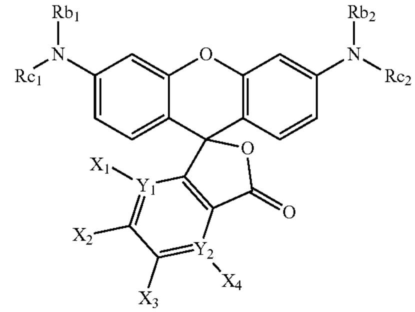

(Le-B)

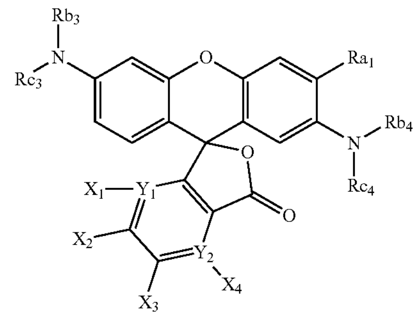

In Formula (Le-A) and Formula (Le-B), $X_1$ to $X_4$ each independently represent a hydrogen atom, a halogen atom, or a dialkylanilino group, $Y_1$ and $Y_2$ each independently represent C or N, $X_1$ does not exist in a case where $Y_1$ is N, $X_4$ does not exist in a case where $Y_2$ is N, $Ra_1$ represents a hydrogen atom, an alkyl group, or an alkoxy group, $Rb_1$ to $Rb_4$ each independently represent an alkyl group or an aryl group, $Rc_1$ and $Rc_2$ each independently represent an alkyl group, and $Rc_3$ and $Rc_4$ each independently represent an alkyl group or an aryl group.

Furthermore, from the viewpoint of UV printing durability, visibility, and the surface condition of the lithographic printing plate precursor, $Rb_1$ to $Rb_4$ in Formula (Le-A) and Formula (Le-B) preferably each independently represent an aryl group.

From the viewpoint of color developability, visibility of exposed portions, and UV printing durability, $Rc_1$ to $Rc_4$ in Formula (Le-A) and Formula (Le-B) preferably each independently represent a phenyl group or an alkylphenyl group, and more preferably each independently represent a phenyl group.

In Formula (Le-A) and Formula (Le-B), from the viewpoint of color developability, visibility of exposed portions, and UV printing durability, $X_1$ to $X_4$ preferably each represent a hydrogen atom, and $Y_1$ and $Y_2$ preferably each represent C.

The alkyl group in Formula (Le-A) and Formula (Le-B) may be linear or branched or may have a ring structure.

The number of carbon atoms in the alkyl group in Formula (Le-A) and Formula (Le-B) is preferably 1 to 20, more preferably 1 to 8, even more preferably 1 to 4, and particularly preferably 1 or 2.

The number of carbon atoms in the aryl group in Formula (Le-A) and Formula (Le-B) is preferably 6 to 20, more preferably 6 to 10, and particularly preferably 6 to 8.

Each of the groups in Formula (Le-A) and Formula (Le-B), such as an alkyl group, an aryl group, a dialkylanilino group, and an alkoxy group, may have a substituent. Examples of the substituent include an alkyl group, an aryl group, a halogen atom, a dialkylamino group, a monoalkyl monoarylamino group, a diarylamino group, a hydroxyl group, an alkoxy group, an aryloxy group, an acyl group, an alkoxycarbonyl group, an aryloxycarbonyl group, a cyano group, and the like. These substituents may be further substituted with these substituents.

From the viewpoint of visibility, a molar absorption coefficient ε of a color-developing substance generated from the color-developing substance precursor is preferably 35,000 or more, more preferably 35,000 or more and 200,000 or less, and particularly preferably 50,000 or more and 150,000 or less.

In the present disclosure, the molar absorption coefficient ε of the color-developing substance generated from the color-developing substance precursor is measured by the following method.

The color-developing substance precursor to be measured is weighed (0.04 mmol) and put in a 100 mL volumetric flask.

Acetic acid (about 90 mL) is added thereto. After it is visually confirmed that the measurement sample has completely dissolved, acetic acid is added thereto so that the volume increases up to 100 mL, thereby preparing a colorant solution A.

Acetic acid (about 80 mL) is added to another 100 mL volumetric flask, 5 mL of deionized water and 5 mL of the colorant solution A are then added thereto by using a 5 mL transfer pipette, and the solution is gently shaken.

After it is visually confirmed that the solution has no precipitate of the color-developing substance precursor, acetic acid is added thereto so that the volume increases up to 100 mL, thereby preparing a colorant solution B. In the colorant solution B, the concentration of the color-developing substance precursor is 0.02 mmol/L.

A measurement cell (quartz glass, optical path width: 10 mm) is filled with the colorant solution B, and the solution is measured using an ultraviolet-visible spectrophotometer (UV-1800, manufactured by Shimadzu Corporation.).

As a blank, a solution of water:acetic acid=5:95 is used.

From the obtained spectrum, the maximum absorption wavelength in the visible light region (380 nm to 750 nm) is read. From the absorbance at the wavelength, the molar absorption coefficient ε is calculated.

From the viewpoint of visibility, a ring-opening rate of the color-developing substance precursor calculated by the following equation is preferably 15% or more and 100% or less, more preferably 40% or more and 99% or less, even more preferably 60% or more and 99% or less, particularly preferably 75% or more and 99% or less, and most preferably 85% or more and 99% or less.

Ring-opening rate=molar absorption coefficient of color-developing substance precursor to which 1 molar equivalent of acid is added/molar absorption coefficient ε of color-developing substance precursor×100

From the viewpoint of visibility, in the visible light region (380 nm to 750 nm), the maximum absorption wavelength λmax of the color-developing substance generated from the color-developing substance precursor is preferably 500 nm to 650 nm, more preferably 520 nm to 600 nm, even more preferably 530 nm to 580 nm, and particularly preferably 540 nm to 570 nm.

In the present disclosure, the ring-opening rate and λmax are measured by the following methods.

—Preparation of Colorant Solution C—

The color-developing substance precursor is weighed (0.1 mmol) and put in a 50 mL volumetric flask.

Acetonitrile (about 40 mL) is added thereto. After it is visually confirmed that the measurement sample has completely dissolved, acetonitrile is added thereto so that the volume increases up to 50 mL, thereby preparing a colorant solution C.

—Preparation of Acid Solution D—

CSA (10-camphorsulfonic acid, 0.2 mmol) is added to a 100 mL volumetric flask, and about 80 mL of acetonitrile is added thereto. After it is confirmed that CSA has completely dissolved, acetonitrile is added thereto so that the volume increases up to 100 mL, thereby preparing an acid solution D.

—Preparation of Measurement Solution E—

Deionized water (5 mL) is added to a 100 mL volumetric flask by using a transfer pipette, and 80 mL of acetonitrile is added thereto. The colorant solution C (1 mL) and 1 mL of the acid solution D are added thereto so that the volume increases up to 100 mL, thereby preparing a measurement solution E.

In the measurement solution E, the concentration of the color-developing substance precursor including the generated color-developing substance is 0.02 mmol/L.

A measurement cell (quartz glass, optical path width: 10 mm) is filled with the colorant solution E, and the solution is measured using an ultraviolet-visible spectrophotometer (UV-1800, manufactured by Shimadzu Corporation.).

As a blank, a solution of water:acetonitrile=5:95 is used.

From the obtained spectrum, the maximum absorption wavelength λmax in the visible light region (380 nm to 750 nm) is read. From the absorbance at the wavelength, the molar absorption coefficient ε is calculated.

The ring-opening rate is calculated according to the following equation.

Ring-opening rate=molar absorption coefficient of color-developing substance precursor to which 1 molar equivalent of acid is added/molar absorption coefficient ε of color-developing substance precursor×100

As the color-developing substance precursor to be used, for example, the following compounds are suitable.

S-1

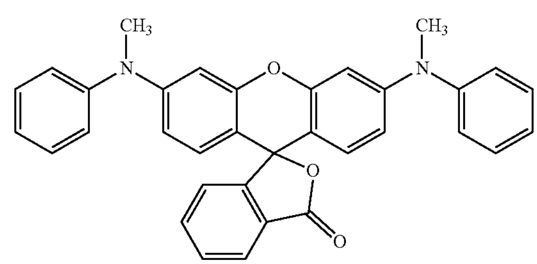

S-2

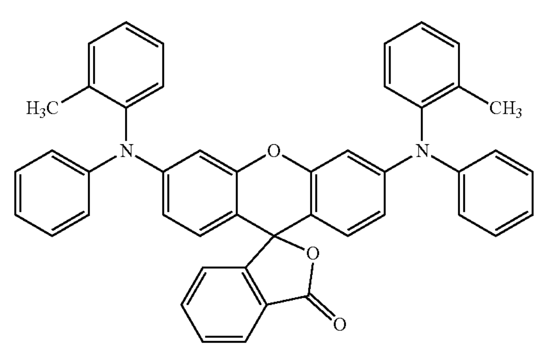

-continued
S-3
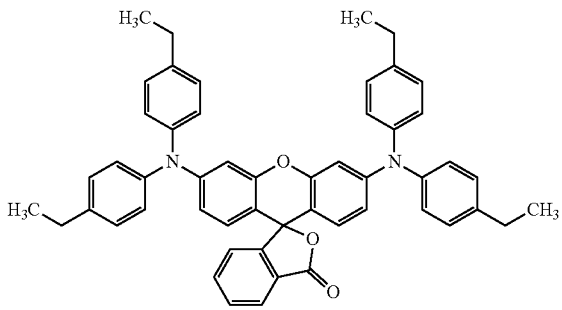
S-4
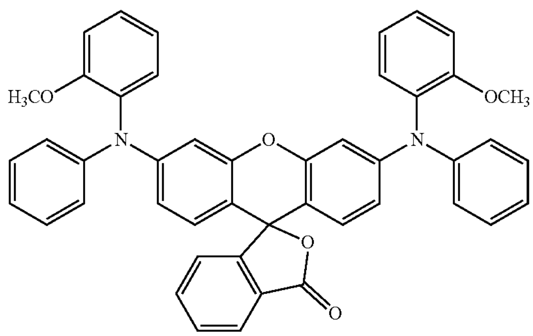
S-5
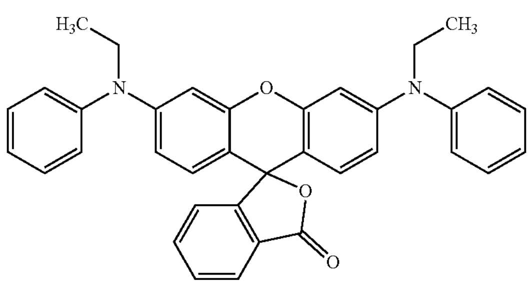
S-6
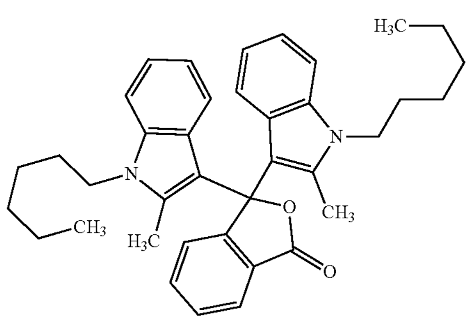
S-7
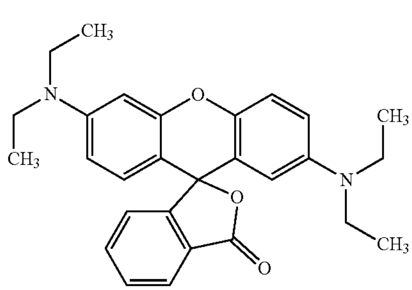
-continued
S-8
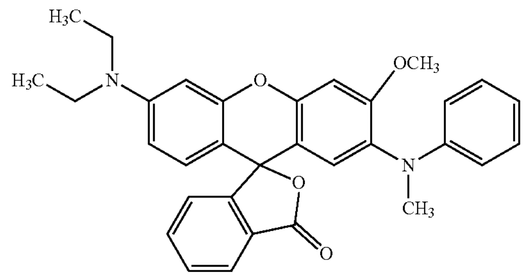
S-9
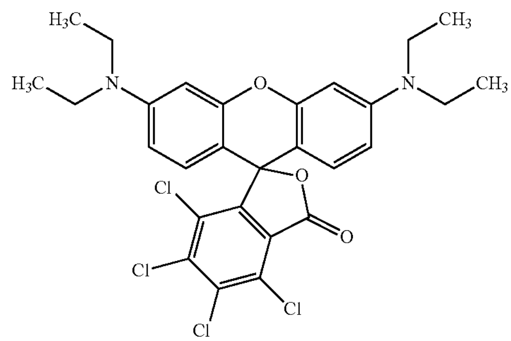
S-10
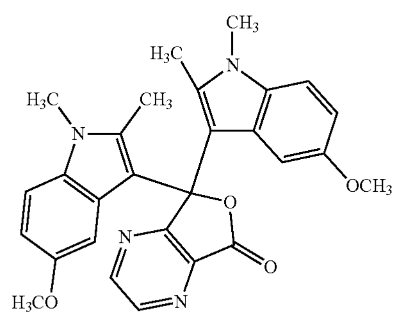
S-11
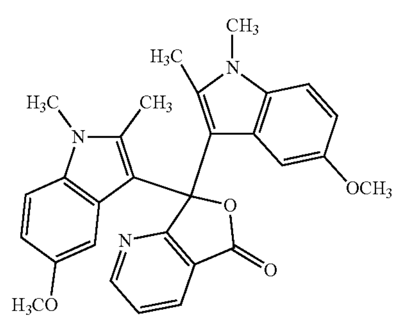
S-12
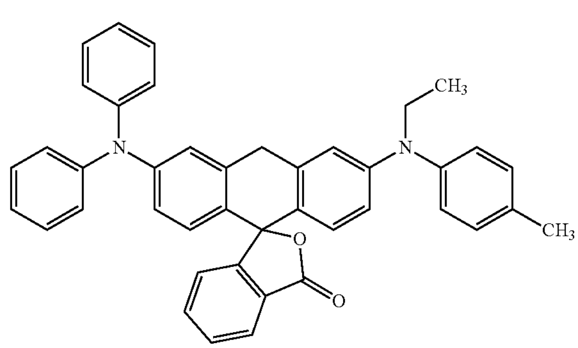

-continued

S-13

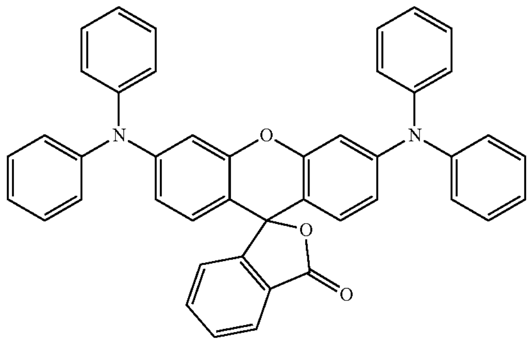

S-14

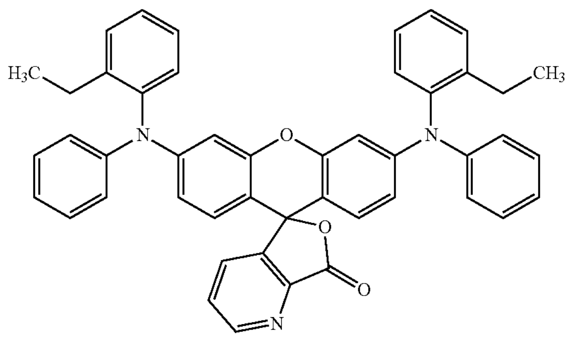

S-15

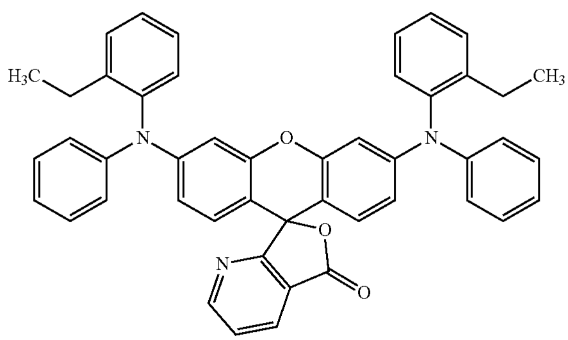

S-16

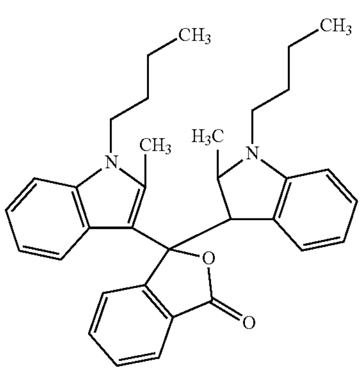

One kind of each of these color-developing substance precursors may be used alone. Alternatively, two or more kinds of these components can be used in combination.

The content of the color-developing substance precursor with respect to the total mass of the image-recording layer is preferably 0.5% by mass to 10% by mass, and more preferably 1% by mass to 5% by mass.

[Infrared Absorber]

The image-recording layer contains an infrared absorber.

The infrared absorber is not particularly limited, and examples thereof include pigments and dyes.

As the dye that is used as the infrared absorber, it is possible to use commercially available dyes and known dyes described in publications, for example, "Dye Handbooks" (edited by the Society of Synthetic Organic Chemistry, Japan, 1970). Specific examples thereof include dyes such as an azo dye, a metal complex azo dye, a pyrazolone azo dye, a naphthoquinone dye, an anthraquinone dye, a phthalocyanine dye, a carbonium dye, a quinoneimine dye, a methine dye, a cyanine dye, a squarylium colorant, a pyrylium salt, and a metal thiolate complex.

Among these dyes, for example, a cyanine dye, a squarylium colorant, a pyrylium salt, a nickel thiolate complex, and an indolenine cyanine dye are particularly preferable. Furthermore, for example, a cyanine dye or an indolenine cyanine dye is preferable. Among these, a cyanine dye is particularly preferable.

The infrared absorber is preferably a cationic polymethine colorant having an oxygen or nitrogen atom at the meso-position. As the cationic polymethine colorant, for example, a cyanine dye, a pyrylium colorant, a thiopyrylium colorant, an azulenium colorant, and the like are preferable. From the viewpoint of ease of availability, solubility in a solvent during an introduction reaction, and the like, a cyanine dye is preferable.

Specific examples of the cyanine dye include the compounds described in paragraphs "0017" to "0019" of JP2001-133969A and the compounds described in paragraphs "0016" to "0021" of JP2002-023360A and paragraphs "0012" to "0037" of JP2002-040638A. As the cyanine dye, for example, the compounds described in paragraphs "0034" to "0041" of JP2002-278057A and paragraphs "0080" to "0086" of JP2008-195018A are preferable, and the compounds described in paragraphs "0035" to "0043" of JP2007-90850A and the compounds described in paragraphs "0105" to "0113" of JP2012-206495A are particularly preferable.

Furthermore, the compounds described in paragraphs "0008" and "0009" of JP1993-5005A (JP-H05-5005A) and paragraphs "0022" to "0025" of JP2001-222101A can also be preferably used.

As pigments, the compounds described in paragraphs "0072" to "0076" of JP2008-195018A are preferable.

The infrared absorber is preferably a decomposable infrared absorber, and more preferably an infrared absorber that decomposes by exposure to infrared.

Presumably, in a case where a decomposable infrared absorber colorant is used as the infrared absorber, the infrared absorber or a decomposition product thereof may facilitate polymerization, a film having high polarity could be obtained by the use of the aforementioned thermoplastic resin, and the decomposition product of the infrared absorber and the aforementioned polymerizable compound may interact with each other and thus result in excellent UV printing durability.

The decomposable infrared absorber is preferably an infrared absorber that performs a function of developing color by absorbing infrared and decomposing by exposure to infrared. "Developing color" mentioned herein means that absorption that substantially does not occur in the visible light region (wavelength region of 400 nm or longer and shorter than 750 nm) before exposure to infrared occurs in the visible light region by exposure to infrared. "Developing color" also describes a case where absorption that occurs in a wavelength region shorter than the visible light region also occurs in a longer wavelength region such as the visible light region.

Hereinafter, a color-developing compound formed as a result of infrared absorption and decomposition of the decomposable infrared absorber by exposure to infrared will be also called "color-developing substance of the decomposable infrared absorber".

Furthermore, it is preferable that the decomposable infrared absorber have a function of absorbing infrared by exposure to infrared and converting the absorbed infrared into heat.

There are no limitations on the decomposable infrared absorber as long as it absorbs at least a part of light in the infrared wavelength region (wavelength of 750 nm to 1 mm) and decomposes. However, the decomposable infrared absorber is preferably an infrared absorber having maximum absorption wavelength in a wavelength region of 750 nm to 1,400 nm.

The decomposable infrared absorber is preferably an infrared absorber that decomposes by either or both of heat and electron transfer resulting from exposure to infrared, and more preferably an infrared absorber that decomposes by electron transfer resulting from exposure to infrared. "Decomposes by electron transfer" mentioned herein means that electrons of the decomposable infrared absorber excited to the lowest unoccupied molecular orbital (LUMO) from the highest occupied molecular orbital (HOMO) by exposure to infrared move to electron accepting groups (groups having potential close to LUMO) in a molecule by means of intramolecular electron transfer and thus result in decomposition.

As the decomposable infrared absorber, from the viewpoint of color developability and UV printing durability of the lithographic printing plate to be obtained, a cyanine dye decomposing by exposure to infrared is preferable.

As the infrared absorber, from the viewpoint of color developability and UV printing durability of the lithographic printing plate to be obtained, a compound represented by Formula 1-1 is more preferable.

Formula 1-1

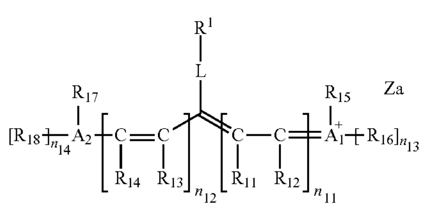

In Formula 1-1, $R^1$ represents a group that cleaves an $R^1$-L bond by exposure to infrared, $R_{11}$ to $R_{18}$ each independently represent a hydrogen atom, a halogen atom, —Ra, —ORb, —SRc, or —NRdRe, Ra to Re each independently represent a hydrocarbon group, $A_1$, $A_2$, a plurality of $R_{11}$ to $R_{18}$ may be linked to each other to form a monocyclic or polycyclic ring, $A_1$ and $A_2$ each independently represent an oxygen atom, a sulfur atom, or a nitrogen atom, $n_{11}$ and $n_{12}$ each independently represent an integer of 0 to 5, the sum of $n_{11}$ and $n_{12}$ is 2 or more, n13 and n14 each independently represent 0 or 1, L represents an oxygen atom, a sulfur atom, or $—NR^{10}—$, $R^{10}$ represents a hydrogen atom, an alkyl group, or an aryl group, and Za represents a counterion that neutralizes charge.

In a case where the cyanine dye represented by Formula 1-1 is exposed to infrared, the $R^1$-L bond is cleaved, L turns into =O, =S or $=NR^{10}$, and the color-developing substance of the decomposable infrared absorber is formed. $R^1$ is liberated and forms a radical or ionic substance. These contribute to the polymerization of the polymerizable compound contained in the image-recording layer.

In Formula 1-1, $R_{11}$ to $R_{18}$ preferably each independently represent a hydrogen atom, —Ra, —ORb, —SRc, or —NRdRe.

The hydrocarbon group represented by Ra to Re is preferably a hydrocarbon group having 1 to 30 carbon atoms, more preferably a hydrocarbon group having 1 to 15 carbon atoms, and even more preferably a hydrocarbon group having 1 to 10 carbon atoms. The hydrocarbon group may be linear or branched or may have a ring structure.

$R_{11}$ to $R_{14}$ in Formula 1-1 preferably each independently represent a hydrogen atom or a hydrocarbon group, more preferably each independently represent a hydrogen atom or an alkyl group, and even more preferably each independently represent a hydrogen atom.

Each of R11 and R13 bonded to the carbon atom that is bonded to the carbon atom to which L is bonded is preferably an alkyl group. It is more preferable that Ru and R13 be linked to each other to form a ring. The formed ring is preferably a 5- or 6-membered ring, and more preferably a 5-membered ring.

$R_{12}$ bonded to the carbon atom to which $A_1^+$ is bonded and $R_{14}$ bonded to the carbon atom to which $A_2$ is bonded are preferably linked to $R_{15}$ and $R_{17}$ respectively so as to form a ring.

$R_{15}$ in Formula 1-1 is preferably a hydrocarbon group. Furthermore, it is preferable that $R_{15}$ and $R_{12}$ bonded to the carbon atom to which $A_1^+$ is bonded be linked to each other to form a ring. As the ring to be formed, an indolium ring, a pyrylium ring, a thiopyrylium ring, a benzoxazoline ring, or a benzimidazoline ring is preferable, and an indolium ring is more preferable from the viewpoint of color developability.

$R_{17}$ in Formula 1-1 is preferably a hydrocarbon group. Furthermore, it is preferable that $R_{17}$ and $R_{14}$ bonded to the carbon atom to which $A_2$ is bonded be linked to each other to form a ring. As the ring to be formed, an indole ring, a pyran ring, a thiopyran ring, a benzoxazole ring, or a benzimidazole ring is preferable, and an indole ring is more preferable from the viewpoint of color developability.

It is preferable that $R_{15}$ and $R_{17}$ in Formula 1-1 be the same group. In a case where $R_{15}$ and $R_{17}$ each form a ring, it is preferable that the formed rings be the same as each other.

It is preferable that Rib and $R_{18}$ in Formula 1-1 be the same group.

Furthermore, from the viewpoint of improving water solubility of the compound represented by Formula 1-1, $R_{16}$ and $R_{18}$ preferably each independently represent an alkyl group having a (poly)oxyalkylene group or an alkyl group having an anion structure, more preferably each independently represent an alkyl group having an alkoxyalkyl group, a carboxylate group, or a sulfonate group, and even more preferably each independently represent an alkyl group having a sulfonate group on a terminal. As the alkyl group, an alkyl group having 1 to 10 carbon atoms is preferable, and an alkyl group having 1 to 4 carbon atoms is more preferable.

The countercation of the aforementioned anion structure may be a cation that can be contained in $R^1$-L in Formula 1-1, $A_1^+$, an alkali metal cation, or an alkaline earth metal cation.

Furthermore, the countercation of the aforementioned sulfonate group may be a cation that can be contained in $R^1$-L in Formula 1-1, $A_1^+$, an alkali metal cation, or an alkaline earth metal cation.

From the viewpoint of increasing the maximum absorption wavelength of the compound represented by Formula 1-1 and from the viewpoint of color developability and printing durability of the lithographic printing plate, $R_{16}$ and $R_{18}$ preferably each independently represent an alkyl group or an alkyl group having an aromatic ring. The alkyl group is preferably an alkyl group having 1 to 10 carbon atoms, more preferably an alkyl group having 1 to 4 carbon atoms, and even more preferably a methyl group or an ethyl group. The alkyl group having an aromatic ring is preferably an alkyl group having an aromatic ring on a terminal, and more preferably a 2-phenylethyl group, a 2-naphthalenyl ethyl group, or a 2-(9-anthracenyl)ethyl group.

$n_{11}$ and $n_{12}$ in Formula 1-1 are preferably the same as each other and represent an integer of 0 to 5, more preferably represent an integer of 1 to 3, even more preferably represent 1 or 2, and particularly preferably represent 2.

$A_1$ and $A_2$ in Formula 1-1 each independently represent an oxygen atom, a sulfur atom, or a nitrogen atom. Among these, a nitrogen atom is preferable.

$A_1$ and $A_2$ in Formula 1-1 are preferably the same atoms.

Za in Formula 1-1 represents a counterion that neutralizes charge. In a case where Za represents an anion species, examples thereof include a sulfonate ion, a carboxylate ion, a tetrafluoroborate ion, a hexafluorophosphate ion, a p-toluenesulfonate ion, and a perchlorate ion. Among these, a hexafluorophosphate ion is preferable. In a case where Za represents a cation species, examples thereof include an alkali metal ion, an alkaline earth metal ion, an ammonium ion, a pyridinium ion, sulfonium ion, and the like. Among these, a sodium ion, a potassium ion, an ammonium ion, a pyridinium ion or a sulfonium ion is preferable, and a sodium ion, a potassium ion, or an ammonium ion is more preferable.

$R_{11}$ to $R_{18}$ and $R^1$-L may have an anion structure or a cation structure. In a case where all the $R_{11}$ to $R_{18}$ and $R^1$-L are groups having neutral charge, Za is a monovalent counteranion. However, for example, in a case where two or more among $R_{11}$ to $R_{18}$ and $R^1$-L have an anion structure, Za can be a countercation.

Furthermore, in a case where the cyanine dye represented by Formula 1-1 has such a structure that the overall charge of the compound is neutral, the compound has no Za.

$R^1$ in Formula 1-1 that is a group cleaving the $R^1$-L bond by exposure to infrared will be specifically described later.

As the decomposable infrared absorber described above, from the viewpoint of color developability and UV printing durability of the lithographic printing plate to be obtained, a cyanine dye represented by Formula 1-A is more preferable.

Formula 1-A

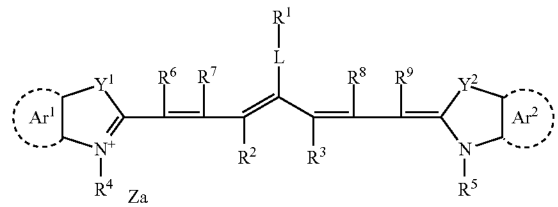

In Formula 1-A, $R^1$ represents a group that cleaves an $R^1$-L bond by exposure to infrared, $R^2$ and $R^3$ each independently represent a hydrogen atom or an alkyl group and may be linked to each other to form a ring, $Ar^1$ and Are each independently represent a group that forms a benzene ring or a naphthalene ring, $Y^1$ and $Y^2$ each independently represent an oxygen atom, a sulfur atom, —$NR^0$—, or a dialkylmethylene group, $R^0$ represents a hydrogen atom, an alkyl group, or an aryl group, $R^4$ and $R^5$ each independently represent an alkyl group, a —$CO_2M$ group, or a —$PO_3M_2$ group, M represents a hydrogen atom, a Na atom, a K atom, or an onium group, $R^6$ to $R^9$ each independently represent a hydrogen atom or an alkyl group, L represents an oxygen atom, a sulfur atom, or —$NR_{10}$—, $R^{10}$ represents a hydrogen atom, an alkyl group, or an aryl group, and Za represents a counterion that neutralizes charge.

The alkyl group represented by $R^2$ to $R^9$ and $R^{10}$ in Formula 1-A is preferably an alkyl group having 1 to 30 carbon atoms, more preferably an alkyl group having 1 to 15 carbon atoms, and even more preferably an alkyl group having 1 to 10 carbon atoms. The alkyl group may be linear or branched, or may have a ring structure.

Specific examples of the alkyl group include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eicosyl group, an isopropyl group, an isobutyl group, an s-butyl group, a tert-butyl group, an isopentyl group, a neopentyl group, a 1-methylbutyl group, an isohexyl group, a 2-ethylhexyl group, a 2-methylhexyl group, a cyclohexyl group, a cyclopentyl group, and a 2-norbomyl group.

Among these alkyl groups, a methyl group, an ethyl group, a propyl group, or a butyl group is preferable.

The above alkyl group may have a substituent. Examples of the substituent include an alkoxy group, an aryloxy group, an amino group, an alkylthio group, an arylthio group, a halogen atom, a carboxy group, a carboxylate group, a sulfo group, a sulfonate group, an alkyloxycarbonyl group, an aryloxycarbonyl group, and groups obtained by combining these, and the like.

The aryl group represented by $R^{10}$ is preferably an aryl group having 6 to 30 carbon atoms, more preferably an aryl group having 6 to 20 carbon atoms, and even more preferably an aryl group having 6 to 12 carbon atoms.

The aryl group may have a substituent. Examples of the substituent include an alkyl group, an alkoxy group, an aryloxy group, an amino group, an alkylthio group, an arylthio group, a halogen atom, a carboxy group, a carboxylate group, a sulfo group, a sulfonate group, an alkyloxycarbonyl group, an aryloxycarbonyl group, and groups obtained by combining these, and the like.

Specific examples thereof include a phenyl group, a naphthyl group, a p-tolyl group, a p-chlorophenyl group, a p-fluorophenyl group, a p-methoxyphenyl group, a p-dimethylaminophenyl group, a p-methylthiophenyl group, a p-phenylthiophenyl group, and the like.

Among these aryl groups, a phenyl group, a p-methoxyphenyl group, a p-dimethylaminophenyl group, or a naphthyl group is preferable.

It is preferable that $R^2$ and $R^3$ be linked to each other to form a ring.

In a case where $R^2$ and $R^3$ are linked to each other to form a ring, the formed ring is preferably a 5- or a 6-membered ring and particularly preferably a 5-membered ring.

$Y^1$ and $Y^2$ each independently represent an oxygen atom, a sulfur atom, —$NR^0$—, or a dialkylmethylene group. Among these, —$NR^0$— or a dialkylmethylene group is preferable, and a dialkylmethylene group is more preferable.

$R^0$ represents a hydrogen atom, an alkyl group, or an aryl group. Among these, an alkyl group is preferable.

The alkyl group represented by $R^4$ or $R^5$ may be substituted alkyl. Examples of the substituted alkyl group represented by $R^4$ or $R^5$ include a group represented by any of Formula (a1) to Formula (a4).

$$—W—(R^{W0}—O)_{n_{W1}}—R^{W1} \quad (a1)$$

$$—R^{W2}—CO_2M \quad (a2)$$

$$—R^{W3}—PO_3M_2 \quad (a3)$$

$$—R^{W4}—SO_3M \quad (a4)$$

In Formula (a1) to Formula (a4), $R^{W0}$ represents an alkylene group having 2 to 6 carbon atoms, W represents a single bond or an oxygen atom, and nwi represents an integer of 1 to 45, $R^{W1}$ represents an alkyl group having 1 to 12 carbon atoms or —C(═O)—$R^{W5}$, $R^{W5}$ represents an alkyl group having 1 to 12 carbon atoms, $R^{W2}$ to $R^{W4}$ each independently represent a single bond or an alkylene group having 1 to 12 carbon atoms, and M represents a hydrogen atom, a Na atom, a K atom, or an onium group.

Specific examples of the alkylene group represented by $R^{W0}$ in Formula (a1) include an ethylene group, a n-propylene group, an isopropylene group, a n-butylene group, an isobutylene group, a n-pentylene group, an isopentylene group, a n-hexyl group, an isohexyl group, and the like. Among these, an ethylene group, a n-propylene group, an isopropylene group, and a n-butylene group are preferable, and a n-propylene group is particularly preferable.

$n_{W1}$ is preferably 1 to 10, more preferably 1 to 5, and particularly preferably 1 to 3. Specific examples of the alkyl group represented by $R^{W1}$ include a methyl group, an ethyl group, a n-propyl group, an isopropyl group, a n-butyl group, an isobutyl group, a tert-butyl group, a n-pentyl group, an isopentyl group, a neopentyl group, a n-hexyl group, a n-octyl group, a n-dodecyl group, and the like. Among these, a methyl group, an ethyl group, a n-propyl group, an isopropyl group, a n-butyl group, and a tert-butyl group are preferable, a methyl group and an ethyl group are more preferable, and a methyl group is particularly preferable.

The alkyl group represented by $R^{W5}$ is the same as the alkyl group represented by $R^{W1}$. Preferred aspects of the alkyl group represented by $R^{W5}$ are the same as preferred aspects of the alkyl group represented by Rwl.

Specific examples of the group represented by Formula (a1) will be shown below. However, the present disclosure is not limited thereto. In the following structural formulas, Me represents a methyl group, Et represents an ethyl group, and * represents a binding site.

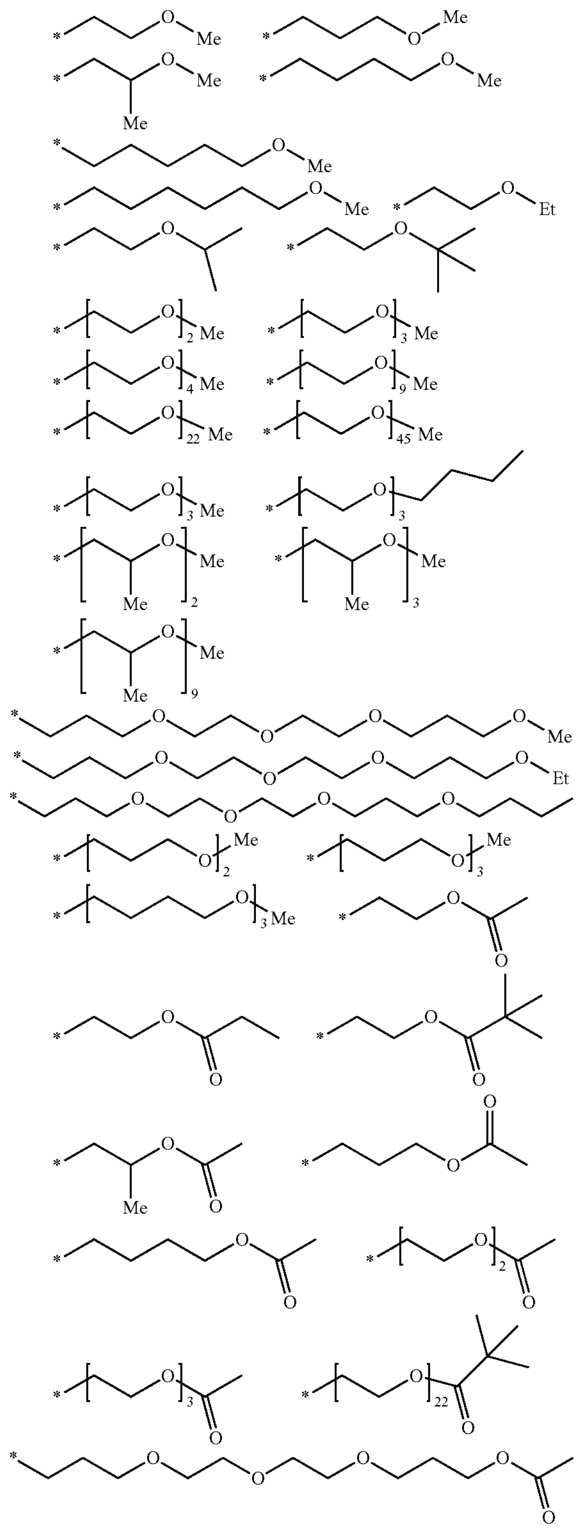

Specific examples of the alkylene group represented by $R^{W2}$ to $R^{W4}$ in Formula (a2) to Formula (a4) include a methylene group, an ethylene group, a n-propylene group, an isopropylene group, a n-butylene group, an isobutylene group, a n-pentylene group, an isopentylene group, a n-hexyl group, an isohexyl group, a n-octylene group, a n-dodecylene group, and the like. Among these, an ethylene group, a n-propylene group, an isopropylene group, and a n-butylene group are preferable, and an ethylene group and a n-propylene group are particularly preferable.

In Formula (a3), two Ms may be the same as or different from each other.

Examples of the onium group represented by M in Formula (a2) to Formula (a4) include an ammonium group, an iodonium group, a phosphonium group, a sulfonium group, and the like.

Among the groups represented by Formula (a1) to Formula (a4), the group represented by Formula (a1) or Formula (a4) is preferable.

In Formula 1-A, $R^4$ and $R^5$ preferably each represent an unsubstituted alkyl group. It is preferable that $R^4$ and $R^5$ be the same group.

$R^6$ to $R^9$ each independently represent a hydrogen atom or an alkyl group, and preferably each independently represent a hydrogen atom.

$Ar^1$ and $Ar^2$ each independently represent a group forming a benzene ring or a naphthalene ring. The benzene ring and the naphthalene ring may have a substituent. Examples of the substituent include an alkyl group, an alkoxy group, an aryloxy group, an amino group, an alkylthio group, an arylthio group, a halogen atom, a carboxy group, a carboxylate group, a sulfo group, a sulfonate group, an alkyloxycarbonyl group, an aryloxycarbonyl group, an acyloxy group, a phosphonic acid group, groups obtained by combining these, and the like. As the substituent, an alkyl group is preferable.

Furthermore, from the viewpoint of increasing the maximum absorption wavelength of the compound represented by Formula 1-A and improving color developability and printing durability of the lithographic printing plate, $Ar^1$ and $Ar^2$ preferably each independently represent a group that forms a naphthalene ring or a benzene ring having an alkyl group or an alkoxy group as a substituent, more preferably each independently represent a group that forms a naphthalene ring or a benzene ring having an alkoxy group as a substituent, and particularly preferably each independently represent a group that forms a naphthalene ring or a benzene ring having a methoxy group as a substituent.

In Formula 1-A, $Ar^1$ or $Ar^2$ is preferably a group forming a group represented by Formula (b1).

(b1)

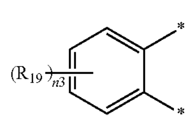

In Formula (b1), $R^{19}$ represents an alkyl group having 1 to 12 carbon atoms. n3 represents an integer of 1 to 4. * represents a binding site.

Za represents a counterion for neutralizing charge. Here, in a case where the compound represented by Formula 1-A has a corresponding ionic substituent in the structure and charge neutralization is not required, Za is unnecessary. In a case where Za represents an anion species, examples thereof include a sulfonate ion, a carboxylate ion, a tetrafluoroborate ion, a hexafluorophosphate ion, a p-toluenesulfonate ion, a perchlorate ion, and the like. Among these, a hexafluorophosphate ion is preferable. In a case where Za represents a cation species, examples thereof include an alkali metal ion, an alkaline earth metal ion, an ammonium ion, a pyridinium ion, sulfonium ion, and the like. Among these, a sodium ion, a potassium ion, an ammonium ion, a pyridinium ion or a sulfonium ion is preferable, and a sodium ion, a potassium ion, or an ammonium ion is more preferable.

$R^1$ to $R^9$, $R^0$, $Ar^2$, $Y^1$, and $Y^2$ may have an anion structure or a cation structure. In a case where all of $R^1$ to $R^9$, $R^0$, $Ar^1$, $Ar^2$, $Y^1$, and $Y^2$ represent a group having neutral charge, Za represents a monovalent counteranion. However, for example, in a case where two or more among $R^1$ to $R^9$, $R^0$, $Ar^2$, $Y^1$, and $Y^2$ have an anion structure, Za can be a countercation.

Hereinafter, $R^1$ in Formula 1-1 and Formula 1-A that is a group cleaving the $R^1$-L bond by exposure to infrared will be described.

In a case where L in Formula 1-1 or Formula 1-A represents an oxygen atom, from the viewpoint of color developability, $R^1$ is preferably a group represented by any of Formula (1-1) to Formula (1-7) and more preferably a group represented by any of Formula (1-1) to Formula (1-3).

(1-1)

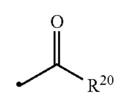

(1-2)

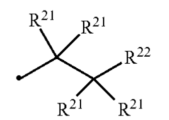

(1-3)

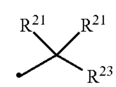

(1-4)

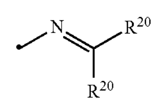

(1-5)

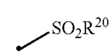

(1-6)

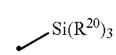

(1-7)

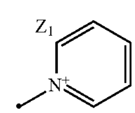

In Formulas (1-1) to (1-7), ● represents a binding site with an oxygen atom represented by L in Formula 1-1 or Formula 1-A, $R^{20}$ each independently represents a hydrogen atom, an alkyl group, an alkenyl group, an aryl group, —$OR^{24}$, —$NR^{25}R^{26}$, or —$SR^{27}$, $R^{21}$ each independently represents a hydrogen atom, an alkyl group, or an aryl group, $R^{22}$ represents an aryl group, —$OR^{24}$, —$NR^{25}R^{26}$, —$SR^{27}$, —C(=O)$R^{28}$, —OC(=O)$R^{28}$, or a halogen atom, $R^{23}$ represents an aryl group, an alkenyl group, an alkoxy group, or an onium group, $R^{24}$ to $R^{27}$ each independently represent a hydrogen atom, an alkyl group, or an aryl group, $R^{28}$ represents an alkyl group, an aryl group, —$OR_{24}$, —$NR^{25}R^{26}$, or —$SR^{27}$, and $Z^1$ represents a counterion for neutralizing charge.

In a case where $R^{20}$, $R^{21}$, and $R^{24}$ to $R^{28}$ each represent an alkyl group, preferred aspects of the alkyl group are the same as preferred aspects of the alkyl group represented by $R^2$ to $R^9$ and $R^0$.

The number of carbon atoms in the alkenyl group represented by $R^{20}$ and $R^{23}$ is preferably 1 to 30, more preferably 1 to 15, and even more preferably 1 to 10.

In a case where $R^{20}$ to $R^{28}$ each represent an aryl group, preferred aspects of the aryl group are the same as preferred aspects of the aryl group represented by $R^0$.

From the viewpoint of color developability, $R^{20}$ in Formula (1-1) is preferably an alkyl group, an alkenyl group, an aryl group, —$OR^{24}$, —$NR^{25}R^{26}$, or —$SR^{27}$, more preferably an alkyl group, —$OR^{24}$, —$NR^{25}R^{26}$, or —$SR^{27}$, even more preferably an alkyl group or —$OR^{24}$, and particularly preferably —$OR^{24}$.

In a case where $R^{20}$ in Formula (1-1) represents an alkyl group, the alkyl group may be an alkyl group having an arylthio group, an alkyloxycarbonyl group, or an arylsulfonyl group at the α-position. The alkyl group is preferably an alkyl group having an arylthio group or an alkyloxycarbonyl group at the a-position.

In a case where $R^{20}$ in Formula (1-1) represents —$OR_{24}$, $R^{24}$ is preferably an alkyl group, more preferably an alkyl group having 1 to 8 carbon atoms, even more preferably an isopropyl group or a tert-butyl group, and particularly preferably a t-butyl group.

In a case where $R^{20}$ in Formula (1-1) represents an alkenyl group, the alkenyl group may be an alkenyl group having an aryl group or a hydroxyaryl group.

From the viewpoint of color developability, $R^{21}$ in Formula (1-2) is preferably a hydrogen atom.

Furthermore, from the viewpoint of color developability, $R^{22}$ in Formula (1-2) is preferably —C(=O)$OR^{24}$, —OC(=O)$OR^{24}$, or a halogen atom, and more preferably —C(=O)$OR^{24}$ or —OC(=O)$OR^{24}$. In a case where $R^{22}$ in Formula (1-2) is —C(=O)$OR^{24}$ or —OC(=O)$OR^{24}$, $R^{24}$ is preferably an alkyl group.

From the viewpoint of color developability, $R^{21}$ in Formula (1-3) preferably each independently represents a hydrogen atom or an alkyl group. It is more preferable that at least one of $R^{21}$'s in Formula (1-3) be an alkyl group.

The alkyl group represented by $R^{21}$ is preferably an alkyl group having 1 to 10 carbon atoms, more preferably an alkyl group having 3 to 10 carbon atoms.

Furthermore, the alkyl group represented by $R^{21}$ is preferably an alkyl group having a branched or ring structure, and more preferably an isopropyl group, a cyclopentyl group, a cyclohexyl group, or a tert-butyl group. In addition, the alkyl group represented by $R^{21}$ is more preferably a secondary or tertiary alkyl group.

From the viewpoint of color developability, $R^{23}$ in Formula (1-3) is preferably an aryl group, an alkoxy group, or an onium group, more preferably a p-dimethylaminophenyl group or a pyridinium group, and even more preferably a pyridinium group.

Examples of the onium group represented by $R^{23}$ include a pyridinium group, an ammonium group, a sulfonium group, and the like. The onium group may have a substituent. Examples of the substituent include an alkyl group, an aryl group, an alkoxy group, an aryloxy group, an amino group, an alkylthio group, an arylthio group, a halogen atom, a carboxy group, a sulfo group, an alkyloxycarbonyl group, an aryloxycarbonyl group, groups formed by combining these, and the like. Among these, an alkyl group, an aryl group, and groups formed by combining these are preferable.

Among these, a pyridinium group is preferable, a N-alkyl-3-pyridinium group, a N-benzyl-3-pyridinium group, a N-(alkoxypolyalkyleneoxyalkyl)-3-pyridinium group, a N-alkoxycarbonylmethyl-3-pyridinium group, a N-alkyl-4-pyridinium group, a N-benzyl-4-pyridinium group, a N-(alkoxypolyalkyleneoxyalkyl)-4-pyridinium group, a N-alkoxycarbonylmethyl-4-pyridinium group, or a N-alkyl-3,5-dimethyl-4-pyridinium group is more preferable, a N-alkyl-3-pyridinium group or a N-alkyl-4-pyridinium group is still more preferable, a N-methyl-3-pyridinium group, a N-octyl-3-pyridinium group, a N-methyl-4-pyridinium group, or a N-octyl-4-pyridinium group is particularly preferable, and a N-octyl-3-pyridinium group or a N-octyl-4-pyridinium group is most preferable.

Furthermore, in a case where $R^{23}$ is a pyridinium group, examples of the counteranion include a sulfonate ion, a carboxylate ion, a tetrafluoroborate ion, a hexafluorophosphate ion, a p-toluenesulfonate ion, a perchlorate ion, and the like. Among these, a p-toluenesulfonate ion or a hexafluorophosphate ion is preferable.

From the viewpoint of color developability, $R^{20}$ in Formula (1-4) is preferably an alkyl group or an aryl group. It is more preferable that one of two $R^{20}$'s be an alkyl group and the other be an aryl group. These two $R^{20}$'s be may be linked to each other to form a ring.

From the viewpoint of color developability, $R^{20}$ in Formula (1-5) is preferably an alkyl group or an aryl group, more preferably an aryl group, and even more preferably a p-methylphenyl group.

From the viewpoint of color developability, $R^{20}$ in Formula (1-6) preferably each independently represents an alkyl group or an aryl group, and more preferably each independently represents a methyl group or a phenyl group.

From the viewpoint of color developability, $Z^1$ in Formula (1-7) has no limitations as long as it is a counterion for neutralizing charge, and may be included in Za in the entirety of the compound.

$Z^1$ is preferably a sulfonate ion, a carboxylate ion, a tetrafluoroborate ion, a hexafluorophosphate ion, a p-toluenesulfonate ion, or a perchlorate ion, and more preferably a p-toluenesulfonate ion or a hexafluorophosphate ion.

In a case where L in Formula 1-1 or Formula 1-A is an oxygen atom, from the viewpoint of color developability, $R^1$ is more preferably a group represented by Formula (5).

(5)

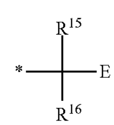

In Formula (5), $R^{15}$ and $R^{16}$ each independently represent a hydrogen atom, an alkyl group, or an aryl group, E represents an onium group, and * represents a binding site with the oxygen atom represented by L in Formula 1-1 or Formula 1-A.

The alkyl group represented by $R^{15}$ or $R^{16}$ is the same as the alkyl group represented by $R^2$ to $R^9$ and $R^{10}$, and preferred aspects of the alkyl group are the same as preferred aspects of the alkyl group represented by $R^2$ to $R^9$ and $R^{10}$.

The aryl group represented by $R^{15}$ or $R^{16}$ is the same as the aryl group represented by $R^{10}$, and preferred aspects of the aryl group are the same as preferred aspects of the aryl group represented by $R^{10}$.

The onium group represented by E is the same as the onium group represented by $R^{23}$, and preferred aspects of the onium group are the same as preferred aspects of the onium group represented by $R^{23}$.

In Formula (5), the onium group represented by E is preferably a pyridinium group represented by Formula (6).

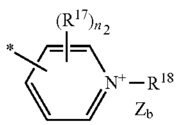

(6)

In Formula (6), $R^{17}$ represents a halogen atom, an alkyl group, an aryl group, a hydroxyl group, or an alkoxy group. In a case where there is a plurality of $R^{17}$'s in Formula (6), the plurality of $R^{17}$'s may be the same as each other or linked to each other to form a ring. n2 represents an integer of 0 to 4. $R^{18}$ represents an alkyl group or an aryl group. Zb represents a counterion for neutralizing charge.

The alkyl group or the aryl group represented by $R^{17}$ or $R^{18}$ is the same as the alkyl group represented by $R^2$ to $R^9$ and $R^{10}$ or the aryl group represented by $R^{10}$. Preferred aspects of the alkyl group or the aryl group represented by $R^{17}$ or $R^{18}$ are the same as preferred aspects of the alkyl group represented by $R^2$ to $R^9$ and $R^{10}$ or the aryl group represented by $R^{10}$.

The alkoxy group represented by $R^{17}$ is preferably an alkoxy group having 1 to 10 carbon atoms. Examples thereof include a methoxy group, an ethoxy group, a n-propoxy group, an isopropoxy group, a n-butoxy group, an isobutoxy group, a tert-butoxy group, and the like.

n2 is preferably 0.

The counterion represented by $Z_b$ for neutralizing charge is the same as $Z^1$ in Formula (1-7). Preferred aspects of $Z_b$ are the same as preferred aspects of $Z^1$ in Formula (1-7).

Specific examples of the group represented by $R^1$ in Formula 1-1 or Formula 1-A in which L represents an oxygen atom will be shown below. However, the present disclosure is not limited thereto. In the following structural formulas, $TsO^-$ represents a tosylate anion, and ● represents a binding site with the oxygen atom represented by L in Formula 1-1 or Formula 1-A.

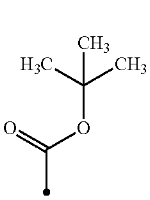
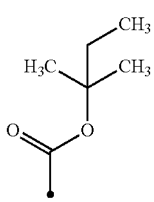
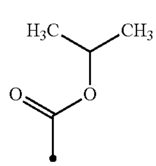

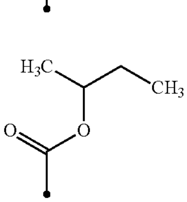
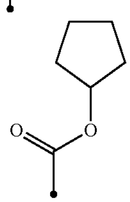
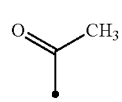

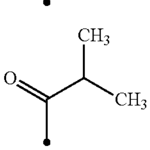
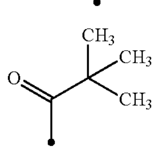
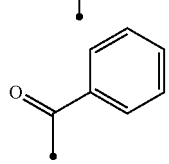

-continued

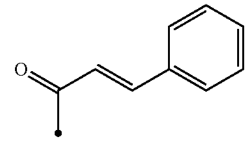
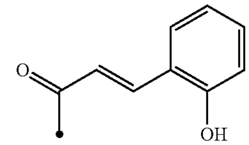

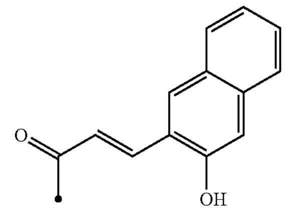

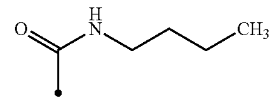
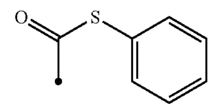

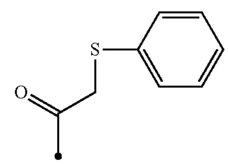
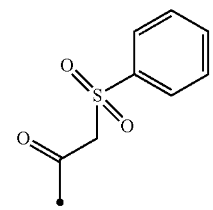

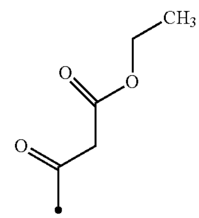
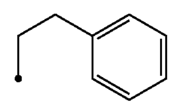
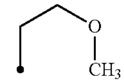

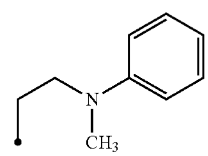
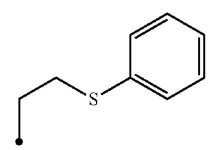

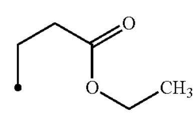
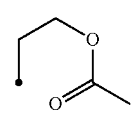

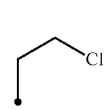
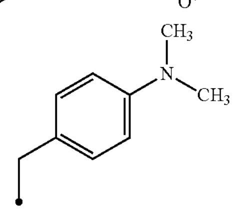

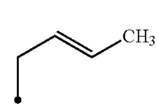
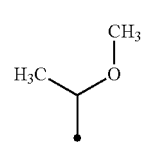
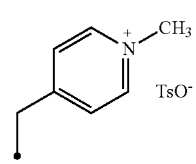

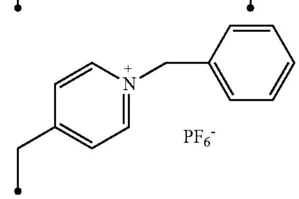

-continued
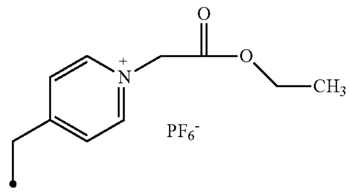
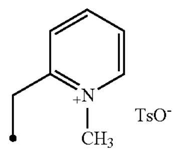
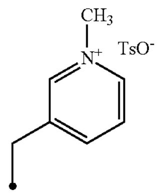
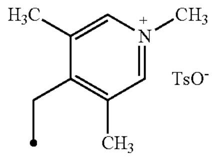
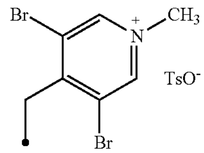
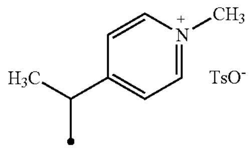
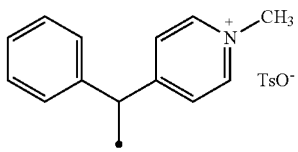
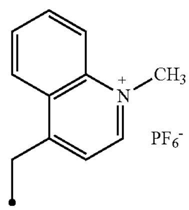
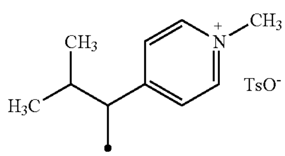
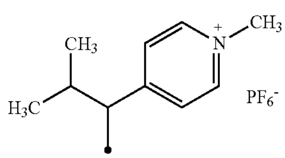
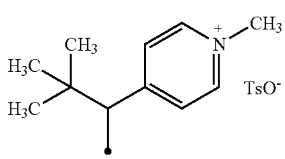
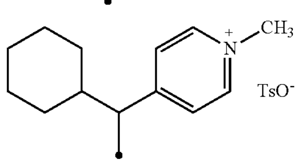
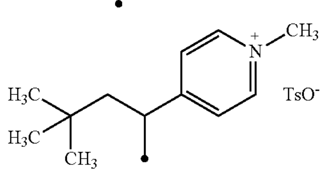
-continued
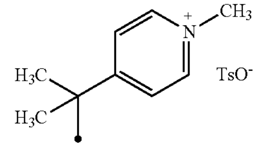
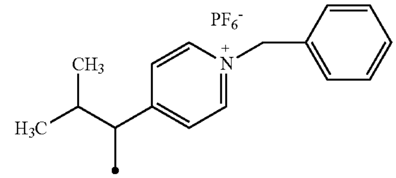
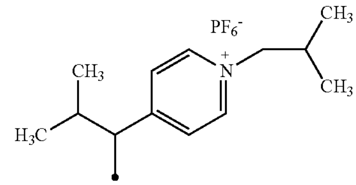
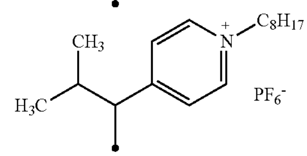
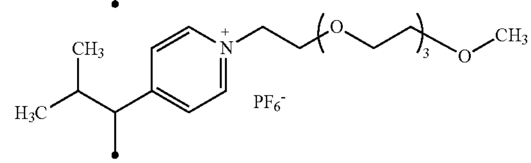
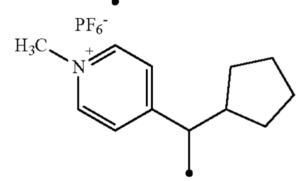
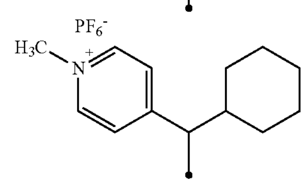
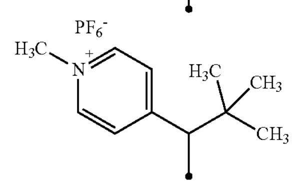
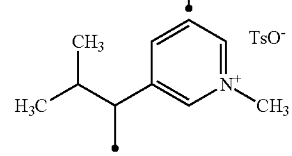
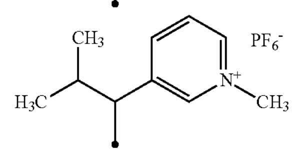
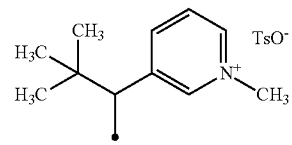

-continued

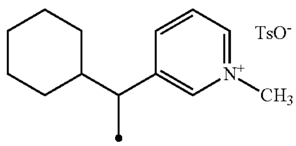

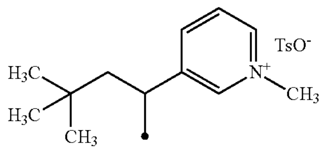

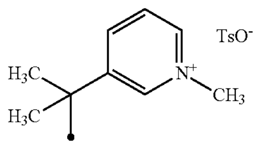

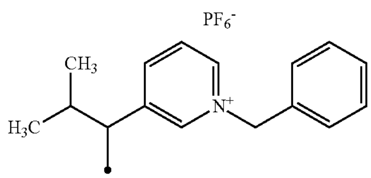

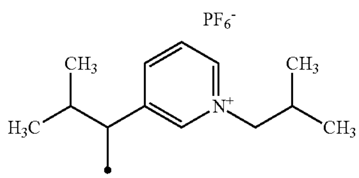

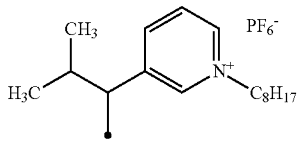

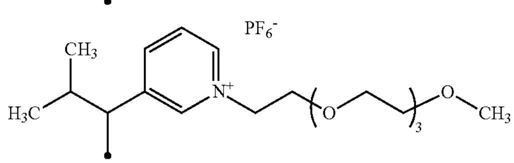

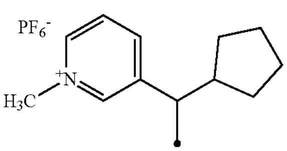

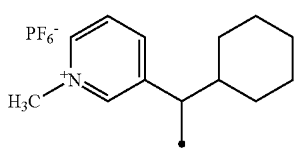

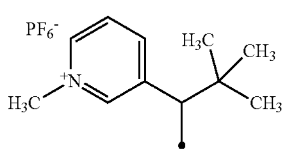

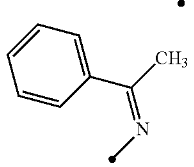

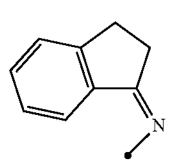

-continued

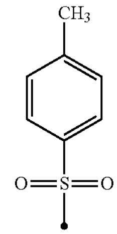

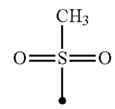

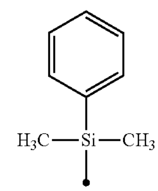

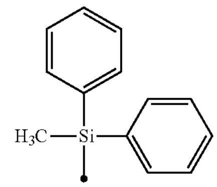

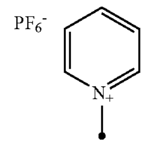

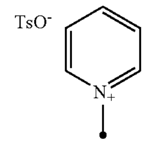

In a case where L is an oxygen atom and $R^1$ is an aryl group or a linear alkyl group, the cleavage of the $R^1$—O bond is not caused by exposure to infrared.

In a case where L in Formula 1-1 or Formula 1-A is a sulfur atom, $R^1$ is preferably a group represented by Formula (2-1).

Formula (2-1)

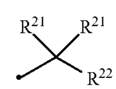

In Formula (2-1), ● represents a binding site with the sulfur atom represented by L in Formula 1-1 or Formula 1-A, $R^{21}$ each independently represents a hydrogen atom, an alkyl group, or an aryl group, and $R^{22}$ represents an aryl group, an alkenyl group, an alkoxy group, or an onium group.

In a case where L in Formula 1-1 or Formula 1-A is —$NR^{10}$—, $R^1$ bonded to N is preferably a group represented by Formula (3-1).

Formula (3-1)

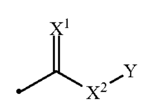

In Formula (3-1), ● represents a binding site with a nitrogen atom contained in L in Formula 1-1 or Formula 1-A, $X^1$ and $X^2$ each independently represent an oxygen atom or a sulfur atom, and Y represents a group represented by Formula (2-1).

What are described above regarding the alkyl group, the aryl group, the alkenyl group, the alkoxy group, and the onium group in Formula (1-1) to Formula (1-7) can be applied to the alkyl group, the aryl group, the alkenyl group, the alkoxy group, and the onium group represented by $R^{21}$ and $R^{22}$ in Formula (2-1).

From the viewpoint of improving printing durability, in Formula 1-1 or Formula 1-A, it is preferable that L represent a sulfur atom or —$NR^{10}$— and $R^{10}$ represent a hydrogen atom, an alkyl group, or an aryl group.

$R^1$ in Formula 1-1 or Formula 1-A is preferably a group represented by Formula 2.

Furthermore, the group represented by Formula 2 is preferably a group in which an $R^Z$—O bond in Formula 2 is cleaved by exposure to infrared.

Formula 2

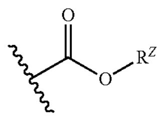

In Formula 2, $R^Z$ represents an alkyl group, and the portion of the wavy line represents a binding site with the group represented by L in Formula 1-1 or Formula 1-A.

Preferred aspects of the alkyl group represented by $R^Z$ are the same as preferred aspects of the alkyl group represented by $R^2$ to $R^9$ and $R^{10}$ described above.

From the viewpoint of color developability and UV printing durability of the lithographic printing plate to be obtained, the aforementioned alkyl group is preferably a secondary alkyl group or a tertiary alkyl group, and more preferably a tertiary alkyl group.

Furthermore, from the viewpoint of color developability and UV printing durability of the lithographic printing plate to be obtained, the alkyl group is preferably an alkyl group having 1 to 8 carbon atoms, more preferably a branched alkyl group having 3 to 10 carbon atoms, even more preferably a branched alkyl group having 3 to 6 carbon atoms, particularly preferably an isopropyl group or a tert-butyl group, and most preferably a t-butyl group.

Specific examples of the group represented by Formula 2 will be shown below. However, the present disclosure is not limited thereto. In the following structural formulas, ● represents a binding site with L in Formula 1-1 or Formula 1-A.

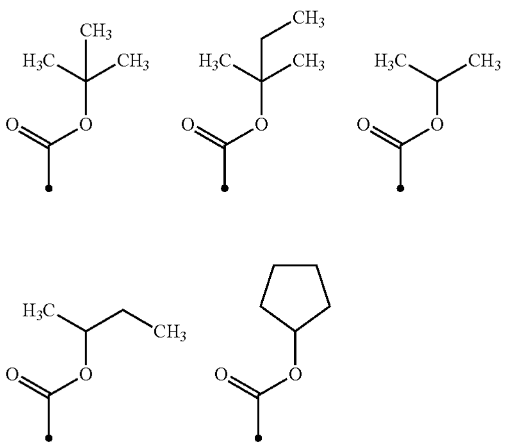

Specific examples of infrared absorbers that decompose by exposure to infrared will be shown below. However, the present disclosure is not limited thereto.

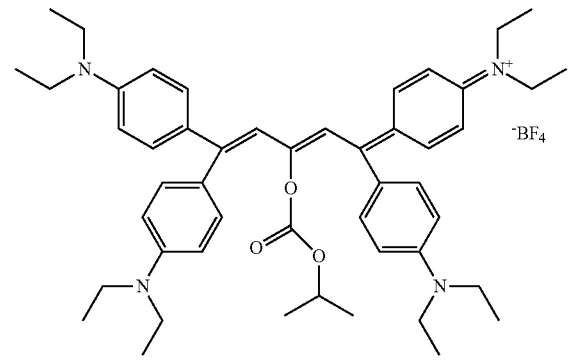

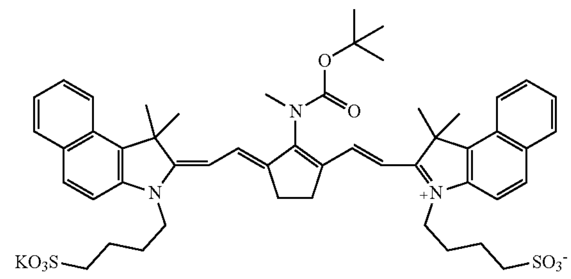

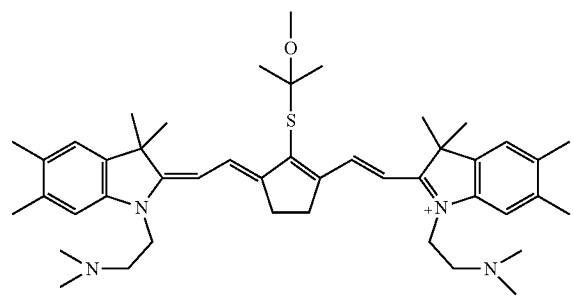

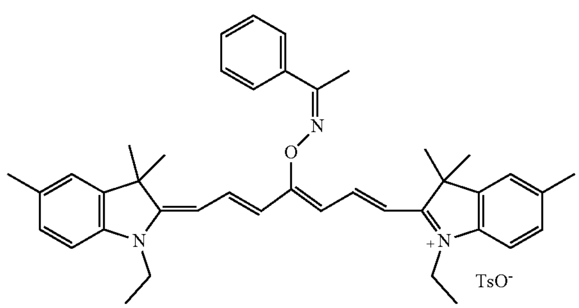

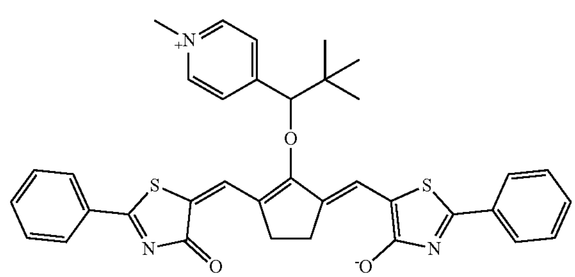

-continued

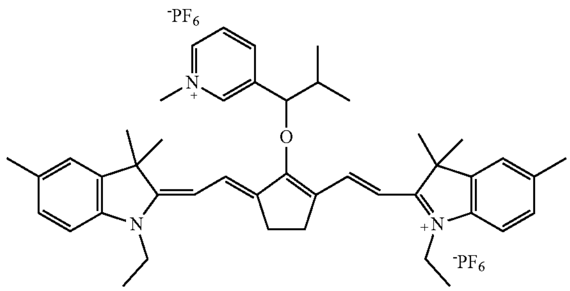

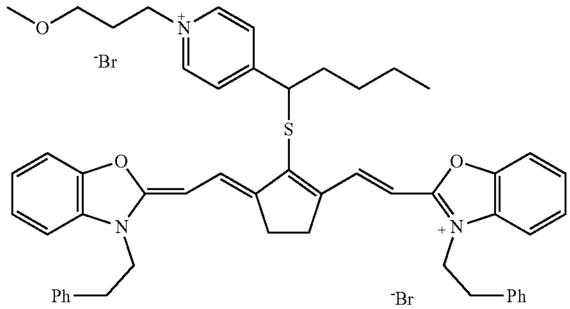

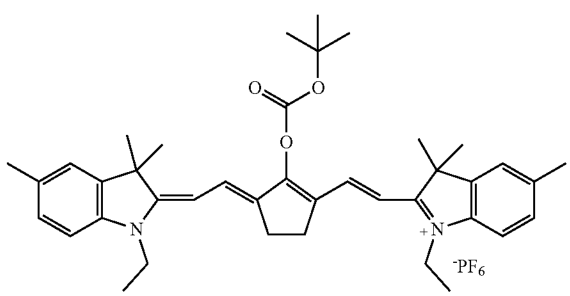

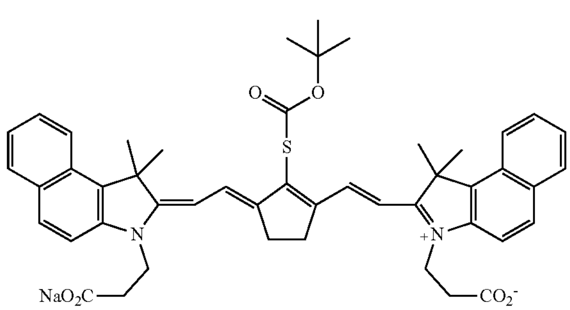

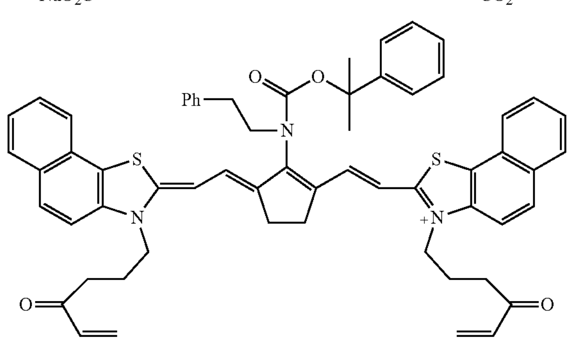

-continued

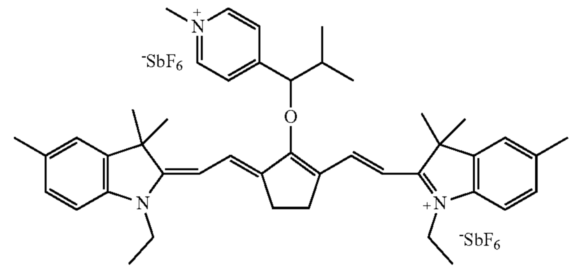

As the infrared absorber that decomposes by exposure to infrared, those described in JP2008-544322A or WO2016/027886A can also be suitably used.

One kind of infrared absorber may be used alone, or two or more kinds of infrared absorbers may be used in combination. In addition, as the infrared absorber, a pigment and a dye may be used in combination.

The content of the infrared absorber in the image-recording layer with respect to the total mass of the image-recording layer is preferably 0.1% by mass to 10.0% by mass, and more preferably 0.5% by mass to 5.0% by mass.

[Polymerizable Compound]

The image-recording layer in the present disclosure contains a polymerizable compound. In the present disclosure, a polymerizable compound refers to a compound having a polymerizable group.

In the present disclosure, a compound which has a polymerizable group but corresponds to a thermoplastic resin included in the aforementioned thermoplastic resin particles, polymer particles that will be described later, and a binder polymer other than the thermoplastic resin that will be described later is regarded as a compound which does not correspond to a polymerizable compound.

The polymerizable group is not particularly limited and may be a known polymerizable group. As the polymerizable group, an ethylenically unsaturated group is preferable.

The polymerizable group may be a radically polymerizable group or a cationically polymerizable group. The polymerizable group is preferably a radically polymerizable group.

Examples of the radically polymerizable group include a (meth)acryloyl group, an allyl group, a vinylphenyl group, a vinyl group, and the like. From the viewpoint of reactivity, a (meth)acryloyl group is preferable.

The molecular weight of the polymerizable compound (weight-average molecular weight in a case where the polymerizable compound has molecular weight distribution) is preferably 50 or more and less than 2,500, and more preferably 50 or more and 2,000 or less. From the viewpoint of UV printing durability, ink receptivity, chemical resistance, and on-press developability of a non-image area over time, the molecular weight of the polymerizable compound is preferably 1,500 or less.

From the viewpoint of UV printing durability of the lithographic printing plate to be obtained, the mass of the polymerizable compound per 1 mol of ethylenically unsaturated bonds (also called "ethylenically unsaturated bond equivalent") is preferably 200 g/mol or less, more preferably 50 g/mol or more and 200 g/mol or less, even more preferably 80 g/mol or more and 180 g/mol or less, and particularly preferably 100 g/mol or more and 150 g/mol or less.

In the present disclosure, the ethylenically unsaturated bond equivalent of the polymerizable compound can be specifically determined as follows, for example.

Ethylenically unsaturated bond equivalent of dipentaerythritol hexaacrylate (DPHA, molecular weight: 578, number of ethylenically unsaturated bonds:6): 578/6=96.3 (g/mol)

Ethylenically unsaturated bond equivalent of styrene (molecular weight: 104, number of ethylenically unsaturated bond: 1): 104/1=104 (g/mol)

Ethylenically unsaturated bond equivalent of "mixture of 10 g of DPHA and 20 g of styrene": (10+20)/{10/96.3+20/104}=101 (g/mol)

In the present disclosure, the ethylenically unsaturated bond equivalent can be determined by the above calculation method by identifying the molecular weight of a polymerizable compound, the number of ethylenically unsaturated bonds, and the composition of the polymerizable compound in the image-recording layer by known methods.

The polymerizable compound used in the present disclosure may be, for example, a radically polymerizable compound or a cationically polymerizable compound. As the polymerizable compound, an addition polymerizable compound having at least one ethylenically unsaturated bond (ethylenically unsaturated compound) is preferable. The ethylenically unsaturated compound is preferably a compound having at least one ethylenically unsaturated bond on a terminal, and more preferably a compound having two or more ethylenically unsaturated bonds on a terminal. The chemical form of the polymerizable compound is, for example, a monomer, a prepolymer which is in other words a dimer, a trimer, or an oligomer, a mixture of these, or the like.

Particularly, from the viewpoint of UV printing durability, the aforementioned polymerizable compound preferably includes a polymerizable compound having 3 or more functional groups, more preferably includes a polymerizable compound having 7 or more functional groups, and even more preferably includes a polymerizable compound having 10 or more functional groups. Furthermore, from the viewpoint of UV printing durability of the lithographic printing plate to be obtained, the aforementioned polymerizable compound preferably includes a ethylenically unsaturated compound having 3 or more functional groups (preferably having 7 or more functional groups and more preferably having 10 or more functional groups), and more preferably includes a (meth)acrylate compound having 3 or more functional groups (preferably having 7 or more functional groups and more preferably having 10 or more functional groups).

—Oligomer—

The polymerizable compound contained in the image-recording layer preferably contains an oligomer.

In the present disclosure, an oligomer represents a polymerizable compound which has a molecular weight (weight-average molecular weight in a case where the compound has molecular weight distribution) of 600 or more and 10,000 or less and at least one polymerizable group.

From the viewpoint of excellent chemical resistance and excellent UV printing durability and excellently inhibiting the occurrence of residues during on-press development, the molecular weight of the oligomer is preferably 1,000 or more and 5,000 or less.

Furthermore, from the viewpoint of improving chemical resistance and UV printing durability, the number of polymerizable groups in one molecule of the oligomer is preferably 2 or more, more preferably 3 or more, even more preferably 6 or more, and particularly preferably 10 or more.

The upper limit of the number of polymerizable groups in the oligomer is not particularly limited. The number of polymerizable groups is preferably 20 or less.

From the viewpoint of further improving chemical resistance and UV printing durability and further inhibiting the occurrence of residues during on-press development, an oligomer having 7 or more polymerizable groups and a molecular weight of 1,000 or more and 10,000 or less is preferable, and an oligomer having 7 or more and 20 or less polymerizable groups and a molecular weight of 1,000 or more and 5,000 or less is more preferable.

From the viewpoint of further improving chemical resistance and UV printing durability, the oligomer preferably has at least one kind of compound selected from the group consisting of a compound having a urethane bond, a compound having an ester bond, and a compound having an epoxy residue, and more preferably has a compound having a urethane bond.

In the present specification, an epoxy residue refers to a structure formed of an epoxy group. For example, the epoxy residue means a structure similar to a structure established by the reaction between an acid group (carboxylic acid group or the like) and an epoxy group.

<<Compound Having Urethane Bond>>

The compound having a urethane bond is not particularly limited. Examples thereof include a compound obtained by a reaction between a polyisocyanate compound and a compound having a hydroxyl group and a polymerizable group.

Examples of the polyisocyanate compound include polyisocyanate compounds having 2 to 5 functional groups. Among these, a polyisocyanate compound having 2 or 3 functional groups is preferable.

As the polyisocyanate compound, for example, 1,3-bis(isocyanatomethyl) cyclohexane, isophorone diisocyanate, trimethylene diisocyanate, tetramethylene diisocyanate, pentamethylene diisocyanate, hexamethylene diisocyanate, 1,3-cyclopentane diisocyanate, 9h-fluorene-2,7-diisocyanate, 9h-fluoren-9-on-2,7-diisocyanate, 4,4'-diphenylmethane diisocyanate, 1,3-phenylene diisocyanate, tolylene-2,4-diisocyanate, tolylene-2,6-diisocyanate, 1,3-bis(isocyanatomethyl) cyclohexane, 2,2-bis(4-isocyanatophenyl) hexafluoropropane, 1,5-diisocyanatonaphthalene, a dimer or trimer (isocyanurate bond) of these polyisocyanates, and the like are preferable. Furthermore, a biuret compound obtained by reacting the above polyisocyanate compound with a known amine compound may also be used.

As the compound having a hydroxyl group and a polymerizable group, a compound having one hydroxyl group and one or more polymerizable groups is preferable, and a compound having one hydroxyl group and two or more polymerizable groups is more preferable.

Examples of the compound having a hydroxyl group and a polymerizable group include hydroxyethyl (meth)acrylate, glycerin di(meth)acrylate, trimethylolpropane di(meth)acrylate, pentaerythritol tri(meth)acrylate, dipentaerythritol penta(meth)acrylate, and the like.

As the compound having a urethane bond, for example, a compound having at least a group represented by Formula (Ac-1) or Formula (Ac-2) is preferable, and a compound having at least a group represented by Formula (Ac-1) is more preferable.

(Ac-1)

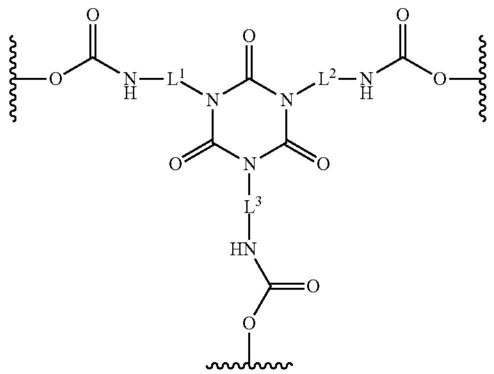

(Ac-2)

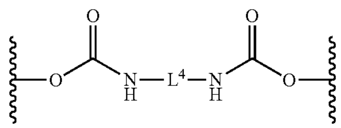

In Formula (Ac-1) and Formula (Ac-2), $L^1$ to $L^4$ each independently represent a divalent hydrocarbon group having 2 to 20 carbon atoms, and the portion of the wavy line represents a position binding to other structures.

$L^1$ to $L^4$ preferably each independently represent an alkylene group having 2 to 20 carbon atoms, more preferably each independently represent an alkylene group having 2 to 10 carbon atoms, and even more preferably each independently represent an alkylene group having 4 to 8 carbon atoms. The alkylene group may have a branched structure or a ring structure. The alkylene group is preferably a linear alkylene group.

The portion of the wavy line in Formula (Ac-1) or Formula (Ac-2) is preferably each independently directly bonded to the portion of the wavy line in a group represented by Formula (Ae-1) or Formula (Ae-2).

(Ae-1)

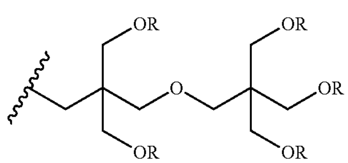

(Ae-2)

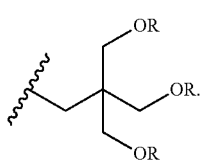

In Formula (Ae-1) and Formula (Ae-2), R each independently represents an acryloyloxy group or a methacryloyloxy group, and the portion of the wavy line represents a position binding to the portion of the wavy line in Formula (Ac-1) and Formula (Ac-2).

As the compound having a urethane bond, a compound may also be used which is prepared by obtaining polyurethane by a reaction between a polyisocyanate compound and a polyol compound and introducing a polymerizable group into the polyurethane by a polymer reaction. For example, the compound having a urethane bond may be obtained by reacting a polyol compound having an acid group with a polyisocyanate compound so as to obtain a polyurethane oligomer and reacting this polyurethane oligomer with a compound having an epoxy group and a polymerizable group.

<<Compound Having Ester Bond>>

The number of polymerizable groups in the compound having an ester bond is preferably 3 or more, and more preferably 6 or more.

<<Compound Having Epoxy Residue>>

As the compound having an epoxy residue, a compound containing a hydroxyl group is preferable.

The number of polymerizable groups in the compound having an epoxy residue is preferably 2 to 6, and more preferably 2 or 3.

The compound having an epoxy residue can be obtained, for example, by reacting a compound having an epoxy group with an acrylic acid.

From the viewpoint of improving chemical resistance and UV printing durability and further inhibiting the occurrence of residues during on-press development, the content of the aforementioned oligomer with respect to the total mass of the polymerizable compounds in the image-recording layer is preferably 30% by mass to 100% by mass, more preferably 50% by mass to 100% by mass, and even more preferably 80% by mass to 100% by mass.

The polymerizable compound may further include a polymerizable compound other than the oligomer described above.

The polymerizable compound other than the oligomer may be, for example, a radically polymerizable compound or a cationically polymerizable compound, and preferably an addition polymerizable compound having at least one ethylenically unsaturated group (ethylenically unsaturated compound). The ethylenically unsaturated compound is preferably a compound having at least one ethylenically unsaturated group on a terminal, and more preferably a compound having two or more ethylenically unsaturated groups on a terminal.

From the viewpoint of chemical resistance, the polymerizable compound other than the oligomer is preferably a low-molecular-weight polymerizable compound. The low-molecular-weight polymerizable compound may take a chemical form such as a monomer, a dimer, a trimer, or a mixture of these.

From the viewpoint of chemical resistance, the low-molecular-weight polymerizable compound is preferably at least a polymerizable compound selected from the group consisting of a polymerizable compound having three or more ethylenically unsaturated groups and a polymerizable compound having an isocyanuric ring structure.

In the present disclosure, a low-molecular-weight polymerizable compound refers to a polymerizable compound having a molecular weight (weight-average molecular weight in a case where the compound has molecular weight distribution) of 50 or more and less than 600.

From the viewpoint of excellent chemical resistance, excellent UV printing durability, and excellently inhibiting the occurrence of residues during on-press development, the molecular weight of the low-molecular-weight polymerizable compound is preferably 100 or more and less than 600, more preferably 300 or more and less than 600, and even more preferably 400 or more and less than 600.

In a case where the polymerizable compound includes a low-molecular-weight polymerizable compound as the polymerizable compound other than an oligomer (total content in a case where the polymerizable compound includes two or more kinds of low-molecular-weight polymerizable compounds), from the viewpoint of chemical resistance and UV printing durability and inhibiting the occurrence of residues during on-press development, the ratio of the mass of the oligomer to the mass of the low-molecular-weight polymerizable compound (oligomer/low-molecular-weight polymerizable compound) is preferably 10/1 to 1/10, more preferably 10/1 to 3/7, and even more preferably 10/1 to 7/3, based on mass.

Examples of the polymerizable compound include unsaturated carboxylic acids (for example, acrylic acid, methacrylic acid, itaconic acid, crotonic acid, isocrotonic acid, maleic acid, and the like), and esters and amides thereof. Among these, esters of unsaturated carboxylic acids and polyhydric alcohol compounds and amides of unsaturated carboxylic acids and polyvalent amine compounds are preferably used. In addition, products of an addition reaction between unsaturated carboxylic acid esters or amides having a nucleophilic substituent such as a hydroxyl group, an amino group, or a mercapto group and monofunctional or polyfunctional isocyanates or epoxies, products of a dehydrocondensation reaction between the aforementioned unsaturated carboxylic acid esters or amides and a monofunctional or polyfunctional carboxylic acid, and the like are also suitably used. Furthermore, products of an addition reaction between unsaturated carboxylic acid esters or amides having an electrophilic substituent such as an isocyanate groups or an epoxy group and monofunctional or polyfunctional alcohols, amines, or thiols, and products of a substitution reaction between unsaturated carboxylic acid esters or amides having a dissociable substituent such as a halogen atom or a tosyloxy group and monofunctional or polyfunctional alcohols, amines, or thiols are also suitable. Moreover, for example, it is also possible to use a group of compounds obtained by substituting the unsaturated carboxylic acid with an unsaturated phosphonic acid, styrene, a vinyl ether, or the like. These compounds are described in JP2006-508380A, JP2002-287344A, JP2008-256850A, JP2001-342222A, JP1997-179296A (JP-H09-179296A), JP1997-179297A (JP-H09-179297A), JP1997-179298A (JP-H09-179298A), JP2004-294935A, JP2006-243493A, JP2002-275129A, JP2003-64130A, JP2003-280187A, JP1998-333321A (JP-H10-333321A), and the like.

Specific examples of monomers of esters of polyhydric alcohol compounds and unsaturated carboxylic acids include acrylic acid esters such as ethylene glycol diacrylate, 1,3-butanediol diacrylate, tetramethylene glycol diacrylate, propylene glycol diacrylate, trimethylolpropane triacrylate, hexanediol diacrylate, tetraethylene glycol diacrylate, pentaerythritol tetraacrylate, sorbitol triacrylate, isocyanuric acid ethylene oxide (EO)-modified triacrylate, and polyester acrylate oligomers, and methacrylic acid esters such as tetramethylene glycol dimethacrylate, neopentyl glycol dimethacrylate, trimethylolpropane trimethacrylate, ethylene glycol dimethacrylate, pentaerythritol trimethacrylate, bis[p-(3-methacryloxy-2-hydroxypropoxy)phenyl] dimethyl methane, and bis[p-(methacryloxyethoxy)phenyl] dimethyl methane. In addition, specific examples of monomers of amides of polyvalent amine compounds and unsaturated carboxylic acids include methylene bisacrylamide, methylene bismethacrylamide, 1,6-hexamethylene bisacrylamide, 1,6-hexamethylene bismethacrylamide, diethylenetriamine trisacrylamide, xylylene bisacrylamide, xylylene bismethacrylamide, and the like.

In addition, urethane-based addition polymerizable compounds produced using an addition reaction between an isocyanate and a hydroxyl group are also suitable, and specific examples thereof include vinyl urethane compounds having two or more polymerizable vinyl groups in one molecule obtained by adding vinyl monomers having a hydroxyl group represented by Formula (M) to a polyisocyanate compound having two or more isocyanate groups in one molecule which is described in, for example, JP1973-41708B (JP-548-41708B).

$$CH_2{=}C(R^{M4})COOCH_2CH(R^{M5})OH \qquad (M)$$

In Formula (M), $RM^4$ and $RM^5$ each independently represent a hydrogen atom or a methyl group.

Furthermore, urethane acrylates described in JP1976-37193A (JP-551-37193A), JP1990-32293B (JP-H02-32293B), JP1990-16765B (JP-H02-16765B), JP2003-344997A, and JP2006-65210A; urethane compounds having an ethylene oxide-based skeleton described in JP1983-49860B (JP-558-49860B), JP1981-17654B (JP-556-17654B), JP1987-39417B (JP-562-39417B), JP1987-39418B (JP-562-39418B), JP2000-250211A, and JP2007-94138A; and urethane compounds having a hydrophilic group described in U57153632B, JP1996-505958A (JP-H08-505958A), JP2007-293221A, and JP2007-293223A are also suitable.

Specific examples of oligomers will be shown in the following tables, but the oligomer used in the present disclosure is not limited thereto.

As the oligomer, commercially available products may also be used. Examples thereof include UA510H, UA-306H, UA-3061, and UA-306T (manufactured by KYOEISHA CHEMICAL Co., LTD.), UV-1700B, UV-6300B, and UV7620EA (manufactured by NIHON GOSEI KAKO Co., Ltd.), U-15HA (manufactured by SHIN-NAKAMURA CHEMICAL Co, LTD.), EBECRYL450, EBECRYL657, EBECRYL885, EBECRYL800, EBECRYL3416, and EBECRYL860 (manufactured by DAICEL-ALLNEX LTD.), and the like. However, the oligomer is not limited to these.

—Specific Compound B1—

From the viewpoint of improving printing durability, the polymerizable compound preferably includes a compound having an ethylenically unsaturated bond valence of 5.0 mmol/g or more (hereinafter, also called specific compound B1).

The ethylenically unsaturated bond valence of the specific compound B1 is preferably 5.5 mmol/g or more, and more preferably 6.0 mmol/g or more. The upper limit of the ethylenically unsaturated bond valence of the specific compound B1 is, for example, 10.0 mmol/g or less, and more preferably 8.5 mmol/g or less.

In the present disclosure, the ethylenically unsaturated bond valence of a compound is determined by the following method. First, for a predetermined amount (for example, 0.2 g) of sample compound, the structure of the compound is specified using, for example, pyrolysis GC/MS, FT-IR, NMR, TOF-SIMS, and the like, and the total amount (mmol) of ethylenically unsaturated groups is determined. The determined total amount (mmol) of ethylenically unsaturated groups is divided by the amount (g) of the sample compound, thereby calculating the ethylenically unsaturated bond valence of the compound.

The specific compound B1 is preferably a compound represented by Formula (I), because such a compound satisfies the C=C valence described above.

$$X\text{—}(Y)n \qquad \text{Formula (I):}$$

In Formula (I), X represents an n-valent organic group having a hydrogen bonding group, Y represents a monovalent group having 2 or more ethylenically unsaturated groups, n represents an integer of 2 or more, and molecular weight of X/(molecular weight of Y×n) is 1 or less.

The hydrogen bonding group represented by X in Formula (I) is not particularly limited as long as it is a group capable of forming a hydrogen bond. The hydrogen bonding group may be a hydrogen bond donating group or a hydrogen bond accepting group. Examples of the hydrogen bonding group include a hydroxyl group, a carboxy group, an amino group, a carbonyl group, a sulfonyl group, a urethane group, a urea group, an imide group, an amide group, a sulfonamide group, and the like. Particularly, from the viewpoint of on-press developability and printing durability, the hydrogen bonding group preferably includes at least one kind of group selected from the group consisting of a urethane group, a urea group, an imide group, an amide group, and a sulfonamide group, more preferably includes at least one kind of group selected from the group consisting of a urethane group, a urea group, an imide group, and an amide group, even more preferably includes at least one kind of group selected from the group consisting of a urethane group, a urea group, and an imide group, and particularly preferably includes at least one kind of group selected from the group consisting of a urethane group and a urea group.

X in Formula (I) is preferably an organic group that does not have an ethylenically unsaturated bond.

Furthermore, from the viewpoint of on-press developability and printing durability, X in Formula (I) is preferably a group obtained by combining two or more kinds of structures selected from the group consisting of a mono- to n-valent aliphatic hydrocarbon group, a mono- to n-valent aromatic hydrocarbon group, a urethane bond, a urea bond, a biuret bond, and an allophanate bond, and more preferably a group obtained by combining two or more kinds of structures selected from the group consisting of a mono- to n-valent aliphatic hydrocarbon group, a mono- to n-valent aromatic hydrocarbon group, a urethane bond, a urea bond, and a biuret bond.

From the viewpoint of on-press developability and printing durability, X in Formula (I) is preferably a group obtained by removing a terminal isocyanate group from a substance prepared by multimerization of a polyfunctional isocyanate compound (including an adduct of a polyfunctional alcohol compound such as trimethylolpropane adduct), more preferably a group obtained by removing a terminal isocyanate group from a substance prepared by multimerization of a difunctional isocyanate compound (including an adduct of a polyfunctional alcohol compound), and particularly preferably a group obtained by removing a terminal isocyanate group from a substance prepared by multimerization of hexamethylene diisocyanate (including an adduct of a polyfunctional alcohol compound).

From the viewpoint of on-press developability and printing durability, the molecular weight of X in Formula (I) is preferably 100 to 1,000, more preferably 150 to 800, and particularly preferably 150 to 500.

The ethylenically unsaturated group represented by Y in Formula (I) is not particularly limited. From the viewpoint of reactivity, on-press developability, and printing durability, the ethylenically unsaturated group is preferably at least one kind of group selected from the group consisting of a vinyl phenyl group, a vinyl ester group, a vinyl ether group, an allyl group, a (meth)acryloxy group, and a (meth)acrylamide group. From the same viewpoint as above, the ethylenically unsaturated group represented by Y in Formula (I) is more preferably at least one kind of group selected from the group consisting of a vinyl phenyl group, a (meth)acryloxy group, and a (meth)acrylamide group, and even more preferably a (meth)acryloxy group. That is, from the viewpoint of on-press developability and printing durability, the ethylenically unsaturated group represented by Y in Formula (I) preferably includes a (meth)acryloxy group.

Y in Formula (I) is preferably a group having 3 or more (meth)acryloxy groups, more preferably a group having 5 or more (meth)acryloxy groups, and even more preferably a group having 5 or more and 12 or less (meth)acryloxy groups.

From the viewpoint of on-press developability and printing durability, Y in Formula (I) may have a structure represented by Formula (Y-1) or Formula (Y-2).

(Y-1)

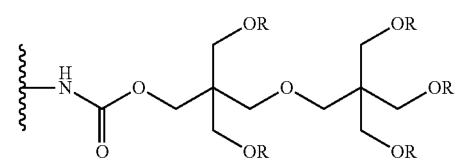

(Y-2)

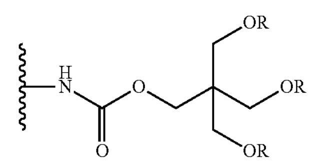

In Formula (Y-1) and Formula (Y-2), R each independently represents an acryloyl group or a methacryloyl group, and the portion of the wavy line represents a position binding to other structures.

It is preferable that all Rs in Formula (Y-1) or Formula (Y-2) be the same group. Furthermore, it is preferable that all Rs in Formula (Y-1) or Formula (Y-2) be an acryloyl group.

It is preferable that all the n pieces of Y in Formula (I) be the same group.

From the viewpoint of on-press developability and printing durability, the molecular weight of Y in Formula (I) is preferably 200 or more and 1,000 or less, and more preferably 250 or more and 800 or less.

n in Formula (I) is an integer of 2 or more. From the viewpoint of on-press developability and printing durability, n is more preferably 2 or 3.

Molecular weight of X/(molecular weight of Y×n) is 1 or less. From the viewpoint of on-press developability and printing durability, the value of the expression is preferably 0.01 to 0.8, and more preferably 0.1 to 0.5.

As the structure of the specific compound B1, for example, a structure is preferable which is established by sealing a terminal isocyanate group of a multimerized substance (including an adduct) of a polyfunctional isocyanate compound with a compound having an ethylenically unsaturated group as described above. As the multimerized substance of the polyfunctional isocyanate compound, particularly, a multimerized substance of a difunctional isocyanate compound is preferable.

From the viewpoint of on-press developability and printing durability, the specific compound B1 is preferably a compound obtained by reacting a terminal isocyanate group of a multimerized substance prepared by multimerizing a polyfunctional isocyanate compound with a polyfunctional ethylenically unsaturated compound having a hydroxyl group (also called hydroxy group) on a terminal. Furthermore, from the same viewpoint as above, the specific compound B1 is more preferably a compound obtained by reacting a terminal isocyanate group of a multimerized substance prepared by multimerizing a difunctional isocyanate compound (including an adduct of a polyfunctional alcohol compound) with a polyfunctional ethylenically unsaturated compound having a hydroxyl group. In addition, from the same viewpoint as above, the specific compound B1 is particularly preferably a compound obtained by reacting a terminal isocyanate group of a multimerized substance prepared by multimerizing hexamethylene diisocyanate (including an adduct of a polyfunctional alcohol compound) with a polyfunctional ethylenically unsaturated compound having a hydroxyl group.

As the polyfunctional isocyanate compound, known compounds can be used without particular limitation. This compound may be an aliphatic polyfunctional isocyanate compound or an aromatic polyfunctional isocyanate compound. As the polyfunctional isocyanate compound, specifically, for example, 1,3-bis(isocyanatomethyl) cyclohexane, isophorone diisocyanate, trimethylene diisocyanate, tetramethylene diisocyanate, pentamethylene diisocyanate, hexamethylene diisocyanate, 1,3-cyclopentane diisocyanate, 9H-fluorene-2,7-diisocyanate, 9H-fluoren-9-on-2,7-diisocyanate, 4,4'-diphenylmethane diisocyanate, 1,3-phenylene diisocyanate, tolylene-2,4-diisocyanate, tolylene-2,6-diisocyanate, 1,3-bis(isocyanatomethyl) cyclohexane, 2,2-bis(4-isocyanatophenyl) hexafluoropropane, 1,5-diisocyanatonaphthalene, a dimer or trimer (isocyanurate bond) of these polyisocyanates, and the like are preferable. Furthermore, a biuret compound obtained by reacting the above polyisocyanate compound with a known amine compound may also be used.

In addition, the polyfunctional ethylenically unsaturated compound having a hydroxyl group is preferably a hydroxyl group-containing ethylenically unsaturated compound having 3 or more functional groups, and more preferably a hydroxyl group-containing ethylenically unsaturated compound having 5 or more functional groups. The aforementioned hydroxyl group-containing polyfunctional ethylenically unsaturated compound is preferably a polyfunctional (meth)acrylate compound having a hydroxyl group.

From the viewpoint of on-press developability and printing durability, the specific compound B1 preferably has at least one kind of structure selected from the group consisting of an adduct structure, a biuret structure, and an isocyanurate structure. From the same viewpoint as above, the specific compound B1 more preferably has at least one kind of structure selected from the group consisting of a trimethylolpropane adduct structure, a biuret structure, and an isocyanurate structure, and particularly preferably has a trimethylolpropane adduct structure.

From the viewpoint of on-press developability and printing durability, the specific compound B1 preferably has a structure represented by any of Formula (A-1) to Formula (A-3), and more preferably has a structure represented by Formula (A-1).

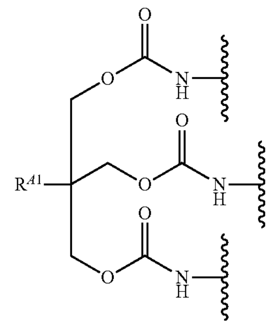

(A-1)

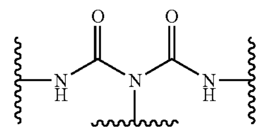

(A-2)

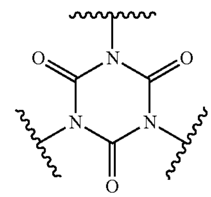

(A-3)

In Formula (A-1), $R^{A1}$ represents a hydrogen atom or an alkyl group having 1 to 8 carbon atoms, and the portion of the wavy line represents a position binding to other structures.

From the viewpoint of on-press developability and printing durability, $R^{A1}$ in Formula (A-1) is preferably a hydrogen atom or an alkyl group having 1 to 4 carbon atoms, more preferably an alkyl group having 1 to 3 carbon atoms, even more preferably a methyl group or an ethyl group, and particularly preferably an ethyl group.

From the viewpoint of on-press developability and printing durability, the specific compound B1 is preferably a (meth)acrylate compound having a urethane group, that is, a urethane (meth)acrylate oligomer.

As long as the specific compound B1 has an ethylenically unsaturated bond valence of 5.0 mmol/g or more, the specific compound B1 may be an oligomer having a polyester bond (hereinafter, also called polyester (meth)acrylate oligomer) or an oligomer having an epoxy residue (hereinafter, also called epoxy (meth)acrylate oligomer).

The epoxy residue in the epoxy (meth)acrylate oligomer is as described above.

The number of ethylenically unsaturated groups in the polyester (meth)acrylate oligomer as the specific compound B1 is preferably 3 or more, and more preferably 6 or more.

The epoxy (meth)acrylate oligomer as the specific compound B1 is preferably a compound containing a hydroxyl group. The number of ethylenically unsaturated groups in the epoxy (meth)acrylate oligomer is preferably 2 to 6, and more preferably 2 or 3. The epoxy (meth)acrylate oligomer can be obtained, for example, by reacting a compound having an epoxy group with an acrylic acid.

The molecular weight of the specific compound B1 (weight-average molecular weight in a case where the compound has molecular weight distribution) is preferably more than 1,000, more preferably 1,100 to 10,000, and even more preferably 1,100 to 5,000.

As the specific compound B1, a synthetic product or a commercially available product may be used.

Specific examples of the specific compound B1 include the following commercially available products. However, the specific compound B1 used in the present disclosure is not limited thereto. The number of functional groups (or the average number of functional groups) and C═C valence of the ethylenically unsaturated group are shown in each bracket.

Specific examples of the specific compound B1 include urethane (meth)acrylate oligomers such as U-10HA (number of functional groups: 10, C═C valence: 8 mmol/g) and U-15HA (number of functional groups: 15, C═C valence: 6 mmol/g) manufactured by SHIN-NAKAMURA CHEMICAL CO, LTD., UA-510H (number of functional groups: 10, C═C valence: 8 mmol/g) manufactured by KYOEISHA CHEMICAL Co., LTD., KRM8452 (number of functional groups: 10, C═C valence: 7 mmol/g) manufactured by DAICEL-ALLNEX LTD., and CN8885NS (number of functional groups: 9, C═C valence: 6 mmol/g) and CN9013NS (number of functional groups: 9, C═C valence: 6 mmol/g) manufactured by Sartomer Company Inc.

Specific examples of the specific compound B1 also include epoxy (meth)acrylate oligomers such as NK OLIGO EA-7420/PGMAc (number of functional groups: 10 to 15, C═C valence: 5 mmol/g) manufactured by SHIN-NAKAMURA CHEMICAL CO, LTD., and CN153 (C═C valence: 5 mmol/g) manufactured by Sartomer Company Inc.

ethylenically unsaturated bonding groups (hereinafter, also called specific compound B2).

Preferred aspects of the ethylenically unsaturated group contained in the specific compound B2 are the same as preferred aspects of the ethylenically unsaturated group in the specific compound B 1.

Furthermore, from the viewpoint of inhibiting the deterioration of on-press developability, the specific compound B2 is preferably a compound having 2 ethylenically unsaturated bonding groups (that is, a difunctional polymerizable compound).

From the viewpoint of on-press developability and printing durability, the specific compound B2 is preferably a methacrylate compound, that is, a compound having a methacryloxy group.

From the viewpoint of on-press developability, the specific compound B2 preferably has an alkyleneoxy structure or a urethane bond.

The molecular weight of the specific compound B2 (weight-average molecular weight in a case where the compound has molecular weight distribution) is preferably 50 or more and less than 1,000, more preferably 200 to 900, and even more preferably 250 to 800.

Specific examples of the specific compound B2 will be shown below. However, the specific compound B2 used in the present disclosure is not limited thereto. In the following compound (2), for example, n+m=10.

(1)

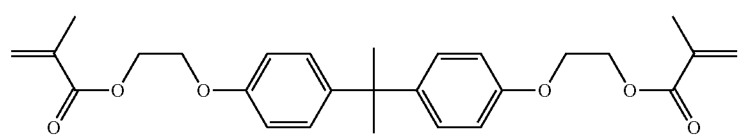

(2)

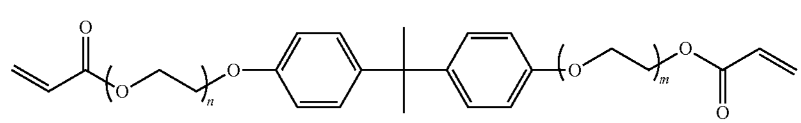

(3)

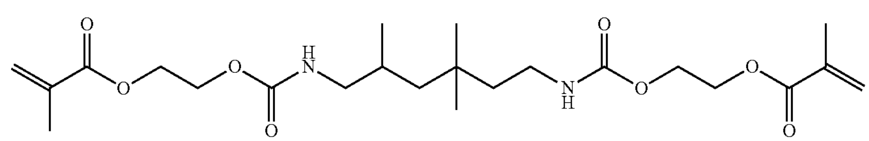

(4)

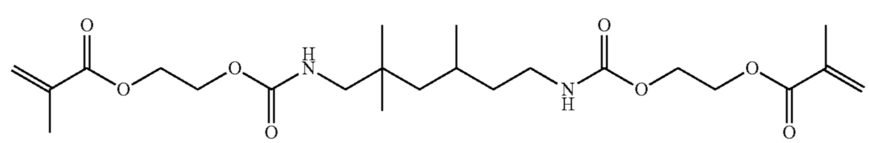

Specific examples of the specific compound B1 also include polyester (meth)acrylate oligomers such as CN2267 (C═C valence: 5 mmol/g) manufactured by Sartomer Company Inc.

In a case where the specific compound B1 is used, the content of the specific compound B1 with respect to the total mass of the polymerizable compounds in the image-recording layer is preferably 10% by mass to 100% by mass, more preferably 50% by mass to 100% by mass, and even more preferably 80% by mass to 100% by mass.

—Specific Compound B2—

The polymerizable compound may include, as a low-molecular-weight compound, a compound having 1 or 2

As the specific compound B2, the following commercially available products may be used. However, the specific compound B2 used in the present disclosure is not limited thereto.

Specific examples of the specific compound B2 include ethoxylated bisphenol A dimethacrylate such as BPE-80N (the above compound (1)), BPE-100, BPE-200, and BPE-500 manufactured by SHIN-NAKAMURA CHEMICAL CO, LTD., and CN104 (the above compound (1)) manufactured by Sartomer Company Inc.

Specific examples of the specific compound B2 include ethoxylated bisphenol A diacrylates such as A-BPE-10 (the above compound (2)) and A-BPE-4 manufactured by SHIN-NAKAMURA CHEMICAL CO, LTD.

Furthermore, specific examples of the specific compound B2 include difunctional methacrylate such as FST 510 manufactured by AZ Electronics.

"FST 510" described above is a product of a reaction between 1 mol of 2,2,4-trimethylhexamethylene diisocyanate and 2 mol of hydroxyethyl methacrylate, which is an 82% by mass methyl ethyl ketone solution of the compound (3).

From the viewpoint of on-press developability and printing durability, the content of the specific compound B2 with respect to the total mass of the image-recording layer is preferably 1% by mass to 60% by mass, more preferably 5% by mass to 55% by mass, and even more preferably 5% by mass to 50% by mass.

In a case where the specific compound B2 is used, the content of the specific compound B2 with respect to the total mass of the polymerizable compounds in the image-recording layer is preferably 10% by mass to 100% by mass, more preferably 50% by mass to 100% by mass, and even more preferably 80% by mass to 100% by mass.

The details of how to use the polymerizable compound, such as the structure of the compound, whether the compound is used alone or used in combination with other compounds, and the amount of the compound to be added, can be randomly set.

Particularly, from the viewpoint of UV printing durability, the image-recording layer preferably contains two or more kinds of polymerizable compounds.

The content of the polymerizable compound (total content of polymerizable compounds in a case where the image-recording layer contains two or more kinds of polymerizable compounds) with respect to the total mass of the image-recording layer is preferably 5% by mass to 75% by mass, more preferably 10% by mass to 70% by mass, and even more preferably 15% by mass to 60% by mass.

Furthermore, the content of the thermoplastic resin contained in the thermoplastic resin particles with respect to the total mass of the polymerizable compounds in the image-recording layer is preferably more than 0% by mass and 400% by mass or less, more preferably 25% by mass to 300% by mass, and even more preferably 50% by mass to 200% by mass.

In the image-recording layer, it is preferable that the thermoplastic resin contained in the thermoplastic resin particles and the aforementioned polymerizable compound form a sea-island structure. For example, it is possible to adopt a structure in which the polymerizable compound is dispersed in the form of islands (discontinuous phase) in the thermoplastic resin as a sea (continuous phase). Presumably, in a case where the content of the thermoplastic resin contained in the thermoplastic resin particles is within the above range with respect to the total mass of the polymerizable compound, the sea-island structure may be easily formed.

[Polymerization Initiator]

The image-recording layer used in the present disclosure contains a polymerization initiator.

The polymerization initiator is not particularly limited, and examples thereof include an electron-accepting polymerization initiator, an electron-donating polymerization initiator, and the like.

—Electron-Accepting Polymerization Initiator—

The image-recording layer preferably contains an electron-accepting polymerization initiator.

The electron-accepting polymerization initiator used in the present disclosure is a compound that generates a polymerization initiation species such as a radical or a cation by either or both of light energy and heat energy, and can be appropriately selected from known thermal polymerization initiators, compounds having a bond that can be dissociated by little energy, photopolymerization initiators, and the like.

The electron-accepting polymerization initiator is preferably a radical polymerization initiator and more preferably an onium salt compound.

In addition, as the electron-accepting polymerization initiator, an infrared-ray-sensitive polymerization initiator is preferable.

One kind of electron-accepting polymerization initiator may be used alone, or two or more kinds of electron-accepting polymerization initiators may be used in combination.

Examples of the radical polymerization initiator include (a) organic halide, (b) carbonyl compound, (c) azo compound, (d) organic peroxide, (e) metallocene compound, (f) azide compound, (g) hexaarylbiimidazole compound, (i) disulfone compound, (j) oxime ester compound, and (k) onium salt compound.

As (a) organic halide, for example, the compounds described in paragraphs "0022" and "0023" of JP2008-195018A are preferable.

As (b) carbonyl compound, for example, the compounds described in paragraph "0024" of JP2008-195018A are preferable.

As (c) azo compound, for example, the azo compounds described in JP1996-108621A (JP-H08-108621A) and the like can be used.

As (d) organic peroxide, for example, the compounds described in paragraph "0025" of JP2008-195018A are preferable.

As (e) metallocene compound, for example, the compounds described in paragraph "0026" of JP2008-195018A are preferable.

Examples of (f) azide compound include compounds such as 2,6-bis(4-azidobenzylidene)-4-methylcyclohexanone.

As (g) hexaarylbiimidazole compound, for example, the compounds described in paragraph "0027" of JP2008-195018A are preferable.

Examples of (i) disulfone compound include the compounds described in JP1986-166544A (JP-S61-166544A) and JP2002-328465A.

As (j) oxime ester compound, for example, the compounds described in paragraphs "0028" to "0030" of JP2008-195018A are preferable.

Among the above electron-accepting polymerization initiators, from the viewpoint of curing properties, an oxime ester compound and an onium salt compound are preferable. Particularly, from the viewpoint of UV printing durability, an iodonium salt compound, a sulfonium salt compound, or an azinium salt compound is preferable, an iodonium salt compound or a sulfonium salt compound is more preferable, and an iodonium salt compound is even more preferable.

Specific examples of these compounds will be shown below, but the present disclosure is not limited thereto.

As the iodonium salt compound, for example, a diaryl iodonium salt compound is preferable. Particularly, a diphenyl iodonium salt compound substituted with an electron donating group such as an alkyl group or an alkoxyl group is more preferable. Furthermore, an asymmetric diphenyl iodonium salt compound is preferable. Specific examples thereof include diphenyliodonium=hexafluorophosphate, 4-methoxyphenyl-4-(2-methylpropyl) phenyliodonium=hexafluorophosphate, 4-(2-methylpropyl) phenyl-p-tolyliodonium=hexafluorophosphate, 4-hexyloxyphenyl-2,4,6-trimethoxyphenyl iodonium=hexafluorophosphate, 4-hexyloxyphenyl-2,4-diethoxyphenyl iodonium=tetrafluoroborate, 4-octyloxyphenyl-2,4,6-trimethoxyphenyl iodonium=1-perfluorobutane sulfonate, 4-octyloxyphenyl-2,4,6-trimethoxyphenyliodonium=hexafluorophosphate, and bis(4-t-butylphenyl)i odonium=hexafluorophosphate.

As the sulfonium salt compound, for example, a triarylsulfonium salt compound is preferable. Particularly, a triarylsulfonium salt compound is preferable in which at least some of electron-withdrawing groups such as groups on an aromatic ring are substituted with halogen atoms, and a triarylsulfonium salt compound is more preferable in which the total number of halogen atoms as substituents on an aromatic ring is 4 or more. Specific examples thereof include triphenylsulfonium=hexafluorophosphate, triphenylsulfonium=benzoyl formate, bis(4-chlorophenyl)phenylsulfonium=benzoyl formate, bis(4-chlorophenyl)-4-methylphenylsulfonium=tetrafluoroborate, tris(4-chlorophenyl)sulfonium=3,5-bis(methoxycarbonyl)benzenesulfonate, tris(4-chlorophenyl)sulfonium=hexafluorophosphate, and tris(2,4-dichlorophenyl)sulfonium=hexafluorophosphate.

As a counteranion of the iodonium salt compound and the sulfonium salt compound, a sulfonamide anion or a sulfonimide anion is preferable, and a sulfonimide anion is more preferable.

As the sulfonamide anion, an aryl sulfonamide anion is preferable.

As the sulfonimide anion, a bisaryl sulfonimide anion is preferable.

Specific examples of the sulfonamide anion or the sulfonimide anion will be shown below, but the present disclosure is not limited thereto. In the following specific examples, Ph represents a phenyl group, Me represents a methyl group, and Et represents an ethyl group.

I-1

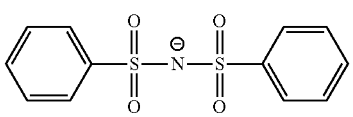

I-2

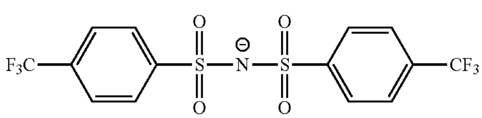

I-3

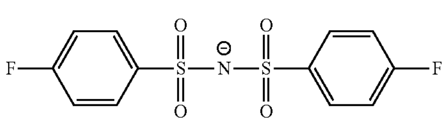

I-4

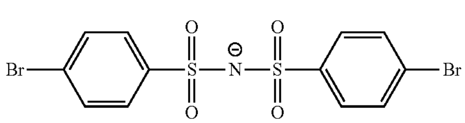

I-5

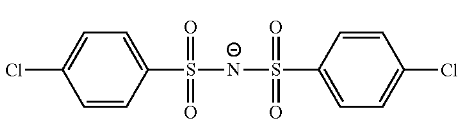

-continued

I-6

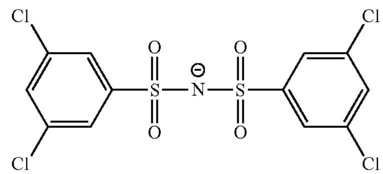

I-7

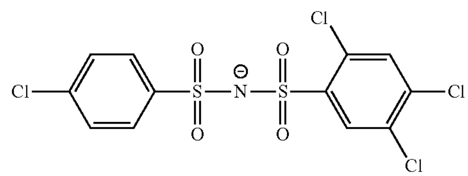

I-8

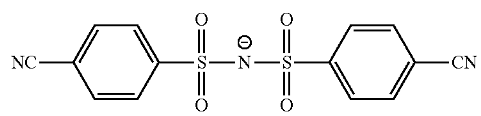

I-9

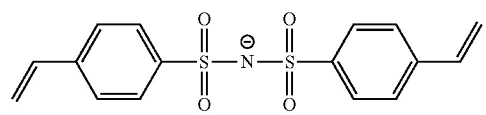

I-10

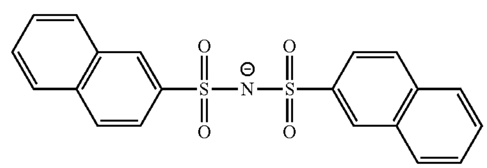

I-11

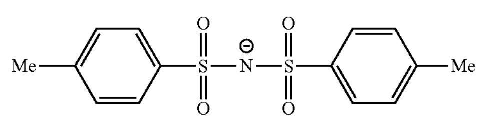

I-12

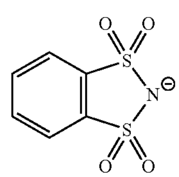

I-13

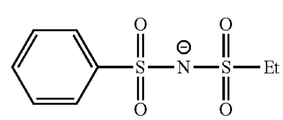

I-14

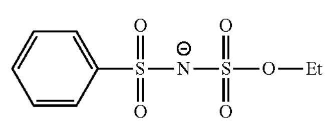

I-15

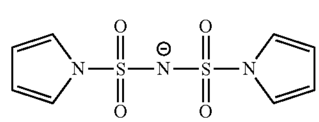

I-16

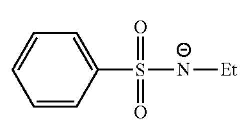

-continued
I-17
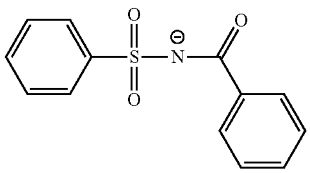
I-18
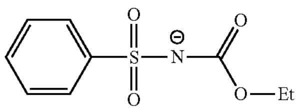
I-19
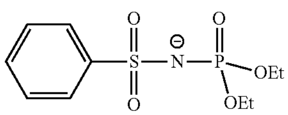
I-20
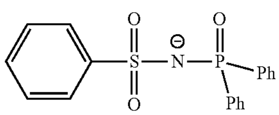
I-21
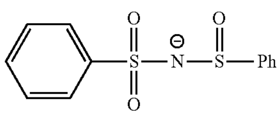
I-22
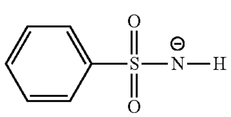
I-23
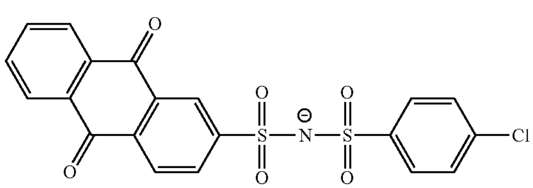
I-24
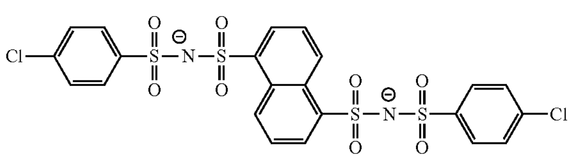
I-25
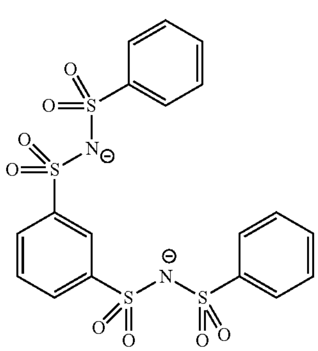
-continued
I-26
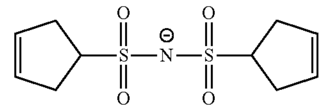
Specific examples of aspects in which the aforementioned electron-accepting polymerization initiator and the electron-donating polymerization initiator that will be described later form a salt will be shown below. However, the present disclosure is not limited thereto.
(IA-1)
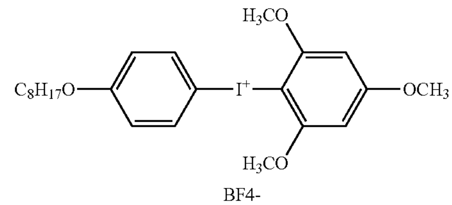
(IA-2)
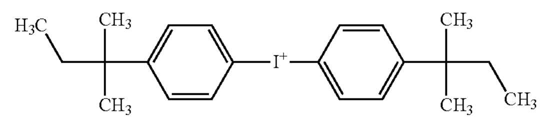
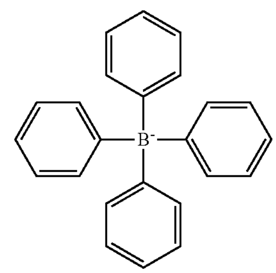
(IA-3)
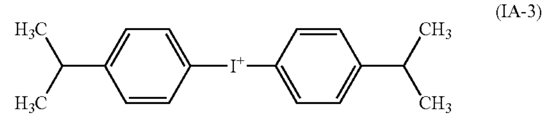
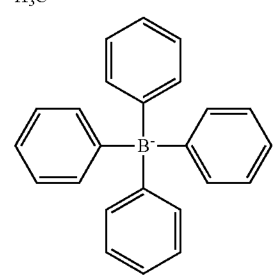
(IA-4)
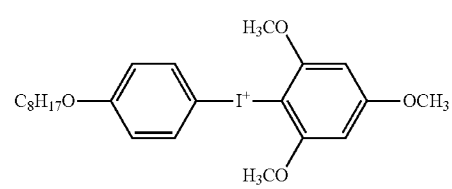
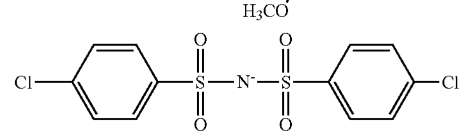

-continued (IA-5)

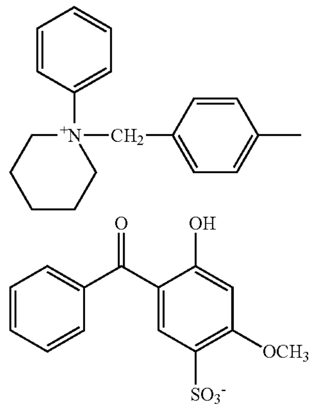

From the viewpoint of color developability, temporal color developability after exposure, developability, and UV printing durability of the lithographic printing plate precursor to be obtained, as the electron-accepting polymerization initiator, a compound represented by Formula (I) can be suitably used.

$$(R^{X1}-A)_{m^x}-\underset{\displaystyle|}{\overset{(R^{X2})_{4-m^x-n^x}}{CH}}-(X)_{n^x} \tag{I}$$

In Formula, X represents a halogen atom. Specifically, examples thereof include a fluorine atom, a chlorine atom, a bromine atom, and an iodine atom. Among these, a chlorine atom or a bromine atom is preferable because these have excellent sensitivity, and a bromine atom is particularly preferable.

A represents a divalent linking group selected from the group consisting of —CO—, —SO—, $—SO_2—$, —PO—, and $—PO_2—$. Among these, —CO—, —SO—, and $—SO_2—$ are more preferable, and —CO— and $—SO_2—$ are particularly preferable. $R^{X1}$ and $R^{X2}$ each independently represent a hydrogen atom or a monovalent hydrocarbon group having 1 to 20 carbon atoms.

Examples of the hydrocarbon constituting the hydrocarbon group include the hydrocarbons described in paragraphs "0013" and "0014" of JP2002-162741A, and the like. Specifically, examples of the hydrocarbons include aliphatic hydrocarbons having 1 to 30 carbon atoms such as methane, ethane, propane, butane, hexane, nonane, decane, octadecane, cyclopentane, cyclohexane, adamantane, norbomane, decahydronaphthalene, tricyclo[5.2.1.$0^{2,6}$]decane, ethylene, propylene, 1-butene, 1-hexene, 1-heptadecene, 2-butene, 2-hexene, 4-nonene, 7-tetradecene, butadiene, piperylene, 1,9-decadien, cyclopentene, cyclohexene, cyclooctene, 1,4-cyclohexadiene, 1,5-cyclooctadiene, 1,5,9-cyclododecatriene, norbornylene, octahydronaphthalene, bicyclo[2.2.1]hepta-2,5-diene, acetylene, 1-propyne, and 2-hexyne; and aromatic hydrocarbons such as benzene, naphthalene, anthracene, indene, and fluorene.

One or more carbon atoms constituting the above hydrocarbon group may be substituted with a hetero atom selected from an oxygen atom, a nitrogen atom, and a sulfur atom.

Except for hydrogen, for example, a group of monovalent non-metal atoms can be used as substituents. Examples thereof include a halogen atom (—F, —Br, —Cl, or —I), a hydroxyl group, an alkoxy group, an aryloxy group, a mercapto group, an alkylthio group, an arylthio group, an alkyldithio group, an aryldithio group, an amino group, a N-alkylamino group, a N,N-dialkylamino group, a N-arylamino group, a N,N-diarylamino group, a N-alkyl-N-arylamino group, an acyloxy group, a carbamoyloxy group, a N-alkylcarbamoyloxy group, a N-arylcarbamoyloxy group, a N,N-dialkylcarbamoyloxy group, a N,N-diarylcarbamoyloxy group, a N-alkyl-N-arylcarbamoyloxy group, an alkyl sulfoxy group, an aryl sulfoxy group, an acylthio group, an acylamino group, a N-alkylacylamino group, a N-arylacylamino group, a ureido group, a N'-alkylureido group, a N',N'-dialkylureido group, a N'-arylureido group, a N',N'-diarylureido group, a N'-alkyl-N'-arylureido group, a N-alkylureido group, a N-arylureido group, a N'-alkyl-N-alkylureido group, a N'-alkyl-N-arylureido group, a N',N'-dialkyl-N-alkylureido group, a N',N'-dialkyl-N-arylureido group, a N'-aryl-N-alkylureido group, a N'-aryl-N-arylureido group, a N',N'-diaryl-N-alkylureido group, a N',N'-diaryl-N-arylureido group, a N'-alkyl-N'-aryl-N-alkylureido group, a N'-alkyl-N'-aryl-N-arylureido group, an alkoxycarbonylamino group, an aryl oxy carbonyl amino group, a N-alkyl-N-alkoxycarbonylamino group, a N-alkyl-N-aryloxycarbonylamino group, a N-aryl-N-alkoxycarbonylamino group, a N-aryl-N-aryloxycarbonylamino group, a formyl group, an acyl group, a carboxyl group and a conjugate base group thereof, an alkoxycarbonyl group, an aryloxycarbonyl group, a carbamoyl group, a N-alkylcarbamoyl group, a N,N-dialkylcarbamoyl group, a N-arylcarbamoyl group, a N,N-diarylcarbamoyl group, a N-alkyl-N-arylcarbamoyl group, an alkylsulfinyl group, an arylsulfinyl group, an alkylsulfonyl group, an arylsulfonyl group, a sulfo group ($—SO_3H$) and a conjugate base group thereof, an alkoxysulfonyl group, an aryloxysulfonyl group, a sulfinamoyl group, a N-alkylsulfinamoyl group, a N,N-dialkylsulfinamoyl group, a N-arylsulfinamoyl group, a N,N-diarylsulfinamoyl group, a N-alkyl-N-arylsulfinamoyl group, a sulfamoyl group, a N-alkylsulfamoyl group, a N,N-dialkylsulfamoyl group, a N-arylsulfamoyl group, a N,N-diarylsulfamoyl group, a N-alkyl-N-arylsulfamoyl group, a N-acylsulfamoyl group and a conjugate base group thereof, a N-alkylsulfonyl sulfamoyl group ($—SO_2NHSO_2$(alkyl)) and a conjugate base group thereof, a N-arylsulfonylsulfamoyl group ($—SO_2NHSO_2$(aryl)) and a conjugate base group thereof, a N-alkylsulfonylcarbamoyl group ($—CONHSO_2$(alkyl)) and a conjugate base group thereof, a N-arylsulfonylcarbamoyl group ($—CONHSO_2$(aryl)) and a conjugate base group thereof, an alkoxysilyl group ($—Si(Oalkyl)_3$), an aryloxysilyl group ($—Si(Oaryl)_3$), a hydroxysilyl group ($—Si(OH)_3$) and a conjugate base group thereof, a phosphono group ($—PO_3H_2$) and a conjugate base group thereof, a dialkylphosphono group ($—PO_3(alkyl)_2$), a diarylphosphono group ($—PO_3(aryl)_2$), an alkylarylphosphono group ($—PO_3$(alkyl)(aryl)), a monoalkylphosphono group ($—PO_3H$(alkyl)) and a conjugate base group thereof, a monoarylphosphono group ($—PO_3H$(aryl)) and a conjugate base group thereof, a phosphonooxy group ($—OPO_3H_2$) and a conjugate base group thereof, a dialkylphosphonooxy group ($—OPO_3(alkyl)_2$), a diarylphosphonooxy group ($—OPO_3(aryl)_2$), an alkylarylphosphonooxy group ($—OPO_3$(alkyl)(aryl)), a monoalkylphosphonooxy group ($—OPO_3H$(alkyl)) and a conjugate base group thereof, a monoarylphosphonooxy group ($—OPO_3H$(aryl)) and a conjugate base group thereof, a cyano group, a nitro group, a dialkylboryl group ($—B(alkyl)_2$), a diarylboryl group ($—B(aryl)_2$), an alkylarylboryl group (—B(alkyl)(aryl)), a dihydroxyboryl group (—B(OH)$_2$) and a conjugate base group thereof, an alkylhydroxyboryl group (—B(alkyl)(OH)) and a conjugate base group thereof, an arylhydroxyboryl group (—B(aryl)(OH)) and a conjugate base group thereof, an aryl group, an alkyl group, an alkenyl group, and an alkynyl group.

If possible, these substituents may be bonded to each other or bonded to the substituted hydrocarbon group so as to form a ring, or may be further substituted with substituents.

As substituents, for example, a halogen atom, an alkoxy group, an aryloxy group, an alkyl group, an alkenyl group, an alkynyl group, and an aryl group are preferable.

$m^x$ and $n^x$ each represent an integer of 1 to 3. However, $m^x+n^x=2$ to 4. In view of sensitivity, it is preferable that $m^x=1$ and $n^x=3$, or $m^x=2$ and $n^x=2$. In a case where each of $m^x$ and $n^x$ is 2 or more, ($R_1$-A) and X may be different from each other. Furthermore, in a case where $m^x=1$ and $n^x=1$, $R^{x2}$'s may be different from each other.

Among the compounds represented by Formula (I), in view of excellent visibility, a compound represented by Formula (II) or Formula (III) is preferable.

(II)

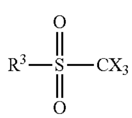

(III)

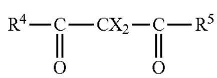

In Formula (II) and Formula (III), X has the same definition as X in Formula (I), and $R^3$, $R^4$, and $R^5$ each independently represent a monovalent hydrocarbon group having 1 to 20 carbon atoms.

$R^3$, $R^4$, and $R^5$ preferably each independently represent an aryl group. It is more preferable that the aryl group be substituted with an amide group, because then sensitivity and storage storability are well balanced.

Among the compounds represented by Formula (I), a compound represented by Formula (IV) is particularly preferable.

(IV)

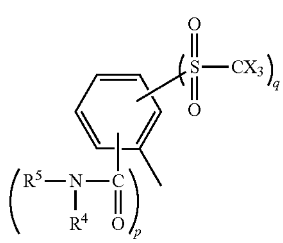

In Formula (IV), $R^4$ and $R^5$ each independently represent a hydrogen atom or a monovalent hydrocarbon group having 1 to 20 carbon atoms. p and q each represent an integer of 1 to 5. Here, p+q=2 to 6.

Specific examples of the electron-accepting polymerization initiator represented by Formula (I) include compounds represented by the following formulas. However, the present disclosure is not limited thereto.

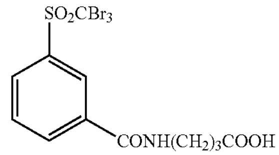

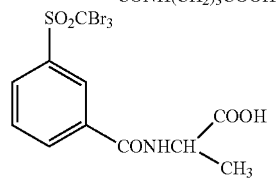

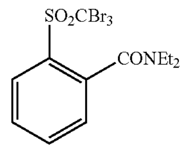

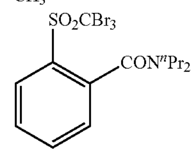

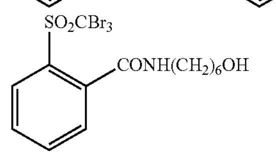

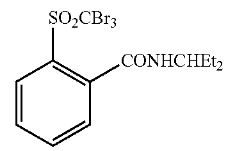

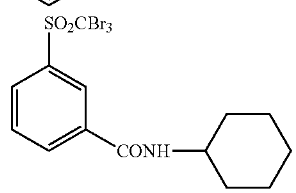

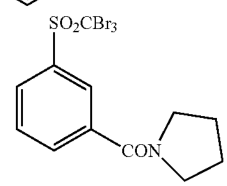

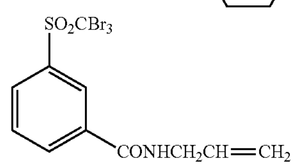

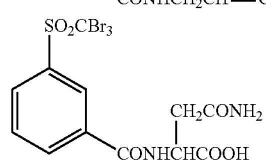

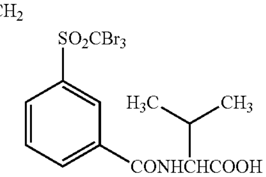

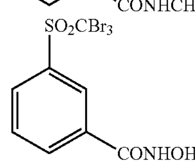

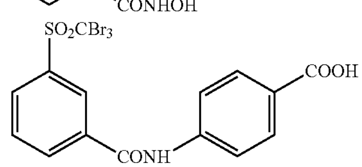

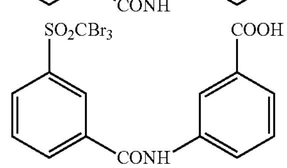

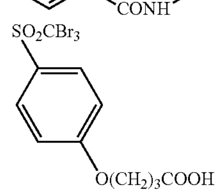

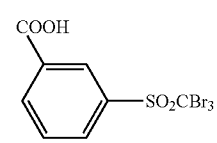

-continued
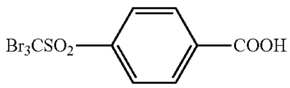
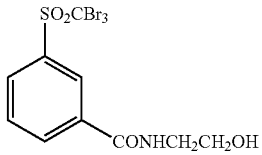
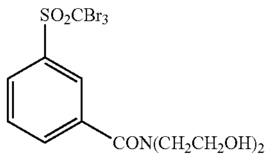
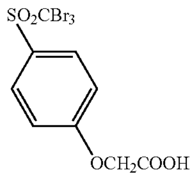
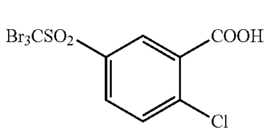
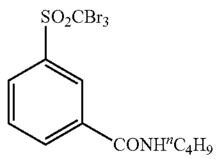
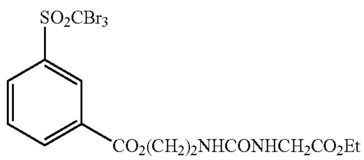
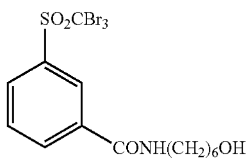
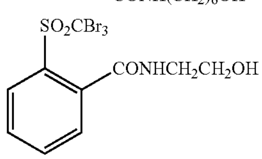
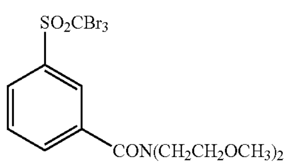
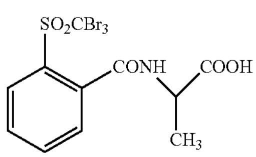
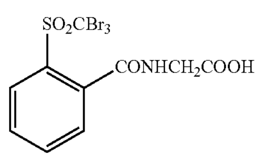
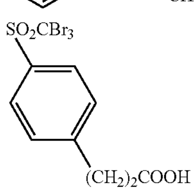
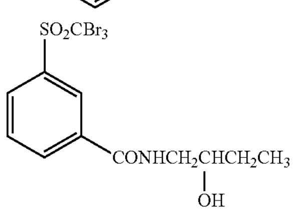
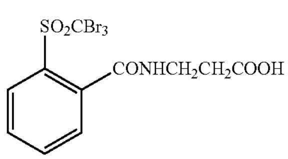
-continued
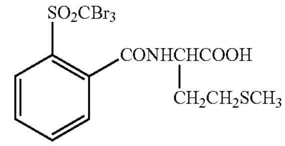
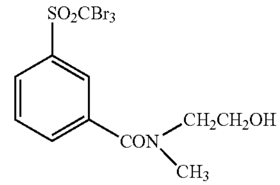
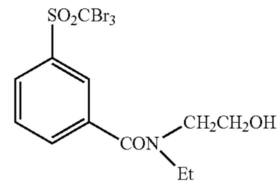
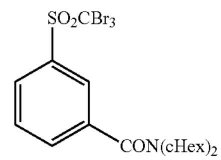
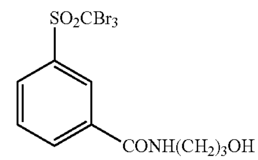
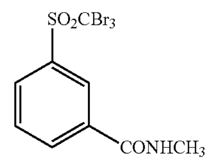
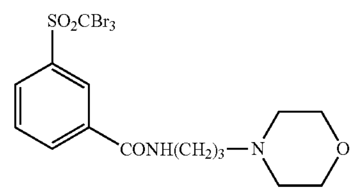
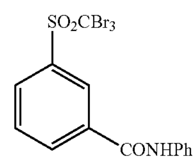
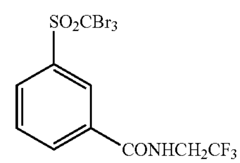
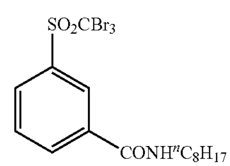
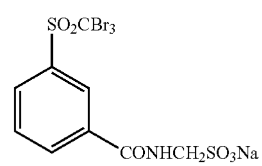
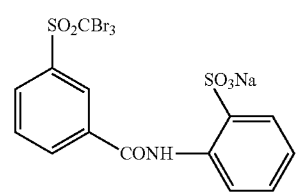
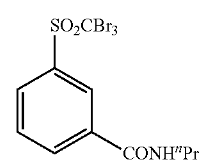
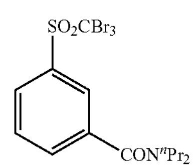
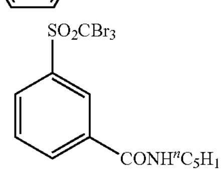

-continued
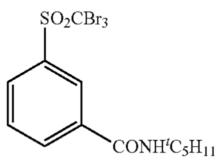
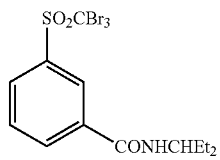
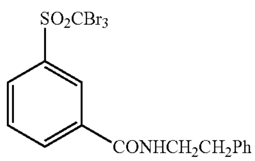
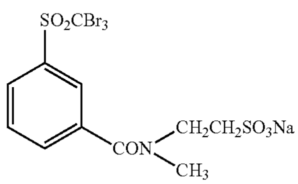
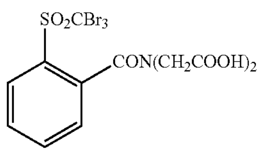
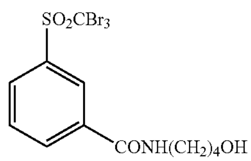
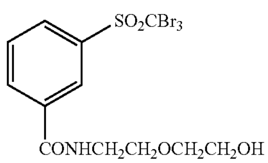
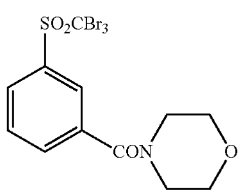
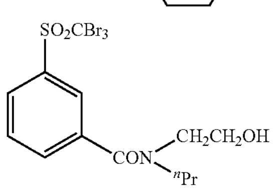
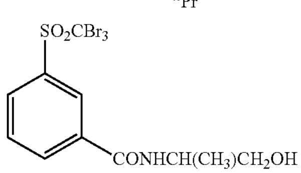
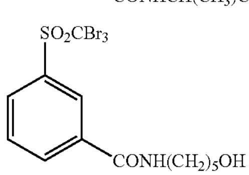
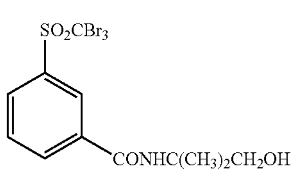
-continued
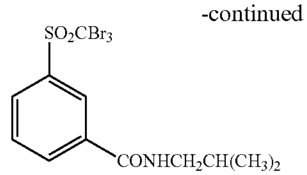
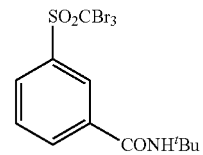
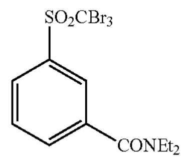
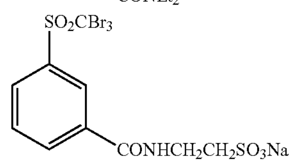
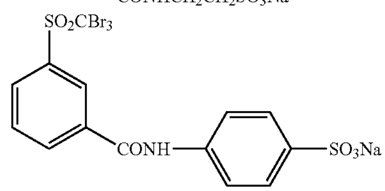
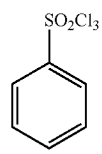
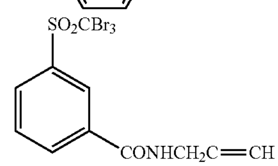
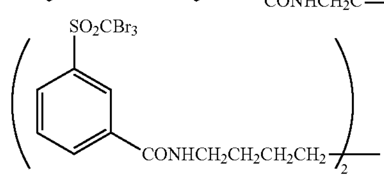
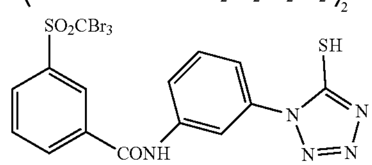
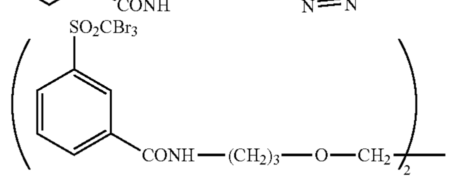
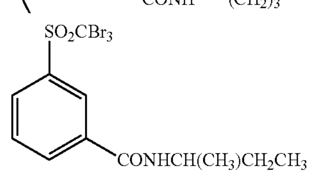
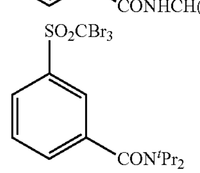
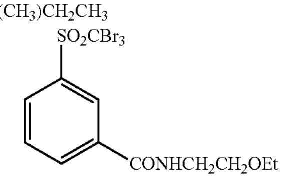
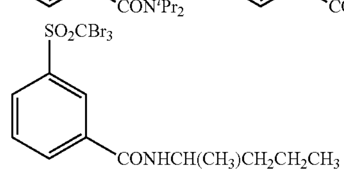

-continued
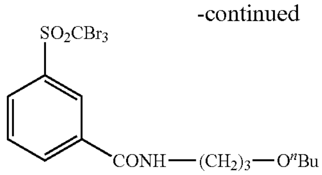
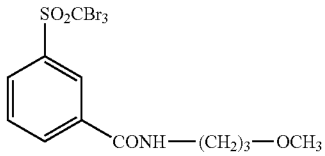
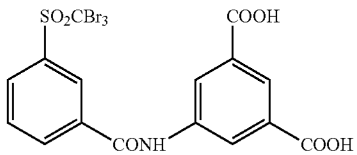
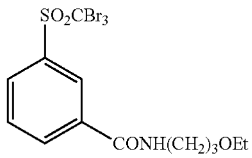
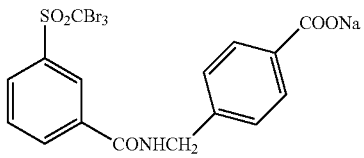
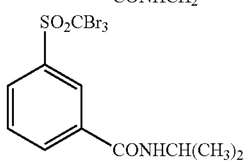
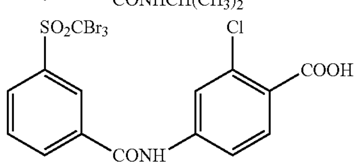
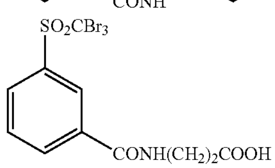
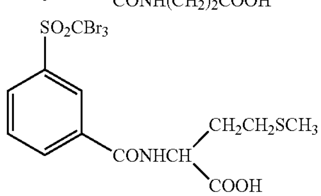
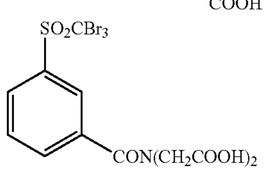
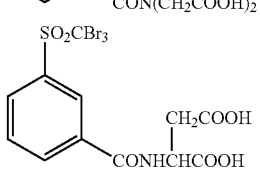
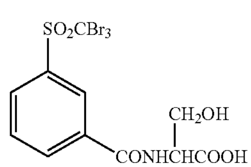
-continued
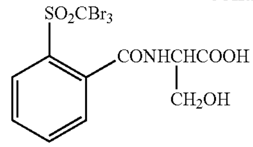
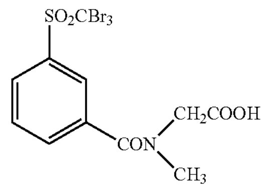
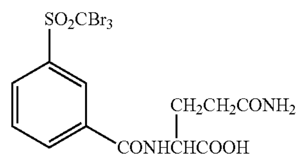
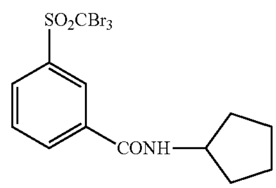
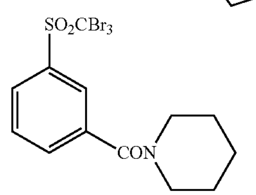
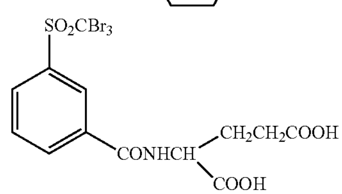
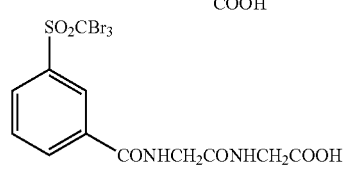
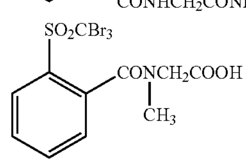
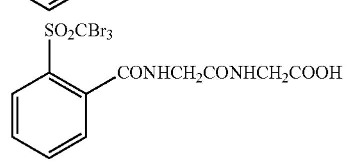
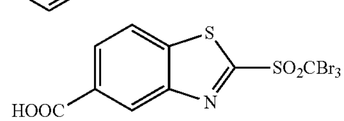

-continued
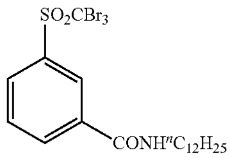
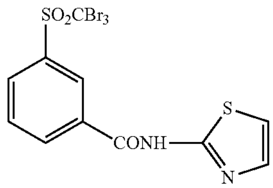
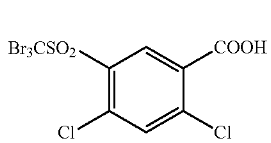
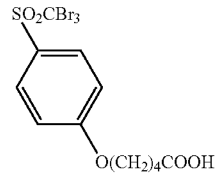
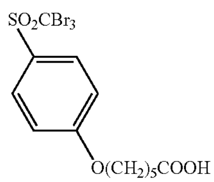
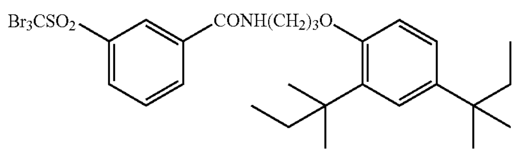
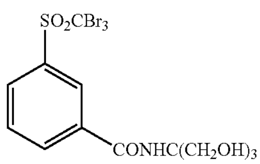
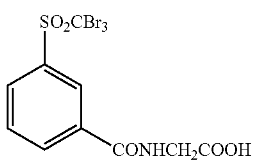
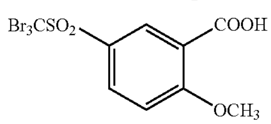
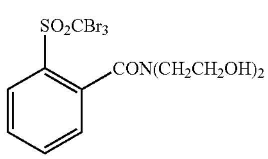
(IS-1)
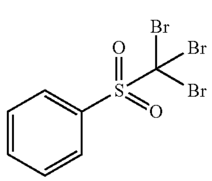
(IS-2)
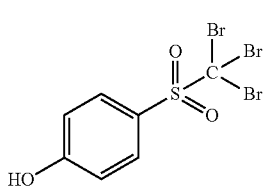
-continued
(IS-3)
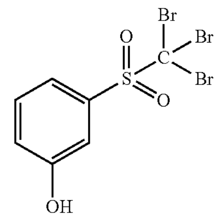
(IS-4)
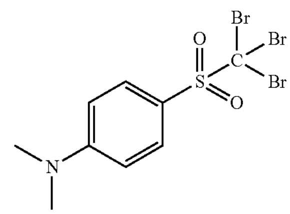
(IS-5)
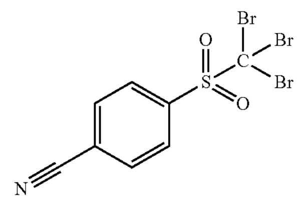
(IS-6)
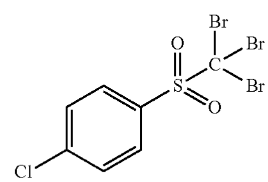
(IS-7)
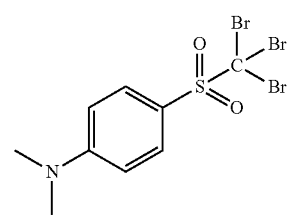
(IS-8)
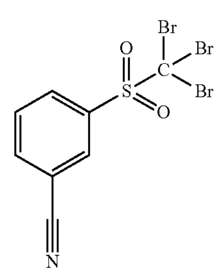
(IS-9)
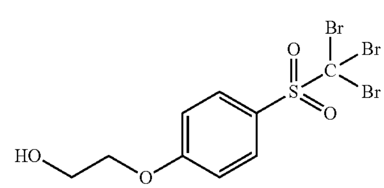

-continued (IS-10)

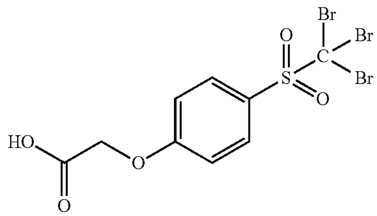

(IS-11)

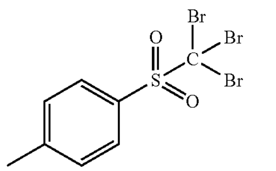

(IS-12)

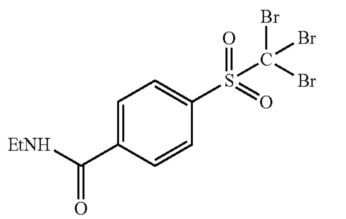

(IS-13)

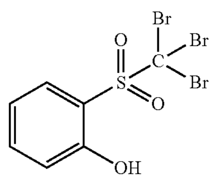

(IS-14)

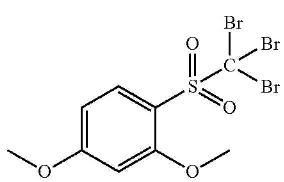

From the viewpoint of chemical resistance and UV printing durability, the lowest unoccupied molecular orbital (LUMO) of the electron-accepting polymerization initiator is preferably −3.00 eV or less, and more preferably −3.02 eV or less.

The lower limit of LUMO is preferably −3.80 eV or more, and more preferably −3.60 eV or more.

The content of the electron-accepting polymerization initiator with respect to the total mass of the image-recording layer is preferably 0.1% by mass to 50% by mass, more preferably 0.5% by mass to 30% by mass, and particularly preferably 0.8% by mass to 20% by mass.

[Electron-Donating Polymerization Initiator]

The polymerization initiator preferably further includes an electron-donating polymerization initiator, and more preferably further includes both the electron-donating polymerization initiator and the electron-accepting polymerization initiator described above, because such a polymerization initiator contributes to the improvement of chemical resistance and UV printing durability of the lithographic printing plate.

Examples of the electron-donating polymerization initiator include the following five kinds of initiators.

(i) Alkyl or arylate complex: considered to generate active radicals by oxidative cleavage of carbon-hetero bond, specific examples thereof include a borate compound and the like.

(ii) Amino acetate compound: considered to generate active radicals by oxidation-induced cleavage of C—X bond on carbon adjacent to nitrogen, X is preferably a hydrogen atom, a carboxy group, a trimethylsilyl group, or a benzyl group. Specific examples thereof include N-phenylglycines (which may have a substituent in a phenyl group.), N-phenyl iminodiacetic acids (which may have a substituent in a phenyl group), and the like.

(iii) Sulfur-containing compound: compound obtained by substituting nitrogen atoms of the aforementioned amino acetate compound with sulfur atoms and capable of generating active radicals by the same action as that of the amino acetate compound. Specific examples thereof include phenylthioacetic acids (which may have a substituent on a phenyl group) and the like.

(iv) Tin-containing compound: compound obtained by substituting nitrogen atoms of the aforementioned amino acetate compound with tin atoms and capable of generating active radicals by the same action as that of the amino acetate compound (v) Sulfinates: capable of generating active radicals by oxidation. Specific examples thereof include sodium aryl sulfinate and the like.

It is preferable that the image-recording layer contain the borate compound among the above electron-donating polymerization initiators. As the borate compound, a tetraaryl borate compound or a monoalkyltriaryl borate compound is preferable. From the viewpoint of compound stability, a tetraaryl borate compound is more preferable, and a tetraphenyl borate compound is particularly preferable.

A countercation that the borate compound has is not particularly limited, but is preferably an alkali metal ion or a tetraalkyl ammonium ion and more preferably a sodium ion, a potassium ion, or a tetrabutylammonium ion.

Specifically, as the borate compound, for example, sodium tetraphenyl borate is preferable.

From the viewpoint of chemical resistance and UV printing durability, the highest occupied molecular orbital (HOMO) of the electron-donating polymerization initiator used in the present disclosure is preferably −6.00 eV or more, more preferably −5.95 eV or more, and even more preferably −5.93 eV or more.

The upper limit of HOMO is preferably −5.00 eV or less, and more preferably −5.40 eV or less.

In the present disclosure, the highest occupied molecular orbital (HOMO) and the lowest unoccupied molecular orbital (LUMO) are calculated by the following methods.

First, free counterions in the compound as a calculation object are excluded from the calculation object. For example, for a cationic electron-accepting polymerization initiator and a cationic infrared absorber, counteranions are excluded from the calculation object, and for an anionic electron-donating polymerization initiator, countercations are excluded from the calculation object. "Free" mentioned herein means that the compound as an object and the counterions thereof are not covalently linked to each other.

The structural optimization is carried out by DFT (B3LYP/6-31G(d)) using quantum chemical calculation software Gaussian 09.

The molecular orbital (MO) energy is calculated by DFT (B3LYP/6-31+G(d,p)/CPCM (solvent=methanol)) using the structure obtained by the structural optimization.

By the following formula, the MO energy Ebare (unit: hartree) obtained by the above MO energy calculation is converted into Escaled (unit: eV) used as the values of HOMO and LUMO in the present disclosure.

$$Escaled = 0.823168 \times 27.2114 \times Ebare - 1.07634$$

27.2114 is a simply a coefficient for converting hartree into eV, and 0.823168 and −1.07634 are adjustment coefficients. These are determined such that the calculated values of HOMO and LUMO of the compound as a calculation object match the measured values.

Specifically, as the electron-donating polymerization initiator, for example, compounds B-1 to B-8 and other compounds shown below are preferable. It goes without saying that the present disclosure is not limited thereto. In the following chemical formulas, Bu represents a n-butyl group, and Z represents a countercation.

Examples of the countercation represented by $Z^+$ include $Na^+$, $K^+$, $N^+ (Bu)_4$, and the like. Bu represents a n-butyl group.

As the countercation represented by $Z^+$, for example, the onium ion in the aforementioned electron-accepting polymerization initiator is also suitable.

B-1

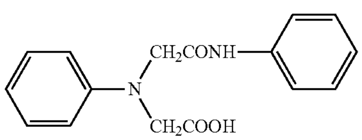

B-2

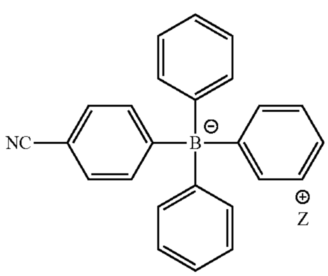

HOMO = 6.052eV

B-3

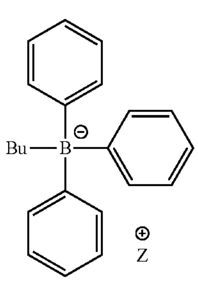

HOMO = 5.772eV

-continued

B-4

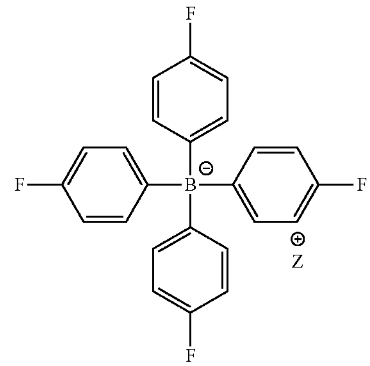

HOMO = 5.957eV

B-5

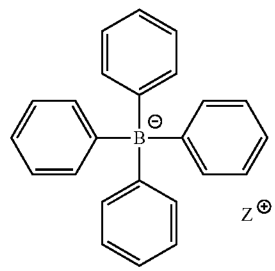

HOMO = 5.905eV

B-6

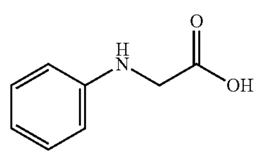

B-7

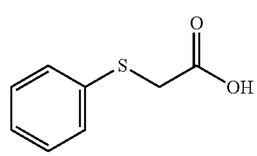

B-8

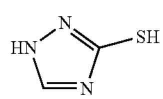

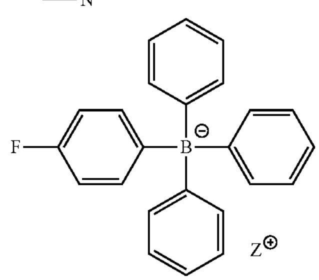

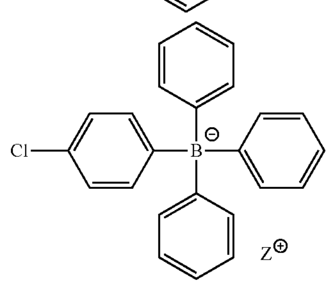

-continued
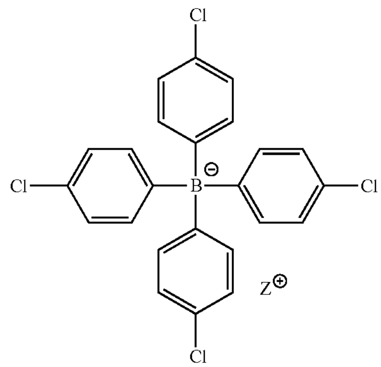
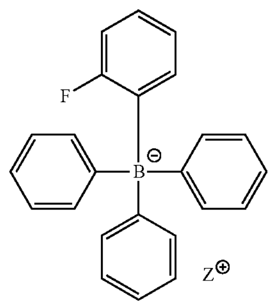
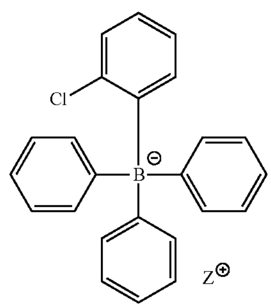
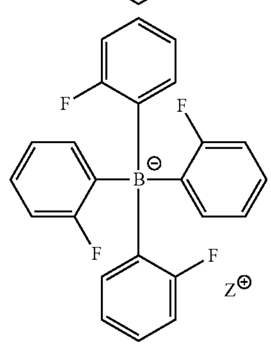
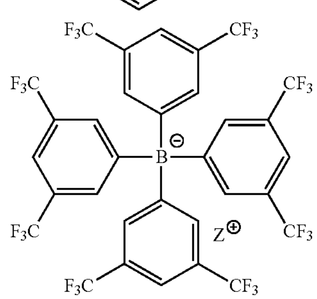
-continued
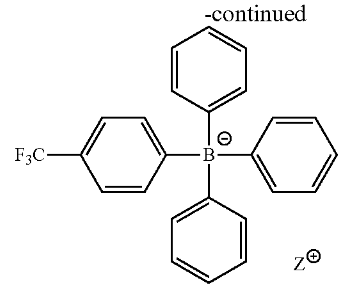
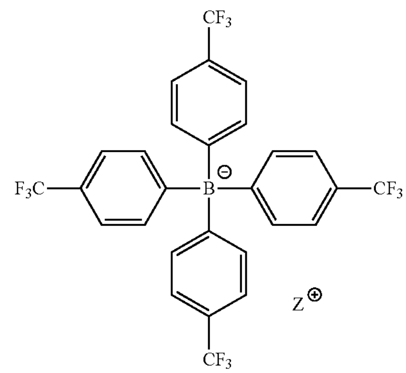
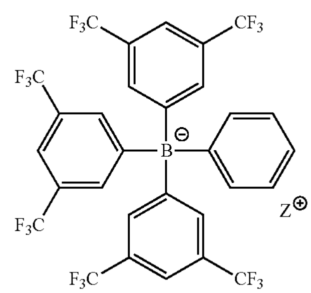
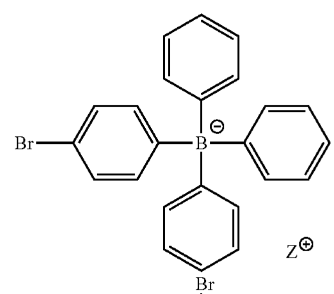
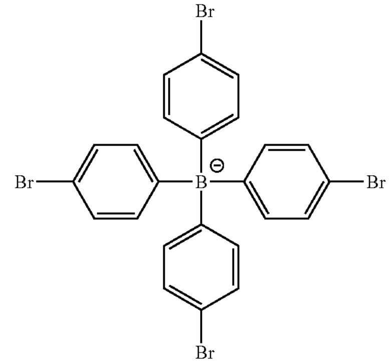

-continued

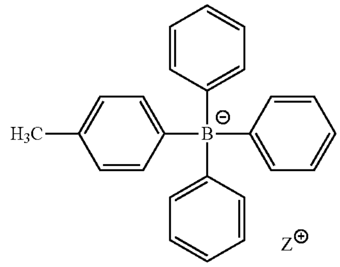

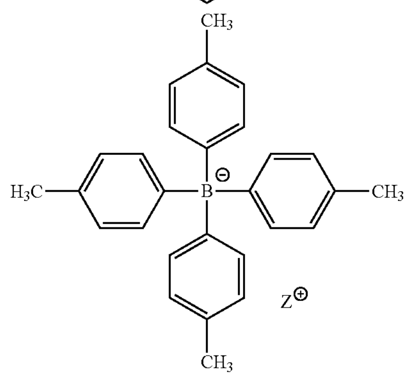

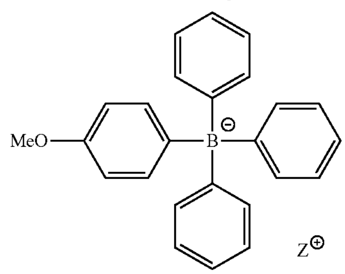

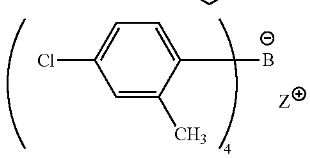

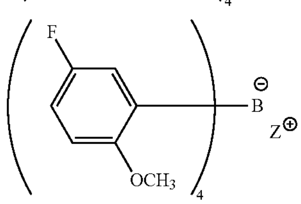

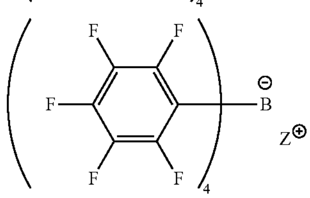

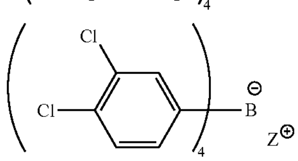

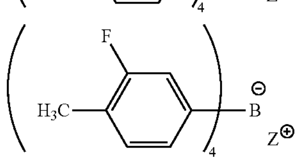

-continued

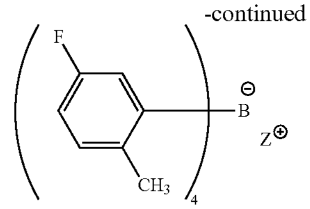

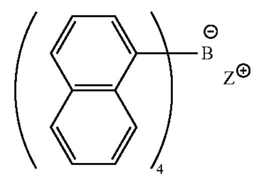

Only one kind of electron-donating polymerization initiator may be added to the image-recording layer, or two or more kinds of electron-donating polymerization initiators may be used in combination.

The content of the electron-donating polymerization initiator with respect to the total mass of the image-recording layer is preferably 0.01% by mass to 30% by mass, more preferably 0.05% by mass to 25% by mass, and even more preferably 0.1% by mass to 20% by mass.

One of the preferred aspects of the present disclosure is an aspect in which the aforementioned electron-accepting polymerization initiator and the aforementioned electron-donating polymerization initiator form a salt.

Specific examples thereof include an aspect in which the aforementioned onium salt compound is a salt formed of an onium ion and an anion of the electron-donating polymerization initiator (for example, a tetraphenyl borate anion). Furthermore, for example, an iodonium borate compound is more preferable which is a salt formed of an iodonium cation of the aforementioned iodonium salt compound (for example, a di-p-tolyl iodonium cation) and a borate anion of the aforementioned electron-donating polymerization initiator.

Specific examples of the aspect in which the electron-accepting polymerization initiator and the electron-donating polymerization initiator form a salt will be shown below. However, the present disclosure is not limited thereto.

(IA-1)

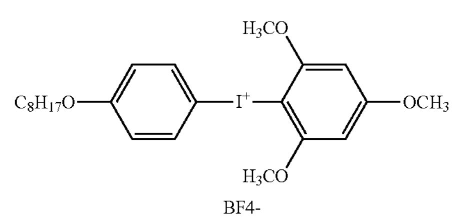

(IA-2)

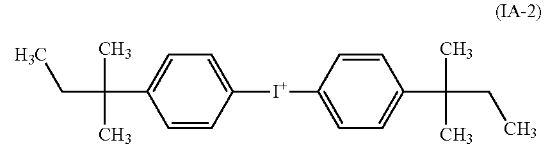

-continued

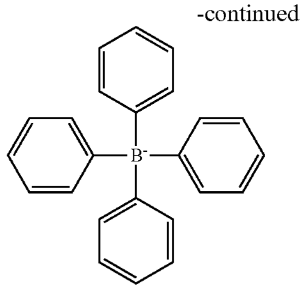

(IA-3)

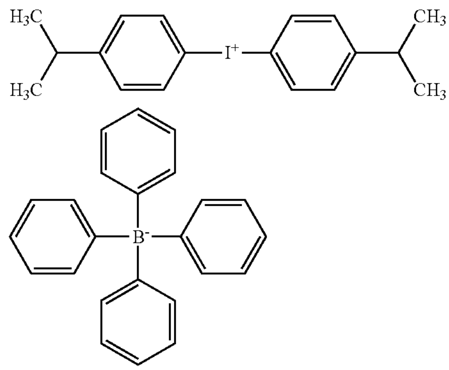

(IA-4)

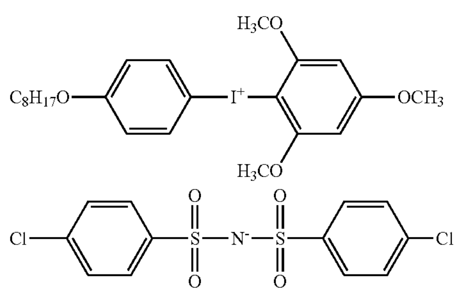

(IA-5)

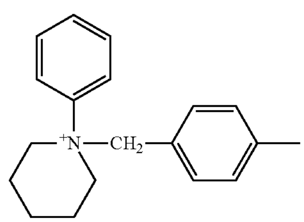

-continued

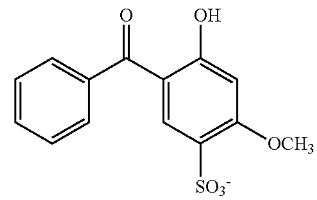

In the present disclosure, in a case where the image-recording layer contains an onium ion and an anion of the aforementioned electron-donating polymerization initiator, the image-recording layer is regarded as containing an electron-accepting polymerization initiator and the electron-donating polymerization initiator described above.

[Relationship Among Electron-Donating Polymerization Initiator, Electron-Accepting Polymerization Initiator, and Infrared Absorber]

The image-recording layer of the present disclosure preferably contains the electron-donating polymerization initiator, the electron-accepting polymerization initiator, and the infrared absorber described above. HOMO of the electron-donating polymerization initiator is preferably −6.0 eV or more, and LUMO of the electron-accepting polymerization initiator is preferably −3.0 eV or less.

More preferred aspects of HOMO of the electron-donating polymerization initiator and LUMO of the electron-accepting polymerization initiator are as described above.

Presumably, in the image-recording layer of the present disclosure, the electron-donating polymerization initiator, the infrared absorber, and the electron-accepting polymerization initiator may exchange energy, for example, in the manner described in the following chemical formula.

Accordingly, it is considered that in a case where HOMO of the electron-donating polymerization initiator is −6.0 eV or more and LUMO of the electron-accepting polymerization initiator is −3.0 eV or less, radicals may be more efficiently generated, and chemical resistance and UV printing durability may be therefore further improved easily.

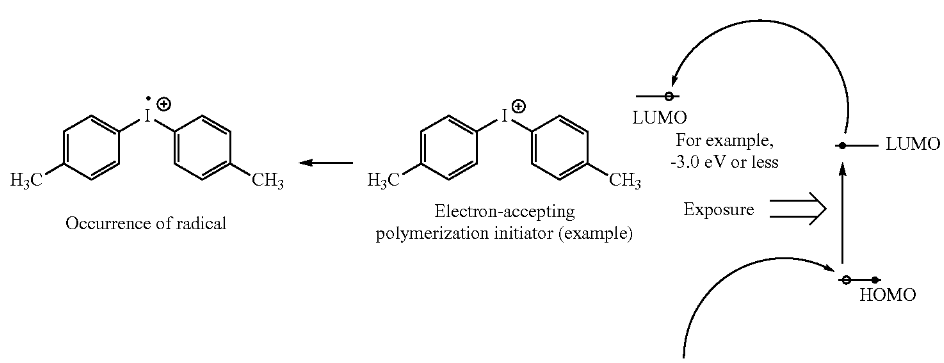

-continued

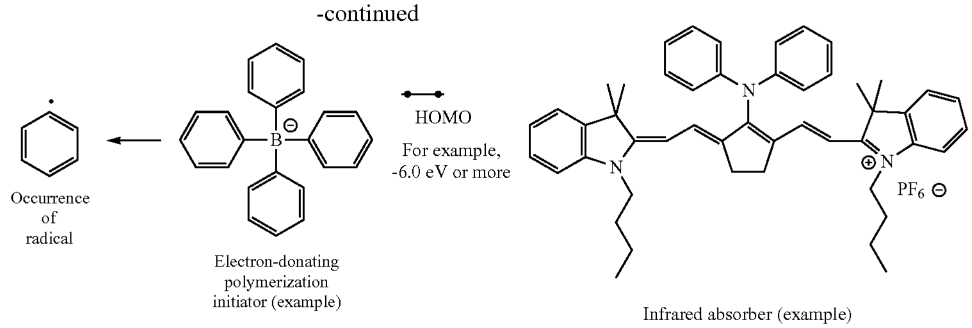

From the viewpoint of UV printing durability and chemical resistance, HOMO of the infrared absorber—HOMO of the electron-donating polymerization initiator is preferably 1.00 eV or less, and more preferably 0.700 eV or less. From the same viewpoint as above, HOMO of the infrared absorber—HOMO of the electron-donating polymerization initiator is preferably −0.200 eV or more, and more preferably 0.100 eV or more.

From the same viewpoint as above, HOMO of the infrared absorber—HOMO of the electron-donating polymerization initiator is preferably equal to 1.00 eV to −0.200 eV, and more preferably equal to 0.700 eV to −0.100 eV. The negative sign means that HOMO of the electron-donating polymerization initiator is higher than HOMO of the infrared absorber.

From the viewpoint of UV printing durability and chemical resistance, LUMO of the electron-accepting polymerization initiator—LUMO of the infrared absorber is preferably 1.00 eV or less, and more preferably 0.700 eV or less. From the same viewpoint as above, LUMO of the electron-accepting polymerization initiator—LUMO of the infrared absorber is preferably −0.200 eV or more, and more preferably 0.100 eV or more.

From the same viewpoint as above, (LUMO of the infrared absorber+LUMO of the electron-accepting polymerization initiator)—LUMO of the infrared absorber is preferably equal to 1.00 eV to −0.200 eV, and more preferably equal to 0.700 eV to −0.100 eV. The negative sign means that LUMO of the infrared absorber is higher than LUMO of the electron-accepting polymerization initiator.

—Particles—

From the viewpoint of UV printing durability, it is preferable that the image-recording layer contain particles.

The particles may be organic particles or inorganic particles. From the viewpoint of UV printing durability, the image-recording layer preferably contains organic particles, and more preferably contains polymer particles.

Known inorganic particles can be used as inorganic particles, and metal oxide particles such as silica particles and titania particles can be suitably used.

The polymer particles are preferably selected from the group consisting of thermoplastic resin particles, thermally reactive resin particles, polymer particles having a polymerizable group, microcapsules encapsulating a hydrophobic compound, and microgel (crosslinked polymer particles). Among these, polymer particles having a polymerizable group or microgel are preferable. In a particularly preferable embodiment, the polymer particles have at least one ethylenically unsaturated polymerizable group. The presence of such polymer particles brings about effects of improving the printing durability of an exposed portion and improving the on-press developability of a non-exposed portion.

From the viewpoint of UV printing durability and on-press developability, the polymer particles are preferably thermoplastic resin particles.

As the thermoplastic resin particles, the thermoplastic polymer particles described in Research Disclosure No. 33303 published in January 1992, JP1997-123387A (JP-H09-123387A), JP1997-131850A (JP-H09-131850A), JP1997-171249A (JP-H09-171249A), JP1997-171250A (JP-H09-171250A), EP931647B, and the like are preferable.

Specific examples of polymers constituting the thermoplastic resin particles include homopolymers or copolymers of monomers of ethylene, styrene, vinyl chloride, methyl acrylate, ethyl acrylate, methyl methacrylate, ethyl methacrylate, vinylidene chloride, acrylonitrile, vinylcarbazole, acrylates or methacrylates having polyalkylene structures, and the like and mixtures of these. For example, copolymers having polystyrene, styrene, and acrylonitrile or polymethyl methacrylate are preferable. The average particle diameter of the thermoplastic resin particle is preferably 0.01 μm to 3.0 μm.

Examples of the thermally reactive resin particles include polymer particles having a thermally reactive group. The thermally reactive polymer particles form a hydrophobilized region through crosslinking by a thermal reaction and the accompanying change in functional groups.

The thermally reactive group in the polymer particles having a thermally reactive group may be a functional group that causes any reaction as long as chemical bonds are formed. The thermally reactive group is preferably a polymerizable group. As the polymerizable group, for example, an ethylenically unsaturated group that causes a radical polymerization reaction (for example, an acryloyl group, a methacryloyl group, a vinyl group, an allyl groups, and the like), a cationically polymerizable group (for example, a vinyl group, a vinyloxy group, an epoxy group, an oxetanyl group, and the like), an isocyanate group or a blocked isocyanate group that causes an addition reaction, an epoxy group, a vinyloxy group, an active hydrogen atom-containing functional group that is a reaction partner thereof (for example, an amino group, a hydroxyl group, a carboxy group, and the like), a carboxy group that causes a condensation reaction, a hydroxyl group or an amino group that is a reaction partner of the carboxy group, an acid anhydride that causes a ring-opening addition reaction, an amino group or a hydroxyl group which is a reaction partner of the acid anhydride, and the like are preferable.

Examples of the microcapsules include microcapsules encapsulating at least some of the constituent components of the image-recording layer as described in JP2001-277740A and JP2001-277742A. The constituent components of the image-recording layer can also be incorporated into the exterior of the microcapsules. In a preferred aspect, the image-recording layer containing microcapsules is composed so that hydrophobic constituent components are encapsulated in the microcapsules and hydrophilic constituent components are incorporated into the exterior of the microcapsules.

The microgel (crosslinked polymer particles) can contain some of the constituent components of the image-recording layer, in at least one of the surface or the interior of the microgel. From the viewpoint of sensitivity of the lithographic printing plate precursor to be obtained and printing durability of the lithographic printing plate to be obtained, reactive microgel having a radically polymerizable group on the surface thereof is particularly preferable.

In order to encapsulate the constituent components of the image-recording layer in microcapsules or microgel, known methods can be used.

As the polymer particles, from the viewpoint of printing durability, antifouling properties, and storage stability of the lithographic printing plate to be obtained, polymer particles are preferable which are obtained by a reaction between a polyvalent isocyanate compound that is an adduct of a polyhydric phenol compound having two or more hydroxyl groups in a molecule and isophorone diisocyanate and a compound having active hydrogen.

As the polyhydric phenol compound, a compound having a plurality of benzene rings having a phenolic hydroxyl group is preferable.

As the compound having active hydrogen, a polyol compound or a polyamine compound is preferable, a polyol compound is more preferable, and at least one kind of compound selected from the group consisting of propylene glycol, glycerin, and trimethylol propane is even more preferable.

As resin particles obtained by the reaction between a polyvalent isocyanate compound that is an adduct of a polyhydric phenol compound having two or more hydroxyl groups in a molecule and isophorone diisocyanate and a compound having active hydrogen, for example, the polymer particles described in paragraphs “0032” to “0095” of JP2012-206495A are preferable.

Furthermore, from the viewpoint of printing durability and solvent resistance of the lithographic printing plate to be obtained, the polymer particles preferably have a hydrophobic main chain and include both i) constitutional unit having a pendant cyano group directly bonded to the hydrophobic main chain and ii) constitutional unit having a pendant group including a hydrophilic polyalkylene oxide segment.

As the hydrophobic main chain, for example, an acrylic resin chain is preferable.

As the pendant cyano group, for example, —[$CH_2CH(C{\equiv}N)$]— or —[$CH_2C(CH_3)(C{\equiv}N)$]— is preferable.

In addition, the constitutional unit having the pendant cyano group can be easily derived from an ethylenically unsaturated monomer, for example, acrylonitrile, or methacrylonitrile, or a combination of these.

Furthermore, as an alkylene oxide in the hydrophilic polyalkylene oxide segment, ethylene oxide or a propylene oxide is preferable, and ethylene oxide is more preferable.

The number of repeating alkylene oxide structures in the hydrophilic polyalkylene oxide segment is preferably 10 to 100, more preferably 25 to 75, and even more preferably 40 to 50.

As the resin particles having a hydrophobic main chain and including both i) constitutional unit having the pendant cyano group directly bonded to the hydrophobic main chain and ii) constitutional unit having a pendant group including the hydrophilic polyalkylene oxide segment, for example, the particles described in paragraphs “0039” to “0068” of JP2008-503365A are preferable.

From the viewpoint of UV printing durability and on-press developability, the polymer particles preferably have a hydrophilic group.

The hydrophilic group is not particularly limited as long as it has a hydrophilic structure, and examples thereof include an acid group such as a carboxy group, a hydroxyl group, an amino group, a cyano group, a polyalkylene oxide structure, and the like.

Among these, from the viewpoint of on-press developability and UV printing durability, a polyalkylene oxide structure is preferable, and a polyethylene oxide structure, a polypropylene oxide structure, or a polyethylene/propylene oxide structure is more preferable.

Furthermore, from the viewpoint of on-press developability and suppressing the occurrence of development residues during on-press development, the polyalkylene oxide structure preferably has a polypropylene oxide structure, and more preferably has a polyethylene oxide structure and a polypropylene oxide structure.

From the viewpoint of printing durability, receptivity, and on-press developability, the hydrophilic group preferably has a cyano group-containing constitutional unit or a group represented by Formula Z, more preferably has a constitutional unit represented by Formula (AN) or a group represented by Formula Z, and particularly preferably has a group represented by Formula Z.

*-Q-W—Y Formula Z

In Formula Z, Q represents a divalent linking group, W represents a divalent group having a hydrophilic structure or a divalent group having a hydrophobic structure, Y represents a monovalent group having a hydrophilic structure or a monovalent group having a hydrophobic structure, either W or Y has a hydrophilic structure, and * represents a binding site with other structures.

(AN)

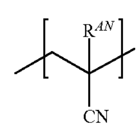

In Formula (AN), RAN represents a hydrogen atom or a methyl group.

From the viewpoint of UV printing durability, the polymer contained in the aforementioned polymer particles preferably has a constitutional unit formed of a cyano group-containing compound.

Generally, it is preferable that a cyano group be introduced as a cyano group-containing constitutional unit into a resin by using a cyano group-containing compound (monomer). Examples of the cyano group-containing compound include acrylonitrile compounds. Among these, for example, (meth)acrylonitrile is suitable.

The cyano group-containing constitutional unit is preferably a constitutional unit formed of an acrylonitrile compound, and more preferably a constitutional unit formed of (meth)acrylonitrile, that is, a constitutional unit represented by Formula (AN).

In a case where the aforementioned polymer includes a polymer having a cyano group-containing constitutional unit, from the viewpoint of UV printing durability, the content of the cyano group-containing constitutional unit which is preferably a constitutional unit represented by Formula (AN) in the polymer having the cyano group-containing constitutional unit with respect to the total mass of the polymer having the cyano group-containing constitutional unit is preferably 5% by mass to 90% by mass, more preferably 20% by mass to 80% by mass, and particularly preferably 30% by mass to 60% by mass.

Furthermore, from the viewpoint of printing durability, receptivity, and on-press developability, the polymer particles preferably include polymer particles having a group represented by Formula Z.

Q in Formula Z is preferably a divalent linking group having 1 to 20 carbon atoms, and more preferably a divalent linking group having 1 to 10 carbon atoms.

Furthermore, Q in Formula Z is preferably an alkylene group, an arylene group, an ester bond, an amide bond, or a group formed by combining two or more of these, and more preferably a phenylene group, an ester bond, or an amide bond.

The divalent group having a hydrophilic structure represented by W in Formula Z is preferably a polyalkyleneoxy group or a group in which —$CH_2CH_2NR^W$— is bonded to one end of a polyalkyleneoxy group. Rw represents a hydrogen atom or an alkyl group.

The divalent group having a hydrophobic structure represented by W in Formula Z is preferably —$R^{WA}$—, —O—$R^{WA}$—O—, —$R^WN$—$R^W$, —OC(═O)—$R^{WA}$—O—, or —OC(═O)—$R^{WA}$—O—. $R^{WA}$ each independently represents a linear, branched, or cyclic alkylene group having 6 to 120 carbon atoms, a haloalkylene group having 6 to 120 carbon atoms, an arylene group having 6 to 120 carbon atoms, an alkarylene group having 6 to 120 carbon atoms (divalent group formed by removing one hydrogen atom from an alkylaryl group), or an aralkylene group having 6 to 120 carbon atoms.

The monovalent group having a hydrophilic structure represented by Y in Formula Z is preferably —OH, —C(═O)OH, a polyalkyleneoxy group having a hydrogen atom or an alkyl group on a terminal, or a group in which —$CH_2CH_2N(R^W)$— is bonded to one terminal of a polyalkyleneoxy group having a hydrogen atom or an alkyl group on the other terminal.

The monovalent group having a hydrophobic structure represented by Y in Formula Z is preferably a linear, branched, or cyclic alkyl group having 6 to 120 carbon atoms, a haloalkyl group having 6 to 120 carbon atoms, an aryl group having 6 to 120 carbon atoms, an alkaryl group having 6 to 120 carbon atoms (alkylaryl group), an aralkyl group having 6 to 120 carbon atoms, —$OR^{WB}$, —C(═O)$OR^{WB}$, or —OC(═O)$R^{WB}$. $R^{WB}$ represents an alkyl group having 6 to 20 carbon atoms.

From the viewpoint of printing durability, receptivity, and on-press developability, in the polymer particles having a group represented by formula Z, W is more preferably a divalent group having a hydrophilic structure, Q is more preferably a phenylene group, an ester bond, or an amide bond, W is more preferably a polyalkyleneoxy group, and Y is more preferably a polyalkyleneoxy group having a hydrogen atom or an alkyl group on a terminal.

From the viewpoint of printing durability and on-press developability, the aforementioned polymer particles preferably include polymer particles having a polymerizable group, and more preferably include polymer particles having a polymerizable group on the particle surface.

Furthermore, from the viewpoint of printing durability, the polymer particles preferably include polymer particles having a hydrophilic group and a polymerizable group.

The polymerizable group may be a cationically polymerizable group or a radically polymerizable group. From the viewpoint of reactivity, the polymerizable group is preferably a radically polymerizable group.

The aforementioned polymerizable group is not particularly limited as long as it is a polymerizable group. From the viewpoint of reactivity, an ethylenically unsaturated group is preferable, a vinylphenyl group (styryl group), a (meth)acryloxy group, or a (meth)acrylamide group is more preferable, and a (meth)acryloxy group is particularly preferable.

In addition, the polymer in the polymer particles having a polymerizable group preferably has a constitutional unit having a polymerizable group.

The polymerizable group may be introduced into the surface of the polymer particles by a polymer reaction.

From the viewpoint of UV printing durability and on-press developability, the image-recording layer preferably contains, as the aforementioned polymer particles, addition polymerization-type resin particles having a dispersible group which more preferably includes a group represented by Formula Z.

Furthermore, from the viewpoint of printing durability, receptivity, on-press developability, and inhibiting the occurrence of development residues during on-press development, the polymer particles preferably contain a resin having a urea bond, more preferably contain a resin having a structure obtained by reacting at least an isocyanate compound represented by Formula (Iso) with water, and particularly preferably contain a resin that has a structure obtained by reacting at least an isocyanate compound represented by Formula (Iso) with water and has a polyethylene oxide structure and a polypropylene oxide structure as polyoxyalkylene structures. Furthermore, the particles containing the resin having a urea bond are preferably microgel.

(Iso)

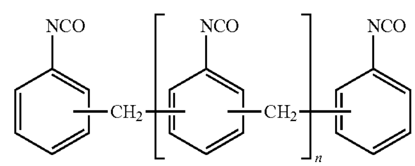

In Formula (Iso), n represents an integer of 0 to 10.

An example of the reaction between the isocyanate compound represented by Formula (Iso) and water is the reaction shown below. In the following example, a 4,4-isomer in which n=0 is used.

As shown below, in a case where the isocyanate compound represented by Formula (Iso) is reacted with water, the isocyanate group is partially hydrolyzed by water and generates an amino group. The generated amino group reacts with the isocyanate group and generates a urea bond, and a dimer is consequently formed. Furthermore, the following reaction is repeated to form a resin having a urea bond.

In the following reaction, by adding a compound (compound having active hydrogen) such as an alcohol compound or an amine compound reactive with an isocyanate group, it is possible to introduce the structure of an alcohol compound, an amine compound, or the like to the resin having a urea bond.

As the compound having active hydrogen, for example, the compounds described above regarding the microgel are preferable.

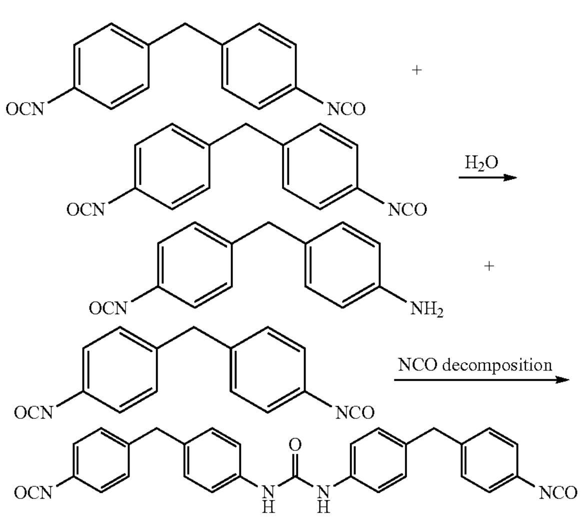

Reaction between NCO and $NH_2$

The resin having a urea bond preferably has an ethylenically unsaturated group, and more preferably has a group represented by Formula (PETA).

(PETA)

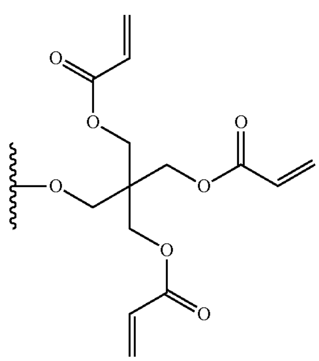

In Formula (PETA), the portion of the wavy line represents a position binding to other structures.

From the viewpoint of UV printing durability and on-press developability, the image-recording layer preferably contains thermoplastic resin particles.

The thermoplastic resin contained in the thermoplastic resin particles is not particularly limited. Examples thereof include polyethylene, polystyrene, polyvinyl chloride, polyvinylidene chloride, polymethyl (meth)acrylate, polyethyl (meth)acrylate, polybutyl (meth)acrylate, polyacrylonitrile, polyvinyl acetate, copolymers of these, and the like. The thermoplastic resin may be in the form of latex.

The thermoplastic resin according to the present disclosure is preferably a thermoplastic resin which melts or softens by heat generated in an exposure step that will be described later and thus forms a part or the entirety of a hydrophobic film forming the recording layer.

From the viewpoint of ink receptivity and UV printing durability, the thermoplastic resin preferably includes a resin A having a constitutional unit formed of an aromatic vinyl compound and a cyano group-containing constitutional unit.

The resin A contained in the thermoplastic resin preferably has a constitutional unit formed of an aromatic vinyl compound.

The aromatic vinyl compound may have a structure composed of an aromatic ring and a vinyl group bonded thereto. Examples of the compound include a styrene compound, a vinylnaphthalene compound, and the like. Among these, a styrene compound is preferable, and styrene is more preferable.

Examples of the styrene compound include styrene, p-methylstyrene, p-methoxystyrene, β-methylstyrene, p-methyl-β-methylstyrene, α-methylstyrene, p-methoxy-β-methylstyrene, and the like. Among these, for example, styrene is preferable.

Examples of the vinylnaphthalene compound include 1-vinylnaphthalene, methyl-1-vinylnaphthalene, β-methyl-1-vinylnaphthalene, 4-methyl-1-vinylnaphthalene, 4-methoxy-1-vinylnaphthalene, and the like. Among these, for example, 1-vinylnaphthalene is preferable.

As the constitutional unit formed of an aromatic vinyl compound, for example, a constitutional unit represented by Formula A1 is preferable.

Formula A1

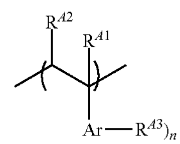

In Formula A1, $R^{A1}$ and $R^{A2}$ each independently represent a hydrogen atom or an alkyl group, Ar represents an aromatic ring group, $R^{A3}$ represents a substituent, and n represents an integer of 0 or greater and equal to or less than the maximum number of substituents of Ar.

In Formula A1, $R^{A1}$ and $R^{A2}$ preferably each independently represent a hydrogen atom or an alkyl group having 1 to 4 carbon atoms, more preferably each independently represent a hydrogen atom or a methyl group, and even more preferably both represent a hydrogen atom.

In Formula A1, Ar is preferably a benzene ring or a naphthalene ring, and more preferably a benzene ring.

In Formula A1, $R^{A3}$ is preferably an alkyl group or an alkoxy group, more preferably an alkyl group having 1 to 4 carbon atoms or an alkoxy group having 1 to 4 carbon atoms, and even more preferably a methyl group or a methoxy group.

In a case where there is a plurality of $R^{A3}$'s in Formula A1, the plurality of $R^{A3}$'s may be the same as or different from each other.

In Formula A1, n is preferably an integer of 0 to 2, more preferably 0 or 1, and even more preferably 0.

In the resin A contained in the thermoplastic resin, from the viewpoint of ink receptivity, the content of the constitutional unit formed of an aromatic vinyl compound is preferably higher than the content of the cyano group-containing constitutional unit that will be described later. The content of the constitutional unit formed of an aromatic vinyl compound with respect to the total mass of the thermoplastic resin is more preferably 15% by mass to 85% by mass, and even more preferably 30% by mass to 70% by mass.

The resin A contained in the thermoplastic resin particles preferably has a cyano group-containing constitutional unit.

Generally, it is preferable that a cyano group be introduced as a cyano group-containing constitutional unit into the resin A by using a cyano group-containing compound (monomer). Examples of the cyano group-containing compound include acrylonitrile compounds. Among these, for example, (meth)acrylonitrile is suitable.

The cyano group-containing constitutional unit is preferably a constitutional unit formed of an acrylonitrile compound, and more preferably a constitutional unit formed of (meth)acrylonitrile.

As the constitutional unit formed of a cyano group-containing compound, for example, a constitutional unit represented by Formula B1 is preferable.

Formula B1

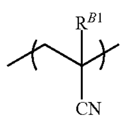

In Formula B1, $R^{B1}$ represents a hydrogen atom or an alkyl group.

In Formula B1, $R^{B1}$ is preferably a hydrogen atom or an alkyl group having 1 to 4 carbon atoms, more preferably a hydrogen atom or a methyl group, and even more preferably a hydrogen atom.

From the viewpoint of ink receptivity, the content of the cyano group-containing constitutional unit in the resin A is preferably less than the content of the constitutional unit formed of an aromatic vinyl compound described above. The content of the cyano group-containing constitutional unit with respect to the total mass of the resin A is preferably 55% by mass to 90% by mass, and more preferably 60% by mass to 85% by mass.

In a case where the resin A included in the thermoplastic resin has the constitutional unit formed of an aromatic vinyl compound and the cyano group-containing constitutional unit, the content ratio between the constitutional unit formed of an aromatic vinyl compound and the cyano group-containing constitutional unit (constitutional unit formed of aromatic vinyl compound: cyano group-containing constitutional unit) is preferably 5:5 to 9:1 and more preferably 6:4 to 8:2 based on mass.

From the viewpoint of UV printing durability and chemical resistance, the resin A contained in the thermoplastic resin particles preferably further has a constitutional unit formed of a N-vinyl heterocyclic compound.

Examples of the N-vinyl heterocyclic compound include N-vinylpyrrolidone, N-vinylcarbazole, N-vinylpyrrole, N-vinylphenothiazine, N-vinylsuccinic acid imide, N-vinylphthalimide, N-vinylcaprolactam, and N-vinylimidazole. Among these, N-vinylpyrrolidone is preferable.

As the constitutional unit formed of a N-vinyl heterocyclic compound, for example, a constitutional unit represented by Formula C1 is preferable.

Formula C1

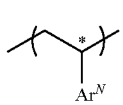

In Formula C1, $Ar^N$ represents a nitrogen atom-containing heterocyclic structure, and the nitrogen atom in $Ar^N$ is bonded to the carbon atom represented by *.

In Formula C1, the heterocyclic structure represented by $Ar^N$ is preferably a pyrrolidone ring, a carbazole ring, a pyrrole ring, a phenothiazine ring, a succinimide ring, a phthalimide ring, a caprolactam ring, or an imidazole ring, and more preferably a pyrrolidone ring.

Furthermore, the heterocyclic structure represented by $Ar^N$ may have a known substituent.

In the resin A, the content of the constitutional unit formed of a N-vinyl heterocyclic compound with respect to the total mass of the resin A is preferably 5% by mass to 50% by mass, and more preferably 10% by mass to 40% by mass.

The resin A contained in the thermoplastic resin particles may contain an acidic group-containing constitutional unit. From the viewpoint of on-press developability and ink receptivity, it is preferable that the resin A do not contain an acidic group-containing constitutional unit.

Specifically, in the thermoplastic resin, the content of the acidic group-containing constitutional unit is preferably 20% by mass or less, more preferably 10% by mass or less, and even more preferably 5% by mass or less. The lower limit of the content is not particularly limited, and may be 0% by mass.

The acid value of the thermoplastic resin is preferably 160 mg KOH/g or less, more preferably 80 mg KOH/g or less, and even more preferably 40 mg KOH/g or less. The lower limit of the acid value is not particularly limited, and may be 0 mg KOH/g.

In the present disclosure, the acid value is determined by the measurement method based on JIS K0070: 1992.

From the viewpoint of ink receptivity, the resin A contained in the thermoplastic resin particles may contain a hydrophobic group-containing constitutional unit.

Examples of the hydrophobic group include an alkyl group, an aryl group, an aralkyl group, and the like.

As the hydrophobic group-containing constitutional unit, a constitutional unit formed of an alkyl (meth)acrylate compound, an aryl (meth)acrylate compound, or an aralkyl (meth)acrylate compound is preferable, and a constitutional unit formed of an alkyl (meth)acrylate compound is more preferable.

The alkyl group in the alkyl (meth)acrylate compound preferably has 1 to 10 carbon atoms. The alkyl group may be linear or branched or may have a cyclic structure. Examples of the alkyl (meth)acrylate compound include methyl (meth) acrylate, ethyl (meth)acrylate, propyl (meth)acrylate, cyclohexyl (meth)acrylate, 2-ethylhexyl (meth)acrylate, dicyclopentanyl (meth)acrylate, and the like.

The aryl group in the aryl (meth)acrylate compound preferably has 6 to 20 carbon atoms. The aryl group is more preferably a phenyl group. The aryl group may further have a known substituent. As the aryl (meth)acrylate compound, for example, phenyl (meth)acrylate is preferable.

The alkyl group in the aralkyl (meth)acrylate compound preferably has 1 to 10 carbon atoms. The alkyl group may be linear or branched or may have a cyclic structure. The aryl group in the aralkyl (meth)acrylate compound preferably has 6 to 20 carbon atoms. The aryl group is more preferably a phenyl group. As the aralkyl (meth)acrylate compound, for example, benzyl (meth)acrylate is preferable.

In the resin A contained in the thermoplastic resin particles, the content of the hydrophobic group-containing constitutional unit with respect to the total mass of the resin A is preferably 5% by mass to 50% by mass, and more preferably 10% by mass to 30% by mass.

From the viewpoint of UV printing durability and on-press developability, the thermoplastic resin contained in the thermoplastic resin particles preferably has a hydrophilic group.

The hydrophilic group is not particularly limited as long as it has a hydrophilic structure, and examples thereof include an acid group such as a carboxy group, a hydroxyl group, an amino group, a cyano group, a polyalkylene oxide structure, and the like.

From the viewpoint of UV printing durability and on-press developability, the hydrophilic group is preferably a group having a polyalkylene oxide structure, a group having a polyester structure, or a sulfonic acid group, more preferably a group having a polyalkylene oxide structure or a sulfonic acid group, and even more preferably a group having a polyalkylene oxide structure.

From the viewpoint of on-press developability, the polyalkylene oxide structure is preferably a polyethylene oxide structure, a polypropylene oxide structure, or a poly(ethylene oxide/propylene oxide) structure.

From the viewpoint of on-press developability, among the above hydrophilic groups, groups having a polypropylene oxide structure as a polyalkylene oxide structure are preferable, and groups having a polyethylene oxide structure and a polypropylene oxide structure are more preferable.

From the viewpoint of on-press developability, the number of alkylene oxide structures in the polyalkylene oxide structure is preferably 2 or more, more preferably 5 or more, even more preferably 5 to 200, and particularly preferably 8 to 150.

From the viewpoint of on-press developability, as the aforementioned hydrophilic group, a group represented by Formula Z is preferable.

From the viewpoint of improving UV printing durability, chemical resistance, and on-press developability, the resin A contained in the thermoplastic resin particles preferably has a hydrophilic group-containing constitutional unit.

Examples of the hydrophilic group include —OH, —CN, —CONR$^1$R$^2$, —NR$^2$COR$^1$ (R$^1$ and R$^2$ each independently represent a hydrogen atom, an alkyl group, an alkenyl group, or an aryl group, R$^1$ and R$^2$ may be bonded to each other to form a ring), —NR$^3$R$^4$, —N$^+$R$^3$R$^4$R$^5$X$^-$ (R$^3$ to R$^5$ each independently represent an alkyl group of 1 to 8 carbon atoms, and X$^-$ represents a counteranion), a group represented by Formula PO, a hydrophilic group that the thermoplastic resin contained in the thermoplastic resin particles preferably has, and the like.

Among these hydrophilic groups, —CONR$^1$R$^2$ or a group represented by Formula PO is preferable, and a group represented by Formula PO is more preferable.

Formula PO

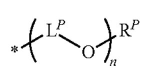

In Formula PO, $L^P$ each independently represents an alkylene group, $R^P$ represents a hydrogen atom or an alkyl group, and n represents an integer of 1 to 100.

In Formula PO, $L^P$ preferably each independently represents an ethylene group, a 1-methylethylene group, or a 2-methylethylene group, and more preferably each independently represents an ethylene group.

In Formula PO, $R^P$ is preferably a hydrogen atom or an alkyl group having 1 to 18 carbon atoms, more preferably a hydrogen atom or an alkyl group having 1 to 10 carbon atoms, even more preferably a hydrogen atom or an alkyl group having 1 to 4 carbon atoms, and particularly preferably a hydrogen atom or a methyl group.

In Formula PO, n is preferably an integer of 1 to 10, and more preferably an integer of 1 to 4.

In the resin A, the content of the hydrophilic group-containing constitutional unit with respect to the total mass of the resin A is preferably 5% by mass to 60% by mass, and more preferably 10% by mass to 30% by mass.

The resin A contained in the thermoplastic resin particles may further contain other constitutional units. The resin A can contain, as those other constitutional units, constitutional units other than the constitutional units described above without particular limitations. Examples thereof include constitutional units formed of an acrylamide compound, a vinyl ether compound, and the like.

Examples of the acrylamide compound include (meth)acrylamide, N-methyl (meth)acrylamide, N-ethyl (meth)acrylamide, N-propyl (meth)acrylamide, N-butyl (meth)acrylamide, N,N'-dimethyl (meth)acrylamide, N,N'-diethyl (meth)acrylamide, N-hydroxyethyl (meth)acrylamide, N-hydroxypropyl (meth)acrylamide, N-hydroxybutyl (meth)acrylamide, and the like.

Examples of the vinyl ether compound include methyl vinyl ether, ethyl vinyl ether, propyl vinyl ether, n-butyl vinyl ether, tert-butyl vinyl ether, 2-ethylhexyl vinyl ether, n-nonyl vinyl ether, lauryl vinyl ether, cyclohexyl vinyl ether, cyclohexyl methyl vinyl ether, 4-methylcyclohexyl methyl vinyl ether, benzyl vinyl ether, dicyclopentenyl vinyl ether, 2-dicyclopentenoxyethyl vinyl ether, methoxyethyl vinyl ether, ethoxyethyl vinyl ether, butoxyethyl vinyl ether, methoxyethoxyethyl vinyl ether, ethoxyethoxyethyl vinyl ether, methoxypolyethylene glycol vinyl ether, tetrahydrofurfuryl vinyl ether, 2-hydroxyethyl vinyl ether, 2-hydroxypropyl vinyl ether, 4-hydroxybutyl vinyl ether, 4-hydroxymethylcyclohexylmethyl vinyl ether, diethylene glycol monovinyl ether, polyethylene glycol vinyl ether, chloroethyl vinyl ether, chlorobutyl vinyl ether, chloroethoxyethyl vinyl ether, phenylethyl vinyl ether, phenoxypolyethylene glycol vinyl ether, and the like.

In the thermoplastic resin, the content of those other constitutional units with respect to the total mass of the thermoplastic resin is preferably 5% by mass to 50% by mass, and more preferably 10% by mass to 30% by mass.

From the viewpoint of UV printing durability and ink receptivity, the glass transition temperature (Tg) of the thermoplastic resin is preferably 60° C. to 150° C., more preferably 80° C. to 140° C., and even more preferably 90° C. to 130° C.

In a case where the thermoplastic resin particles contain two or more kinds of thermoplastic resins, the value obtained by the FOX equation that will be described later is referred to as the glass transition temperature of the thermoplastic resin.

In the present disclosure, the glass transition temperature of a resin can be measured by differential scanning calorimeter (DSC).

Specifically, the glass transition temperature is measured according to the method described in JIS K 7121 (1987) or JIS K 6240 (2011). In the present specification, an extrapolated glass transition initiation temperature (hereinafter, called Tig in some cases) is used as the glass transition temperature.

Specifically, the glass transition temperature is measured by the method described below.

In order to determine the glass transition temperature, the device is kept at a temperature approximately 50° C. lower than the expected Tg of the resin until the device stabilizes. Then, the resin is heated at a heating rate of 20° C./min to a temperature approximately 30° C. higher than the temperature at which the glass transition ends, and a differential thermal analysis (DTA) curve or a DSC curve is plotted.

The extrapolated glass transition initiation temperature (Tig), that is, the glass transition temperature Tg in the present specification is determined as a temperature at an intersection point between a straight line that is obtained by extending the baseline of a low temperature side in the DTA curve or the DSC curve to a high temperature side and a tangent line that is drawn at a point where the slope of the curve of a portion in which the glass transition temperature stepwise changes is maximum.

In a case where the thermoplastic resin particles contain two or more kinds of thermoplastic resins, Tg of the thermoplastic resins contained in the thermoplastic resin particles is determined as follows.

In a case where Tg1 (K) represents Tg of a first thermoplastic resin, W1 represents the mass ratio of the first thermoplastic resin to the total mass of thermoplastic resin components in the thermoplastic resin particles, Tg2 (K) represents Tg of a second resin, and W2 represents the mass ratio of the second resin to the total mass of thermoplastic resin components in the thermoplastic resin particles, Tg0 (K) of the thermoplastic resin particles can be estimated according to the following FOX equation.

$$1/Tg0 = (W1/Tg1) + (W2/Tg2) \qquad \text{FOX equation}$$

Furthermore, in a case where the thermoplastic resin particles contain 3 kinds of resins or in a case where 3 kinds of thermoplastic resin particles containing different types of thermoplastic resins are contained in a pretreatment liquid, provided that Tgn (K) represents Tg of nth resin and Wn represents the mass ratio of the nth resin to the total mass of resin components in the thermoplastic resin particles, Tg of the thermoplastic resin particles can be estimated according to the following equation just as in the case described above.

$$1/Tg0 = (W1/Tg1) + (W2/Tg2) + (W3/Tg3) \ldots + (Wn/Tgn) \qquad \text{FOX equation}$$

In the present specification, Tg is a value measured by a differential scanning calorimeter (DSC). As the differential scanning calorimeter (DSC), for example, EXSTAR 6220 manufactured by SII NanoTechnology Inc. can be used.

From the viewpoint of UV printing durability, the arithmetic mean particle diameter of the thermoplastic resin particles is preferably 1 nm or more and 200 nm or less, more preferably 3 nm or more and less than 80 nm, and even more preferably 10 nm or more and 49 nm or less.

Unless otherwise specified, the arithmetic mean particle diameter of the thermoplastic resin particles in the present disclosure refers to a value measured by a dynamic light scattering method (DLS). The arithmetic mean particle diameter of the thermoplastic resin particles by DLS is measured using Brookhaven BI-90 (manufactured by Brookhaven Instruments) according to the manual of the instrument.

The weight-average molecular weight of the thermoplastic resin contained in the thermoplastic resin particles is preferably 3,000 to 300,000, and more preferably 5,000 to 100,000.

The method for manufacturing the thermoplastic resin contained in the thermoplastic resin particles is not particularly limited. The thermoplastic resin can be manufactured by known methods.

For example, the thermoplastic resin is obtained by polymerizing a styrene compound, an acrylonitrile compound, and at least one kind of optional compound selected from the group consisting of the aforementioned N-vinyl heterocyclic compound, a compound used for forming the aforementioned ethylenically unsaturated group-containing constitutional unit, a compound used for forming the aforementioned acidic group-containing constitutional unit, a compound used for forming the aforementioned hydrophobic group-containing constitutional unit, and a compound used for forming the aforementioned other constitutional units by known methods.

Specific examples of the thermoplastic resin contained in the thermoplastic resin particles are shown in the following tables. However, the thermoplastic resin used in the present disclosure is not limited thereto.

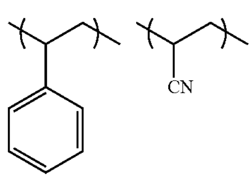

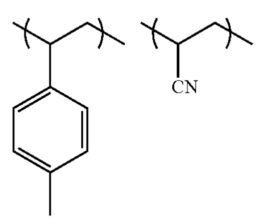

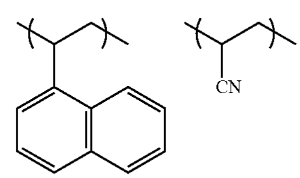

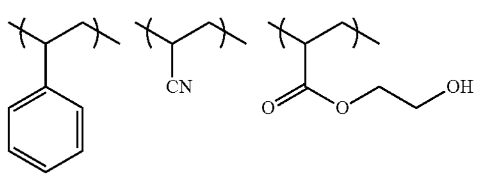

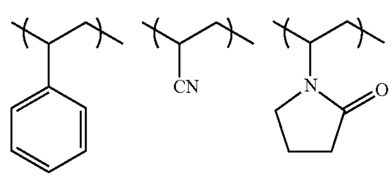

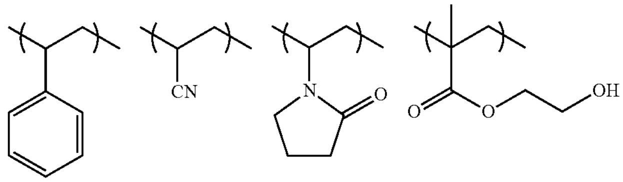

-continued

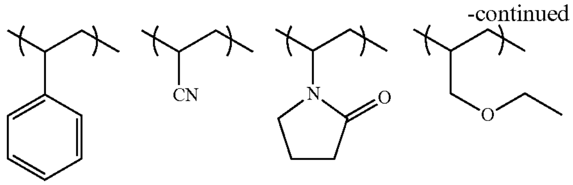

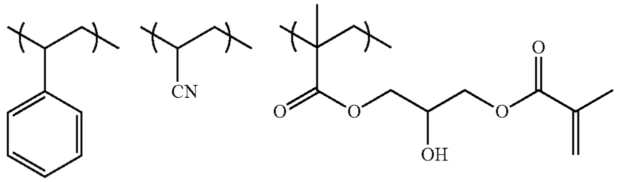

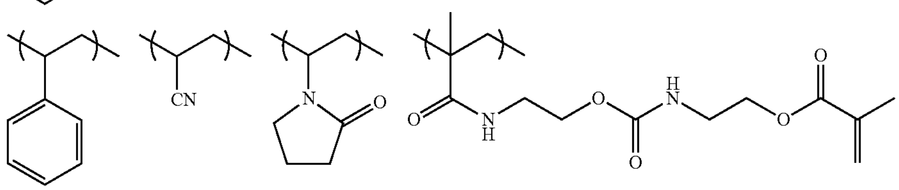

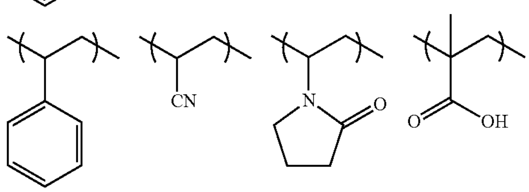

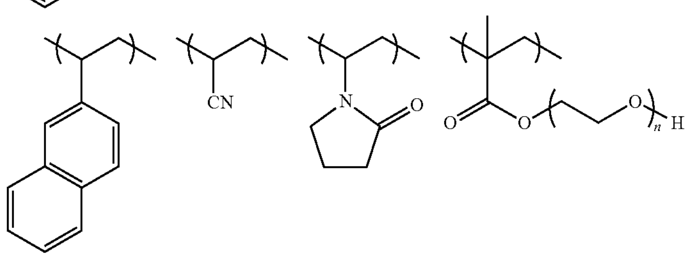

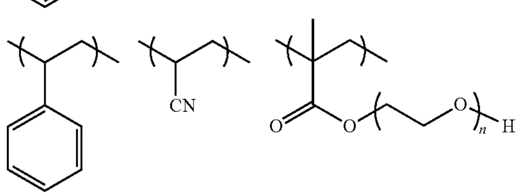

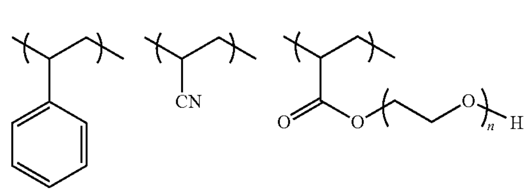

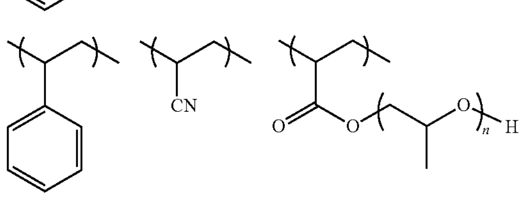

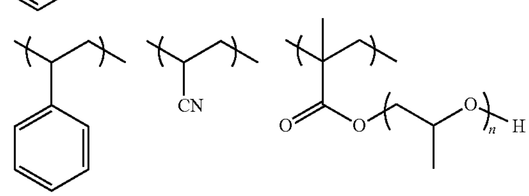

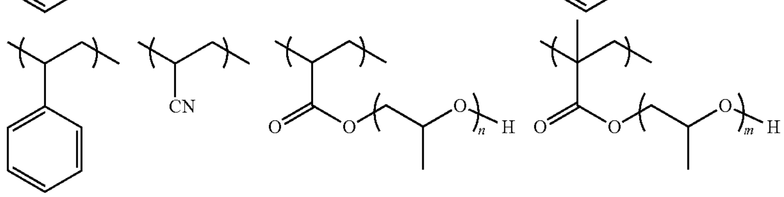

The content ratio of the constitutional units in the above specific examples can be appropriately changed according to the preferred range of the content of each of the constitutional units described above.

Furthermore, the weight-average molecular weight of each of the compounds shown in the above specific examples can be appropriately changed according to the preferred range of the weight-average molecular weight of the thermoplastic resin described above.

The average particle diameter of the above particle is preferably 0.01 μm to 3.0 μm, more preferably 0.03 μm to 2.0 μm, and even more preferably 0.10 nm to 1.0 nm. In a case where the particle diameter is in this range, excellent resolution and temporal stability are obtained.

In the present disclosure, the average primary particle diameter of the above particles is measured using a light scattering method or by capturing an electron micrograph of the particles, measuring the particle diameter of a total of 5,000 particles in the photograph, and calculating the average thereof. For non-spherical particles, the value of particle diameter of spherical particles having the same area as the area of the particles on the photograph is adopted as the particle diameter.

Note that unless otherwise specified, the average particle diameter in the present disclosure means a volume average particle diameter.

The image-recording layer may contain only one kind of particles, particularly, one kind of polymer particles or two or more kinds of polymer particles.

From the viewpoint of on-press developability and UV printing durability, the content of particles, particularly, the content of polymer particles in the image-recording layer with respect to the total mass of the image-recording layer is preferably 5% by mass to 90% by mass, more preferably 10% by mass to 90% by mass, even more preferably 20% by mass to 90% by mass, and particularly preferably 50% by mass to 90% by mass.

Furthermore, from the viewpoint of on-press developability and UV printing durability, the content of the polymer particles in the image-recording layer with respect to the total mass of components having a molecular weight of 3,000 or more in the image-recording layer is preferably 20% by mass to 100% by mass, more preferably 35% by mass to 100% by mass, even more preferably 50% by mass to 100% by mass, and particularly preferably 80% by mass to 100% by mass.

—Binder Polymer—

The image-recording layer may contain a binder polymer.

The aforementioned thermoplastic resin particles and polymer particles do not correspond to another binder polymer described above. That is, the aforementioned another binder polymer is a polymer that is not in the form of particles.

The aforementioned another binder polymer is preferably a (meth)acrylic resin, a polyvinyl acetal resin, or a polyurethane resin.

Among these, as the binder polymer, known binder polymers that can be used in an image-recording layer in lithographic printing plate precursors can be suitably used. As an example, a binder polymer that is used for an on-press development-type lithographic printing plate precursor (hereinafter, also called binder polymer for on-press development) will be specifically described.

As the binder polymer for on-press development, a binder polymer having an alkylene oxide chain is preferable. The binder polymer having an alkylene oxide chain may have a poly(alkylene oxide) moiety in a main chain or side chain. In addition, the binder polymer may be a graft polymer having poly(alkylene oxide) in a side chain or a block copolymer of a block constituted with a poly(alkylene oxide)-containing repeating unit and a block constituted with an (alkylene oxide)-free repeating unit.

As a binder polymer having a poly(alkylene oxide) moiety in the main chain, a polyurethane resin is preferable. In a case where the binder polymer has a poly(alkylene oxide) moiety in the side chain, examples of polymers include a (meth)acrylic resin, a polyvinyl acetal resin, a polyurethane resin, a polyurea resin, a polyimide resin, a polyamide resin, an epoxy resin, a polystyrene resin, a novolac-type phenol resin, a polyester resin, synthetic rubber, and natural rubber. Among these, a (meth)acrylic resin is particularly preferable.

In addition, as the binder polymer, for example, a polymer compound is also preferable which has a polyfunctional thiol having 6 or more and 10 or less functional groups as a nucleus and a polymer chain that is bonded to the nucleus by a sulfide bond and has a polymerizable group (hereinafter, this compound will be also called star-shaped polymer compound). As the star-shaped polymer compound, for example, the compounds described in JP2012-148555A can be preferably used.

Examples of the star-shaped polymer compound include the compound described in JP2008-195018A that has a polymerizable group such as an ethylenically unsaturated bond for improving the film hardness of an image area in a main chain or side chain and preferably in a side chain. The polymerizable group forms a crosslink between polymer molecules, which facilitates curing.

As the polymerizable group, an ethylenically unsaturated group such as a (meth)acryloyl group, a vinyl group, an allyl group, or a vinyl phenyl group (styryl group), an epoxy group, or the like is preferable, a (meth)acryloyl group, a vinyl group, or a vinyl phenyl group (styryl group) is more preferable from the viewpoint of polymerization reactivity, and a (meth)acryloyl group is particularly preferable. These groups can be introduced into the polymer by a polymer reaction or copolymerization. For example, it is possible to use a reaction between a polymer having a carboxy group in a side chain and glycidyl methacrylate or a reaction between a polymer having an epoxy group and an ethylenically unsaturated group-containing carboxylic acid such as methacrylic acid. These groups may be used in combination.

The molecular weight of the binder polymer that is a weight-average molecular weight (Mw) expressed in terms of polystyrene by GPC is preferably 2,000 or more, more preferably 5,000 or more, and even more preferably 10,000 to 300,000.

If necessary, a hydrophilic polymer such as polyacrylic acid or polyvinyl alcohol described in JP2008-195018A can be used in combination. In addition, a lipophilic polymer and a hydrophilic polymer can be used in combination.

From the viewpoint of UV printing durability and on-press developability, the image-recording layer preferably contains a polymer having a constitutional unit formed of an aromatic vinyl compound, and more preferably contains a polymer having a constitutional unit formed of an aromatic vinyl compound and an infrared absorber which decomposes by exposure to infrared.

From the viewpoint of inhibiting on-press developability from deteriorating over time, the glass transition temperature (Tg) of the binder polymer used in the present disclosure is preferably 50° C. or higher, more preferably 70° C. or higher, even more preferably 80° C. or higher, and particularly preferably 90° C. or higher.

Furthermore, from the viewpoint of ease of permeation of water into the image-recording layer, the upper limit of the glass transition temperature of the binder polymer is preferably 200° C., and more preferably 120° C. or lower.

From the viewpoint of further inhibiting on-press developability from deteriorating over time, as the binder polymer having the above glass transition temperature, polyvinyl acetal is preferable.

Polyvinyl acetal is a resin obtained by acetalizing hydroxyl groups of polyvinyl alcohol with an aldehyde.

Particularly, polyvinyl butyral is preferable which is obtained by acetalizing (that is, butyralizing) hydroxyl groups of polyvinyl alcohol with butyraldehyde.

As polyvinyl acetal, a compound having a constitutional unit represented by the following (a) is preferable which is obtained by acetalizing hydroxyl groups of polyvinyl alcohol with an aldehyde.

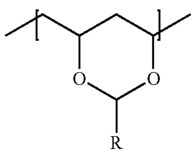

(a)

R represents a residue of aldehyde used for acetalization.

Examples of R include a hydrogen atom, an alkyl group, and an ethylenically unsaturated group which will be described later.

The content of the constitutional unit represented by (a) (also described as the amount of ethylene groups in the main chain contained in the constitutional unit represented by (a), which is also called degree of acetalization) with respect to the total content of constitutional units of the polyvinyl acetal (total amount of ethylene groups in the main chain) is preferably 50 mol % to 90 mol %, more preferably 55 mol % to 85 mol %, and even more preferably 55 mol % to 80 mol %.

The degree of acetalization is a value obtained by dividing the amount of ethylene groups to which acetal groups are bonded (amount of ethylene groups in the main chain contained in the constitutional unit represented by (a)) by the total amount of ethylene groups in the main chain and expressing the thus obtained molar fraction as a percentage.

The same shall be applied to the content of each constitutional unit of polyvinyl acetal which will be described later.

From the viewpoint of improving printing durability, the polyvinyl acetal preferably has an ethylenically unsaturated group.

The ethylenically unsaturated group that the polyvinyl acetal has is not particularly limited. From the viewpoint of reactivity, on-press developability, and printing durability, the ethylenically unsaturated group is preferably at least one kind of group selected from the group consisting of a vinyl phenyl group (styryl group), a vinyl ester group, a vinyl ether group, an allyl group, a (meth)acryloxy group, and a (meth)acrylamide group. Among these, a vinyl group, an allyl group, a (meth)acryloxy group, and the like are more preferable.

From the viewpoint of improving printing durability, the polyvinyl acetal preferably has an ethylenically unsaturated group-containing constitutional unit.

The ethylenically unsaturated group-containing constitutional unit may be the aforementioned constitutional unit having an acetal ring or a constitutional unit other than the constitutional unit having an acetal ring.

Particularly, from the viewpoint of increasing crosslink density during exposure, the polyvinyl acetal is preferably a compound in which an ethylenically unsaturated group is introduced into an acetal ring. That is, it is preferable that the constitutional unit represented by (a) have an ethylenically unsaturated group as R.

In a case where the ethylenically unsaturated group-containing constitutional unit is a constitutional unit other than the constitutional unit having an acetal ring, for example, the ethylenically unsaturated group-containing constitutional unit may be a constitutional unit having an acrylate group, specifically, a constitutional unit represented by (d).

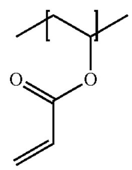

(d)

In a case where the ethylenically unsaturated group-containing constitutional unit is a constitutional unit other than the constitutional unit having an acetal ring, the content of the ethylenically unsaturated group-containing constitutional unit (also called amount of acrylate groups) with respect to the total content of constitutional units of the polyvinyl acetal is preferably 1 mol % to 15 mol %, and more preferably 1 mol % to 10 mol %.

From the viewpoint of on-press developability, the polyvinyl acetal preferably further has a hydroxyl group-containing constitutional unit. That is, the polyvinyl acetal preferably contains a constitutional unit derived from vinyl alcohol.

Examples of the hydroxyl group-containing constitutional unit include a constitutional unit represented by (b).

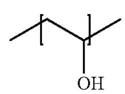

(b)

From the viewpoint of on-press developability, the content of the constitutional unit represented by (b) (also called amount of hydroxyl groups) with respect to the total content of constitutional units of the polyvinyl acetal is preferably 5 mol % to 50 mol %, more preferably 10 mol % to 40 mol %, and even more preferably 20 mol % to 40 mol %.

The polyvinyl acetal may further have other constitutional units.

Examples of those other constitutional units include a constitutional unit having an acetyl group, specifically, a constitutional unit represented by (c).

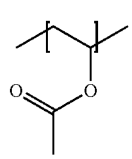

(c)

The content of the constitutional unit represented by (c) (also called amount of acetyl groups) with respect to the total content of constitutional units of the polyvinyl acetal is preferably 0.5 mol % to 10 mol %, more preferably 0.5 mol % to 8 mol %, and even more preferably 1 mol % to 3 mol %.

The degree of acetalization, the amount of acrylate groups, the amount of hydroxyl groups, and the amount of acetyl groups can be determined as follows.

That is, by $^1$H NMR spectroscopy, the content expressed as mol % is calculated from the ratio of peak surface area of protons of a methyl or methylene moiety of acetal, a methyl moiety of an acrylate group, and a methyl moiety of a hydroxyl group and an acetyl group.

The weight-average molecular weight of the polyvinyl acetal is preferably 18,000 to 150,000.

The solubility parameter (also called SP value) of the polyvinyl acetal is preferably 17.5 MPa$^{1/2}$ to 20.0 MPa$^{1/2}$, and more preferably 18.0 MPa$^{1/2}$ to 19.5 MPa$^{1/2}$.

In the present disclosure, as "solubility parameter (unit: (MPa)$^{1/2}$)", the Hansen solubility parameters are used.

The Hansen solubility parameters are obtained by dividing the solubility parameters introduced by Hildebrand into three components, a dispersion element δd, a polarity element δp, and a dispersion element δh, and expressing the parameters in a three-dimensional space. In the present disclosure, the solubility parameters (hereinafter, also called SP value) are expressed as δ (unit: (MPa)$^{1/2}$), and a value calculated by the following equation is used.

$$\delta(\text{MPa})^{1/2} = (\delta d^2 + \delta p^2 + \delta h^2)^{1/2}$$

The dispersion element δd, the polarity element δp, and the hydrogen bond element δh of various substances have been found by Hansen and his successors, and are described in detail in the Polymer Handbook (fourth edition), VII-698 to 711. The Hansen solubility parameters are also specifically described in the document "Hansen Solubility Parameters; A Users Handbook (CRC Press, 2007)" written by Charles M. Hansen.

In the present disclosure, as the Hansen solubility parameters of a partial structure of a compound, it is also possible to use values estimated from the chemical structure by using the computer software "Hansen Solubility Parameters in Practice (HSPiP ver.4.1.07)".

Furthermore, in the present disclosure, in a case where a compound is an addition polymerization-type polymer, a polycondensation-type polymer, or the like, the SP value of the compound is expressed as the total SP value obtained by multiplying the SP values of monomer units by molar fractions. Furthermore, in a case where a compound is a low-molecular-weight compound having no monomer unit, the SP value is expressed as the total solubility parameter of the compound.

In the present disclosure, the SP value of a polymer may be calculated from the molecular structure of the polymer by the Hoy method described in Polymer Handbook (fourth edition).

Specific examples of the polyvinyl acetal are shown in the following [P-1 to P-3]. However, the polyvinyl acetal used in the present disclosure is not limited thereto.

In the following structures, "1" is 50 mol % to 90 mol %, "m" is 0.5 mol % to 10 mol %, "n" is 5 mol % to 50 mol %, and "o" is 1 mol % to 15 mol %.

P-1

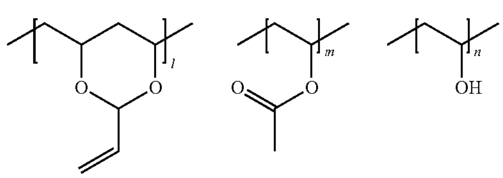

-continued

P-2

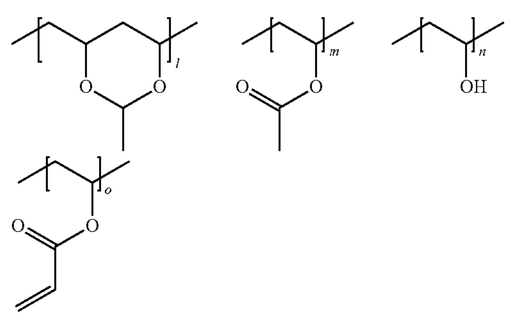

P-3

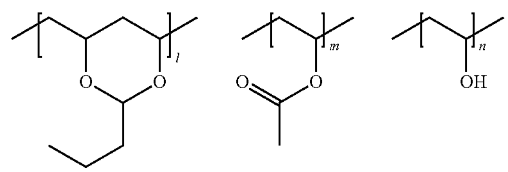

As the polyvinyl acetal, commercially available products can be used.

Examples of the commercially available products of the polyvinyl acetal include S-LEC series manufactured by SEKISUI CHEMICAL CO., LTD. (specifically, S-LEC BX-L, BX-1, BX-5, BL-7Z, BM-1, BM-5, BH-6, BH-3, and the like).

The image-recording layer in the present disclosure preferably contains a resin having a fluorine atom, and more preferably contains a fluoroaliphatic group-containing copolymer.

In a case where the resin having a fluorine atom, particularly, the fluoroaliphatic group-containing copolymer is used, it is possible to inhibit surface abnormalities resulting from foaming during the formation of the image-recording layer and to improve the condition of the coating surface, and the formed image-recording layer has higher ink receptivity.

In addition, the image-recording layer containing the fluoroaliphatic group-containing copolymer has high gradation and highly sensitive, for example, to laser light. Therefore, the obtained lithographic printing plate exhibits excellent fogging properties by scattered light, reflected light, and the like and has excellent printing durability.

The fluoroaliphatic group-containing copolymer preferably has a constitutional unit formed of a compound represented by any of Formula (F1) and Formula (F2).

(F1)

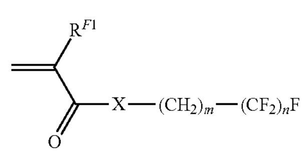

(F2)

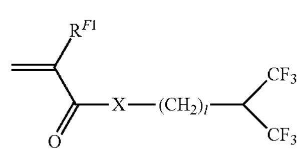

In Formula (F1) and Formula (F2), $R^{F1}$ each independently represents a hydrogen atom or a methyl group, X each independently represents an oxygen atom, a sulfur atom, or —N($R^{F2}$)—, m represents an integer of 1 to 6, n represents an integer of 1 to 10, 1 represents an integer of 0 to 10, and $R^{F2}$ represents a hydrogen atom or an alkyl group having 1 to 4 carbon atoms.

The alkyl group having 1 to 4 carbon atoms represented by $R^{F2}$ in Formula (F1) and Formula (F2) is preferably a methyl group, an ethyl group, a n-propyl group, or a n-butyl group, and more preferably a hydrogen atom or a methyl group.

X in Formula (F1) and Formula (F2) is preferably an oxygen atom.

m in Formula (F1) is preferably 1 or 2, and more preferably 2.

n in Formula (F1) is preferably 2, 4, 6, 8, or 10, and more preferably 4 or 6.

l in Formula (F1) is preferably 0.

Specific examples of the monomers having a fluorine atom used in the resin having a fluorine atom will be shown below. However, the present disclosure is not limited thereto.

F-1

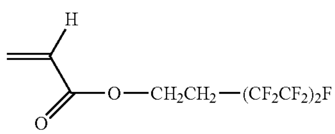

F-2

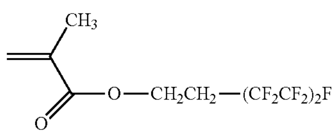

F-3

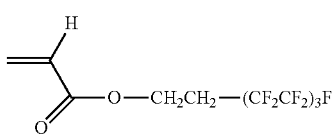

F-4

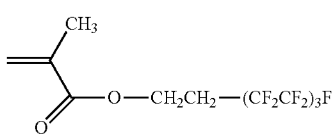

F-5

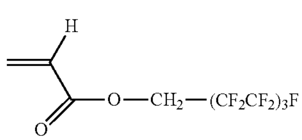

F-6

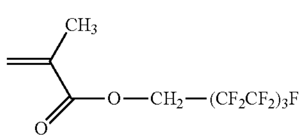

F-7

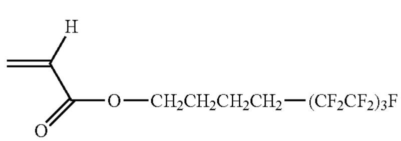

-continued

F-8

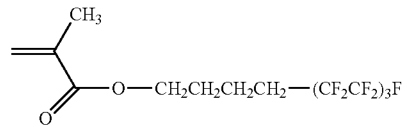

F-9

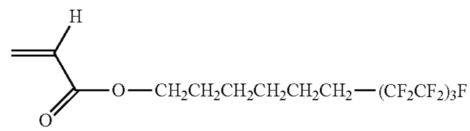

F-10

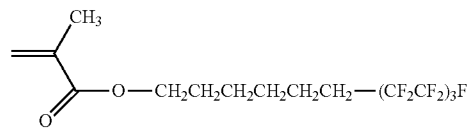

F-11

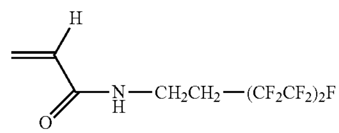

F-12

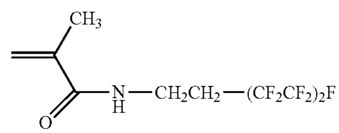

F-13

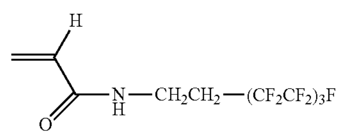

F-14

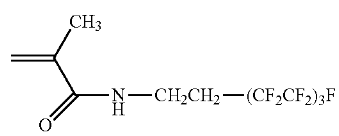

F-15

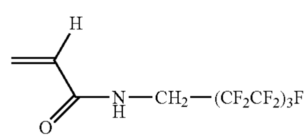

F-16

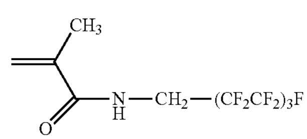

F-17

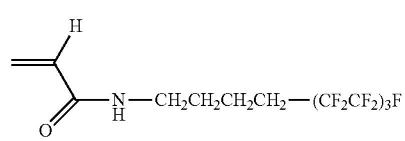

F-18

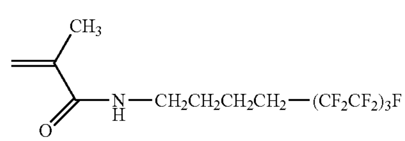

F-19
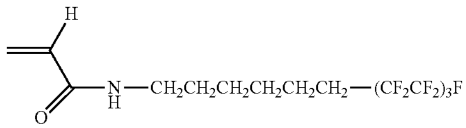
F-20
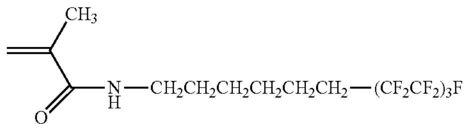
F-21
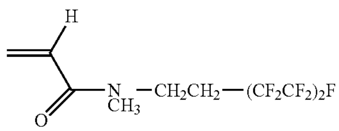
F-22
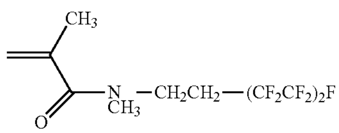
F-23
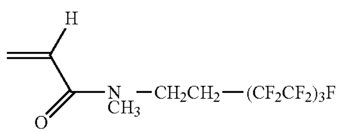
F-24
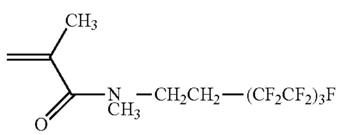
F-25
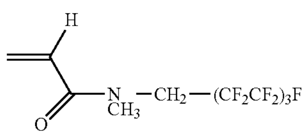
F-26
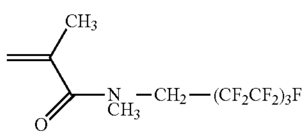
F-27
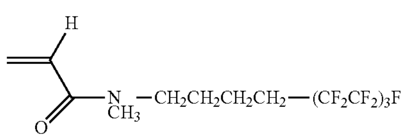
F-28
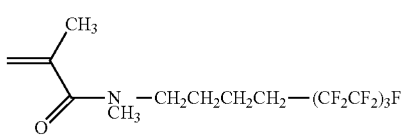
F-29
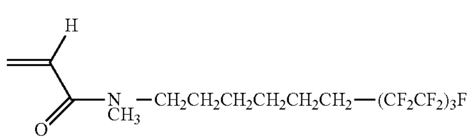
F-30
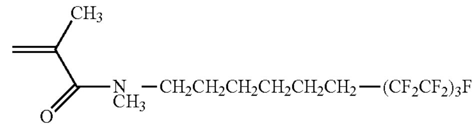
F-31
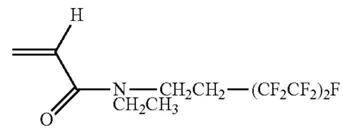
F-32
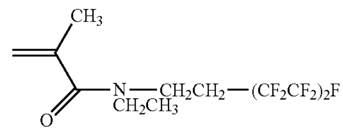
F-33
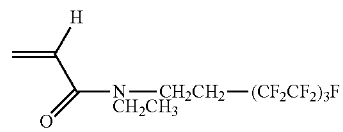
F-34
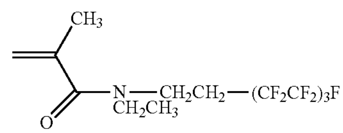
F-35
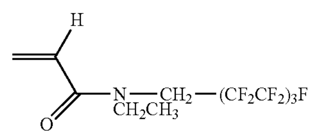
F-36
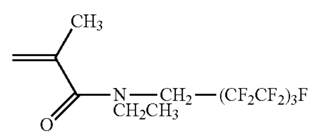
F-37
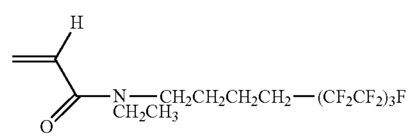
F-38
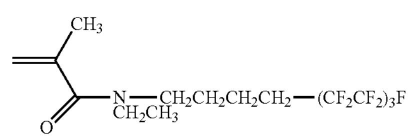
F-39
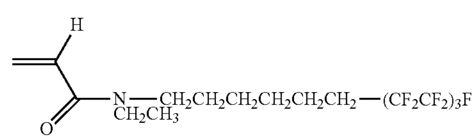
F-40
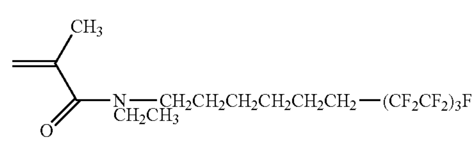

-continued
F-41
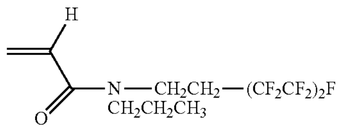
F-42
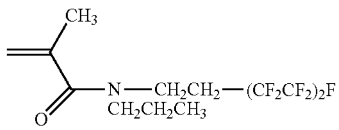
F-43
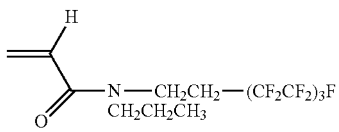
F-44
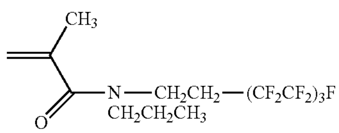
F-45
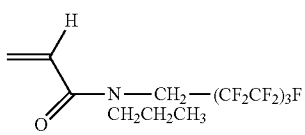
F-46
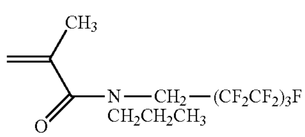
F-47
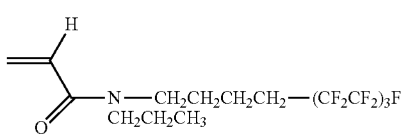
F-48
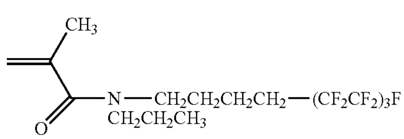
F-49
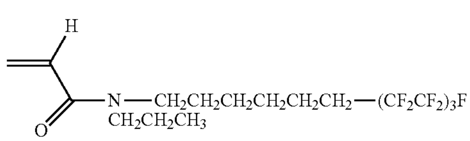
F-50
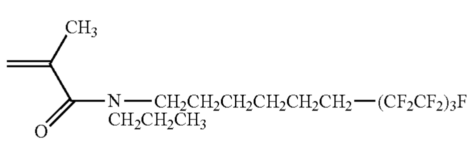
F-51
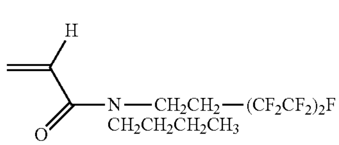
-continued
F-52
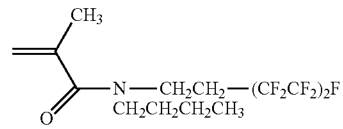
F-53
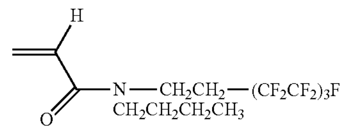
F-54
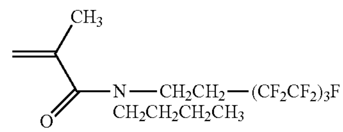
F-55
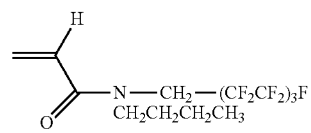
F-56
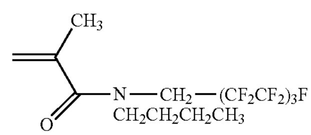
F-57
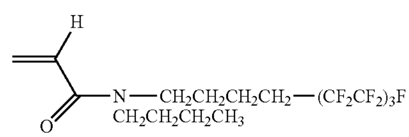
F-58
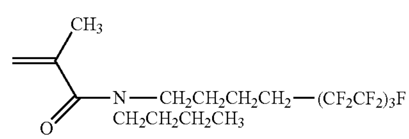
F-59
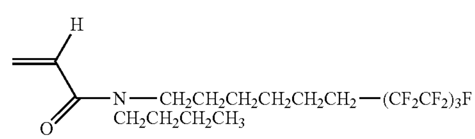
F-60
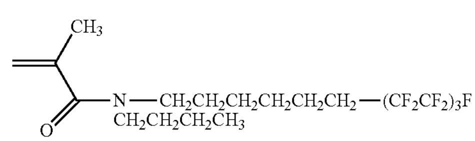
F-61
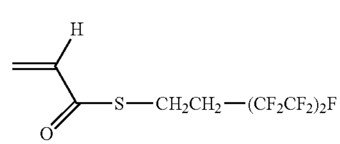
F-62
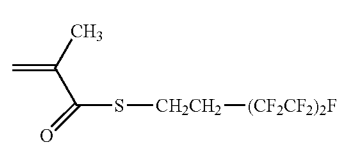

-continued
F-63
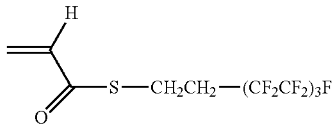
F-64
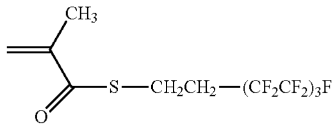
F-65
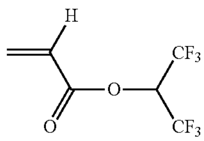
F-66
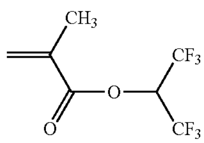
F-67
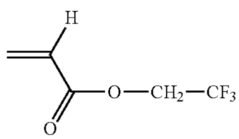
F-68
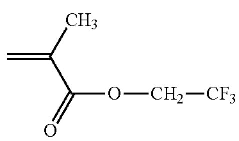
F-69
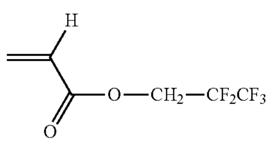
F-70
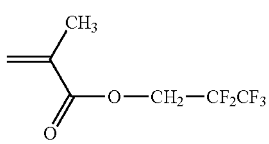
F-71
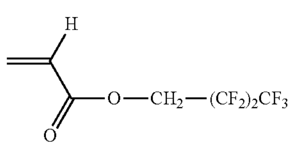
F-72
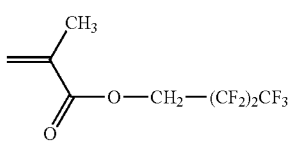
F-73
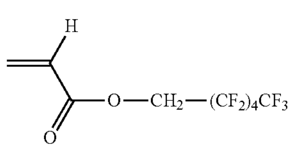
-continued
F-74
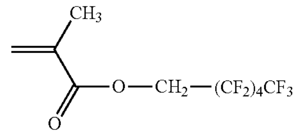
F-75
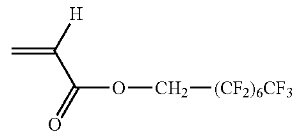
F-76
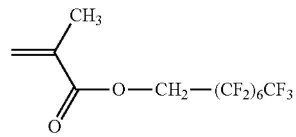
F-77
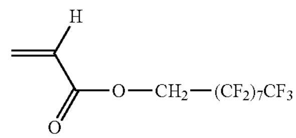
F-78
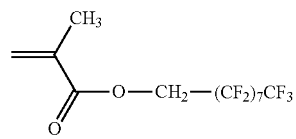
F-79
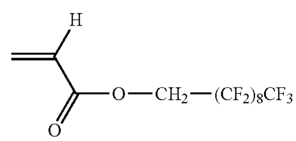
F-80
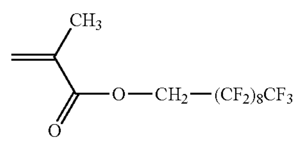
F-81
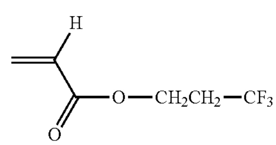
F-82
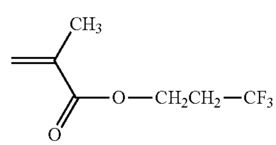
F-83
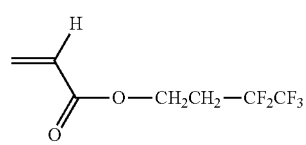
F-84
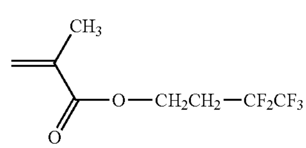

-continued
F-85
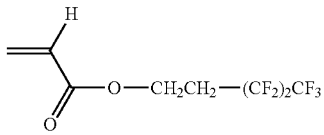
F-86
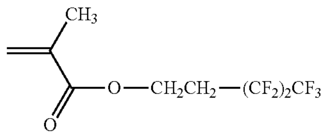
F-87
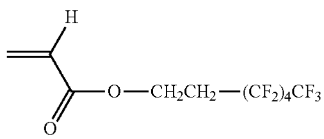
F-88
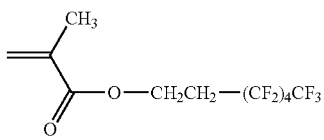
F-89
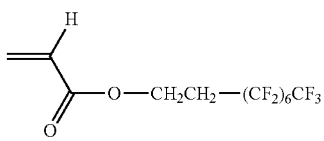
F-90
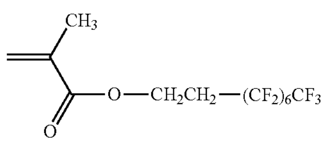
F-91
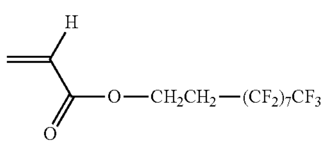
F-92
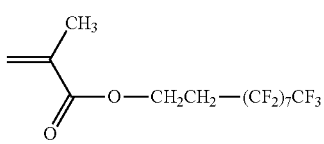
F-93
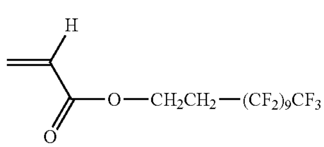
F-94
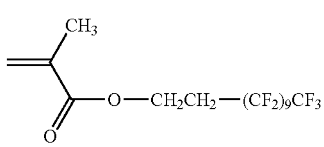
F-95
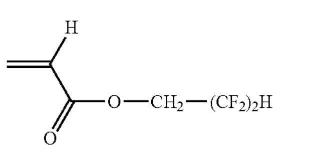
-continued
F-96
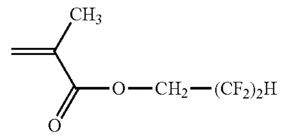
F-97
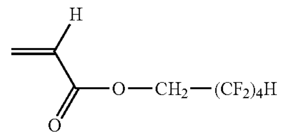
F-98
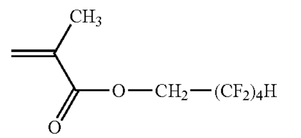
F-99
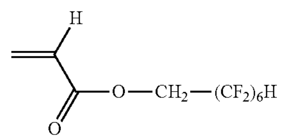
F-100
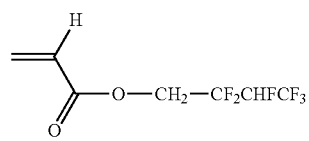
F-101
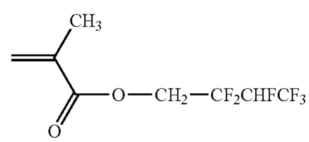
F-102
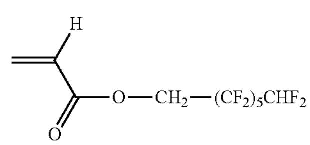
F-103
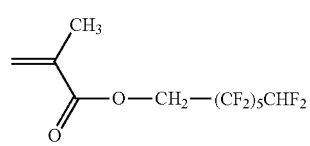
F-104
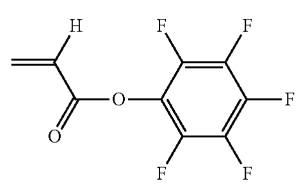
F-105
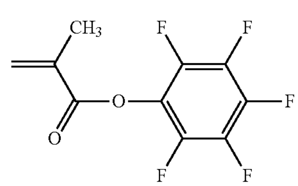

-continued

F-106

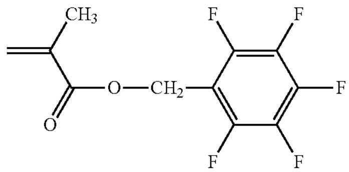

F-107

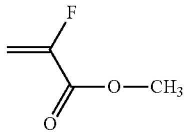

F-108

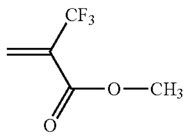

F-109

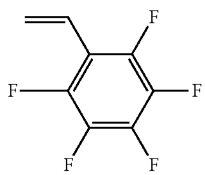

The fluoroaliphatic group-containing copolymer preferably further has a constitutional unit formed of at least one kind of compound selected from the group consisting of poly(oxyalkylene) acrylate and a poly(oxyalkylene) methacrylate, in addition to the constitutional unit formed of a compound represented by any of Formula (F1) and Formula (F2).

The polyoxyalkylene group in the poly(oxyalkylene) acrylate and poly(oxyalkylene) methacrylate can be represented by —$(OR^{F3})_x$—. $R^{F3}$ represents an alkyl group, and x represents an integer of 2 or more. $R^{F3}$ is preferably a linear or branched alkylene group having 2 to 4 carbon atoms. As the linear or branched alkylene group having 2 to 4 carbon atoms, —$CH_2CH_2$—, —$CH_2CH_2CH_2$—, —$CH(CH_3)CH_2$—, or —$CH(CH_3)CH(CH_3)$— is preferable. x is preferably an integer of 2 to 100.

In the polyoxyalkylene groups, x pieces of "$OR^{F3}$" may be the same as or different from each other. That is, the polyoxyalkylene group may be composed of two or more kinds of "$OR^{F3}$" that are regularly or irregularly bonded to each other. For example, the polyoxyalkylene group may be composed of a linear or branched oxypropylene unit and an oxyethylene unit that are regularly or irregularly bonded to each other. More specifically, the polyoxyalkylene group may be composed of a block of a linear or branched oxypropylene unit and a block of an oxyethylene unit that are bonded to each other.

The polyoxyalkylene group may have one or more linking groups (for example, —CONH-Ph-NHCO—, —S—, and the like, in which Ph represents a phenylene group).

The molecular weight of the polyoxyalkylene group is preferably 250 to 3,000.

As the poly(oxyalkylene) acrylate and the poly(oxyalkylene) methacrylate described above, commercially available products or synthetic products may be used.

The poly(oxyalkylene) acrylate and the poly(oxyalkylene) methacrylate can be synthesized, for example, by reacting a hydroxypoly(oxyalkylene) compound with acrylic acid, methacrylic acid, acryloyl chloride, methacryloyl chloride, acrylic acid anhydride, or the like by known methods.

As the aforementioned hydroxypoly(oxyalkylene) compound, commercially available products may be used. Examples thereof include ADEKA (registered trademark) PLURONIC manufactured by ADEKA Corporation, ADEKA polyether manufactured by ADEKA Corporation, Carbowax (registered trademark) manufactured by Union Carbide Corporation, Triton manufactured by The Dow Chemical Company., PEG manufactured by DKS Co. Ltd., and the like.

As the poly(oxyalkylene) acrylate and the poly(oxyalkylene) methacrylate, poly(oxyalkylene) diacrylate or the like synthesized by known methods may also be used.

In the image-recording layer used in the present disclosure, one kind of binder polymer may be used alone, or two or more kinds of binder polymers may be used in combination.

The content of the binder polymer to be incorporated into the image-recording layer can be randomly set. The content of the binder polymer with respect to the total mass of the image-recording layer is preferably 1% by mass to 90% by mass, and more preferably 5% by mass to 80% by mass.

In a case where the image-recording layer of the present disclosure contains other binder polymers, the content of those other binder polymers with respect to the total mass of the aforementioned thermoplastic resin particles and those other binder polymers is preferably more than 0% by mass and 99% by mass or less, more preferably 20% by mass to 95% by mass, and even more preferably 40% by mass to 90% by mass.

[Chain Transfer Agent]

The image-recording layer used in the present disclosure may contain a chain transfer agent. The chain transfer agent contributes to the improvement of UV printing durability of the lithographic printing plate.

As the chain transfer agent, a thiol compound is preferable, a thiol compound having 7 or more carbon atoms is more preferable from the viewpoint of boiling point (low volatility), and a compound having a mercapto group on an aromatic ring (aromatic thiol compound) is even more preferable. The thiol compound is preferably a monofunctional thiol compound.

Specific examples of the chain transfer agent include the following compounds.

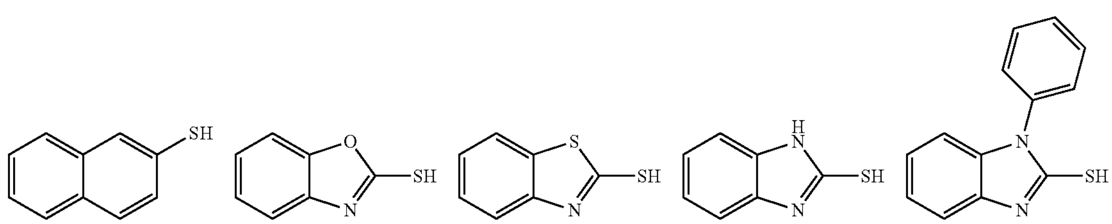

-continued
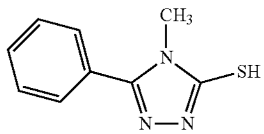
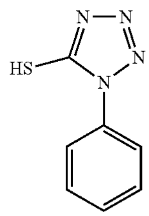
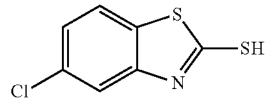
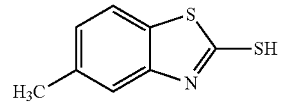
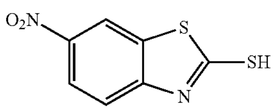
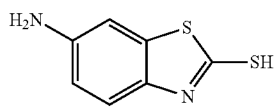
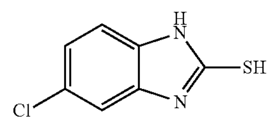
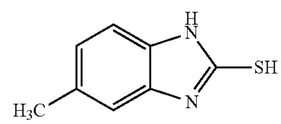
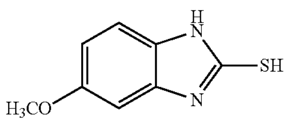
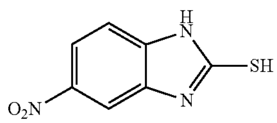
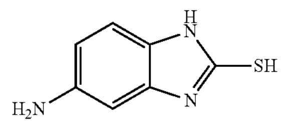
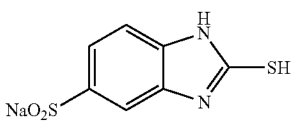
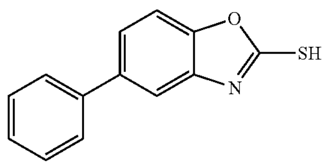
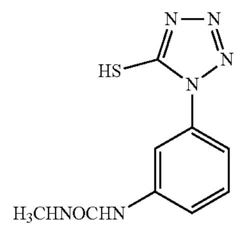
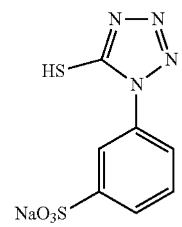
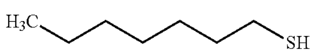
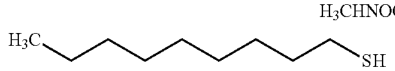
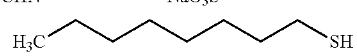
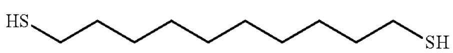
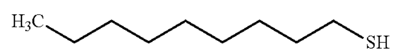
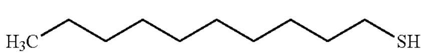
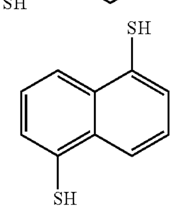
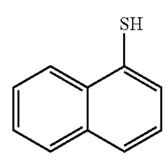
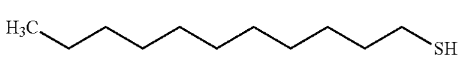
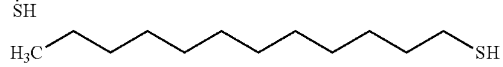
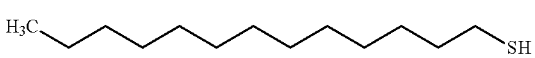
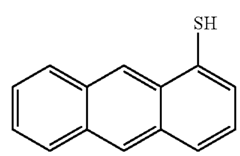
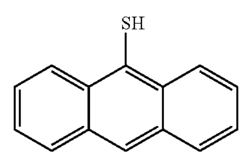
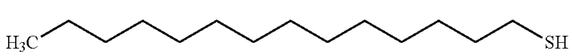
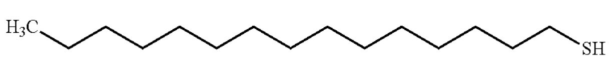
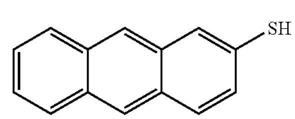
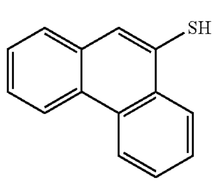
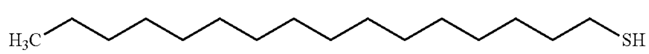
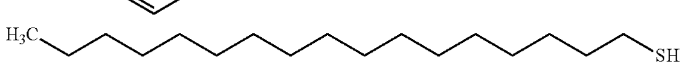
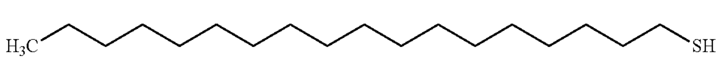
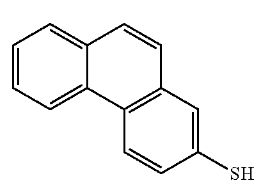

-continued

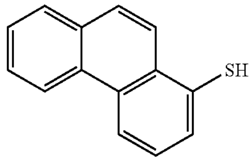

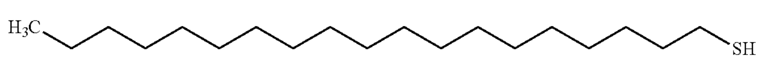

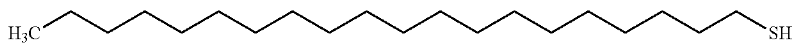

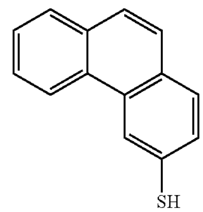

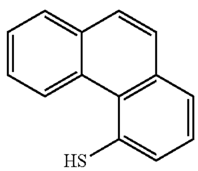

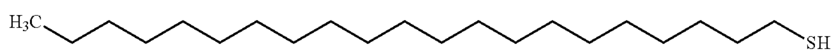

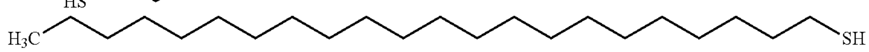

Only one kind of chain transfer agent may be added to the image-recording layer, or two or more kinds of chain transfer agents may be used in combination.

The content of the chain transfer agent with respect to the total mass of the image-recording layer is preferably 0.01% by mass to 50% by mass, more preferably 0.05% by mass to 40% by mass, and even more preferably 0.1% by mass to 30% by mass.

[Oil Sensitizing Agent]

In order to improve ink receptivity, the image-recording layer preferably further contains an oil sensitizing agent.

The SP value of the oil sensitizing agent is preferably less than 18.0, more preferably 14 or more and less than 18, even more preferably 15 to 17, and particularly preferably 16 to 16.9.

Furthermore, the oil sensitizing agent may be a compound having a molecular weight (weight-average molecular weight in a case where the compound has molecular weight distribution) of 2,000 or more, or a compound having a molecular weight less than 2,000.

In the present disclosure, as the SP value (solubility parameter, (unit: $(MPa)^{1/2}$)), the Hansen solubility parameters are used.

The Hansen solubility parameters are obtained by dividing the solubility parameters introduced by Hildebrand into three components, a dispersion element δd, a polarity element δp, and a hydrogen bond element δh, and expressing the parameters in a three-dimensional space. In the present disclosure, the SP value is expressed as δ (unit: $(MPa)^{1/2}$), and a value calculated by the following equation is used.

$$\delta(MPa)^{1/2}=(\delta d^2+\delta p^2+\delta h^2)^{1/2}$$

The dispersion element δd, the polarity element δp, and the hydrogen bond element δh of various substances have been found by Hansen and his successors, and are described in detail in the Polymer Handbook (fourth edition), VII-698 to 711.

Furthermore, in the present disclosure, the SP value of a polymer is calculated from the molecular structure of the polymer by the Hoy method described in Polymer Handbook fourth edition.

Examples of the aforementioned oil sensitizing agent include an onium salt compound, a nitrogen-containing low-molecular-weight compound, an ammonium compound such as an ammonium group-containing polymer, and the like.

Particularly, in a case where an inorganic lamellar compound is incorporated into an overcoat layer, these compounds function as a surface coating agent for the inorganic lamellar compound and can inhibit the receptivity deterioration caused in the middle of printing by the inorganic lamellar compound.

From the viewpoint of receptivity, the oil sensitizing agent is preferably an onium salt compound.

Examples of the onium salt compound include a phosphonium compound, an ammonium compound, a sulfonium compound, and the like. As the onium salt compound, from the viewpoint described above, at least one kind of compound selected from the group consisting of a phosphonium compound and an ammonium compound is preferable.

The onium salt compound, which will be described later, in a development accelerator or electron-accepting polymerization initiator is a compound having an SP value more than 18, and is not included in the oil sensitizing agent.

Examples of the phosphonium compound include the phosphonium compounds described in JP2006-297907A and JP2007-50660A. Specific examples thereof include 1,4-bis(triphenylphosphonio)butane=di(hexafluorophosphate), 1,7-bis(triphenylphosphonio)heptane=sulfate, and 1,9-bis(triphenylphosphonio)nonane=naphthalene-2,7-disulfonate, and the like.

As the ammonium compound, for example, a nitrogen-containing low-molecular-weight compound, an ammonium group-containing polymer, and the like are preferable.

Examples of the nitrogen-containing low-molecular-weight compound include amine salts and quaternary ammonium salts. In addition, examples thereof also include imidazolinium salts, benzimidazolinium salts, pyridinium salts, and quinolinium salts.

Among these, quaternary ammonium salts and pyridinium salts are preferable.

Specific examples thereof include tetramethylammonium=hexafluorophosphate, tetrabutylammonium=hexafluorophosphate, dodecyltrimethylammonium=p-toluene sulfonate, benzyltriethylammonium=hexafluorophosphate, benzyldimethyloctylammonium=hexafluorophosphate, benzyldimethyldodecylammonium=hexafluorophosphate, compounds described in paragraphs "0021" to "0037" of JP2008-284858A and paragraphs "0030" to "0057" of JP2009-90645A, and the like.

The ammonium group-containing polymer may have an ammonium group in the structure. As such a polymer, a polymer is preferable in which the content of (meth)acrylate having an ammonium group in a side chain as a copolymerization component is 5 mol % to 80 mol %. Specific examples thereof include the polymers described in paragraphs "0089" to "0105" of JP2009-208458A.

The reduced specific viscosity (unit: ml/g) of an ammonium group-containing polymer determined according to the measurement method described in JP2009-208458A is preferably in a range of 5 to 120, more preferably in a range of 10 to 110, and particularly preferably in a range of 15 to 100. In a case where the reduced specific viscosity is converted into a weight-average molecular weight (Mw), the weight-average molecular weight is preferably 10,000 to 150,000, more preferably 17,000 to 140,000, and particularly preferably 20,000 to 130,000.

Specific examples of the ammonium group-containing polymer will be shown below.

(1) 2-(Trimethylammonio)ethylmethacrylate=p-toluenesulfonate/3,6-dioxaheptylmethacrylate copolymer (molar ratio: 10/90, Mw: 45,000)

(2) 2-(Trimethylammonio) ethylmethacrylate=hexafluorophosphate/3,6-dioxaheptylmethacrylate copolymer (molar ratio: 20/80, Mw: 60,000)

(3) 2-(Ethyldimethylammonio)ethylmethacrylate=p-toluenesulfonate/hexylmethacrylate copolymer (molar ratio: 30/70, Mw: 45,000)

(4) 2-(Trimethylammonio) ethylmethacrylate=hexafluorophosphate/2-ethylhexylmethacrylate copolymer (molar ratio: 20/80, Mw: 60,000)

(5) 2-(Trimethylammonio) ethylmethacrylate=methylsulfate/hexylmethacrylate copolymer (molar ratio: 40/60, Mw: 70,000)

(6) 2-(Butyldimethylammonio) ethylmethacrylate=hexafluorophosphate/3,6-dioxaheptylmethacrylate copolymer (molar ratio: 25/75, Mw: 65,000)

(7) 2-(Butyldimethylammonio) ethylacrylate=hexafluorophosphate/3,6-dioxaheptylmethacrylate copolymer (molar ratio: 20/80, Mw: 65,000)

(8) 2-(Butyldimethylammonio)ethylmethacrylate=13-ethyl-5,8,11-trioxa-1-heptadecanesulfonate/3,6-dioxaheptylmethacrylate copolymer (molar ratio: 20/80, Mw: 75,000)

The content of the oil sensitizing agent with respect to the total mass of the image-recording layer is preferably 1% by mass to 40.0% by mass, more preferably 2% by mass to 25.0% by mass, and even more preferably 3% by mass to 20.0% by mass.

The image-recording layer may contain only one kind of oil sensitizing agent, or two or more kinds of oil sensitizing agents may be used in combination.

One of the preferred aspects of the image-recording layer used in the present disclosure is an aspect in which the image-recording layer contains two or more kinds of compounds as an oil sensitizing agent.

Specifically, from the viewpoint of satisfying both the on-press developability and receptivity, the image-recording layer used in the present disclosure preferably uses all the phosphonium compound, the nitrogen-containing low-molecular-weight compound, and the ammonium group-containing polymer as an oil sensitizing agent, and more preferably uses all the phosphonium compound, the quaternary ammonium salts, and the ammonium group-containing polymer as an oil sensitizing agent.

[Development Accelerator]

The image-recording layer used in the present disclosure preferably further contains a development accelerator.

The value of polarity element as an SP value of the development accelerator is preferably 6.0 to 26.0, more preferably 6.2 to 24.0, even more preferably 6.3 to 23.5, and particularly preferably 6.4 to 22.0.

In the present disclosure, as the value of polarity element as an SP value (solubility parameter, unit: $(cal/cm^3)^{1/2}$), the value of polarity element δp in the Hansen solubility parameters is used. The Hansen solubility parameters are obtained by dividing the solubility parameters introduced by Hildebrand into three components, a dispersion element δd, a polarity element δp, and a hydrogen bond element δh, and expressing the parameters in a three-dimensional space. In the present disclosure, the polarity element δp is used.

δp [$cal/cm^3$] is a dipole-dipole force element in the Hansen solubility parameters, V [$cal/cm^3$] is a molar volume, and μ[D] is a dipole moment. As δp, the following equation simplified by Hansen and Beerbower is generally used.

$$\delta_p = \frac{37.4\mu}{V^{1/2}}$$

The development accelerator is preferably a hydrophilic polymer compound or a hydrophilic low-molecular-weight compound.

In the present disclosure, "hydrophilic" means that the value of polarity element as an SP value is 6.0 to 26.0, the hydrophilic polymer compound refers to a compound having a molecular weight (weight-average molecular weight in a case where the compound has molecular weight distribution) of 3,000 or more, and the hydrophilic low-molecular-weight compound refers to a compound having a molecular weight (weight-average molecular weight in a case where the compound has molecular weight distribution) of less than 3,000.

Examples of the hydrophilic polymer compound include a cellulose compound and the like. Among these, a cellulose compound is preferable.

Examples of the cellulose compound include cellulose or a compound obtained by modifying at least a part of cellulose (modified cellulose compound). Among these, a modified cellulose compound is preferable.

As the modified cellulose compound, for example, a compound is preferable which is obtained by substituting at least some of hydroxyl groups of cellulose with at least one kind of group selected from the group consisting of an alkyl group and a hydroxyalkyl group.

The degree of substitution of the compound, which is obtained by substituting at least some of hydroxyl groups of cellulose with at least one kind of group selected from the group consisting of an alkyl group and a hydroxyalkyl group, is preferably 0.1 to 6.0, and more preferably 1 to 4.

As the modified cellulose compound, an alkyl cellulose compound or a hydroxyalkyl cellulose compound is preferable, and a hydroxyalkyl cellulose compound is more preferable.

As the alkyl cellulose compound, for example, methyl cellulose is preferable.

As the hydroxyalkyl cellulose compound, for example, hydroxypropyl cellulose is preferable.

The molecular weight of the hydrophilic polymer compound (weight-average molecular weight in a case where the compound has molecular weight distribution) is preferably 3,000 to 5,000,000, and more preferably 5,000 to 200,000.

Examples of the hydrophilic low-molecular-weight compound include a glycol compound, a polyol compound, an organic amine compound, an organic sulfonic acid compound, an organic sulfamine compound, an organic sulfuric acid compound, an organic phosphonic acid compound, an organic carboxylic acid compound, a betaine compound, and the like. Among these, a polyol compound, an organic sulfonic acid compound, or a betaine compound is preferable.

Examples of the glycol compound include glycols such as ethylene glycol, diethylene glycol, triethylene glycol, propylene glycol, dipropylene glycol, and tripropylene glycol, and ether or ester derivatives of these compounds.

Examples of the polyol compound include glycerin, pentaerythritol, tris(2-hydroxyethyl) isocyanurate, and the like.

Examples of the organic amine compound include triethanolamine, diethanolamine, monoethanolamine, salts of these, and the like.

Examples of the organic sulfonic acid compound include alkyl sulfonic acid, toluene sulfonic acid, benzene sulfonic acid, salts of these, and the like. Among these, for example, alkyl sulfonic acid having an alkyl group having 1 to 10 carbon atoms is preferable.

Examples of the organic sulfamine compound include alkylsulfamic acid, salts thereof, and the like.

Examples of the organic sulfuric acid compound include alkyl sulfuric acid, alkyl ether sulfuric acid, salts of these, and the like.

Examples of the organic phosphonic acid compound include phenylphosphonic acid, salts thereof, and the like.

Examples of the organic carboxylic acid compound include tartaric acid, oxalic acid, citric acid, malic acid, lactic acid, gluconic acid, salts of these, and the like.

Examples of the betaine compound include a phosphobetaine compound, a sulfobetaine compound, a carboxybetaine compound, and the like. Among these, for example, trimethylglycine is preferable.

The molecular weight of the hydrophilic low-molecular-weight compound (weight-average molecular weight in a case where the compound has molecular weight distribution) is preferably 100 or more and less than 3,000, and more preferably 300 to 2,500.

The development accelerator is preferably a compound having a cyclic structure.

The cyclic structure is not particularly limited. Examples thereof include a glucose ring in which at least some of hydroxyl groups may be substituted, an isocyanuric ring, an aromatic ring which may have a heteroatom, an aliphatic ring which may have a heteroatom, and the like. Among these, for example, a glucose ring or an isocyanuric ring is preferable.

Examples of the compound having a glucose ring include the aforementioned cellulose compound.

Examples of the compound having an isocyanuric ring include the aforementioned tris(2-hydroxyethyl) isocyanurate and the like.

Examples of the compound having an aromatic ring include the toluene sulfonic acid and benzene sulfonic acid described above, and the like.

Examples of the compound having an aliphatic ring include a compound which is the aforementioned alkyl sulfate and has an alkyl group having a ring structure, and the like.

The compound having a cyclic structure preferably has a hydroxyl group.

As the compound having a hydroxyl group and a cyclic structure, for example, the aforementioned cellulose compound and the aforementioned tris(2-hydroxyethyl) isocyanurate are preferable.

The development accelerator is preferably an onium salt compound.

Examples of the onium salt compound include an ammonium compound, a sulfonium compound, and the like. Among these, an ammonium compound is preferable.

Examples of the development accelerator which is an onium salt compound include trimethylglycine and the like.

The value of polarity element as an SP value of the onium salt compound in the electron-accepting polymerization initiator is not in a range of 6.0 to 26.0. This onium salt compound is not included in the development accelerator.

The image-recording layer may contain only one kind of development accelerator, or two or more kinds of development accelerators may be used in combination.

One of the preferred aspects of the image-recording layer used in the present disclosure is an aspect in which the image-recording layer contains two or more kinds of compounds as a development accelerator.

Specifically, from the viewpoint of on-press developability and receptivity, the image-recording layer used in the present disclosure preferably contains, as a development accelerator, the polyol compound and the betaine compound described above, the betaine compound and the organic sulfonic acid compound described above, or the polyol compound and the organic sulfonic acid compound described above.

The content of the development accelerator with respect to the total mass of the image-recording layer is preferably 0.1% by mass or more and 20% by mass or less, more preferably 0.5% by mass or more and 15% by mass or less, and even more preferably 1% by mass or more and 10% by mass or less.

[Other Components]

As other components, a surfactant, a polymerization inhibitor, a higher fatty acid derivative, a plasticizer, inorganic particles, an inorganic lamellar compound, and the like can be incorporated into the image-recording layer. Specifically, the description in paragraphs "0114" to "0159" of JP2008-284817A can be referred to.

[Formation of Image-Recording Layer]

The image-recording layer in the lithographic printing plate precursor according to the present disclosure can be formed, for example, by preparing a coating solution by dispersing or dissolving the necessary components described above in a known solvent, coating a support with the coating solution by a known method such as bar coating, and drying the coating solution, as described in paragraphs "0142" and "0143" of JP2008-195018A. The coating amount (solid content) of the image-recording layer after coating and drying varies with uses, but is preferably 0.3 $g/m^2$ to 3.0 $g/m^2$. In a case where the coating amount is in this range, excellent sensitivity and excellent film characteristics of the image-recording layer are obtained.

As the solvent, known solvents can be used. Specific examples thereof include water, acetone, methyl ethyl ketone (2-butanone), cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 1-methoxy-2-propanol, 3-methoxy-1-propanol, methoxy methoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, γ-butyrolactone, methyl lactate, ethyl lactate, and the like. One kind of solvent may be used alone, or two or more kinds of the solvents may be used in combination. The concentration of solid contents in the coating solution is preferably 1% by mass to 50% by mass.

The coating amount (solid content) of the image-recording layer after coating and drying varies with uses. However, from the viewpoint of obtaining excellent sensitivity and excellent film characteristics of the image-recording layer, the coating amount is preferably 0.3 $g/m^2$ to 3.0 $g/m^2$.

The film thickness of the image-recording layer in the lithographic printing plate precursor according to the present disclosure is preferably 0.1 μm to 3.0 μm, and more preferably 0.3 μm to 2.0 μm.

In the present disclosure, the film thickness of each layer in the lithographic printing plate precursor is checked by preparing a slice by cutting the lithographic printing plate precursor in a direction perpendicular to the surface of the precursor and observing the cross section of the slice with a scanning electron microscope (SEM).

<Support>

The lithographic printing plate precursor according to the present disclosure has a support.

As the support, a support having a hydrophilic surface (also called "hydrophilic support") is preferable. The water contact angle of the hydrophilic surface is preferably less than 10°, and more preferably less than 5°.

As the water contact angle in the present disclosure, the contact angle of water droplets (after 0.2 seconds) on a surface at 25° C. is measured using DM-501 manufactured by Kyowa Interface Science Co., Ltd.

The support of the lithographic printing plate precursor according to the present disclosure to be used can be appropriately selected from known supports for a lithographic printing plate precursor. As the support, an aluminum plate is preferable which has been roughened using a known method and has undergone an anodic oxidation treatment.

Hereinafter, the support used in the lithographic printing plate precursor according to the present disclosure will be described with reference to drawings. Some reference signs will not be mentioned in the description of the drawings.

The thickness of the anodic oxide film is preferably 200 nm to 2,000 nm.

Figure 2A:
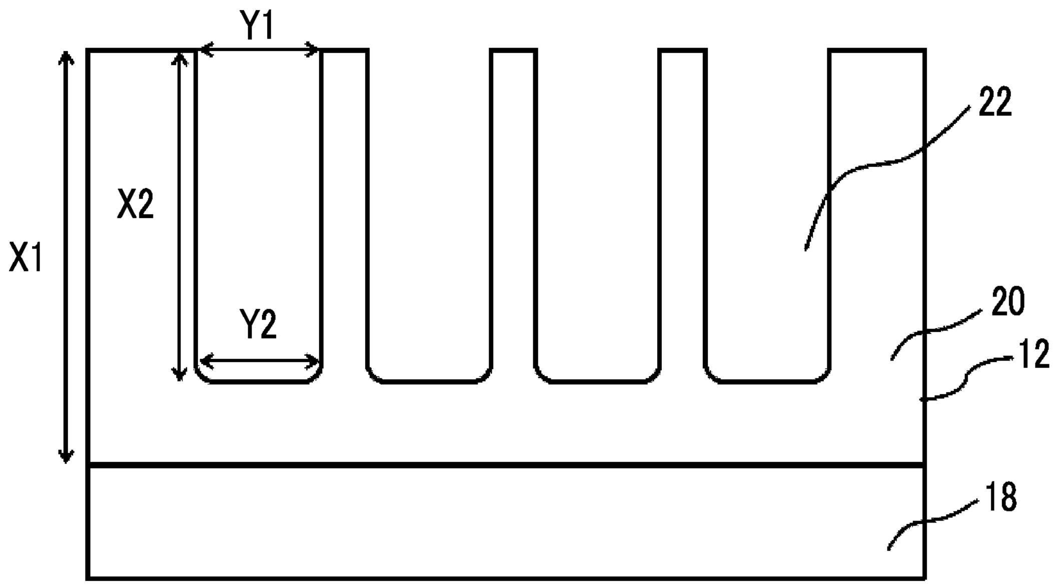
FIG. 2A is a schematic cross-sectional view of an embodiment of an aluminum support having an anodic oxide film.

FIG. 2A is a schematic cross-sectional view of an embodiment of an aluminum support having an anodic oxide film. In FIG. 2A, an aluminum support 12 having an anodic oxide film has an aluminum plate 18 and an anodic oxide film 20 of aluminum (hereinafter, also simply called "anodic oxide film 20") in this order. The anodic oxide film 20 in the aluminum support 12 is positioned on the side of an image-recording layer 16 of a lithographic printing plate precursor 10 in FIG. 1. That is, the lithographic printing plate precursor 10 has the aluminum plate 18, the anodic oxide film 20, an undercoat layer 14, and the image-recording layer 16.

[Aluminum Plate]

The aluminum plate (aluminum support) consists of a dimensionally stable metal containing aluminum as a main component, that is, aluminum or an aluminum alloy. The aluminum plate consists of a pure aluminum plate or an alloy plate containing aluminum as main component and traces of different elements.

The different elements contained in the aluminum alloy include silicon, iron, manganese, copper, magnesium, chromium, zinc, bismuth, nickel, titanium, and the like. The content of the different elements in the alloy is 10% by mass or less. As the aluminum plate, a pure aluminum plate is suitable. However, the aluminum plate may contain traces of different elements, because it is difficult to manufacture perfectly pure aluminum by smelting technologies. The composition of the aluminum plate 18 is not limited, and aluminum plates made of generally known materials (for example, JIS A 1050, JIS A 1100, JIS A 3103, and JIS A 3005) can be appropriately used.

The width of the aluminum plate is preferably about 400 mm to 2,000 mm, and the thickness of thereof is preferably about 0.1 mm to 0.6 mm. This width or thickness can be appropriately changed depending on the size of the printer and the printing plate or changed as the user wishes.

The support used in the lithographic printing plate precursor according to the present disclosure preferably has micropores within a surface on the image-recording layer side, and more preferably has an anodic oxide film on a surface on the image-recording layer side and micropores on the surface of the anodic oxide film.

Presumably, in a case where the infrared absorber, the polymerization initiator, the polymerizable compound, and the thermoplastic resin particles described above are used in combination in the image-recording layer of the lithographic printing plate precursor, the thermoplastic resin particles may be thermally fused with each other, the polymerizable compound may be polymerized while being mixed with the thermally fused thermoplastic resin particles, and a harder film may be formed. Furthermore, presumably, in a case where the anodic oxide film has micropores within a surface thereof, the polymerization of the polymerizable compound may also occur in the micropores in the same manner as described above, the adhesiveness between the support and the image-recording layer may be consequently improved, and excellent UV printing durability may be obtained.

From the viewpoint of UV printing durability, the average diameter of the micropores within the surface is preferably more than 13 nm and 100 nm or less, more preferably 15 nm to 80 nm, and even more preferably 20 nm to 60 nm.

In the present disclosure, "micropore" is a term generally used for pores formed within a surface of the support on the image-recording layer side, specifically, pores in the anodic oxide film. This term does not specify the pore size.

In the L*a*b* color space, the value of brightness L* of the surface of the aluminum support on the image-recording layer side (surface of the anodic oxide film on the image-recording layer side) is preferably 70 to 100. Especially, the value of brightness L* is preferably 75 to 100 and more preferably 75 to 90, because printing durability and image visibility are better balanced in this range.

The brightness L* is measured using a color difference meter Spectro Eye manufactured by X-Rite, Incorporated.

One of the examples of preferred aspects of the aluminum support used in the present disclosure (the aluminum support according to this example is also called "support (1)") is as below.

That is, the support (1) has an aluminum plate and an anodic oxide film of aluminum disposed on the aluminum plate, the anodic oxide film is at a position closer to a side of the image-recording layer than the aluminum plate and has micropores extending in a depth direction from the surface of the anodic oxide film on the side of the image-recording layer, the average diameter of the micropores within the surface of the anodic oxide film is more than 10 nm and 100 nm or less, and a value of brightness L* of the surface of the anodic oxide film on the side of the image-recording layer is 70 to 100 in the L*a*b* color space.

For example, an aspect is also preferable in which the micropores in the support (1) are each constituted with a large diameter portion that extends to a position at a depth of 10 nm to 1,000 nm from the surface of the anodic oxide film and a small diameter portion that is in communication with the bottom portion of the large diameter portion and extends to a position at a depth of 20 nm to 2,000 nm from a communication position, an average diameter of the large diameter portion within the surface of the anodic oxide film is 15 nm to 150 nm, and an average diameter of the small diameter portion at a communication position is 13 nm or less (hereinafter, the support according to this aspect will be also called "support (2)").

[Anodic Oxide Film]

The support used in the lithographic printing plate precursor according to the present disclosure preferably has an anodic oxide film on a surface on the side of the image-recording layer.

In FIG. 2A, the anodic oxide film 20 refers to an anodic aluminum oxide film which is generally provided on a surface of the aluminum plate 18 by an anodic oxidation treatment and has uniformly distributed ultrafine micropores 22 approximately perpendicular to the surface of the film. The micropores 22 extend in the thickness direction (toward the aluminum plate 18) from the surface of the anodic oxide film.

A thickness X1 of the anodic oxide film is preferably 200 nm to 2,000 nm, more preferably 500 nm to 1,800 nm, and even more preferably 750 nm to 1,500 nm.

The aluminum support used in the lithographic printing plate precursor according to the present disclosure preferably has any of the following aspects 1 to 3.

(Aspect 1)

The micropores extend to a position at a depth more than 10 nm from the surface of the anodic oxide film. The ratio of the average diameter of the bottom portion of the micropores to the average diameter of the micropores within the surface of the anodic oxide film is 0.8/1 or more and 1.2/1 or less.

(Aspect 2)

The micropores are each composed of a large diameter portion that extends to a position at a depth of 10 nm to 1,000 nm from the surface of the anodic oxide film and a small diameter portion that is in communication with the bottom portion of the large diameter portion and extends to a position 20 nm to 2,000 nm distant from the communication position in the depth direction, the average diameter of the large diameter portion is more than 13 nm and 100 nm or less, and the average diameter of the small diameter portion is 5% to 80% of the average diameter of the large diameter portion.

(Aspect 3)

The average diameter of the micropores within the surface of the anodic oxide film is 10 nm or more and 30 nm or less, the average of maximum inner diameter of the micropores is 20 nm to 300 nm, and the average of maximum inner diameter of the micropores is larger than the average diameter of the micropores within the surface of the anodic oxide film.

Hereinafter, each of the aspects will be described with reference to drawings.

[Regarding Aspect 1]

FIG. 2A is a schematic cross-sectional view showing an embodiment of Aspect 1.

In FIG. 2A, the micropores 22 extend to a position at a depth more than 10 nm from the surface of the anodic oxide film 20, and the ratio of the average diameter of the bottom portion of the micropores to the average diameter of the micropores within the surface of the anodic oxide film is 0.8/1 or more and 1.2/1 or less.

A depth X2 of the micropores 22 is more than 10 nm, preferably 50 nm or more, and more preferably 75 nm or more.

The depth X2 of the micropores 22 is determined by observing the cross section of the anodic oxide film 20 with FE-SEM (150,000× magnification), measuring the depth of 25 micropores in the obtained image, and calculating the arithmetic mean thereof.

An average diameter Y1 of the micropores 22 within the surface of the anodic oxide film is preferably more than 13 nm and 100 nm or less, more preferably 15 nm or more and 75 nm or less, and even more preferably 20 nm or more and 50 nm or less.

Regarding the micropores 22 within the surface of the anodic oxide film, the ratio of the depth X2 to the average diameter Y1 (X2/Y1) is preferably 2/1 or more and 10/1 or less, more preferably 2.5/1 or more and 7/1 or less, and even more preferably 3/1 or more and 6/1 or less.

An average diameter Y2 of the bottom portion of the micropores 22 is preferably 10 nm or more and 100 nm or less, more preferably 15 nm or more and 75 nm or less, and even more preferably 20 nm or more and 50 nm or less.

The ratio of the average diameter Y2 of the bottom portion of the micropores 22/the average diameter Y1 of the micropores 22 within the surface of the anodic oxide film is preferably 0.8/1 or more and 1.2/1 or less, more preferably 0.85/1 or more and 1.15/1 or less, and even more preferably 0.9/1 or more and 1.1/1 or less.

The ratio of the average diameter Y2 of the bottom portion of the micropores 22 to the average diameter Y1 of the micropores 22 within the surface of the anodic oxide film is a value calculated by Expression 1A.

Expression 1A: (average diameter Y1 of micropores 22 within surface of anodic oxide film)/(average diameter Y2 of bottom portion of micropores 22)

The average diameter Y1 of the micropores within the surface of the anodic oxide film is obtained by observing the surface of the anodic oxide film 20 with a field emission scanning electron microscope (FE-SEM) at a 150,000× magnification (N=4), measuring the size (diameter) of micropores existing in a range of 400 nm×600 nm in the obtained 4 images, and calculating the arithmetic mean thereof.

In a case where the shape of micropores (shape of opening portions) within the surface of the anodic oxide film is not circular, the equivalent circular diameter is used.

The average diameter Y2 of the bottom portion of the micropores 22 is obtained by observing the surface of the anodic oxide film 20 with FE-SEM at a 150,000× magnification (N=4), measuring the size (diameter) of the bottom portion of the micropores 22 existing in a range of 400 nm×600 nm in the obtained 4 images, and calculating the arithmetic mean thereof. In a case where the micropores 22 are deep, if necessary, the upper portion of the anodic oxide film 20 may be cut in the in-plane direction of the anodic oxide film (for example, argon gas is used for cutting), then the surface of the anodic oxide film 20 may be observed with FE-SEM described above, and the average diameter Y2 of the bottom portion of the micropores 22 may be determined.

In a case where the shape of the bottom portion of the micropores is not circular, the equivalent circular diameter is used.

Figure 2B:
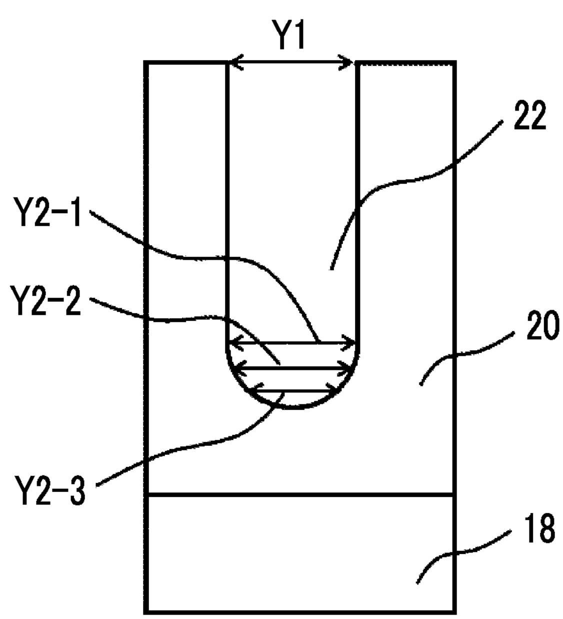
FIG. 2B is an enlarged schematic cross-sectional view of one of the micropores in FIG. 2A.

Furthermore, in a case where the shape of the bottom portion is not planer, for example, Y2-1 shown in FIG. 2B is measured as the average diameter of the bottom portion.

FIG. 2B is an enlarged schematic cross-sectional view of one of the micropores in FIG. 2A.

The shape of the micropores 22 in Aspect 1 is not particularly limited. For example, the micropores 22 have a substantially straight tubular shape (substantially cylindrical shape), a conical shape that tapers along the depth direction (thickness direction), an inverted conical shape that thickens along the depth direction (thickness direction), a cylindrical shape that bulges out in the middle portion, a cylindrical shape that is narrow in the middle portion, and the like. Among these, a substantially straight tubular shape is preferable. The shape of the bottom portion of the micropores 22 is not particularly limited, and may be a curved (concave) or flat surface shape.

The ratio of a diameter Y1A of the middle portion of the micropores 22 to the average diameter Y1 of the micropores 22 within the surface of the anodic oxide film (Y1A/Y1) is preferably 80/100 or more and 120/100 or less.

The average diameter Y1A of the middle portion of the micropores 22 is obtained by observing the surface of the anodic oxide film 20 with FE-SEM at a 150,000× magnification (N=4), measuring the size (diameter) of the middle portion of the micropores 22 existing in a range of 400 nm×600 nm in the obtained 4 images, and calculating the arithmetic mean thereof. In a case where the micropores 22 are deep, if necessary, the upper portion of the anodic oxide film 20 may be cut in the in-plane direction of the anodic oxide film (for example, argon gas is used for cutting), then the surface of the anodic oxide film 20 may be observed with FE-SEM described above, and the diameter Y1A of the middle bottom portion of the micropores 22 may be determined.

—Other Characteristics—

The density of the micropores 22 within the surface of the anodic oxide film 20 is not particularly limited. The density of the micropores 22 per unit area of the anodic oxide film is preferably 200/μm$^2$ to 2,000/μm$^2$, and more preferably 200/μm$^2$ to 1,000/μm$^2$.

The above density is determined by observing the surface of the anodic oxide film 20 with a field emission scanning electron microscope (FE-SEM) at 150,000× magnification (N=4), counting the number of micropores existing in a range of 400 nm×600 nm in the obtained 4 images, and calculating the arithmetic mean of the counted number.

In the anodic oxide film 20, the micropores 22 may be distributed over the entire surface of the anodic oxide film or may be distributed to at least a part of the anodic oxide film. It is preferable that the micropores 22 are distributed over the entire surface of the anodic oxide film.

The micropores 22 are preferably substantially perpendicular to a surface of the anodic oxide film 20.

Furthermore, it is preferable that the micropores 22 be substantially evenly distributed.

[Regarding Aspect 2]

Figure 3A:
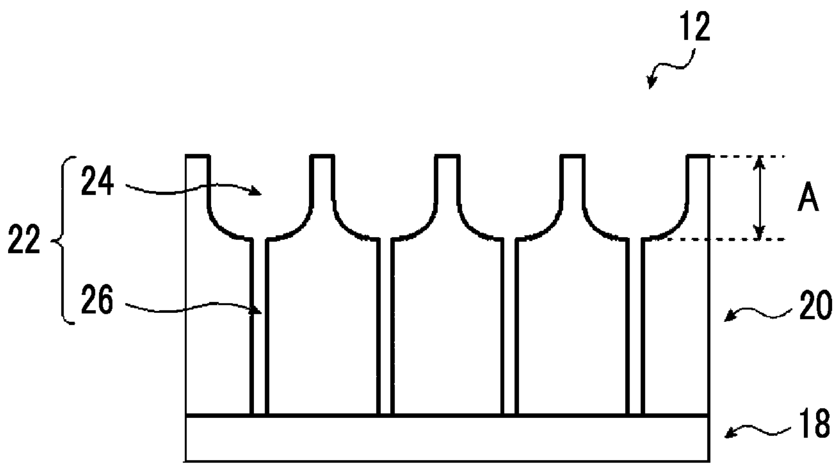
FIG. 3A is a schematic cross-sectional view of another embodiment of the aluminum support having an anodic oxide film.

FIG. 3A is a schematic cross-sectional view showing an embodiment of Aspect 2.

The micropores 22 in the anodic oxide film 20 are each composed of a large diameter portion 24 that extends to a position at a depth of 10 nm to 1,000 nm (depth A: see FIG. 3A) from the surface of the anodic oxide film and a small diameter portion 26 that is in communication with the bottom portion of the large diameter portion 24 and further extends from the communication position in the depth direction.

Hereinafter, the large diameter portion 24 and the small diameter portion 26 will be specifically described.

—Large Diameter Portion—

Presumably, in a case where the image-recording layer of the present disclosure that is in contact with the support is partially stuck in the large diameter portion within the surface of the anodic oxide film, an anchoring effect may be exhibited, the adhesiveness between the image area and the support may be improved, and the printing durability of the image area during printing may be enhanced.

The average micropore diameter (average opening diameter) of the large diameter portion 24 within the surface of the anodic oxide film is preferably 10 nm or more and 100 nm or less. In view of further improving UV printing durability, the average micropore diameter is more preferably more than 13 nm and 100 nm or less, even more preferably 15 nm to 60 nm, and particularly preferably 18 nm to 40 nm.

In a case where the average micropore diameter is larger than 13 nm, a lithographic printing plate having excellent UV printing durability is easily obtained. Furthermore, in a case where the average micropore diameter is 100 nm or less, a lithographic printing plate having excellent deinking properties is easily obtained.

In the present specification, "having excellent deinking properties" means that in a case where printing is performed using a lithographic printing plate, and stopped (for example, stopped for several hours), and then resumed, the number of printing sheets used until a printed matter having no noticeable stains is obtained is small.

The average diameter of the large diameter portion 24 is determined by observing the surface of the anodic oxide film 20 with a field emission scanning electron microscope (FE-SEM) at 150,000× magnification (N=4), measuring the diameter of micropores (large diameter portion) existing in a range of 400 nm×600 nm in the obtained 4 images, and calculating the arithmetic mean thereof.

In a case where the shape of the large diameter portion 24 is not circular, the equivalent circular diameter is used.

The bottom portion of the large diameter portion 24 is preferably at a position at a depth of 10 nm to 1,000 nm (hereinafter, called "depth A" in some cases) from the surface of the anodic oxide film. That is, the large diameter portion 24 is preferably a pore portion extending 10 nm or more from the surface of the anodic oxide film in the depth direction (thickness direction). Particularly, in view of further improving the effects of the present disclosure, the depth A is preferably more than 10 nm and 1,000 nm or less, more preferably 25 nm to 200 nm, and even more preferably 70 nm to 100 nm.

In a case where the depth A is 10 nm or more, it is easier to obtain a lithographic printing plate excellent in dot printing durability, dot developing latitude, and printing durability of solid image area. Furthermore, in a case where the depth A is 1,000 nm or less, it is easy to obtain a lithographic printing plate which is particularly excellent in deinking properties.

In the present specification, "dot printing durability" especially means the printing durability of dots (for example, an image area having a diameter (equivalent circular diameter) of a few μm to tens of μm).

The depth from the surface of the anodic oxide film is determined by observing the cross section of the anodic oxide film 20 with FE-SEM (150,000× magnification), measuring the depths of 25 large diameter portions in the obtained image, and calculating the arithmetic mean thereof.

The shape of the large diameter portion 24 is not particularly limited. For example, the large diameter portion 24 has a substantially straight tubular shape (substantially cylindrical shape), a conical shape that tapers along the depth direction (thickness direction), an inverted conical shape that thickens along the depth direction (thickness direction), and the like. Among these, a substantially straight tubular shape is preferable. Generally, there may be a difference of about 1 nm to 10 nm between the diameter of the bottom portion of the large diameter portion and the diameter of the opening portion. The shape of the bottom portion of the large diameter portion 24 is not particularly limited, and may be a curved (concave) or flat surface shape.

—Small Diameter Portion—

As shown in FIG. 3A, the micropores preferably each further have a small diameter portion 26 that is in communication with the bottom portion of the large diameter portion 24 and further extends in the depth direction (thickness direction) from the communication position.

Generally, one small diameter portion 26 is in communication with one large diameter portion 24. However, two or more small diameter portions 26 may be in communication with the bottom portion of one large diameter portion 24.

The average diameter of the small diameter portion 26 at the communication position is not particularly limited. The average diameter of the small diameter portion 26 that is in communication with the bottom portion of the large diameter portion 24 is smaller than the average diameter of the large diameter portion 24, which is preferably less than 20 nm, more preferably 15 nm or less, even more preferably 13 nm or less, and particularly preferably 10 nm or less. The average diameter is preferably 5 nm or more. In a case where the average diameter is less than 20 nm, it is easy to obtain a lithographic printing plate having excellent deinking properties.

The average diameter of the small diameter portion 26 is determined by observing the surface of the anodic oxide film 20 with FE-SEM at a 150,000× magnification (N=4), measuring the size (diameter) of the micropores (small diameter portion) existing in a range of 400 nm×600 nm in the obtained 4 images, and calculating the arithmetic mean thereof.

In a case where the large diameter portion is deep, if necessary, the upper portion of the anodic oxide film 20 (region where the large diameter portion is located) may be cut using, for example, argon gas or the like, then the surface of the anodic oxide film 20 may be observed with FE-SEM described above, and the average diameter of the small diameter portion may be determined.

In a case where the shape of the small diameter portion26 is not circular, the equivalent circular diameter is used.

The bottom portion of the small diameter portion 26 is preferably at a position at a depth of 20 nm to 2,000 nm (more preferably 100 nm or more and less than 1,940 nm) from the communication position (corresponding to the depth A described above) with the large diameter portion 24 in the depth direction. In other words, the depth of the small diameter portion 26 is preferably 20 nm to 2,000 nm (more preferably 100 nm or more and less than 1,940 nm). Particularly, in view of further improving the effects of the present disclosure, the small diameter portion 26 preferably extends to a position at a depth of 300 nm to 1,600 nm from the communication position, and more preferably extends to a position at a depth of 900 nm to 1,300 nm from the communication position.

In a case where the depth from the communication position is 20 nm or more, it is easy to obtain a lithographic printing plate precursor having excellent scratch resistance. In a case where the depth from the communication position is 2,000 nm or less, the treatment time is shortened, and excellent productivity and economic efficiency are easily obtained.

The depth of the small diameter portion is determined by observing the cross section of the anodic oxide film 20 with FE-SEM (50,000× magnification), measuring the depths of 25 small diameter portions in the obtained image, and calculating the arithmetic mean thereof.

The shape of the small diameter portion 26 is not particularly limited. For example, the small diameter portion 26 has a substantially straight tubular shape (substantially cylindrical shape), a conical shape that tapers along the depth direction, a dendritic shape that branches off along the depth direction, and the like. Among these, a substantially straight tubular shape is preferable. Generally, there may be a difference of about 1 to 5 nm between the diameter of the bottom portion of the small diameter portion 26 and the diameter of the small diameter portion 26 at the communication position. The shape of the bottom portion of the small diameter portion 26 is not particularly limited, and may be a curved (concave) or flat surface shape.

In the aluminum support having the anodic oxide film, the average diameter of the small diameter portion at the communication position is preferably smaller than the average diameter of the large diameter portion within the surface of the anodic oxide film. In a case where the average diameter of the small diameter portion is smaller than the average diameter of the large diameter portion, it is easy to obtain a lithographic printing plate having excellent antifouling properties (deinking properties).

Regarding the average diameter of the large diameter portion and the average diameter of the small diameter portion, the ratio, that is, average diameter of large diameter portion/average diameter of small diameter portion is preferably 1.1 to 12.5, and more preferably 1.5 to 10.

Furthermore, from the viewpoint of excellent UV printing durability, the average diameter of the small diameter portion is preferably smaller than the average diameter of the large diameter portion within the surface of the anodic oxide film. The average diameter of the small diameter portion is more preferably 5% to 80% and even more preferably 10% to 60% of the average diameter of the large diameter portion.

Figure 3B:
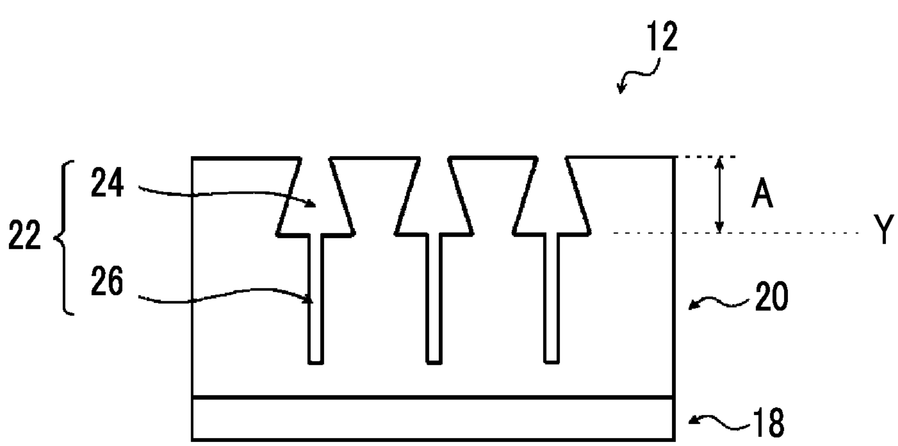
FIG. 3B is a schematic cross-sectional view of another embodiment of the aluminum support having an anodic oxide film.

As micropores, the micropores shown in FIG. 3B may also be used which each have a shape in which the average diameter at the bottom portion of the large diameter portion is larger than the average diameter of the micropores within the surface of the anodic oxide film, and further includes a small diameter portion that is in communication with the bottom portion of the large diameter portion. In a case where the average diameter of the bottom portion of the large diameter portion is larger than the average diameter of the micropores within the surface of the anodic oxide film, the average diameter of the micropores within the surface of the anodic oxide film is preferably 10 nm to 100 nm, and more preferably more than 13 nm and 100 nm or less. Furthermore, the average diameter of the bottom portion is preferably 20 nm to 300 nm.

In a case where the micropores each have such a shape that the average diameter of the bottom portion of the large diameter portion is larger than the average diameter of the micropores within the surface of the anodic oxide film, the average diameter of the micropores within the surface of the anodic oxide film is preferably 10 nm to 100 nm, and more preferably more than 13 nm and 30 nm or less from the viewpoint of antifouling properties (deinking properties). The average diameter of the bottom portion has no limitations as long as it is 20 nm to 300 nm, but is preferably 40 nm to 200 nm.

The thickness of the portion 10 nm to 100 nm distant from the surface of the anodic oxide film in the depth direction has no limitations, and is preferably 10 nm to 500 nm. From the viewpoint of scratch resistance, the thickness is more preferably 50 nm to 300 nm.

—Other Characteristics—

The density of the micropores 22 within the surface of the anodic oxide film 20 is not particularly limited. The density of the micropores 22 per unit area of the anodic oxide film is preferably $200/\mu m^2$ to $2,000/\mu m^2$, and more preferably $200/\mu m^2$ to $1,000/\mu m^2$.

The above density is determined by observing the surface of the anodic oxide film 20 with a field emission scanning electron microscope (FE-SEM) at 150,000× magnification (N=4), counting the number of micropores existing in a range of 400 nm×600 nm in the obtained 4 images, and calculating the arithmetic mean of the counted number.

In the anodic oxide film 20, the micropores 22 may be distributed over the entire surface of the anodic oxide film or may be distributed to at least a part of the anodic oxide film. It is preferable that the micropores 22 are distributed over the entire surface of the anodic oxide film.

The micropores 22 are preferably substantially perpendicular to a surface of the anodic oxide film 20.

Furthermore, it is preferable that the micropores 22 be substantially evenly distributed.

[Regarding Aspect 3; Average Diameter of Micropores]

Figure 4A:
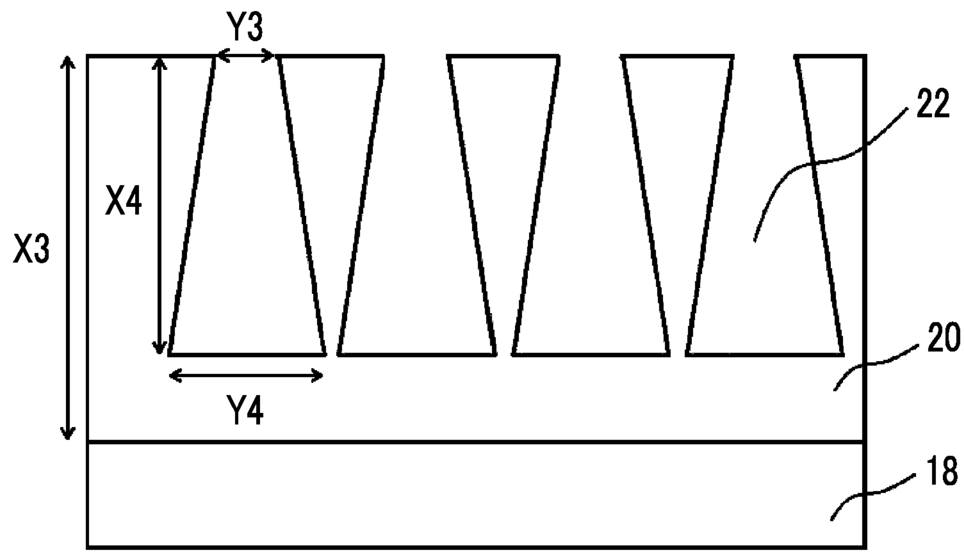
FIG. 4A is a schematic cross-sectional view of another embodiment of the aluminum support having an anodic oxide film.

FIG. 4A is a schematic cross-sectional view showing an embodiment of Aspect 3.

In FIG. 4A, an average diameter Y3 of the micropores 22 within the surface of the anodic oxide film is 10 nm to 30 nm, an average Y4 of the maximum inner diameter of the micropores 22 is 20 nm to 300 nm, and the average Y4 of the maximum inner diameter of the micropores 22 is larger than the average diameter Y3 of the micropores within the surface of the anodic oxide film.

A depth X4 of the micropore 22 is more than 10 nm, preferably 30 nm or more, and more preferably 75 nm or more.

The depth X4 of the micropores 22 is determined by observing the cross section of the anodic oxide film 20 with FE-SEM (150,000× magnification), measuring the depth of 25 micropores in the obtained image, and calculating the arithmetic mean thereof.

The average diameter Y3 of the micropores 22 within the surface of the anodic oxide film is preferably 10 nm or more and 30 nm or less, more preferably 11 nm or more and 25 nm or less, and even more preferably 12 nm or more and 20 nm or less.

The average Y4 of the maximum inner diameter of the micropore is preferably 10 nm or more and 300 nm or less, more preferably 15 nm or more and 200 nm or less, and even more preferably 20 nm or more and 100 nm or less.

The ratio of average Y4 of the maximum inner diameter of the micropore 22/average diameter Y3 of the micropores within the surface of the anodic oxide film is preferably 1.2/1 or more and 10/1 or less, more preferably 1.5/1 or more and 8/1 or less, and even more preferably 2/1 or more and 5/1 or less.

The ratio of the average Y4 of the maximum inner diameter of the micropores 22 to the average diameter Y3 of the micropores 22 is a value obtained by Expression 1B.

Equation 1B: (average Y4 of maximum inner diameter of micropores 22)/(average diameter Y3 of micropores 22 within surface of anodic oxide film)

The average diameter Y3 of the micropores within the surface of the anodic oxide film is obtained by the same method as that used for obtaining Y1 in Aspect 1.

The average Y4 of the maximum inner diameter of the micropores 22 is obtained by observing the surface of the anodic oxide film 20 with FE-SEM at a 150,000× magnification (N=4), measuring the maximum size (diameter) of the micropores 22 existing in a range of 400 nm×600 nm in the obtained 4 images, and calculating the arithmetic mean thereof. In a case where the micropores 22 are deep, if necessary, the upper portion of the anodic oxide film 20 may be cut in the in-plane direction of the anodic oxide film (for example, argon gas is used for cutting), then the surface of the anodic oxide film 20 may be observed with FE-SEM described above, and the average diameter Y4 of the bottom portion of the micropores 22 may be determined.

In a case where the shape of the micropores 22 is not circular, the equivalent circular diameter is used.

The shape of the micropores 22 in Aspect 3 is not particularly limited. For example, the micropores 22 have a substantially straight tubular shape (substantially cylindrical shape), a conical shape that tapers along the depth direction (thickness direction), an inverted conical shape that thickens along the depth direction (thickness direction), a cylindrical shape that bulges out in the middle, a cylindrical shape that is narrow in the middle, and the like. Among these, a substantially straight tubular shape is preferable. The shape of the bottom portion of the micropores 22 is not particularly limited, and may be a curved (concave) or flat surface shape.

Figure 4B:
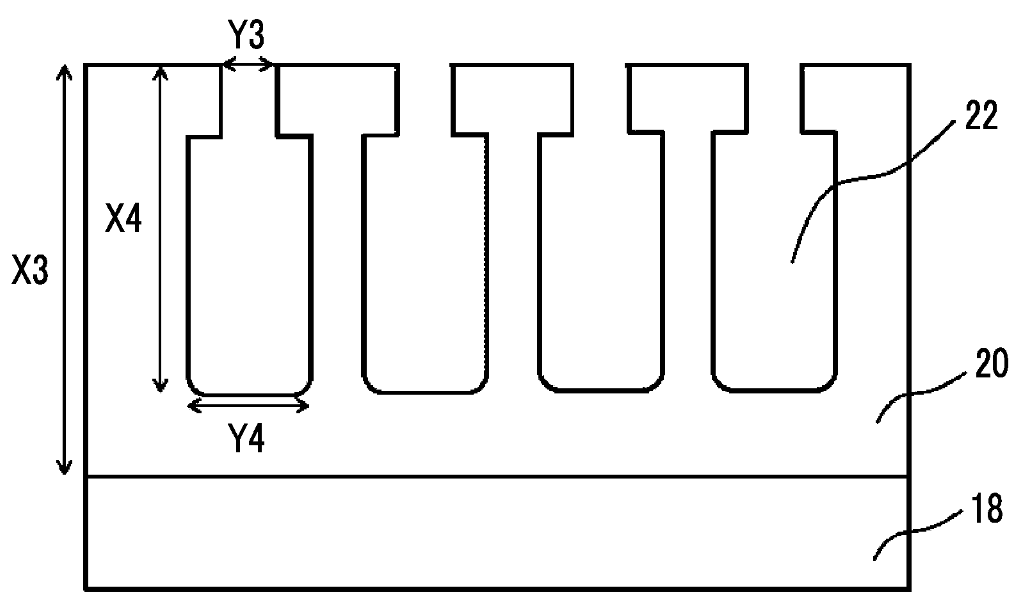
FIG. 4B is a schematic cross-sectional view of another embodiment of the aluminum support having an anodic oxide film.

Furthermore, as shown in FIG. 4B, the micropores may have a shape in which a small diameter cylinder and a large diameter cylinder are combined. These cylinders may have a substantially straight tubular shape, a conical shape, an inverted conical shape, a cylindrical shape that bulges out in the middle, or a cylindrical shape that is narrow in the middle. Among these, a substantially straight tubular shape is preferable. There are no particular limitations on the shape of the bottom portion of the micropores 22 having the shape shown in FIG. 4. The bottom portion may have a curved (concave) or flat surface shape.

—Other Characteristics—

The density of the micropores 22 within the surface of the anodic oxide film 20 is not particularly limited. The density of the micropores 22 per unit area of the anodic oxide film is preferably 200/$\mu m^2$ to 2,000/$\mu m^2$, and more preferably 200/$\mu m^2$ to 1,000/$\mu m^2$.

The above density is determined by observing the surface of the anodic oxide film 20 with a field emission scanning electron microscope (FE-SEM) at 150,000× magnification (N=4), counting the number of micropores existing in a range of 400 nm×600 nm in the obtained 4 images, and calculating the arithmetic mean of the counted number.

In the anodic oxide film 20, the micropores 22 may be distributed over the entire surface of the anodic oxide film or may be distributed to at least a part of the anodic oxide film. It is preferable that the micropores 22 are distributed over the entire surface of the anodic oxide film.

The micropores 22 are preferably substantially perpendicular to a surface of the anodic oxide film 20.

Furthermore, it is preferable that the micropores 22 be substantially evenly distributed.

[Method for Manufacturing Aluminum Support]

Hereinafter, a method for manufacturing the aluminum support having an anodic oxide film in the lithographic printing plate precursor according to the present disclosure will be described.

The method for manufacturing the aluminum support having an anodic oxide film is not particularly limited, but is preferably a manufacturing method having the following steps performed in order.

(Roughening treatment step) step of performing roughening treatment on aluminum plate (First anodic oxidation treatment step) step of subjecting aluminum plate having undergone roughening treatment to anodic oxidation (Pore widening treatment step) step of bringing aluminum plate having anodic oxide film obtained by first anodic oxidation treatment step into contact with aqueous acid solution or aqueous alkali solution so that diameter of micropores in anodic oxide film increases (Second anodic oxidation treatment step) step of subjecting aluminum plate obtained by pore widening treatment step to anodic oxidation (Hydrophilizing treatment step) step of performing hydrophilizing treatment on aluminum plate obtained by second anodic oxidation treatment step Hereinafter, each of the steps will be specifically described. Note that the roughening treatment step and the hydrophilizing treatment step may not be performed if these are unnecessary.

According to the above manufacturing method, the aluminum support according to Aspect 2 is obtained.

Figure 5A:
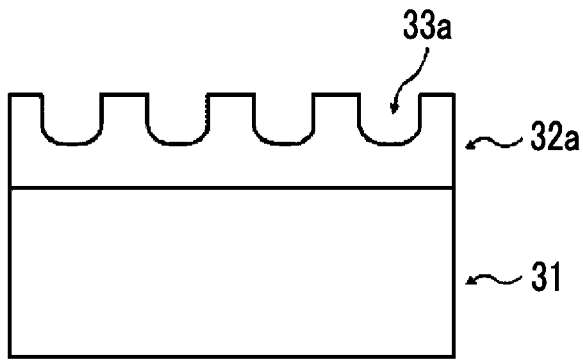
FIGS. 5A to 5C are schematic cross-sectional views of an aluminum support having an anodic oxide film, which show steps from a first anodic oxidation treatment step to a second anodic oxidation treatment step in order.
Figure 5B:
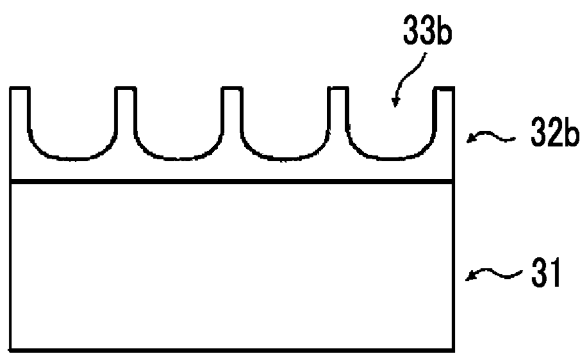
Figure 5C:
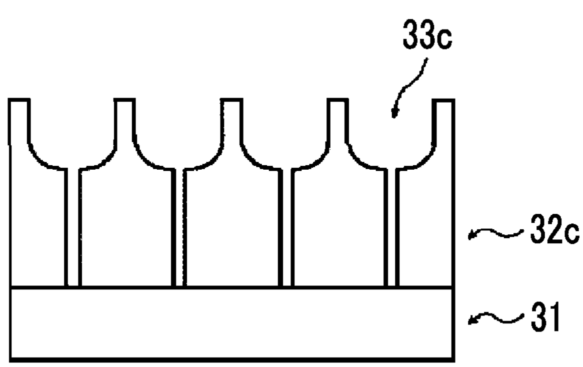

FIGS. 5A to 5C are schematic cross-sectional views of an aluminum support having an anodic oxide film, which show steps from the first anodic oxidation treatment step to the second anodic oxidation treatment step in order.

[Roughening Treatment Step]

The roughening treatment step is a step of performing a roughening treatment including an electrochemical roughening treatment on the surface of the aluminum plate. The roughening treatment step is preferably performed before the first anodic oxidation treatment step which will be described later. However, in a case where the surface of the aluminum plate already has a preferable shape, the roughening treatment step may not be performed.

As the roughening treatment, only an electrochemical roughening treatment may be performed, or an electrochemical roughening treatment and mechanical roughening treatment and/or a chemical roughening treatment may be performed in combination.

In a case where the mechanical roughening treatment and the electrochemical roughening treatment are combined, it is preferable to perform the electrochemical roughening treatment after the mechanical roughening treatment.

Figure 8:
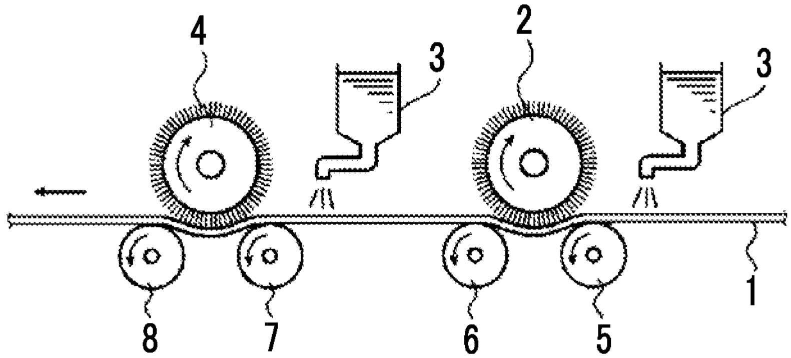
FIG. 8 is a lateral view conceptually showing a brush graining step used in a mechanical roughening treatment in a method for manufacturing an aluminum support having an anodic oxide film.

The mechanical roughening treatment is performed using, for example, the device shown in FIG. 8. Specifically, for example, in a state where a pumice suspension (specific gravity: 1.1 g/$cm^3$) as a polishing slurry liquid is being supplied to the surface of the aluminum plate, the mechanical roughening treatment is performed using a rotating bundled brush. In FIG. 8, 1 represents an aluminum plate, 2 and 4 represent roller-shaped brushes (bundled brushes and the like), 3 represents a polishing slurry liquid, and 5, 6, 7, and 8 represent support rollers.

The electrochemical roughening treatment is preferably performed in an aqueous solution of nitric acid or hydrochloric acid.

Generally, the mechanical roughening treatment is performed so that the aluminum plate has a surface roughness Ra of 0.35 μm to 1.0 μm.

The conditions of the mechanical roughening treatment are not particularly limited. For example, the mechanical roughening treatment can be performed according to the method described in JP1975-40047B (JP-S50-40047B). The mechanical roughening treatment can be performed by a brush graining treatment using a pumice stone suspension or by a transfer method.

The chemical roughening treatment is also not particularly limited, and can be performed according to known methods.

After the mechanical roughening treatment, it is preferable to perform the following chemical etching treatment.

By the chemical etching treatment performed after the mechanical roughening treatment, the edge portion of surface irregularities of the aluminum plate smoothed, so that ink clotting that may occur during printing is prevented, the antifouling properties (deinking properties) of the lithographic printing plate are improved, and unnecessary substances such as abrasive particles remaining on the surface are removed.

As the chemical etching treatment, etching with an acid or etching with an alkali is known. One of the examples of particularly efficient etching methods is a chemical etching treatment using an alkaline solution (hereinafter, also called "alkaline etching treatment").

The alkaline agent used in the alkaline solution is not particularly limited. For example, caustic soda (sodium hydroxide), caustic potash, sodium metasilicate, sodium carbonate, sodium aluminate, and sodium gluconate, and the like are suitable.

The alkaline agent may contain aluminum ions. The concentration of the alkaline solution is preferably 0.01% by mass or more, and more preferably 3% by mass or more. Furthermore, the concentration is preferably 30% by mass or less, and more preferably 25% by mass or less.

The temperature of the alkaline solution is preferably equal to or higher than room temperature, and more preferably 30° C. or higher. Furthermore, the temperature is preferably 80° C. or lower, and more preferably 75° C. or lower.

The etching amount is preferably 0.1 $g/m^2$ or more, and more preferably 1 $g/m^2$ or more. Furthermore, the etching amount is preferably 20 $g/m^2$ or less, and more preferably 10 $g/m^2$ or less.

The treatment time preferably is in a range of 2 seconds to 5 minutes depending on the etching amount. In view of improving productivity, the treatment time is more preferably 2 seconds to 10 seconds.

In a case where the alkaline etching treatment is performed after the mechanical roughening treatment, in order to remove products generated by the alkaline etching treatment, it is preferable to perform the chemical etching treatment by using a low-temperature acidic solution (hereinafter, also called "desmutting treatment").

The acid used in the acidic solution is not particularly limited, and examples thereof include sulfuric acid, nitric acid, and hydrochloric acid. The concentration of the acidic solution is preferably 1% by mass to 50% by mass. The temperature of the acidic solution is preferably 20° C. to 80° C. In a case where the concentration and temperature of the acidic solution are in this range, the antifouling properties (deinking properties) of the lithographic printing plate are further improved.

The roughening treatment is a treatment in which a mechanical roughening treatment and a chemical etching treatment are performed as desired and then an electrochemical roughening treatment is performed. However, even though the electrochemical roughening treatment is performed without performing the mechanical roughening treatment, the chemical etching treatment using an aqueous alkali solution such as caustic soda can be performed before the electrochemical roughening treatment. In this case, impurities existing near the surface of the aluminum plate and the like can be removed.

The electrochemical roughening treatment makes it easy to form fine irregularities (pits) on the surface of the aluminum plate. Therefore, this treatment is suited for preparing a lithographic printing plate having excellent printing properties.

The electrochemical roughening treatment is carried out using direct current or alternating current in an aqueous solution containing nitric acid or hydrochloric acid as a main component.

After the electrochemical roughening treatment, it is preferable to perform the following chemical etching treatment. There are smut and intermetallic compounds on the surface of the aluminum plate having undergone the electrochemical roughening treatment. The chemical etching treatment performed after the electrochemical roughening treatment is particularly efficient for removing smut. Therefore, it is preferable to perform the chemical etching treatment using an alkaline solution (alkaline etching treatment). Regarding the conditions of the chemical etching treatment using an alkaline solution, the treatment temperature is preferably 20° C. to 80° C., and the treatment time is preferably 1 second to 60 seconds. The alkaline solution preferably contains aluminum ions.

After performing the chemical etching treatment using an alkaline solution following the electrochemical roughening treatment, in order to remove the products generated by the chemical etching treatment, it is preferable to perform a chemical etching treatment using a low-temperature acidic solution (desmutting treatment).

Even in a case where the alkaline etching treatment is not performed after the electrochemical roughening treatment, in order to efficiently remove smut, it is preferable to perform the desmutting treatment.

The chemical etching treatment described above is not particularly limited, and can be performed by a dipping method, a shower method, a coating method, or the like.

[First Anodic Oxidation Treatment Step]

The first anodic oxidation treatment step is a step of performing an anodic oxidation treatment on the aluminum plate having undergone the aforementioned roughening treatment, so that an aluminum oxide film having micropores extending in the depth direction (thickness direction) is formed on the surface of the aluminum plate. By the first anodic oxidation treatment, as shown in FIG. 5A, an anodic oxide film 32*a* of aluminum having micropores 33*a* is formed on the surface of an aluminum plate 31.

The first anodic oxidation treatment can be carried out by the method conventionally performed in the field of related art. The manufacturing conditions are appropriately set so that the aforementioned micropores can be finally formed.

Specifically, the average diameter (average opening diameter) of the micropores 33*a* formed by the first anodic oxidation treatment step is preferably about 4 nm to 14 nm, and more preferably 5 nm to 10 nm. In a case where the diameter of the micropores is within the above range, micropores having the predetermined shape described above can be easily formed, and the obtained lithographic printing plate precursor has higher performance.

The depth of the micropore 33*a* is preferably about 60 nm or more and less than 200 nm, and more preferably 70 nm to 100 nm. In a case where the diameter of the micropores is within the above range, micropores having the predetermined shape described above can be easily formed, and the obtained lithographic printing plate precursor has higher performance.

The pore density of the micropores 33*a* is not particularly limited. The pore density is preferably 50/$\mu m^2$ to 4,000/$\mu m^2$, and more preferably 100/$\mu m^2$ to 3,000/$\mu m^2$. In a case where the pore density is within the above range, the obtained lithographic printing plate is excellent in UV printing durability and deinking properties, and the lithographic printing plate precursor has excellent developability.

The film thickness of the anodic oxide film obtained by the first anodic oxidation treatment step is preferably 70 nm to 300 nm, and more preferably 80 nm to 150 nm. In a case where the film thickness is within the above range, the obtained lithographic printing plate is excellent in UV printing durability, deinking properties, and antifouling properties, and the lithographic printing plate precursor has excellent developability.

The amount of the anodic oxide film obtained by the first anodic oxidation treatment step is preferably 0.1 $g/m^2$ to 0.3 $g/m^2$, and more preferably 0.12 $g/m^2$ to 0.25 $g/m^2$. In a case where the film thickness is within the above range, the obtained lithographic printing plate is excellent in UV printing durability, deinking properties, and antifouling properties, and the lithographic printing plate precursor has excellent developability.

In the first anodic oxidation treatment step, an aqueous solution of sulfuric acid, oxalic acid, phosphoric acid, or the like can be mainly used as an electrolytic cell. In some cases, an aqueous solution or a non-aqueous solution of chromic acid, sulfamic acid, benzenesulfonic acid, or the like or an aqueous solution or a non-aqueous solution containing two or more kinds among the above acids can also be used. In a case where direct current or alternating current is applied to the aluminum plate in the aforementioned electrolytic cell, an anodic oxide film can be formed on the surface of the aluminum plate. It is known that the pore diameter greatly varies with the type of electrolytic solution. In brief, pore diameter obtained using sulfuric acid electrolytic solution<pore diameter obtained using oxalic acid electrolytic solution<pore diameter obtained using phosphoric acid electrolytic solution.

Therefore, the anodic oxidation treatment may be performed twice by replacing the electrolytic solution, or performed in two or three stages in succession by using two or three treatment devices connected in series so that an anodic oxide film structure is established. With the method using a phosphoric acid electrolytic solution described in JP2002-365791A, it is possible to obtain an anodic oxide film having large pores at the bottom portion while maintaining the pore diameter of surface openings.

The electrolytic cell may contain aluminum ions. The content of the aluminum ions is not particularly limited, and is preferably 1 g/L to 10 g/L.

The conditions of the anodic oxidation treatment are appropriately set depending on the electrolytic solution used. Generally, the concentration of the electrolytic solution of 1% by mass to 80% by mass (preferably 5% by mass to 20% by mass), the liquid temperature of 5° C. to 70° C. (preferably 10° C. to 60° C.), the current density of 0.5 $A/dm^2$ to 60 $A/dm^2$ (preferably 5 $A/dm^2$ to 50 $A/dm^2$), the voltage of 1 V to 100 V (preferably 5 V to 50 V), and the electrolysis time of 1 second to 100 seconds (preferably 5 seconds to 60 seconds) are suitable.

Among the above anodic oxidation treatments described above, particularly, the anodic oxidation method described in UK Patent No. 1,412,768 is preferable which is performed in a sulfuric acid at a high current density.

[Pore Widening Treatment Step]

The pore widening treatment step is a treatment of enlarging the diameter of micropores (pore diameter) present in the anodic oxide film formed by the aforementioned first anodic oxidation treatment step (pore diameter enlarging treatment). By the pore widening treatment, as shown in FIG. 5B, the diameter of the micropores 33*a* is enlarged, and an anodic oxide film 32*b* having micropores 33*b* having a larger average diameter are formed.

By the pore widening treatment, the average diameter of the micropores 33*b* is enlarged to a range of 10 nm to 100 nm (preferably 15 nm to 60 nm, and more preferably 18 nm to 40 nm). The micropores 33*b* are portions corresponding to the aforementioned large diameter portion 24 (FIG. 5A).

It is preferable that the depth of the micropores 33*b* from the surface is adjusted to be about the same as the aforementioned depth A (FIG. 3A) by the pore widening treatment.

The pore widening treatment is carried out by bringing the aluminum plate obtained by the first anodic oxidation treatment step into contact with an aqueous acid solution or an aqueous alkali solution. The contact method is not particularly limited, and examples thereof include a dipping method and a spraying method. Among these, a dipping method is preferable.

In a case where an aqueous alkali solution is used in the pore widening treatment step, it is preferable to use at least one aqueous alkali solution selected from sodium hydroxide, potassium hydroxide, and lithium hydroxide. The concentration of the aqueous alkali solution is preferably 0.1% by mass to 5% by mass.

As a proper treatment method, the pH of the aqueous alkali solution is adjusted to 11 to 13, and then the aluminum plate is brought into contact with the aqueous alkali solution for 1 second to 300 seconds (preferably 1 second to 50 seconds) under the condition of 10° C. to 70° C. (preferably 20° C. to 50° C.).

The alkaline treatment liquid may contain a metal salt of a polyvalent weak acid such as carbonate, borate, or phosphate.

In a case where an aqueous acid solution is used in the pore widening treatment step, it is preferable to use an aqueous solution of an inorganic acid such as sulfuric acid, phosphoric acid, nitric acid, or hydrochloric acid, or a mixture of these. The concentration of the aqueous acid solution is preferably 1% by mass to 80% by mass, and more preferably 5% by mass to 50% by mass.

As a proper treatment method, the aluminum plate is brought into contact with the aqueous acid solution for 1 second to 300 seconds (preferably 1 second to 150 seconds) under the condition of a liquid temperature of the aqueous acid solution of 5° C. to 70° C. (preferably 10° C. to 60° C.).

The aqueous alkali solution or the aqueous acid solution may contain aluminum ions. The content of the aluminum ions is not particularly limited, and is preferably 1 g/L to 10 g/L.

[Second Anodic Oxidation Treatment Step]

The second anodic oxidation treatment step is a step of performing an anodic oxidation treatment on the aluminum plate having undergone the aforementioned pore widening treatment so that micropores extending in the depth direction (thickness direction) are formed. By the second anodic oxidation treatment step, as shown in FIG. 5C, an anodic oxide film 32*c* having micropores 33*c* extending in the depth direction is formed.

By the second anodic oxidation treatment step, new pore portions are formed which are in communication with the bottom portion of the micropores 33*b* having enlarged average diameter, have an average diameter smaller than the average diameter of the micropores 33*b* (corresponding to the large diameter portion 24), and extend from the communication position in the depth direction. These pore portions correspond to the small diameter portion 26 described above.

In the second anodic oxidation treatment step, the treatment is performed so that the newly formed pore portions have an average diameter of larger than 0 and less than 20 nm, and the depth from the communication position with the large diameter portion 20 falls into the predetermined range described above. The electrolytic cell used in this treatment is the same as the electrolytic cell used in the first anodic oxidation treatment step. The treatment conditions are appropriately set depending on the materials to be used.

The conditions of the anodic oxidation treatment are appropriately set depending on the electrolytic solution used. Generally, the concentration of the electrolytic solution of 1% by mass to 80% by mass (preferably 5% by mass to 20% by mass), the liquid temperature of 5° C. to 70° C. (preferably 10° C. to 60° C.), the current density of 0.5 $A/dm^2$ to 60 $A/dm^2$ (preferably 1 $A/dm^2$ to 30 $A/dm^2$), the voltage of 1 V to 100 V (preferably 5 V to 50 V), and the electrolysis time of 1 second to 100 seconds (preferably 5 seconds to 60 seconds) are suitable.

The film thickness of the anodic oxide film obtained by the second anodic oxidation treatment step is preferably 200 nm to 2,000 nm, and more preferably 750 nm to 1,500 nm. In a case where the film thickness is within the above range, the obtained lithographic printing plate is excellent in UV printing durability and deinking properties.

The amount of the anodic oxide film obtained by the second anodic oxidation treatment step is preferably 2.2 $g/m^2$ to 5.4 $g/m^2$, and more preferably 2.2 $g/m^2$ to 4.0 $g/m^2$. In a case where the film amount is within the above range, the obtained lithographic printing plate is excellent in UV printing durability and deinking properties, and the lithographic printing plate precursor is excellent in developability and scratch resistance.

The ratio of the thickness of the anodic oxide film obtained by the first anodic oxidation treatment step (film thickness 1) to the thickness of the anodic oxide film obtained by the second anodic oxidation treatment step (film thickness 2) (film thickness 1/film thickness 2) is preferably 0.01 to 0.15, and more preferably 0.02 to 0.10. In a case where the ratio is within the above range, the support for a lithographic printing plate has excellent scratch resistance.

In order to manufacture the small diameter portion 26 having the shape described above (see FIG. 5A), the applied voltage may be increased stepwise or continuously in the process of the second anodic oxidation treatment step. As the applied voltage is raised, the diameter of the formed pore portion increases. As a result, the small diameter portion 26 having the shape described above is obtained.

[Third Anodic Oxidation Treatment Step]

A third anodic oxidation treatment step may be performed after the second anodic oxidation treatment step.

The anodic oxidation treatment in the third anodic oxidation treatment step may be performed by the same method as the second anodic oxidation treatment step, by appropriately setting the solution components, current density, time, and the like depending on the surface condition required for the support surface.

[Hydrophilizing Treatment Step]

The method for manufacturing the aluminum support having an anodic oxide film may include a hydrophilizing treatment step of performing a hydrophilizing treatment after the anodic oxidation treatments described above. As the hydrophilizing treatment, known methods disclosed in paragraphs “0109” to “0114” of JP2005-254638A can be used.

It is preferable to perform the hydrophilizing treatment by a method of immersing the aluminum plate in an aqueous solution of an alkali metal silicate such as sodium silicate or potassium silicate.

The hydrophilizing treatment using an aqueous solution of an alkali metal silicate such as sodium silicate or potassium silicate can be performed according to the method and procedure described in U.S. Pat. Nos. 2,714,066A and 3,181,461A.

As the aluminum support having an anodic oxide film of the present disclosure, a support obtained by subjecting the aforementioned aluminum plate to the treatments shown in the following Aspects A to D in the following order is preferable. In view of printing durability, Aspect A is particularly preferable. It is desirable that rinsing is performed between the following treatments. However, in a case where two consecutive steps (treatments) are performed using a solution of the same composition, rinsing may not be performed.

[Aspect A]

(2) Chemical etching treatment in aqueous alkali solution (first alkaline etching treatment)

(3) Chemical etching treatment in aqueous acidic solution (first desmutting treatment)

(4) Electrochemical roughening treatment in aqueous solution containing hydrochloric acid or nitric acid as main component (first electrochemical roughening treatment)

(5) Chemical etching treatment in aqueous alkali solution (second alkaline etching treatment)

(6) Chemical etching treatment in aqueous acidic solution (second desmutting treatment)

(7) Electrochemical roughening treatment in aqueous solution containing hydrochloric acid as main component (second electrochemical roughening treatment)

(8) Chemical etching treatment in aqueous alkali solution (third alkaline etching treatment)

(9) Chemical etching treatment in aqueous acidic solution (third desmutting treatment)

(10) Anodic oxidation treatment (first anodic oxidation treatment (sulfuric acid), pore widening treatment, second anodic oxidation treatment (sulfuric acid))

(11) Hydrophilizing treatment

According to Aspect A, the aluminum support according to Aspect 2 described above is obtained.

[Aspect B]

(2) Chemical etching treatment in aqueous alkali solution (first alkaline etching treatment)

(3) Chemical etching treatment in aqueous acidic solution (first desmutting treatment)

(12) Electrochemical roughening treatment in aqueous solution containing hydrochloric acid or nitric acid as main component (5) Chemical etching treatment in aqueous alkali solution (second alkaline etching treatment)

(6) Chemical etching treatment in aqueous acidic solution (second desmutting treatment)

(10) anodic oxidation treatment (first anodic oxidation treatment (sulfuric acid), pore widening treatment)

(11) Hydrophilizing treatment

According to Aspect B, the aluminum support according to Aspect 1 described above is obtained.

[Aspect C]

(2) Chemical etching treatment in aqueous alkali solution (first alkaline etching treatment)

(3) Chemical etching treatment in aqueous acidic solution (first desmutting treatment)

(12) Electrochemical roughening treatment in aqueous solution containing hydrochloric acid or nitric acid as main component (5) Chemical etching treatment in aqueous alkali solution (second alkaline etching treatment)

(6) Chemical etching treatment in aqueous acidic solution (second desmutting treatment)

(10) Anodic oxidation treatment (first anodic oxidation treatment (phosphoric acid), second anodic oxidation treatment (sulfuric acid))

(11) Hydrophilizing treatment

According to Aspect C, the aluminum support according to Aspect 2 described above is obtained.

[Aspect D]

(2) Chemical etching treatment in aqueous alkali solution (first alkaline etching treatment)

(3) Chemical etching treatment in aqueous acidic solution (first desmutting treatment)

(12) Electrochemical roughening treatment in aqueous solution containing hydrochloric acid or nitric acid as main component (5) Chemical etching treatment in aqueous alkali solution (second alkaline etching treatment)

(6) Chemical etching treatment in aqueous acidic solution (second desmutting treatment)

(10) Anodic oxidation treatment (first anodic oxidation treatment (phosphoric acid))

(11) Hydrophilizing treatment

According to Aspect D, the aluminum support according to Aspect 3 described above is obtained.

If necessary, (1) mechanical roughening treatment may be performed before the treatment (2) of Aspects A to D. From the viewpoint of printing durability and the like, it is preferable that each of the aspects do not include the treatment (1)

The mechanical roughening treatment, electrochemical roughening treatment, chemical etching treatment, anodic oxidation treatment, and hydrophilizing treatment in (1) to (12) described above can be performed by the same methods as the treatment methods described above under the same conditions as above. However, it is preferable that these treatments be performed by the following treatment methods under the following conditions.

The mechanical roughening treatment is preferably a treatment of mechanically roughening the aluminum plate by using a rotating nylon brush roll having a bristle diameter of 0.2 mm to 1.61 mm and a slurry liquid supplied to the surface of the aluminum plate. As an abrasive, known materials can be used, which are preferably silica sand, quartz, aluminum hydroxide, and a mixture of these. The specific gravity of the slurry liquid is preferably 1.05 to 1.3. It goes without saying that a method of spraying the slurry liquid, a method of using a wire brush, a method of transferring the surface condition of a rolling mill roll having irregularities to the aluminum plate, or the like may also be used.

The concentration of the aqueous alkali solution used in the chemical etching treatment in an aqueous alkali solution (first to third alkaline etching treatments) is preferably 1% by mass to 30% by mass. In the aqueous alkali solution, the content of aluminum or alloy components contained an aluminum alloy may be 0% by mass to 10% by mass.

As the aqueous alkali solution, particularly, an aqueous solution containing sodium hydroxide as a main component is preferable. The treatment is preferably performed in the solution at room temperature (25° C.) to 95° C. for 1 second to 120 seconds.

After the etching treatment ends, in order to prevent the treatment liquid from affecting the next step, it is preferable to drain the liquid with a nip roller and perform rinsing by spraying.

The amount of the aluminum plate dissolved by the first alkaline etching treatment is preferably 0.5 $g/m^2$ to 30 $g/m^2$, more preferably 1.0 $g/m^2$ to 20 $g/m^2$, and even more preferably 3.0 $g/m^2$ to 15 $g/m^2$.

The amount of the aluminum plate dissolved by the second alkaline etching treatment is preferably 0.001 $g/m^2$ to 30 $g/m^2$, more preferably 0.1 $g/m^2$ to 4 $g/m^2$, and even more preferably 0.2 $g/m^2$ to 1.5 $g/m^2$.

The amount of the aluminum plate dissolved by the third alkaline etching treatment is preferably 0.001 $g/m^2$ to 30 $g/m^2$, more preferably 0.01 $g/m^2$ to 0.8 $g/m^2$, and even more preferably 0.02 $g/m^2$ to 0.3 $g/m^2$.

In the chemical etching treatment (first to third desmutting treatments) in an aqueous acidic solution, phosphoric acid, nitric acid, sulfuric acid, chromic acid, hydrochloric acid, or a mixed acid consisting of two or more of these acids is suitably used. The concentration of the aqueous acidic solution is preferably 0.5% by mass to 60% by mass. In the aqueous acidic solution, the amount of dissolved aluminum or alloy components contained in an aluminum alloy may be 0% by mass to 5% by mass.

The treatment is preferably performed under the conditions of a liquid temperature of room temperature to 95° C. and a treatment time of 1 second to 120 seconds. After the desmutting treatment ends, in order to prevent the treatment liquid from affecting the next step, it is preferable to drain the liquid with a nip roller and perform rinsing by spraying.

The aqueous solution used for the electrochemical roughening treatment will be described.

In the first electrochemical roughening treatment, as an aqueous solution containing nitric acid as a main component, an aqueous solution used for general electrochemical roughening treatment using direct current or alternating current can be used. It is possible to use a 1 g/L to 100 g/L aqueous nitric acid solution supplemented with one or more hydrochloric acid or nitric acid compounds having nitrate ions of aluminum nitrate, sodium nitrate, ammonium nitrate, and the like; hydrochloric acid ions of aluminum chloride, sodium chloride, ammonium chloride, and the like at 1 g/L to a saturation concentration.

In the aqueous solution containing nitric acid as a main component, metals contained in an aluminum alloy such as iron, copper, manganese, nickel, titanium, magnesium, and silica may be dissolved.

Specifically, it is preferable to use a 0.5% by mass to 2% by mass aqueous nitric acid solution supplemented with aluminum chloride and aluminum nitrate to yield an aluminum ion concentration of 3 g/L to 50 g/L.

The liquid temperature is preferably 10° C. to 90° C., and more preferably 40° C. to 80° C.

In the second electrochemical roughening treatment, as an aqueous solution containing hydrochloric acid as a main component, an aqueous solution used for general electrochemical roughening treatment using direct current or alternating current can be used. It is possible to use a 1 g/L to 100 g/L aqueous hydrochloric acid solution supplemented with one or more hydrochloric acid or nitric acid compounds having nitrate ions of aluminum nitrate, sodium nitrate, ammonium nitrate, and the like; hydrochloric acid ions of aluminum chloride, sodium chloride, ammonium chloride, and the like at 1 g/L to a saturation concentration.

In the aqueous solution containing hydrochloric acid as a main component, metals contained in an aluminum alloy such as iron, copper, manganese, nickel, titanium, magnesium, and silica may be dissolved.

Specifically, it is preferable to use a 0.5% by mass to 2% by mass aqueous hydrochloric acid solution supplemented with aluminum chloride and aluminum nitrate to yield an aluminum ion concentration of 3 g/L to 50 g/L.

The liquid temperature is preferably 10° C. to 60° C., and more preferably 20° C. to 50° C. Note that hypochlorous acid may also be added.

In the electrochemical roughening treatment in an aqueous hydrochloric acid solution in Aspect B, as an aqueous solution containing hydrochloric acid as a main component, an aqueous solution used for the general electrochemical roughening treatment using direct current or alternating current can be used. It is possible to use a 1 g/L to 100 g/L aqueous hydrochloric acid solution supplemented with 0 g/L to 30 g/L sulfuric acid. This aqueous solution can be used by being supplemented with one or more hydrochloric acid or nitric acid compounds having nitrate ions such as aluminum nitrate, sodium nitrate, and ammonium nitrate; hydrochloric acid ions such as aluminum chloride, sodium chloride, and ammonium chloride; and the like at a concentration of 1 g/L to a saturation concentration.

In the aqueous solution containing hydrochloric acid as a main component, metals contained in an aluminum alloy such as iron, copper, manganese, nickel, titanium, magnesium, and silica may be dissolved.

Specifically, it is preferable to use a solution composed of a 0.5% by mass to 2% by mass aqueous nitric acid solution supplemented with aluminum chloride, aluminum nitrate, and the like to yield an aluminum ion concentration of 3 to 50 g/L.

The liquid temperature is preferably 10° C. to 60° C., and more preferably 20° C. to 50° C. Note that hypochlorous acid may also be added.

As the waveform of an alternating current power source for the electrochemical roughening treatment, a sine wave, a square wave, a trapezoidal wave, a triangular wave, or the like can be used. The frequency is preferably 0.1 Hz to 250 Hz.

Figure 6:
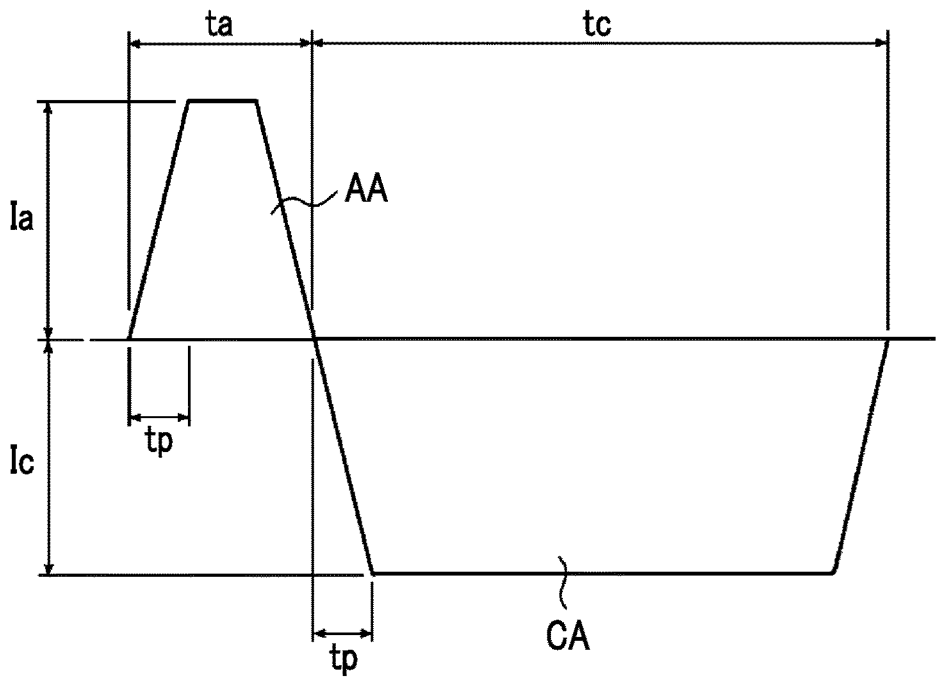
FIG. 6 is an example of a waveform graph of alternating current used for an electrochemical roughening treatment in a method for manufacturing an aluminum support having an anodic oxide film.

FIG. 6 shows an example of waveform graph of alternating current used for the electrochemical roughening treatment in the method for manufacturing the aluminum support having an anodic oxide film.

In FIG. 6, ta represents an anodic reaction time, tc represents a cathodic reaction time, tp represents the time taken for current to reach a peak from 0, Ia represents the peak current on the anodic cycle side, and Ic represents the peak current on the cathodic cycle side. For a trapezoidal wave, the time tp taken for current to reach a peak from 0 is preferably 1 ms to 10 ms.

Due to the influence of impedance of the power source circuit, in a case where tp is 1 or more, the voltage of the power source required at current waveform rise time is reduced, which is preferable in view of the equipment cost of the power source. In a case where tp is 10 ms or less, the treatment is less likely to be affected by the trace components in the electrolytic solution. Therefore, the aluminum plate can be more uniformly roughened.

Regarding the conditions of one cycle of alternating current used for the electrochemical roughening, a ratio tc/ta of the cathodic reaction time tc to the anodic reaction time ta of the aluminum plate is preferably within a range of 1 to 20, a ratio Qc/Qa of an electricity quantity Qc during the cathodic reaction to an electricity quantity Qa during the anodic reaction of the aluminum plate is preferably within a range of 0.3 to 20, and the anodic reaction time ta is preferably within a range of 5 ms to 1,000 ms. tc/ta is more preferably 2.5 to 15. Qc/Qa is more preferably 2.5 to 15. The peak current density of the trapezoidal wave is preferably 10 $A/dm^2$ to 200 $A/dm^2$ at both the anodic cycle side Ia and the cathodic cycle side Ic of the current. Ic/Ia is preferably in a range of 0.3 to 20. At a point time when the electrochemical roughening has ended, the total quantity of electricity that participates in the anodic reaction of the aluminum plate is preferably 25 $C/dm^2$ to 1,000 $C/dm^2$.

For the electrochemical roughening using alternating current, it is possible to use electrolytic cells used in known surface treatments, such as vertical, flat, and radial electrolytic cells. Particularly, the radial electrolytic cell described in JP1993-195300A (JP-H05-195300A) is preferable.

Figure 7:
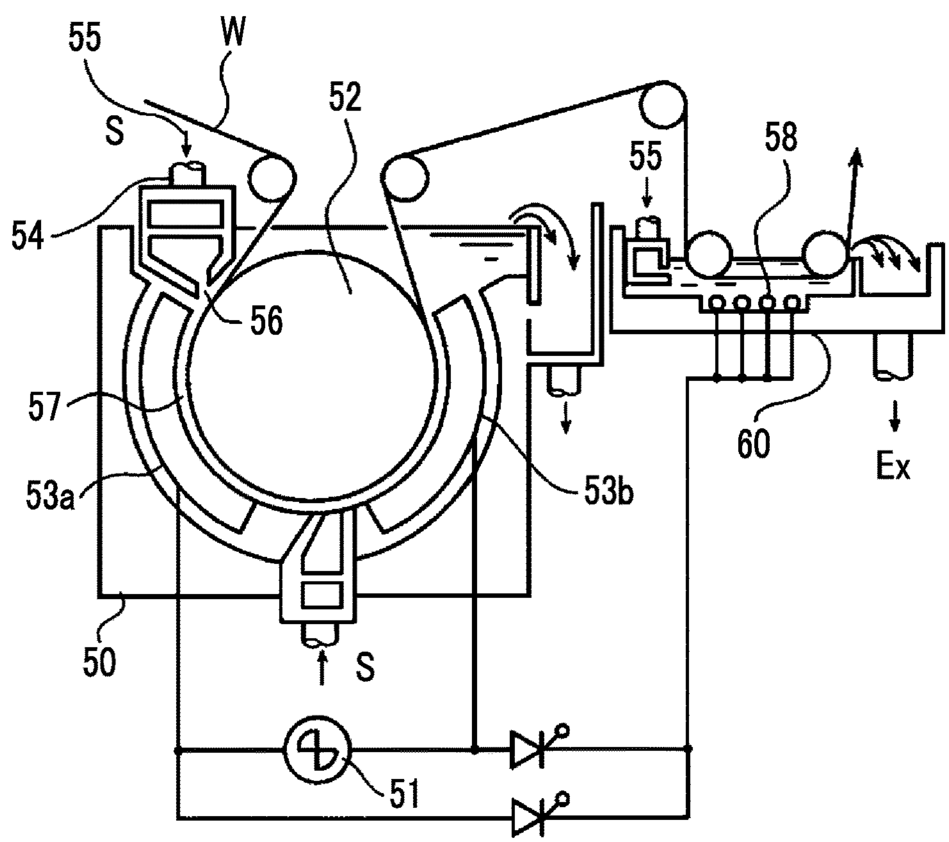
FIG. 7 is a lateral view showing an example of a radial cell in an electrochemical roughening treatment using alternating current in a method for manufacturing an aluminum support having an anodic oxide film.

The electrochemical roughening using alternating current can be performed using the device shown in FIG. 7. FIG. 7 is a lateral view showing an example of a radial cell in the electrochemical roughening treatment using alternating current in the method for manufacturing the aluminum support having an anodic oxide film.

In FIG. 7, 50 represents a main electrolytic cell, 51 represents an alternating current power source, 52 represents a radial drum roller, 53*a* and 53*b* represent main poles, 54 represents an electrolytic solution supply port, 55 represents an electrolytic solution, 56 represents a slit, 57 represents an electrolytic solution path, 58 represents an auxiliary anode, 60 represents an auxiliary anode tank, and W represents an aluminum plate. In a case where two or more electrolytic cells are used, the electrolysis conditions may be the same as or different from each other.

The aluminum plate W is wound around the radial drum roller 52 immersed and disposed in the main electrolytic cell 50. While being transported, the aluminum plate W is electrolyzed by the main poles 53*a* and 53*b* connected to the alternating current power source 51. From the electrolytic solution supply port 54, the electrolytic solution 55 is supplied to the electrolytic solution path 57 between the radial drum roller 52 and the main poles 53*a* and 53*b* through the slit 56. The aluminum plate W treated in the main electrolytic cell 50 is then electrolyzed in the auxiliary anode tank 60. In the auxiliary anode tank 60, the auxiliary anode 58 is disposed to face the aluminum plate W. The electrolytic solution 55 is supplied to flow in the space between the auxiliary anode 58 and the aluminum plate W.

If necessary, the support may have a backcoat layer on the side opposite to the image-recording layer, the backcoat layer containing the organic polymer compound described in JP1993-45885A (JP-H05-45885A) or the alkoxy compound of silicon described in JP1994-35174A (JP-H6-35174A).

<Undercoat Layer>

The lithographic printing plate precursor according to the present disclosure preferably has an undercoat layer (called interlayer in some cases) between the image-recording layer and the support. The undercoat layer enhances the adhesiveness between the support and the image-recording layer in an exposed portion, and enables the image-recording layer to be easily peeled from the support in a non-exposed portion. Therefore, the undercoat layer inhibits the deterioration of printing durability and contributes to the improvement of developability. Furthermore, in the case of exposure to infrared laser, the undercoat layer functions as a heat insulating layer and thus brings about an effect of preventing sensitivity reduction resulting from the diffusion of heat generated by exposure to the support.

Examples of compounds that are used in the undercoat layer include polymers having adsorbent groups that can be adsorbed onto the surface of the support and hydrophilic groups. In order to improve adhesiveness to the image-recording layer, polymers having adsorbent groups and hydrophilic groups plus crosslinking groups are preferable. The compounds that are used in the undercoat layer may be low-molecular-weight compounds or polymers. If necessary, as the compounds that are used in the undercoat layer, two or more kinds of compounds may be used as a mixture.

In a case where the compounds that are used in the undercoat layer are polymers, copolymers of monomers having adsorbent groups, monomers having hydrophilic groups, and monomers having crosslinking groups are preferable.

As the adsorbent groups that can be adsorbed onto the surface of the support, a phenolic hydroxyl group, a carboxy group, $—PO_3H_2$, $—OP_3OH_2$, $—CONHSO_2—$, $—SO_2NHSO_2—$, and $—COCH_2COCH_3$ are preferable. As the hydrophilic groups, a sulfo group or salts thereof and salts of a carboxy group are preferable. As the crosslinking groups, an acryloyl group, a methacryloyl group, an acrylamide group, a methacrylamide group, an allyl group, and the like are preferable.

The polymer may have a crosslinking group introduced by the formation of a salt of a polar substituent of the polymer and a compound that has a substituent having charge opposite to that of the polar substituent and an ethylenically unsaturated bond, or may be further copolymerized with monomers other than the monomers described above and preferably with hydrophilic monomers.

Specifically, for example, silane coupling agents having addition polymerizable ethylenic double bond reactive groups described in JP1998-282679A (JP-H10-282679A) and phosphorus compounds having ethylenic double bond reactive groups described in JP1990-304441A (JP-H02-304441A) are suitable. The low-molecular-weight compounds or polymer compounds having crosslinking groups (preferably ethylenically unsaturated bonding groups), functional groups that interact with the surface of the support, and hydrophilic groups described in JP2005-238816A, JP2005-125749A, JP2006-239867A, and JP2006-215263A are also preferably used.

For example, the high-molecular-weight polymers having adsorbent groups that can be adsorbed onto the surface of the support, hydrophilic groups, and crosslinking groups described in JP2005-125749A and JP2006-188038A are more preferable.

The content of ethylenically unsaturated bonding group in the polymer used in the undercoat layer is preferably 0.1 mmol to 10.0 mmol per gram of the polymer, and more preferably 0.2 mmol to 5.5 mmol per gram of the polymer.

The weight-average molecular weight (Mw) of the polymer used in the undercoat layer is preferably 5,000 or more, and more preferably 10,000 to 300,000.

In order to prevent contamination over time, the undercoat layer may contain, in addition to the compounds for the undercoat layer described above, a chelating agent, a secondary or tertiary amine, a polymerization inhibitor, a compound having an amino group or a functional group capable of inhibiting polymerization and a group that interacts with the surface of the support (for example, 1,4-diazabicyclo [2.2.2]octane (DABCO), 2,3,5,6-tetrahydroxy-p-quinone, chloranil, sulfophthalic acid, hydroxyethyl ethylenediaminetriacetic acid, dihydroxyethyl ethylenediaminediacetic acid, hydroxyethyl iminodiacetic acid, and the like), and the like.

The undercoat layer is formed by known coating methods. The coating amount (solid content) of the undercoat layer is preferably 0.1 mg/m$^2$ to 100 mg/m$^2$, and more preferably 1 mg/m$^2$ to 30 mg/m$^2$.

<Overcoat Layer>

The lithographic printing plate precursor according to the present disclosure may have an overcoat layer (also called "protective layer" in some cases) on a surface of the image-recording layer that is opposite to the support side.

The film thickness of the overcoat layer is preferably greater than the film thickness of the image-recording layer.

The overcoat layer preferably has a function of suppressing the reaction inhibiting image formation by blocking oxygen and a function of preventing the damage of the image-recording layer and preventing ablation during exposure to high-illuminance lasers.

The overcoat layer having such characteristics is described, for example, in U.S. Pat. No. 3,458,311A and JP1980-49729B (JP-S55-49729B). As polymers with low oxygen permeability that are used in the overcoat layer, any of water-soluble polymers and water-insoluble polymers can be appropriately selected. If necessary, two or more kinds of such polymers can be used by being mixed together. From the viewpoint of on-press developability, the polymers with low oxygen permeability preferably include a water-soluble polymer.

In the present disclosure, a water-soluble polymer refers to a polymer that dissolves 1 g or more in 100 g of pure water at 70° C. and is not precipitated even though a solution of 1 g of the polymer in 100 g of pure water at 70° C. is cooled to 25° C.

Examples of the water-soluble polymer used in the overcoat layer include polyvinyl alcohol, modified polyvinyl alcohol, polyvinylpyrrolidone, a water-soluble cellulose derivative, polyethylene glycol, poly(meth)acrylonitrile, and the like.

As the modified polyvinyl alcohol, acid-modified polyvinyl alcohol having a carboxy group or a sulfo group is preferably used. Specific examples thereof include modified polyvinyl alcohols described in JP2005-250216A and JP2006-259137A.

Among the above water-soluble polymers to be incorporated into the overcoat layer, polyvinyl alcohol is preferable, polyvinyl alcohol having a saponification degree of 50% or more is more preferable.

The saponification degree is preferably 60% or higher, more preferably 70% or higher, and even more preferably 85% or higher. The upper limit thereof of the saponification degree is not particularly limited, and may be 100% or less.

The saponification degree is measured according to the method described in JIS K 6726: 1994.

As an aspect of the overcoat layer, for example, an aspect in which the overcoat layer contains polyvinyl alcohol and polyethylene glycol is also preferable.

In a case where the overcoat layer in the present disclosure contains a water-soluble polymer, the content of the water-soluble polymer with respect to the total mass of the overcoat layer is preferably 1% by mass to 99% by mass, more preferably 3% by mass to 97% by mass, and even more preferably 5% by mass to 95% by mass.

The overcoat layer preferably contains a hydrophobic polymer.

The hydrophobic polymer refers to a polymer that dissolves less than 5 g or does not dissolve in 100 g of pure water at 125° C.

Examples of the hydrophobic polymer include polyethylene, polystyrene, polyvinyl chloride, polyvinylidene chloride, polyalkyl (meth)acrylate ester (for example, polymethyl (meth)acrylate, polyethyl (meth)acrylate, polybutyl (meth)acrylate, and the like), a copolymer obtained by combining raw material monomers of these resins, and the like.

The hydrophobic polymer preferably includes a polyvinylidene chloride resin.

Furthermore, the hydrophobic polymer preferably includes a styrene-acrylic copolymer (also called styrene acrylic resin).

From the viewpoint of on-press developability, the hydrophobic polymer is preferably hydrophobic polymer particles.

One kind of hydrophobic polymer may be used alone, or two or more kinds of hydrophobic polymers may be used in combination.

In a case where the overcoat layer contains a hydrophobic polymer, the content of the hydrophobic polymer with respect to the total mass of the overcoat layer is preferably 1% by mass to 70% by mass, more preferably 5% by mass to 50% by mass, and even more preferably 10% by mass to 40% by mass.

In the present disclosure, the proportion of the area of the hydrophobic polymer occupying the surface of the overcoat layer is preferably 30 area % or higher, more preferably 40 area % or higher, and even more preferably 50 area % or higher.

The upper limit of the proportion of the area of the hydrophobic polymer occupying the surface of the overcoat layer is, for example, 90 area %.

The proportion of the area of the hydrophobic polymer occupying the surface of the overcoat layer can be measured as follows.

By using PHI nano TOFII time-of-flight secondary ion mass spectrometer (TOF-SIMS) manufactured by ULVAC-PHI, INCORPORATED., the surface of the overcoat layer is irradiated with Bi ion beams (primary ions) at an acceleration voltage of 30 kV, and the peak of ions (secondary ions) corresponding to a hydrophobic portion (that is, a region formed of the hydrophobic polymer) that are emitted from the surface is measured so that the hydrophobic portion is mapped. By measuring the area of the hydrophobic portion in an area of 1 $\mu m^2$, the proportion of the area occupied by the hydrophobic portion is determined and adopted as "proportion of the area of the hydrophobic polymer occupying the surface of the overcoat layer".

For example, in a case where the hydrophobic polymer is an acrylic resin, the proportion is measured using the peak of $C_6H_{13}O^-$. Furthermore, in a case where the hydrophobic polymer is polyvinylidene chloride, the proportion is measured using the peak of $C_2H_2Cl^+$.

The proportion of occupied area can be adjusted by the amount of the hydrophobic polymer added or the like.

From the viewpoint of improving visibility of exposed portions, the overcoat layer preferably contains a color-developing substance precursor.

As the color-developing substance precursor, for example, those described above regarding the image-recording layer are suitable.

In a case where the overcoat layer contains the color-developing substance precursor, a brightness change ΔL in the lithographic printing plate precursor that will be described later can be easily set to 2.0 or more.

From the viewpoint of improving visibility of exposed portions, in a case where the lithographic printing plate precursor according to the present disclosure is exposed to infrared with a wavelength of 830 nm at an energy density of 110 mJ/cm$^2$, a brightness change ΔL between the brightness of the precursor before exposure and the brightness of the precursor after exposure is preferably 2.0 or more.

The brightness change AL is more preferably 3.0 or more, even more preferably 5.0 or more, particularly preferably 8.0 or more, and most preferably 10.0 or more.

An upper limit of the brightness change AL is, for example, 20.0.

The brightness change AL is measured by the following method.

In Luxel PLATESETTER T-9800 manufactured by FUJIFILM Graphic Systems that is equipped with an infrared semiconductor laser with a wavelength of 830 nm, the lithographic printing plate precursor is exposed under the conditions of output of 99.5%, outer drum rotation speed of 220 rpm, and resolution of 2,400 dpi (dots per inch, 1 inch=25.4 mm (energy density of 110 mJ/cm$^2$). The exposure is performed in an environment of 25° C. and 50% RH.

The brightness change of the lithographic printing plate precursor before and after exposure is measured.

The brightness change is measured using a spectrocolorimeter eXact manufactured by X-Rite, Incorporated. By using the L* value (brightness) in the L*a*b* color space, the absolute value of a difference between the L* value of the image-recording layer after the exposure and the L* value of the image-recording layer before the exposure is adopted as the brightness change ΔL.

One kind of color-developing substance precursor may be used alone, or two or more kinds of components may be combined and used as the color-developing substance precursor.

From the viewpoint of color developability, the content of the color-developing substance precursor in the overcoat layer with respect to the total mass of the overcoat layer is preferably 0.10% by mass to 50% by mass, more preferably 0.50% by mass to 30% by mass, and even more preferably 1.0% by mass to 20% by mass.

From the viewpoint of color developability, $M^X/M^Y$ which is a ratio of a content $M^X$ of the color-developing substance precursor in the overcoat layer to a content $M^Y$ of the infrared absorber in the image-recording layer is preferably 0.1 or higher, more preferably 0.2 or higher, and particularly preferably 0.3 or higher and 3.0 or less.

In order to improve oxygen barrier properties, the overcoat layer may contain an inorganic lamellar compound. The inorganic lamellar compound refers to particles in the form of a thin flat plate, and examples thereof include mica groups such as natural mica and synthetic mica, talc represented by Formula 3MgO·4SiO·H2O, taeniolite, montmorillonite, saponite, hectorite, zirconium phosphate, and the like.

As the inorganic lamellar compound, a mica compound is preferably used. Examples of the mica compound include mica groups such as natural mica and synthetic mica represented by Formula: $A(B, C)_{2-5}D_4O_{10}(OH, F, O)_2$ [here, A represents any of K, Na, and Ca, B and C represent any of Fe (II), Fe (III), Mn, Al, Mg, and V, and D represents Si or Al.].

In the mica groups, examples of natural mica include white mica, soda mica, gold mica, black mica, and lepidolite. Examples of synthetic mica include non-swelling mica such as fluorophlogopite $KMg_3(AlSi_3O_{10})F_2$, potassium tetrasilic mica $KMg_{2.5}(Si_4O_{10})F_2$, and, Na tetrasilylic mica $NaMg_{2.5}(Si_4O_{10})F_2$, swelling mica such as Na or Li taeniolite $(Na, Li)Mg_2Li(Si_4O_{10})F_2$, montmorillonite-based Na or Li hectorite $(Na, Li)_{1/8}Mg_{2/5}Li_{1/8}(Si_4O_{10})F_2$, and the like. Furthermore, synthetic smectite is also useful.

Among the aforementioned mica compounds, fluorine-based swelling mica is particularly useful. That is, swelling synthetic mica has a laminate structure consisting of unit crystal lattice layers having a thickness in a range of approximately 10 Å to 15 Å (1 Å is equal to 0.1 nm), and metal atoms in lattices are more actively substituted than in any other clay minerals. As a result, positive charges are deficient in the lattice layers, and positive ions such as $Li^+$, $Na^+$, $Ca^{2+}$, and $Mg^{2+}$ are adsorbed between the layers in order to compensate for the deficiency. Positive ions interposed between the layers are referred to as exchangeable positive ions and are exchangeable with various positive ions. Particularly, in a case where the positive ions between the layers are $Li^+$ and $Na^+$, the ionic radii are small, and thus the bonds between lamellar crystal lattices are weak, and mica is significantly swollen by water. In a case where shear is applied in this state, mica easily cleavages and forms a stable sol in water. Swelling synthetic mica is particularly preferably used because it clearly exhibits such a tendency.

From the viewpoint of diffusion control, regarding the shapes of the mica compounds, the thickness is preferably thin, and the planar size is preferably large as long as the smoothness and actinic ray-transmitting property of coated surfaces are not impaired. Therefore, the aspect ratio is preferably 20 or higher, more preferably 100 or higher, and particularly preferably 200 or higher. The aspect ratio is the ratio of the long diameter to the thickness of a particle and can be measured from projection views obtained from the microphotograph of the particle. The higher the aspect ratio is, the stronger the obtained effect is.

Regarding the particle diameter of the mica compound, the average long diameter thereof is preferably 0.3 μm to 20 μm, more preferably 0.5 μm to 10 μm, and particularly preferably 1 μm to 5 μm. The average thickness of the particles is preferably 0.1 μm or less, more preferably 0.05 μm or less, and particularly preferably 0.01 μm or less. Specifically, for example, in the case of swelling synthetic mica which is a typical compound, an aspect is preferable in which the compound has a thickness of about 1 nm to 50 nm and a surface size (long diameter) of about 1 μm to 20 μm.

The content of the inorganic lamellar compound with respect to the total mass of the overcoat layer is preferably 1% by mass to 60% by mass, and more preferably 3% by mass to 50% by mass. Even in a case where two or more kinds of inorganic lamellar compounds are used in combination, the total amount of the inorganic lamellar compounds preferable equals the content described above. In a case where the content is within the above range, the oxygen barrier properties are improved, and excellent sensitivity is obtained. In addition, the deterioration of receptivity can be prevented.

The overcoat layer may contain known additives such as a plasticizer for imparting flexibility, a surfactant for improving coating properties, and inorganic particles for controlling surface slipperiness. In addition, the oil sensitizing agent described above regarding the image-recording layer may be incorporated into the overcoat layer.

The overcoat layer is formed by known coating method. The coating amount of the overcoat layer (solid content) is preferably 0.01 $g/m^2$ to 10 $g/m^2$, more preferably 0.02 $g/m^2$ to 3 $g/m^2$, and particularly preferably 0.02 $g/m^2$ to 1 $g/m^2$.

The film thickness of the overcoat layer in the lithographic printing plate precursor according to the present disclosure is preferably 0.1 μm to 5.0 and more preferably 0.3 μm to 4.0 μm.

The film thickness of the overcoat layer in the lithographic printing plate precursor according to the present disclosure/film thickness of the image-recording layer is preferably 1.1/1 to 5.0/1, and more preferably 1.5/1 to 3.0/1.

The lithographic printing plate precursor according to the present disclosure may have other layers in addition to those described above.

Known layers can be adopted as those other layers without particular limitations. For example, if necessary, a backcoat layer may be provided on a surface of the support that is opposite to the image-recording layer side.

(Method for Preparing a Lithographic Printing Plate and Lithographic Printing Method)

It is possible to prepare a lithographic printing plate by performing image exposure and a development treatment on the lithographic printing plate precursor according to the present disclosure.

The method for preparing a lithographic printing plate according to the present disclosure preferably includes a step of exposing the on-press development type lithographic printing plate precursor according to the present disclosure in the shape of an image (hereinafter, this step will be also called "exposure step") and a step of removing the image-recording layer in a non-image area by supplying at least one material selected from the group consisting of printing ink and dampening water on a printer (hereinafter, this step will be also called "on-press development step").

The lithographic printing method according to the present disclosure preferably includes a step of exposing the on-press development type lithographic printing plate precursor according to the present disclosure in the shape of an image (exposure step), a step of removing the image-recording layer in a non-image area on a printer by supplying at least one material selected from the group consisting of printing ink and dampening water so that a lithographic printing plate is prepared (on-press development step), and a step of performing printing by using the obtained lithographic printing plate (printing step).

Hereinafter, regarding the method for preparing a lithographic printing plate according to the present disclosure and the lithographic printing method according to the present disclosure, preferred aspects of each step will be described in order. Note that the lithographic printing plate precursor according to the present disclosure can also be developed using a developer.

Hereinafter, the exposure step and the on-press development step in the method for preparing a lithographic printing plate will be described. The exposure step in the method for preparing a lithographic printing plate according to the present disclosure is the same step as the exposure step in the lithographic printing method according to the present disclosure. Furthermore, the on-press development step in the method for preparing a lithographic printing plate according to the present disclosure is the same step as the on-press development step in the lithographic printing method according to the present disclosure.

<Exposure Step>

The method for preparing a lithographic printing plate according to the present disclosure preferably includes an exposure step of exposing the lithographic printing plate precursor according to the present disclosure in the shape of an image so that an exposed portion and a non-exposed portion are formed. The lithographic printing plate precursor according to the present disclosure is preferably exposed to a laser through a transparent original picture having a linear image, a halftone dot image, or the like or exposed in the shape of an image by laser light scanning according to digital data or the like.

The wavelength of a light source to be used is preferably 750 nm to 1,400 nm. As the light source of 750 nm to 1,400 nm, a solid-state laser or a semiconductor laser that radiates infrared is suitable. In a case where an infrared laser is used, the output is preferably 100 mW or higher, the exposure time per pixel is preferably 20 microseconds or less, and the amount of irradiation energy is preferably 10 $mJ/cm^2$ to 300 $mJ/cm^2$. In addition, in order to shorten the exposure time, a multibeam laser device is preferably used. The exposure mechanism may be any one of an in-plane drum method, an external surface drum method, a flat head method, or the like.

The image exposure can be carried out by a common method using a platesetter or the like. In the case of on-press development, image exposure may be carried out on a printer after the lithographic printing plate precursor is mounted on the printer.

<On-Press Development Step>

The method for preparing a lithographic printing plate according to the present disclosure preferably includes an on-press development step of removing the image-recording layer in a non-image area by supplying at least one selected from the group consisting of printing ink and dampening water on a printer.

Hereinafter, the on-press development method will be described.

[On-Press Development Method]

In the on-press development method, the lithographic printing plate precursor having undergone image exposure is preferably supplied with an oil-based ink and an aqueous component on a printer, so that the image-recording layer in a non-image area is removed and a lithographic printing plate is prepared.

That is, in a case where the lithographic printing plate precursor is subjected to image exposure and then directly mounted on a printer without being subjected to any development treatment, or in a case where the lithographic printing plate precursor is mounted on a printer, then subjected to image exposure on the printer, and then supplied with an oil-based ink and an aqueous component for printing, at the initial stage in the middle of printing, in a non-image area, a non-cured image-recording layer is removed by either or both of the supplied oil-based ink and the aqueous component by means of dissolution or dispersion, and the hydrophilic surface is exposed in the non-image area. On the other hand, in an exposed portion, the image-recording layer cured by exposure forms an oil-based ink-receiving portion having a lipophilic surface. Any of the oil-based ink and the aqueous component may be supplied first to the surface of the plate. However, in view of preventing the plate from being contaminated by the components of the image-recording layer from which aqueous components are removed, it is preferable that the oil-based ink be supplied first. In the manner described above, the lithographic printing plate precursor is subjected to on-press development on a printer and used as it is for printing a number of sheets. As the oil-based ink and the aqueous component, ordinary printing ink and ordinary dampening water for lithographic printing are suitably used.

As the laser used for performing image exposure on the lithographic printing plate precursor according to the present disclosure, a light source having a wavelength of 300 nm to 450 nm or 750 nm to 1,400 nm is preferably used. A light source of 300 nm to 450 nm is preferable for a lithographic printing plate precursor including an image-recording layer containing sensitizing dye having maximum absorption in such a wavelength region. The light source of 750 nm to 1,400 nm is preferable for the aforementioned lithographic printing plate precursor. As the light source of 300 nm to 450 nm, a semiconductor laser is suitable.

<Printing Step>

The lithographic printing method according to the present disclosure includes a printing step of printing a recording medium by supplying printing ink to the lithographic printing plate.

The printing ink is not particularly limited, and various known inks can be used as desired. In addition, as the printing ink, for example, oil-based ink or ultraviolet-curable ink (UV ink) is preferable.

In the printing step, if necessary, dampening water may be supplied.

Furthermore, the printing step may be successively carried out after the on-press development step without stopping the printer.

The recording medium is not particularly limited, and known recording media can be used as desired.

In the method for preparing a lithographic printing plate from the lithographic printing plate precursor according to the present disclosure and in the lithographic printing method according to the present disclosure, if necessary, the entire surface of the lithographic printing plate precursor may be heated as necessary before exposure, in the middle of exposure, or during a period of time from exposure to development. In a case where the lithographic printing plate precursor is heated as above, an image-forming reaction in the image-recording layer is accelerated, which can result in advantages such as improvement of sensitivity and printing durability, stabilization of sensitivity, and the like. Heating before development is preferably carried out under a mild condition of 150° C. or lower. In a case where this aspect is adopted, it is possible to prevent problems such as curing of a non-image area. For heating after development, it is preferable to use an extremely severe condition which is preferably in a range of 100° C. to 500° C. In a case where this aspect is adopted, a sufficient image-strengthening action is obtained, and it is possible to inhibit problems such as the deterioration of the support or the thermal decomposition of the image area.

EXAMPLES

Hereinafter, the present disclosure will be specifically described based on examples, but the present disclosure is not limited thereto. In the present examples, unless otherwise specified, "%" and "part" mean "% by mass" and "part by mass" respectively. Unless otherwise described, the molecular weight of a polymer compound is a weight-average molecular weight (Mw), and the ratio of repeating constitutional units of a polymer compound is expressed as molar percentage. The weight-average molecular weight (Mw) is a value measured by gel permeation chromatography (GPC) and expressed in terms of polystyrene.

<Preparation of Support>

<<Surface Treatment A>>

(A-a) Mechanical Roughening Treatment (Brush Graining Method)

By using the device shown in FIG. 8, a pumice suspension (specific gravity: 1.1 g/cm$^3$) as a polishing slurry liquid was supplied to the surface of an aluminum plate, and in this state, a mechanical roughening treatment is performed using a rotating bundled brush. In FIG. 8, 1 represents an aluminum plate, 2 and 4 represent roller-shaped brushes (bundled brushes in the present example), 3 represents a polishing slurry liquid, and 5, 6, 7, and 8 represent support rollers.

In the mechanical roughening treatment, an abrasive having a median diameter (μm) of 30 μm and 4 brushes were used, and the rotation speed of the brushes was set to 250 rpm. The bundled brush was made of 6.10 nylon and consisted of bristles having a diameter of 0.3 mm and a length of 50 mm. The brush was prepared by making holes in a φ300 mm stainless steel cylinder and densely implanting bristles therein. The distance between two support rollers (c) 200 mm) under the bundled brush was 300 mm. The bundled brush was pressed until the load of the drive motor for rotating the brush was 10 kW higher than the load applied before the bundled brush was pressed on the aluminum plate. The direction of rotation of the brush was the same as the direction of movement of the aluminum plate.

(A-b) Alkaline Etching Treatment

From a spray tube, an aqueous solution of caustic soda having a caustic soda concentration of 26% by mass and an aluminum ion concentration of 6.5% by mass was sprayed onto the aluminum plate obtained above at a temperature of 70° C., thereby performing an etching treatment. Then, rinsing was performed by means of spraying. The amount of dissolved aluminum was 10 g/m$^2$.

(A-c) Desmutting Treatment in Aqueous Acidic Solution

Next, a desmutting treatment was performed in an aqueous nitric acid solution. As the aqueous nitric acid solution used in the desmutting treatment, the waste liquid of nitric acid used in the next step, electrochemical roughening, was used. The liquid temperature was 35° C. The desmutting treatment was performed for 3 seconds by spraying the desmutting liquid.

(A-d) Electrochemical Roughening Treatment

An electrochemical roughening treatment was continuously performed using nitric acid as an electrolyte at an alternating current voltage of 60 Hz. In this treatment, an electrolytic solution was used which was prepared by adding aluminum nitrate to 10.4 g/L aqueous nitric acid solution at a temperature of 35° C. so that the aluminum ion concentration was adjusted to 4.5 g/L. By using an alternating current power source having the waveform shown in FIG. 6, alternating current having a trapezoidal rectangular waveform, and a carbon electrode as a counter electrode, an electrochemical roughening treatment was performed under the conditions of a time tp taken for the current value to reach the peak from zero of 0.8 msec and the duty ratio of 1:1. As an auxiliary anode, ferrite was used. The electrolytic cell shown in FIG. 7 was used. The current density was 30 $A/dm^2$ in terms of the peak value of current, and 5% of the current coming from the power source was allowed to flow into the auxiliary anode. The quantity of electricity ($C/dm^2$) was 185 $C/dm^2$, which was the total quantity of electricity used when the aluminum plate was an anode. Then, rinsing was performed by means of spraying.

(A-e) Alkaline Etching Treatment

From a spray tube, an aqueous solution of caustic soda having a caustic soda concentration of 5% by mass and an aluminum ion concentration of 0.5% by mass was sprayed onto the aluminum plate obtained above at a temperature of 50° C., thereby performing an etching treatment. Then, rinsing was performed by means of spraying. The amount of dissolved aluminum was 0.5 $g/m^2$.

(A-f) Desmutting Treatment In Aqueous Acidic Solution

Next, a desmutting treatment was performed in an aqueous sulfuric acid solution. The aqueous sulfuric acid solution used in the desmutting treatment had a sulfuric acid concentration of 170 g/L and an aluminum ion concentration of 5 g/L. The liquid temperature was 30° C. The desmutting treatment was performed for 3 seconds by spraying the desmutting liquid.

(A-g) Electrochemical Roughening Treatment

An electrochemical roughening treatment was continuously performed using hydrochloric acid as an electrolyte at an alternating current voltage of 60 Hz. An electrolytic solution was used which was prepared by adding aluminum chloride to 6.2 g/L aqueous hydrochloric acid solution at a temperature of 35° C. so that the aluminum ion concentration was adjusted to 4.5 g/L. By using an alternating current power source having the waveform shown in FIG. 6, alternating current having a trapezoidal rectangular waveform, and a carbon electrode as a counter electrode, an electrochemical roughening treatment was performed under the conditions of a time tp taken for the current value to reach the peak from zero of 0.8 msec and the duty ratio of 1:1. As an auxiliary anode, ferrite was used. The electrolytic cell shown in FIG. 7 was used.

The current density was 25 $A/dm^2$ in terms of the peak value of current, and the quantity of electricity ($C/dm^2$) during the hydrochloric acid electrolysis was 63 $C/dm^2$ which is the total quantity of electricity used during the anodization of the aluminum plate. Then, rinsing was performed by means of spraying.

(A-h) Alkaline Etching Treatment

From a spray tube, an aqueous solution of caustic soda having a caustic soda concentration of 5% by mass and an aluminum ion concentration of 0.5% by mass was sprayed onto the aluminum plate obtained above at a temperature of 50° C., thereby performing an etching treatment. Then, rinsing was performed by means of spraying. The amount of dissolved aluminum was 0.1 $g/m^2$.

(A-i) Desmutting Treatment in Aqueous Acidic Solution

Next, a desmutting treatment was performed in an aqueous sulfuric acid solution. Specifically, by using a waste liquid generated in the anodic oxidation treatment step (170 g/L aqueous nitric acid solution containing dissolved aluminum ions at a concentration of 5 g/L), the desmutting treatment was performed for 4 seconds at a liquid temperature of 35° C. The desmutting treatment was performed for 3 seconds by spraying the desmutting liquid.

(A-j) First-Stage Anodic Oxidation Treatment

Figure 9:
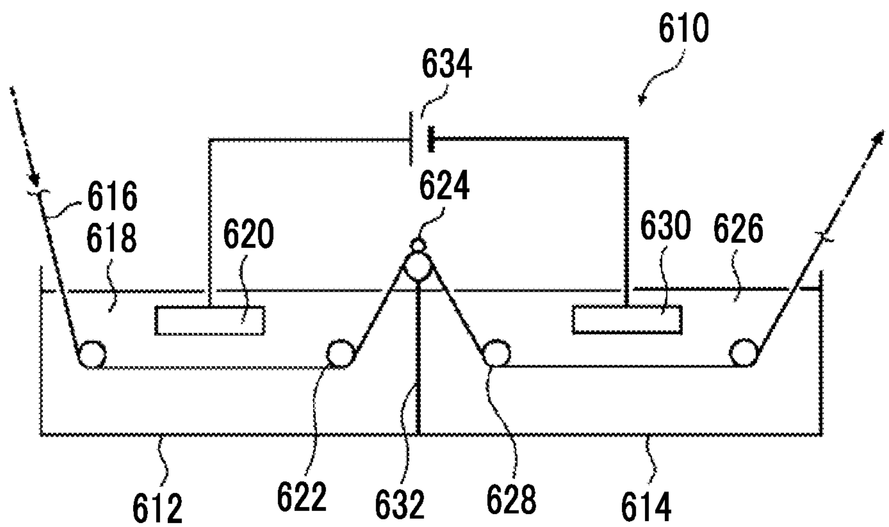
FIG. 9 is a schematic view of an anodic oxidation treatment device used for an anodic oxidation treatment in a method for manufacturing an aluminum support having an anodic oxide film.

By using the anodic oxidation device for direct current electrolysis having the structure shown in FIG. 9, a first-stage anodic oxidation treatment was performed. The anodic oxidation treatment was performed under the conditions shown in Table 1, thereby forming an anodic oxide film having a predetermined film thickness. In an anodic oxidation treatment device 610, an aluminum plate 616 is transported as indicated by the arrow in FIG. 9. In a power supply tank 612 containing an electrolytic solution 618, the aluminum plate 616 is positively (+) charged by a power supply electrode 620. Then, the aluminum plate 616 is transported upwards by a roller 622 in the power supply tank 612, makes a turn downwards by a nip roller 624, then transported toward an electrolytic treatment tank 614 containing an electrolytic solution 626, and makes a turn by a roller 628 so as to move in the horizontal direction. Subsequently, the aluminum plate 616 is negatively (−) charged by an electrolysis electrode 630. As a result, an anodic oxide film is formed on the surface of the aluminum plate 616. The aluminum plate 616 exits from the electrolytic treatment tank 614 and is then transported for the next step. In the anodic oxidation treatment device 610, the roller 622, the nip roller 624, and the roller 628 constitute a direction change unit. Furthermore, in the inter-tank portion between the power supply tank 612 and the electrolytic treatment tank 614, the aluminum plate 616 is transported in a ridge shape and an inverted U shape by the rollers 622, 624, and 628. The power supply electrode 620 and the electrolysis electrode 630 are connected to a direct current power source 634.

(A-k) Pore Widening Treatment

The aluminum plate having undergone the above anodic oxidation treatment was immersed in an aqueous solution of caustic soda at a temperature of 35° C. and having a caustic soda concentration of 5% by mass and an aluminum ion concentration of 0.5% by mass under the conditions shown in Table 1, thereby performing a pore widening treatment. Then, rinsing was performed by means of spraying.

(A-l) Second-Stage Anodic Oxidation Treatment

By using the anodic oxidation device for direct current electrolysis having the structure shown in FIG. 9, a second-stage anodic oxidation treatment was performed. The anodic oxidation treatment was performed under the conditions shown in Table 1, thereby forming an anodic oxide film having a predetermined film thickness.

(A-m) Third Stage Anodic Oxidation Treatment

By using the anodic oxidation device for direct current electrolysis having the structure shown in FIG. 9, a third-stage anodic oxidation treatment was performed. The anodic oxidation treatment was performed under the conditions shown in Table 1, thereby forming an anodic oxide film having a predetermined film thickness.

<<Surface Treatment B>>:

[Support having Large Diameter Portion and Small Diameter Portion]

(B-a) Alkaline Etching Treatment

From a spray tube, an aqueous solution of caustic soda having a caustic soda (sodium hydroxide) concentration of 26% by mass and an aluminum ion concentration of 6.5% by mass was sprayed onto the aluminum plate at a temperature of 70° C., thereby performing an etching treatment. Then, rinsing was performed by means of spraying. The amount of dissolved aluminum within the surface to be subjected to the electrochemical roughening treatment later was 1.0 g/m$^2$.

(B-b) Desmutting Treatment in Aqueous Acidic Solution (First Desmutting Treatment)

Next, a desmutting treatment was performed in an aqueous acidic solution. In the desmutting treatment, a 150 g/L aqueous sulfuric acid solution was used as the aqueous acidic solution. The liquid temperature was 30° C. The desmutting treatment was performed for 3 seconds by spraying the desmutting liquid. Then, a rinsing treatment was performed.

(B-c) Electrochemical Roughening Treatment in Aqueous Hydrochloric Acid Solution Next, an electrolytic roughening treatment was performed using alternating current and an electrolytic solution having a hydrochloric acid concentration of 14 g/L, an aluminum ion concentration of 13 g/L, and a sulfuric acid concentration of 3 g/L. The liquid temperature of the electrolytic solution was 30° C. The aluminum ion concentration was adjusted by adding aluminum chloride. The waveform of the alternating current was a sine wave in which positive and negative waveforms are symmetrical, the frequency was 50 Hz, the ratio of the anodic reaction time and the cathodic reaction time in one cycle of the alternating current was 1:1, and the current density was 75 A/dm$^2$ in terms of the peak current value of the alternating current waveform. In addition, the quantity of electricity was 450 C/dm$^2$ which is the total quantity of electricity used for the aluminum plate to have an anodic reaction, and the electrolysis treatment was performed 4 times by conducting electricity of 125 C/dm$^2$ for 4 seconds at each treatment session. A carbon electrode was used as the counter electrode of the aluminum plate. Then, a rinsing treatment was performed.

(B-d) Alkaline Etching Treatment

From a spray tube, an aqueous solution of caustic soda having a caustic soda concentration of 5% by mass and an aluminum ion concentration of 0.5% by mass was sprayed onto the aluminum plate having undergone the electrochemical roughening treatment at a temperature of 45° C., thereby performing an etching treatment. The amount of dissolved aluminum within the surface having undergone the electrochemical roughening treatment was 0.2 g/m$^2$. Then, a rinsing treatment was performed.

(B-e) Desmutting Treatment in Aqueous Acidic Solution

Next, a desmutting treatment was performed in an aqueous acidic solution. In the desmutting treatment, a waste liquid generated in the anodic oxidation treatment step (170 g/L aqueous sulfuric acid solution containing dissolved aluminum ions at 5.0 g/L) was used as an aqueous acidic solution. The liquid temperature was 30° C. The desmutting treatment was performed for 3 seconds by spraying the desmutting liquid.

(B-f) First-Stage Anodic Oxidation Treatment

By using the anodic oxidation device for direct current electrolysis having the structure shown in FIG. 9, a first-stage anodic oxidation treatment was performed. The anodic oxidation treatment was performed under the conditions shown in Table 1, thereby forming an anodic oxide film having a predetermined film thickness.

(B-g) Pore Widening Treatment

The aluminum plate having undergone the above anodic oxidation treatment was immersed in an aqueous solution of caustic soda at a temperature of 35° C. and having a caustic soda concentration of 5% by mass and an aluminum ion concentration of 0.5% by mass under the conditions shown in Table 1, thereby performing a pore widening treatment. Then, rinsing was performed by means of spraying.

(B-h) Second-Stage Anodic Oxidation Treatment

By using the anodic oxidation device for direct current electrolysis having the structure shown in FIG. 9, a second-stage anodic oxidation treatment was performed. The anodic oxidation treatment was performed under the conditions shown in Table 1, thereby forming an anodic oxide film having a predetermined film thickness.

By the surface treatment A or B, supports S1 to S6 shown in Tables 1 and 2 were obtained.

Table 2 shows the average diameter (nm) of the large diameter portion within the surface of the anodic oxide film having micropores obtained after the second anodic oxidation treatment step, the average diameter (nm) of the small diameter portion at a communication position, the depth (nm) of the large diameter portion and the small diameter portion, the pit density (micropore density, unit; number of micropores/μm$^2$), and the thickness (nm) of the anodic oxide film from the bottom portion of the small diameter portion to the surface of the aluminum plate.

The average diameter of the micropores (average diameter of the large diameter portion and the small diameter portion) is a value obtained by observing the surface of the large diameter portion and the surface of the small diameter portion with FE-SEM at a 150,000× magnification (N=4), and measuring the diameters of the micropores (large diameter portion and small diameter portion) in a range of 400 nm×600 nm in the obtained 4 images, and calculating the average thereof. In a case where the large diameter portion was deep, it was difficult to measure the diameter of the small diameter portion, and the diameter of an enlarged portion in the small diameter portion needed to be measured, the upper portion of the anodic oxide film was cut, and then various diameters were calculated.

The depth of the micropores (depth of the large diameter portion and the small diameter portion) is a value obtained by observing the cross section of the support (anodic oxide film) with FE-SEM (observation of the depth of the large diameter portion: 150,000× magnification, observation of depth of small diameter portion: 50,000× magnification), measuring the depths of 25 random micropores in the obtained image, and calculating the average thereof.

In Table 1, Film amount (AD) in the column of First anodic oxidation treatment and Film amount (AD) in the column of Second anodic oxidation treatment represent the amount of film obtained by each treatment. As electrolytic solutions, the aqueous solutions containing the components in Table 1 were used.

TABLE 1

| | | First anodic oxidation treatment | | | | | | | Pore widening treatment |
|---|---|---|---|---|---|---|---|---|---|
| Support | Surface treatment | Liquid type | Liquid component | Component concentration | Temperature | Current density | Time | Film amount | Liquid component |
| Support S1 | A | Sulfuric acid | $H_2SO_4$/Al | 170/5 | 40 | 5 | 5 | 0.25 | NaOH5%/Al0.5% |
| Support S2 | A | Sulfuric acid | $H_2SO_4$/Al | 170/5 | 40 | 30 | 1.6 | 0.25 | NaOH5%/Al0.5% |
| Support S3 | A | Sulfuric acid | $H_2SO_4$/Al | 170/5 | 40 | 17 | 8 | 1.25 | NaOH5%/Al0.5% |
| Support S4 | B | Sulfuric acid | $H_2SO_4$/Al | 170/5 | 40 | 30 | 16 | 2.5 | NaOH5%/Al0.5% |
| Support S5 | B | Sulfuric acid | $H_2SO_4$/Al | 170/5 | 40 | 8 | 4 | 0.25 | NaOH5%/Al0.5% |
| Support S6 | A | Sulfuric acid | $H_3PO_4$ | 200 | 35 | 2 | 50 | 0.3 | — |

| | Pore widening treatment | | Second anodic oxidation treatment | | | | | | |
|---|---|---|---|---|---|---|---|---|---|
| Support | Temperature | Time | Liquid type | Liquid component | Component concentration | Temperature | Current density | Time | Film amount |
| Support S1 | 35 | 3 | Sulfuric acid | $H_2SO_4$/Al | 170/5 | 50 | 13 | 17 | 2.25 |
| Support S2 | 35 | 5 | Sulfuric acid | $H_2SO_4$/Al | 170/5 | 50 | 13 | 17 | 2.25 |
| Support S3 | 35 | 3 | Sulfuric acid | $H_2SO_4$/Al | 170/5 | 50 | 13 | 9 | 1.25 |
| Support S4 | 35 | 3 | — | — | — | — | — | — | — |
| Support S5 | 35 | 3 | Sulfuric acid | $H_2SO_4$/Al | 170/5 | 50 | 13 | 25 | 3.35 |
| Support S6 | — | — | Sulfuric acid | $H_2SO_4$/Al | 170/5 | 50 | 13 | 17 | 2.25 |

TABLE 2

| | Large diameter portion | | | | Small diameter portion | | | |
|---|---|---|---|---|---|---|---|---|
| | Average diameter (nm) | Shape | Micropore density (number/μm$^2$) | Depth (nm) | Pore diameter at communication position (nm) | Shape | Depth (nm) | Thickness of anodic oxide film (nm) |
| Support S1 | 26 | Straight tubular | 1,150 | 150 | 10 | Straight tubular | 850 | 1,000 |
| Support S2 | 35 | Straight tubular | 500 | 100 | 10 | Straight tubular | 900 | 1,000 |
| Support S3 | 26 | Straight tubular | 800 | 500 | 10 | Straight tubular | 500 | 1,000 |
| Support S4 | 25 | Straight tubular | 500 | 980 | — | — | — | 1,000 |
| Support S5 | 26 | Straight tubular | 1,080 | 100 | 10 | Straight tubular | 1,400 | 1,500 |
| Support S6 | 26 | Straight tubular | 1,150 | 160 | 10 | Straight tubular | 850 | 1,000 |

Examples 1 to 23 and Comparative Example 1

<Formation of Lithographic Printing Plate Precursor>

The support described in Table 3 was coated with an undercoat solution 1 or 2 having the following composition so that the dry coating amount reached 92 mg/m$^2$, and the support was dried in an oven at 100° C. for 30 seconds, thereby preparing a support having an undercoat layer.

The undercoat layer was bar-coated with the following coating solution (1) for an image-recording layer and dried in an oven at 100° C. for 60 seconds so that an image-recording layer having a dry coating amount of 0.90 g/m$^2$ (film thickness=about 0.9 μm) was formed. In this way, a lithographic printing plate precursor was obtained.

Thereafter, the image-recording layer was bar-coated with the coating solution for a protective layer described in Table 3 or 4 having the following composition, and dried in an oven at 120° C. for 60 seconds so that a protective layer having a dry coating amount described below regarding each coating solution for a protective layer was formed, thereby preparing an on-press development type lithographic printing plate precursor.

[Composition of Undercoat Solution 1]

Compound (P-1) for undercoat layer: 0.105 parts

Sodium gluconate: 0.0700 parts

Surfactant (EMALEX 710, manufactured by NIHON EMULSION Co., Ltd.): 0.00159 parts Preservative (BIOHOPE L, manufactured by K-I Chemical Industry Co., LTD.): 0.00149 parts Water: 2.8519 parts

[Composition of Undercoat Solution 2]

Compound (P-1) for undercoat layer: 0.105 parts

CHELEST 400 (manufactured by CHELEST CORPORATION): 0.0700 parts

Surfactant (EMALEX 710, manufactured by NIHON EMULSION Co., Ltd.): 0.00159 parts Preservative (BIOHOPE L, manufactured by K-I Chemical Industry Co., LTD.): 0.00149 parts Water: 2.8519 parts —Synthesis of Undercoat Compound (P-1)—

<<Purification of Monomer M-1>>

LIGHT ESTER P-1M (2-methacryloyloxyethyl acid phosphate, manufactured by KYOEISHA CHEMICAL Co., LTD.) (420 parts), 1,050 parts of diethylene glycol dibutyl ether, and 1,050 parts of distilled water were added to a separatory funnel, vigorously stirred, and then left to stand. The upper layer was discarded, 1,050 parts of diethylene glycol dibutyl ether was then added thereto, the solution was vigorously stirred, and then left to stand. The upper layer was discarded, thereby obtaining 1,300 parts of an aqueous solution of a monomer M-1 (10.5% by mass in terms of solid contents).

(P-1)

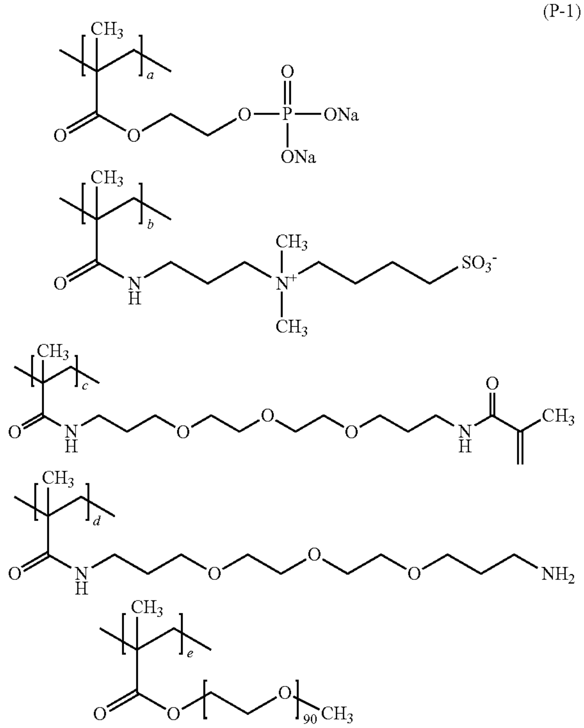

a/b/c/d/e = 14.2/71.8/8.9/0.1/5.0 (% by mass)
a/b/c/d/e = 19.0/72.8/7.7/0.1/0.4 (mol%)
Weight-average molecular weight = 200,000

<Composition of Coating Solution (1) for Image-recording Layer>

Infrared absorbers described in Table 3 or 4: amount described in Table 3 or 4

Color-developing substance precursor described in Table 3 or 4: amount described in Table 3 or 4

Electron-accepting polymerization initiator described in Table 3 or 4: amount described in Table 3 or 4

Borate compounds (electron-donating polymerization initiator) described in Table 3 or 4: amount described in Table 3 or 4

Binder polymer described in Table 3 or 4: amount described in Table 3 or 4

Polymerizable compound described in Table 3 or 4: amount described in Table 3 or 4

Oil sensitizing agent described in Table 3 or 4: amount described in Table 3 or 4

Anionic surfactant (A-1, the following compound): amount described in Table 3 or 4

Fluorine-based surfactant (W-1, the following compound): 4.16 parts

2-Butanone: 4,920 parts

1-Methoxy-2-propanol: 3,100 parts

Methanol: 2,790 parts

Polymer particles described in Table 3 or 4: amount described in Table 3 or 4

[Infrared Absorber]

IR-1: Compound having the following structure, HOMO=−5.35 eV

IR-2: Compound having the following structure, HOMO=−5.35 eV

IR-3: Compound having the following structure, HOMO=−5.35 eV

IR-4: Compound having the following structure, HOMO=−5.20 eV

IR-5: Compound having the following structure, HOMO=−5.43 eV

IR-6: Compound having the following structure, HOMO=−5.34 eV

IR-7: Compound having the following structure, HOMO=−5.34 eV

IR-1

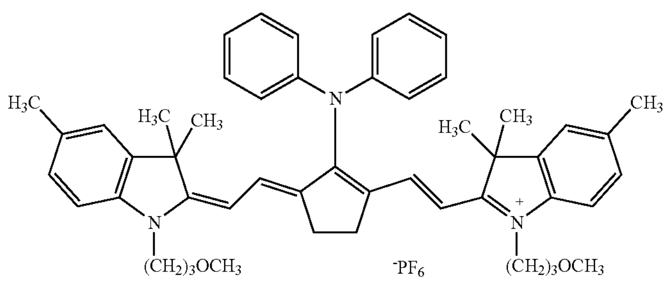

IR-2

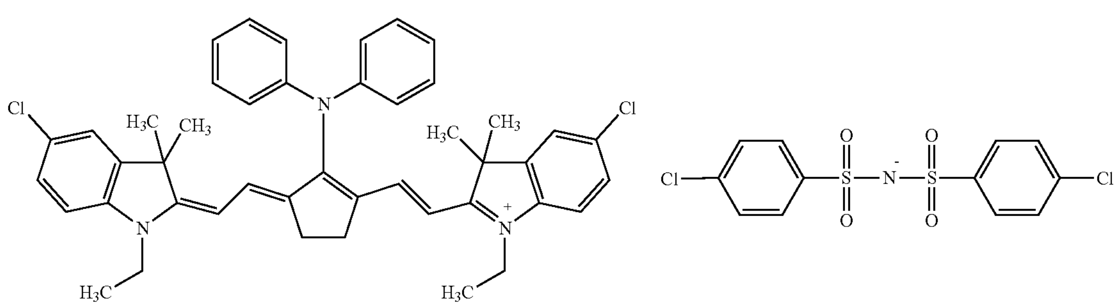

-continued
IR-3
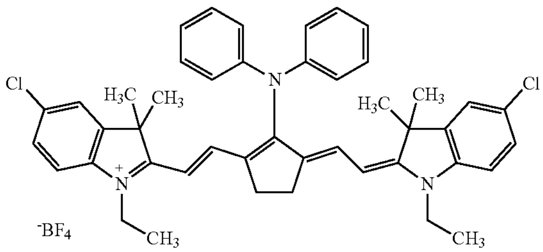
IR-4
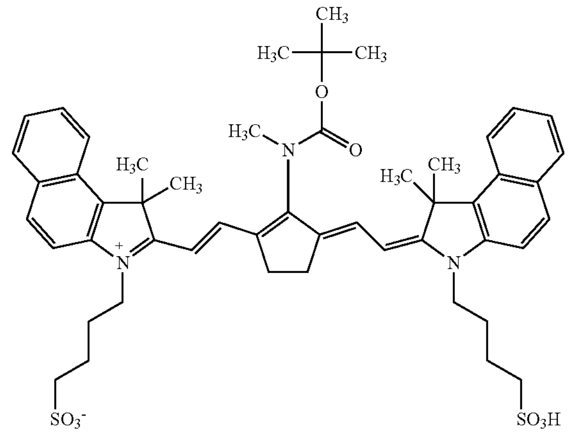
IR-5
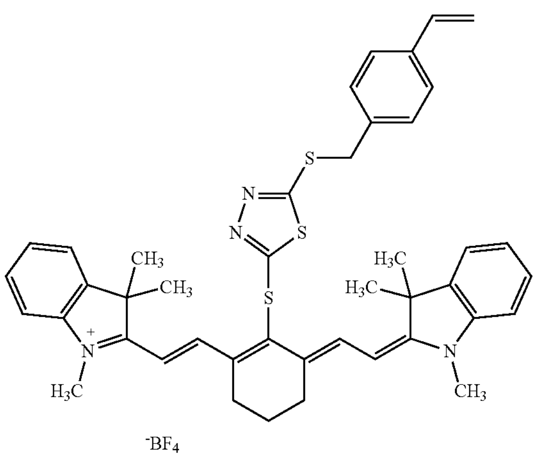
IR-6
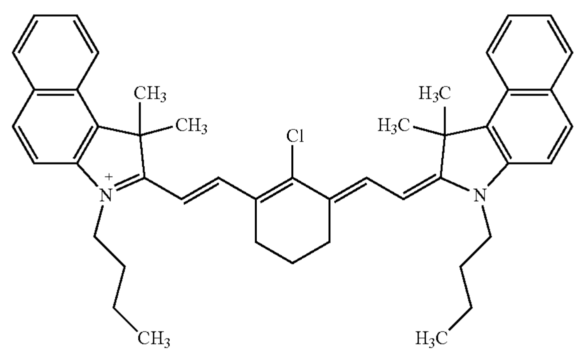
IR-7
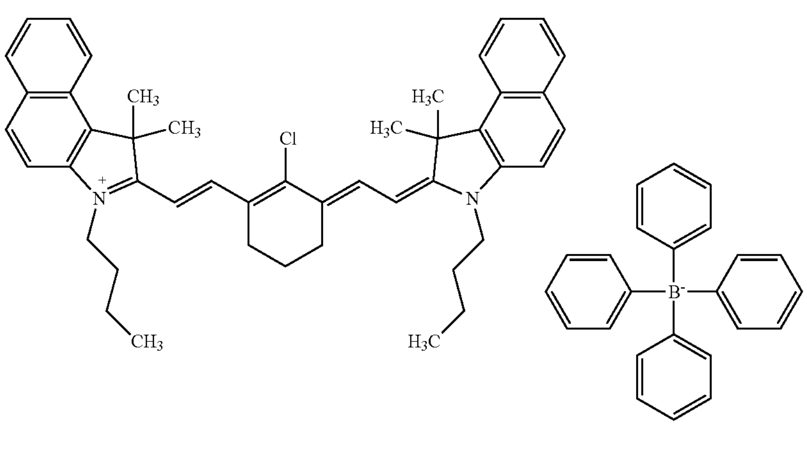

[Color-Developing Substance Precursor]
S-1 to S-12: The following compounds
C-1: The following compound
S-1
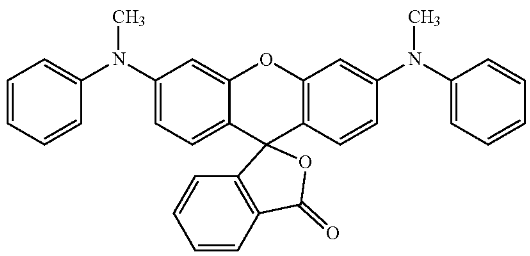
S-2
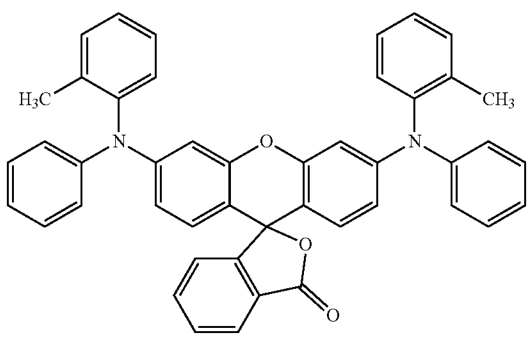
S-3
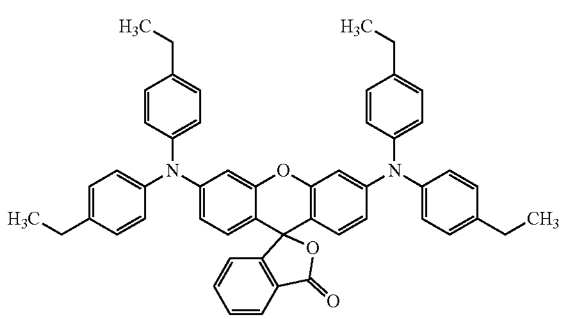
S-4
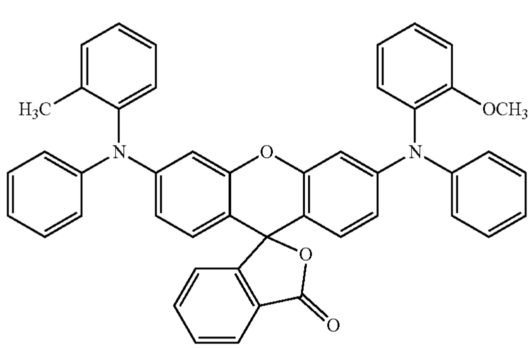
-continued
S-5
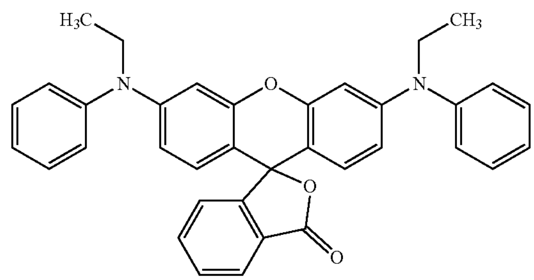
S-6
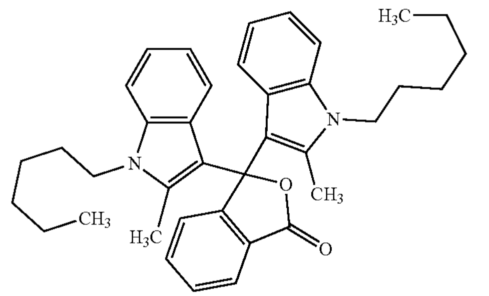
S-7
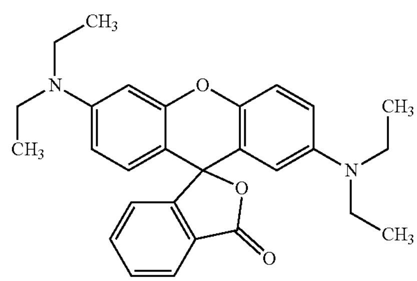
S-8
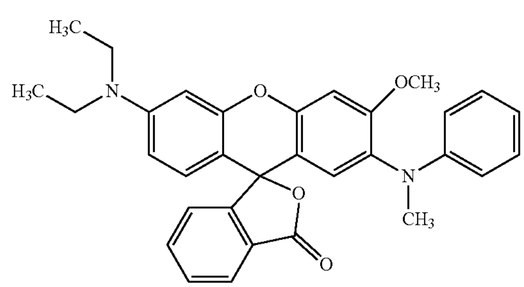
S-9
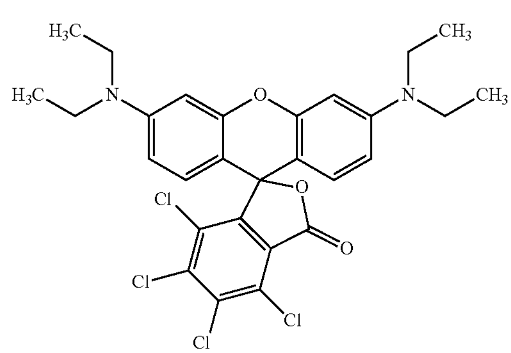

-continued

S-10

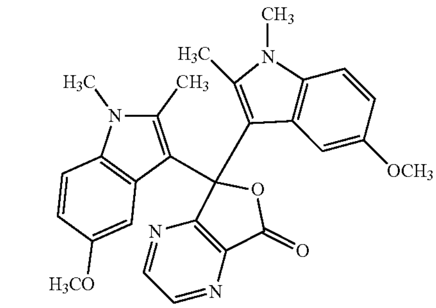

S-11

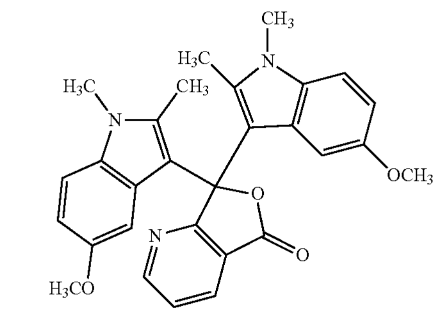

S-12

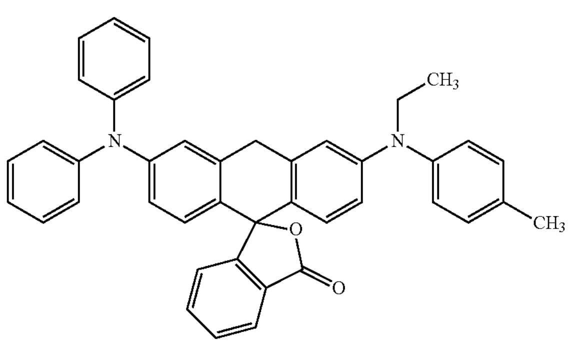

C-1

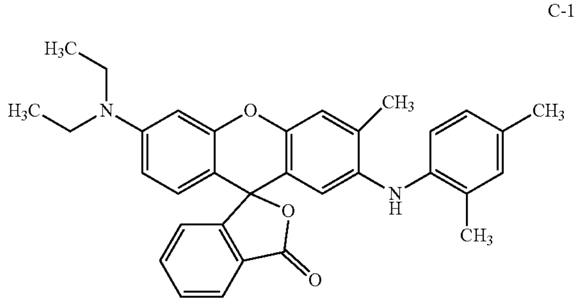

[Electron-Accepting Polymerization Initiator]

IA-1: Compound having the following structure

IA-2: Compound having the following structure

IA-3: Compound having the following structure

IA-4: Compound having the following structure

IA-1

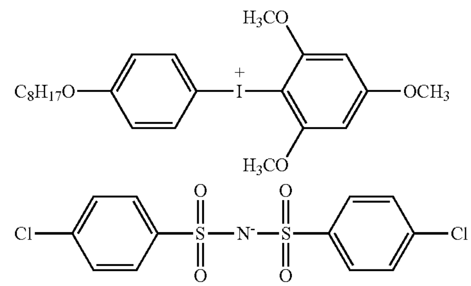

IA-2

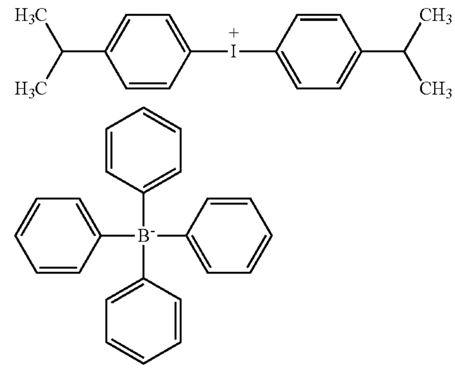

IA-3

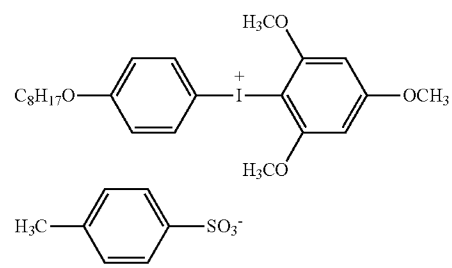

IA-4

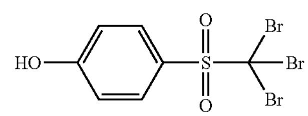

[Binder Polymer]

Synthesis of Binder Polymer (6) (Binder Polymer P-1)

1-Methoxy-2-propanol (78.0 parts) was weighed, put into a three-neck flask, and heated to 70° C. under a nitrogen stream. A mixed solution consisting of BLEMMER PME-100 (methoxydiethylene glycol monomethacrylate, manufactured by NOF CORPORATION.): 52.1 parts, methyl methacrylate: 21.8 parts, methacrylic acid: 14.2 parts, hexakis(3-mercaptopropionic acid)dipentaerythritol: 2.15 parts, V-601 (dimethyl 2,2'-azobis(isobutyrate), manufactured by FUJIFILM Wako Pure Chemical Corporation): 0.38 parts, 1-methoxy-2-propanol: 54 parts was added dropwise to the reaction vessel for 2 hours and 30 minutes. After dropwise addition ended, the solution was heated to 80° C., and the reaction was continued for 2 more hours. A mixed solution consisting of V-601: 0.04 part and 1-methoxy-2-propanol: 4 parts was added thereto, the reaction solution was heated to 90° C., and the reaction was continued for 2.5 hours. After the reaction ended, the reaction solution was cooled to room temperature.

1-Methoxy-2-propanol: 137.2 parts, 4-hydroxytetramethylpiperidine-N-oxide: 0.24 parts, glycidyl methacrylate: 26.0 parts, and tetraethylammonium bromide: 3.0 parts were added to the reaction solution, and the reaction solution was well stirred and heated at 90° C.

After 18 hours, the reaction solution was cooled to room temperature (25° C.), and then 99.4 parts of 1-methoxy-2-propanol was added thereto for dilution.

The binder polymer (6) (binder polymer P-1) obtained in this way had a concentration of solid contents of 23% by mass and a weight-average molecular weight of 35,000 measured by GPC and expressed in terms of polystyrene.

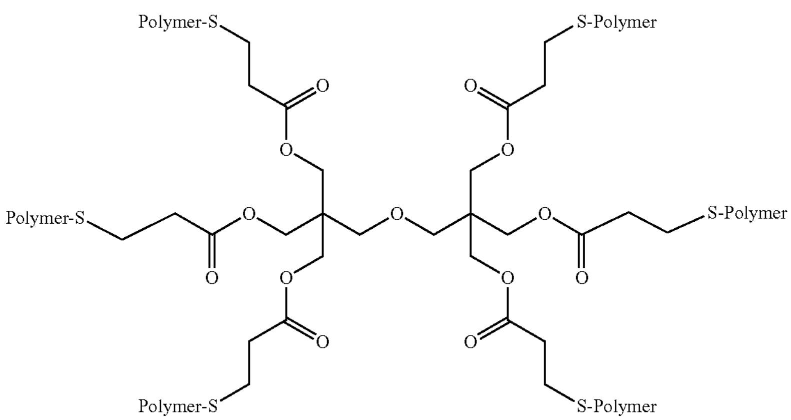

Polymer moiety

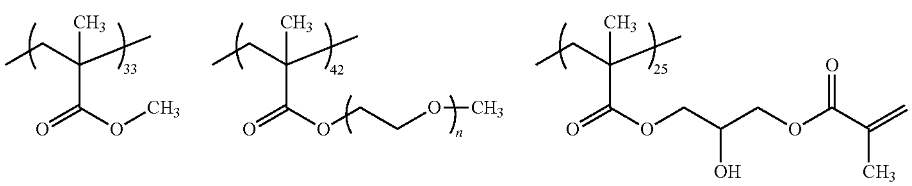

Binder polymer (6)
n = 2

Synthesis of Binder Polymer (7) (Binder Polymer P-2)

1-Methoxy-2-propanol (78.00 parts) was weighed, put into a three-neck flask, and heated to 70° C. under a nitrogen stream. A mixed solution consisting of BLEMMER PME-100 (methoxydiethylene glycol monomethacrylate, manufactured by NOF CORPORATION.): 52.8 parts, methyl methacrylate: 2.8 parts, methacrylic acid: 25.0 parts, hexakis (3-mercaptopropionic acid)dipentaerythritol: 6.4 parts, V-601 (dimethyl 2,2'-azobis(isobutyrate), manufactured by FUJIFILM Wako Pure Chemical Corporation): 1.1 parts, 1-methoxy-2-propanol: 55 parts was added dropwise to the reaction vessel for 2 hours and 30 minutes. After dropwise addition ended, the solution was heated to 80° C., and the reaction was continued for 2 more hours. After 2 hours, a mixed solution consisting of V-601: 0.11 part and 1-methoxy-2-propanol: 1 part was added thereto, the reaction solution was heated to 90° C., and the reaction was continued for 2.5 hours. After the reaction ended, the reaction solution was cooled to room temperature.

1-Methoxy-2-propanol: 177.2 parts, 4-hydroxytetramethylpiperidine-N-oxide: 0.28 parts, glycidyl methacrylate: 46.0 parts, and tetrabutylammonium bromide: 3.4 parts were added to the reaction solution, and the reaction solution was well stirred and heated at 90° C.

After 18 hours, the reaction solution was cooled to room temperature (25° C.), and then 0.06 part of 4-methoxyphenol and 114.5 parts of 1-methoxy-2-propanol were added thereto for dilution.

The binder polymer (7) (binder polymer P-2) obtained in this way had a concentration of solid contents of 23% by mass and a weight-average molecular weight of 15,000 measured by GPC and expressed in terms of polystyrene.

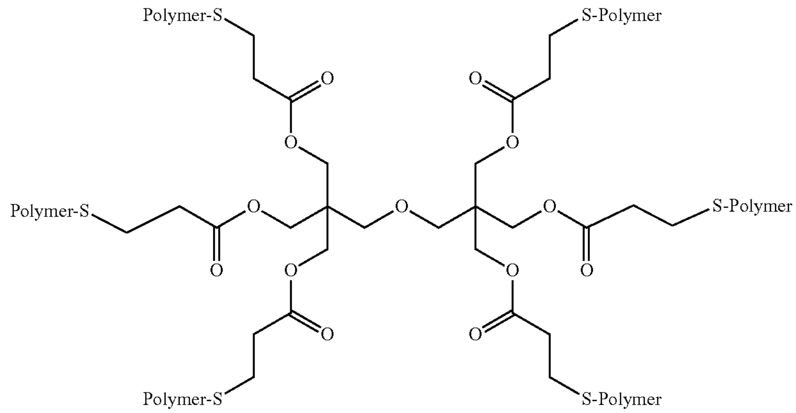

Polymer moiety

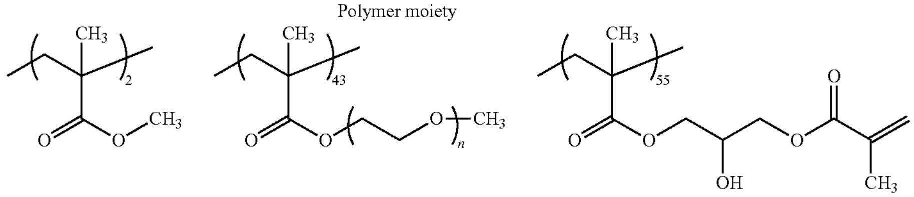

Binder polymer (7)
n = 2

[Surfactant]

Anionic surfactant (A-1): the following compound

Fluorine-based surfactant (W-1): the following compound

A-1

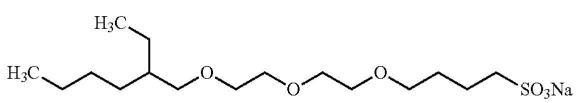

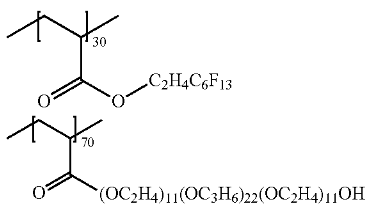

W - 1
Mw = 13,000

<Preparation of Polymer Particles R-1>

Microgel (polymer particles): 2.640 parts

Distilled water: 2.425 parts

Microgel used in the aforementioned microgel solution was prepared by the following method.

—Preparation of Polyvalent Isocyanate Compound—

Bismuth tris(2-ethylhexanoate) (NEOSTAN U-600, manufactured by NITTO KASEI CO., LTD., 0.043 parts) was added to an ethyl acetate (25.31 g) suspension solution of 17.78 parts (80 molar equivalents) of isophorone diisocyanate and 7.35 parts (20 molar equivalents) of the following polyhydric phenol compound (1), and the obtained solution was stirred. The reaction temperature was set to 50° C. at a point in time when heat release subsided, and the solution was stirred for 3 hours, thereby obtaining an ethyl acetate solution of the polyvalent isocyanate compound (1) (50% by mass).

compound (1)

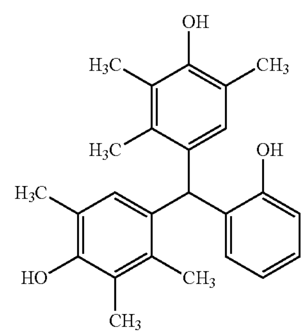

Polyhydric alcohol

—Preparation of Microgel—

The following oil-phase components and water-phase components were mixed together and emulsified at 12,000 rpm for 10 minutes by using a homogenizer. The obtained emulsion was stirred at 45° C. for 4 hours, a 10% by mass aqueous solution of 5.20 g of 1,8-diazabicyclo[5.4.0]undec-7-ene-octylate (U-CAT SA102, manufactured by San-Apro Ltd.) was added thereto, and the solution was stirred at room temperature for 30 minutes and left to stand at 45° C. for 24 hours. Distilled water was added thereto so that the concentration of solid contents was adjusted to 20% by mass, thereby obtaining an aqueous dispersion of microgel (1). The average particle diameter thereof measured by a light scattering method was 0.28 μm.

~Oil-Phase Components~

(Component 1) ethyl acetate: 12.0 parts (Component 2) an adduct obtained by addition of trimethylolpropane (6 molar equivalent), xylene diisocyanate (18 molar equivalents), and polyoxyethylene having one methylated terminal (1 molar equivalent, the number of repeating oxyethylene units: 90) (50% by mass ethyl acetate solution, manufactured by Mitsui Chemicals, Inc.): 3.76 g (Component 3) polyvalent isocyanate compound (1) (as 50% by mass ethyl acetate solution): 15.0 parts (Component 4) 65% by mass ethyl acetate solution of dipentaerythritol pentaacrylate (SR-399, manufactured by Sartomer Company Inc.): 11.54 parts (Component 5) 10% ethyl acetate solution of sulfonate type surfactant (PIONINE A-41-C, manufactured by TAKEMOTO OIL & FAT Co., Ltd.): 4.42 parts ~Water-Phase Component~

Distilled water: 46.87 parts

<Preparation of Polymer Particles R-2>

A polyfunctional isocyanate compound (PM-200: manufactured by Wanhua Chemical Group Co., Ltd.): 6.66 parts, a 50% by mass ethyl acetate solution of "TAKENATE (registered trademark) D-116N (adduct of trimethylolpropane (TMP), m-xylylene diisocyanate (XDI), and polyethylene glycol monomethyl ether (E090) (following structure)" manufactured by Mitsui Chemicals, Inc.: 5.46 parts, a 65% by mass ethyl acetate solution of dipentaerythritol pentaacrylate (SR-399, manufactured by Sartomer Company Inc., represented by the following M-2): 11.53 parts, ethyl acetate: 18.66 parts, and PIONIN (registered trademark) A-41-C manufactured by TAKEMOTO OIL & FAT Co., Ltd.: 0.45 parts were mixed together and stirred at room temperature (25° C.) for 15 minutes, thereby obtaining an oil-phase component.

As a water-phase component, pure water: 46.89 parts was added to the obtained oil-phase component and mixed together, and the obtained mixture was emulsified at 12,000 rpm for 12 minutes by using a homogenizer, thereby obtaining an emulsion.

The obtained emulsion was added to 16.66 parts of distilled water, and stirred. Then, the obtained liquid was heated to 45° C., and stirred for 4 hours in a state of being kept at 45° C. so that ethyl acetate was distilled away from the liquid. Then, the liquid from which ethyl acetate was distilled off was heated to 45° C. and stirred for 48 hours in a state of being kept at 45° C., thereby obtaining microcapsule-type encapsulated polymer particles P-2 made of a polyaddition type resin in a liquid. Thereafter, the liquid containing the encapsulated polymer particles P-2 was diluted with distilled water so that the concentration of solid contents was 20% by mass, thereby obtaining an aqueous dispersion of encapsulated polymer particles P-1.

The encapsulated polymer particles P-2 had a volume average particle diameter of 200 nm that was measured using a laser diffraction/scattering-type particle diameter distribution analyzer LA-920 (manufactured by HORIBA, Ltd.).

The content of the polymerizable compound M-2 with respect to the total mass of the encapsulated polymer particles P-2 was 42% by mass.

M-2

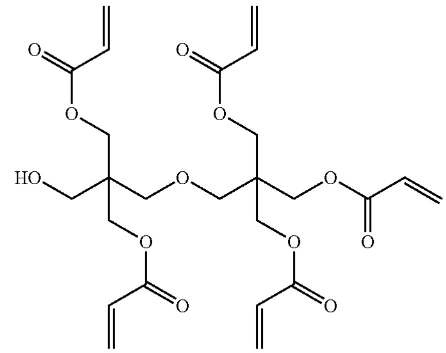

<Polymer Particles R-3>

Dispersion unit: the following compound B-1 (n=45): 10.0 parts, 85.0 parts of distilled water, and 240.0 parts of n-propanol were added to a four-neck flask, and the mixture was heated and stirred at 70° C. in a nitrogen atmosphere.

Then, a mixture of the following compound A-1: 20.0 parts, the following compound A-2: 70.0 parts, and 0.7 parts of 2,2'-azobisisobutyronitrile that were mixed together in advance was added dropwise for 2 hours to the four-neck flask.

After the dropwise addition ended, the reaction continued for 5 hours, then 0.5 parts of 2,2'-azobisisobutyronitrile was added thereto, and the solution was heated to 80° C. The reaction was performed for a total of 19 hours by adding 0.4 parts of 2,2'-azobisisobutyronitrile every 6 hours.

The reaction solution was left to cool to room temperature (25° C.), thereby obtaining a dispersion of particles R-3 (solid content 23%).

A-1

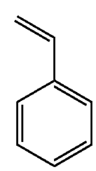

A-2

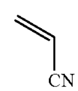

B-1

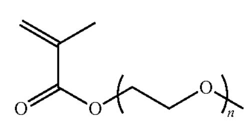

The resin particles R-3 had a median diameter of 150 nm and a coefficient of variation of 23%.

Furthermore, the dispersibility of the resin particles R-3 was checked by the method described above. As a result, the resin particles R-3 were found to be water-dispersible and organic solvent-dispersible particles.

<Preparation of Polymer Particles R-4 and R-5>

Polymer particles R-4 and R-5 were prepared in the same manner as in the preparation of the polymer particles R-3, except that the type and amount of the monomers used were changed.

R-3

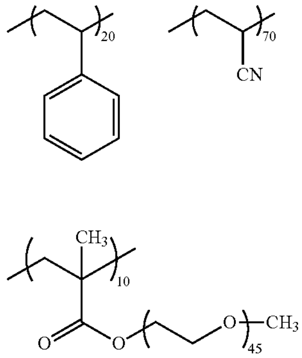

R-4

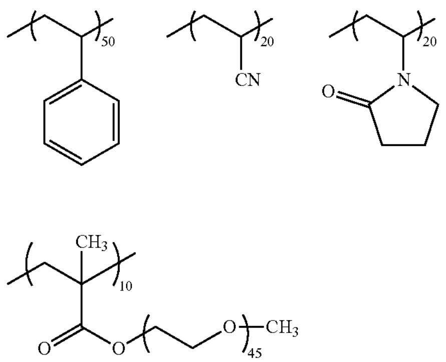

R-5

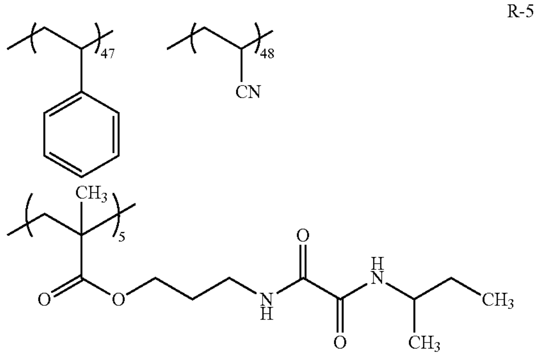

[Polymerizable Compound]

M-1: Dipentaerythritol pentaacrylate hexamethylene diisocyanate urethane prepolymer, UA-510H manufactured by KYOEISHA CHEMICAL Co., LTD., number of functional groups: 10

M-2: U-15HA (urethane acrylate, manufactured by SHIN-NAKAMURA CHEMICAL CO, LTD., number of functional groups: 15)

M-3: The following polymerizable compound (number of functional groups: 15)

M-4: CN8885NS (manufactured by Sartomer Company Inc., number of functional groups: 9)

M-5: Dipentaerythritol hexaacrylate (manufactured by Toagosei Co., Ltd., ARONIX M-403, number of functional groups: 6)

M-6: Urethane dimethacrylate (manufactured by Sigma-Aldrich Co. LLC, number of functional groups: 2)

M-7: CN 104 (manufactured by Arkema S.A., number of functional groups: 2)

Synthesis of M-3

A mixed solution of TAKENATE D-160N (manufactured by Mitsui Chemicals, Inc.) 4.7 parts by mass, and ARONIX M-405 (manufactured by TOAGOSEI CO., LTD.) in such an amount that the ratio of the NCO value of polyisocyanate to the hydroxyl number of hydroxyl group-containing polyfunctional acrylate is 1:1, 0.02 parts by mass of t-butylbenzoquinone, and 11.5 parts by mass of methyl ethyl ketone was heated at 65° C. NEOSTANN U-600 (bismuth-based polycondensation catalyst, manufactured by NITTO KASEI CO., LTD., 0.11 parts by mass) was added to the reaction solution, and the reaction solution was heated at the same temperature for 4 hours. The reaction solution was cooled to room temperature (25° C.), and methyl ethyl ketone was added thereto, thereby synthesizing a urethane acrylate solution having a solid content of 50% by mass.

[Oil Sensitizing Agent]

C-1: Compound having the following structure

C-2: Benzyldimethyloctylammonium·PF6 salt

C-3: Compound having the following structure

C-1

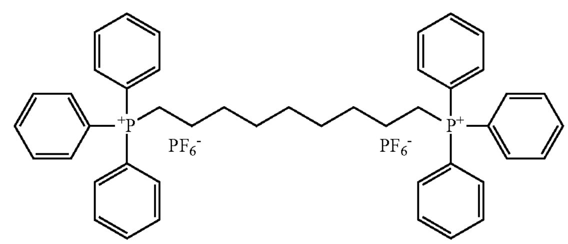

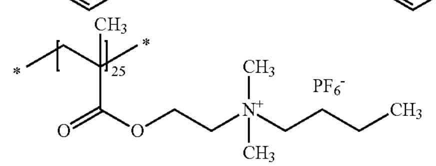

C-3

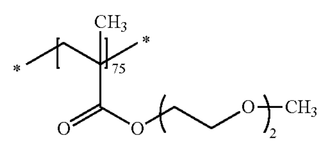

[Electron-Donating Polymerization Initiator]

B-1 to B-5: The following compounds

B-1

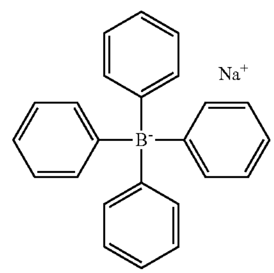

HOMO = -5.92 eV

-continued

B-2

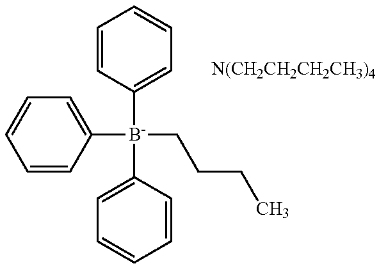

HOMO = -5.77 eV

B-3

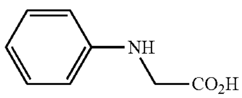

HOMO = -5.91 eV

B-4

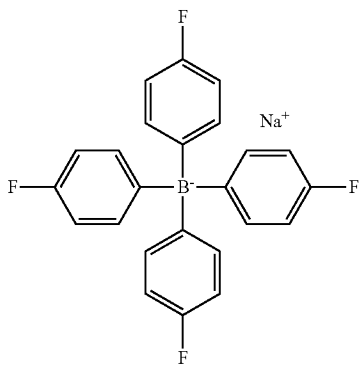

HOMO = -5.96 eV

B-5

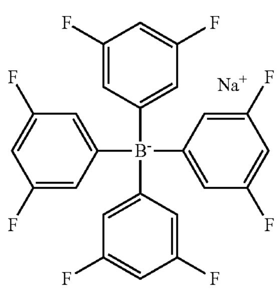

HOMO = -6.12 eV

<Composition of Coating Solution 1 for Protective Layer: Dry Coating Amount 0.15 g/m$^2$>

POVAL PVA105 (manufactured by KURARAY CO., LTD., saponification degree: 80% or more): 0.6 parts by mass PEG4000 (manufactured by Tokyo Chemical Industry Co., Ltd.): 0.39 parts by mass Surfactant (RAPISOL A-80, manufactured by NOF CORPORATION): 0.01 parts by mass Water: Amount for making up a total of 10 parts by mass <Composition of Coating Solution 2 for Protective Layer: Dry Coating Amount 0.1 g/m$^2$>

GOHSENOL L-3266 ((manufactured by Mitsubishi Chemical Corporation., saponification degree: 86% to 89% or higher): 0.1 parts by mass Surfactant (RAPISOL A-80, manufactured by NOF CORPORATION): 0.01 parts by mass Water: 0.9 parts by mass <Composition of Coating Solution 3 for Protective Layer: Dry Coating Amount 0.8 g/m$^2$>

6% by mass aqueous solution of polyvinyl alcohol (CKS50 manufactured by NIHON GOSEI KAKO Co., Ltd., modified with sulfonic acid, saponification degree: 99 mol % or higher, degree of polymerization: 300): 10 parts Surfactant (RAPISOL A-80, manufactured by NOF CORPORATION: 0.001 parts Deionized water: 6.0 parts <Composition of Coating Solution 4 for Protective Layer: Dry Coating Amount 0.15 g/m$^2$>

Inorganic lamellar compound dispersion (1) [described below]: 1.5 parts

6% by mass aqueous solution of polyvinyl alcohol (CKS50 manufactured by NIHON GOSEI KAKO Co., Ltd., modified with sulfonic acid, saponification degree: 99 mol % or higher, degree of polymerization: 300): 0.55 parts 6% by mass aqueous solution of polyvinyl alcohol (PVA-405, manufactured by KURARAY CO., LTD., saponification degree: 81.5 mol %, degree of polymerization: 500): 0.03 parts 1% by mass aqueous solution of surfactant (polyoxyethylene lauryl ether, EMALEX 710, manufactured by NIHON EMULSION Co., Ltd.): 0.86 parts Deionized water: 6.0 parts The method for preparing an inorganic lamellar compound dispersion (1) will be described below.

<<Preparation of Inorganic Lamellar Compound Dispersion (1)>>

Synthetic mica (SOMASIF ME-100 manufactured by Co-op Chemical Co., Ltd.) (6.4 g) was added to deionized water (193.6 g) and was dispersed using a homogenizer until the average particle diameter (the laser scattering method) reached 3 μm. The aspect ratio of the obtained dispersed particles was 100 or higher.

<Composition of Coating Solution 5 for Protective Layer: Dry Coating Amount 0.5 g/m$^2$>

Mowiol 4-88 (partially hydrolyzed polyvinyl alcohol, manufactured by Kuraray Europe GmbH): 0.5 parts by mass Diofan A050 (polyvinylidene chloride, manufactured by Solvay S.A.): 0.5 parts by mass IR-4: 0.07 parts by weight lutenzol A8 (nonionic surfactant, manufactured by BASF SE): 0.02 parts by weight Water: Amount for making up a total of 10 parts by mass

Example 24

<Preparation of Support 1>

The following treatments (J-a) to (J-m) were performed on an aluminum plate (aluminum alloy plate) made of a material 1S having a thickness of 0.3 mm, thereby manufacturing a support 1. A rinsing treatment was performed between all the treatment steps. After the rinsing treatment, water was drained using a nip roller.

(J-a) Mechanical Roughening Treatment (Brush Graining Method)

By using the device shown in FIG. 8, a pumice suspension (specific gravity: 1.1 g/cm$^3$) as a polishing slurry liquid was supplied to the surface of an aluminum plate, and in this state, a mechanical roughening treatment is performed using a rotating bundled brush.

In the mechanical roughening treatment, an abrasive having a median diameter (μm) of 30 μm and 4 brushes were used, and the rotation speed of the brushes was set to 250 rpm. The bundled brush was made of 6.10 nylon and consisted of bristles having a diameter of 0.3 mm and a length of 50 mm. The brush was prepared by making holes in a cp 300 mm stainless steel cylinder and densely implanting bristles therein. The distance between two support rollers (c) 200 mm) under the bundled brush was 300 mm. The bundled brush was pressed until the load of the drive motor for rotating the brush was 10 kW higher than the load applied before the bundled brush was pressed on the aluminum plate. The direction of rotation of the brush was the same as the direction of movement of the aluminum plate.

(J-b) Alkaline Etching Treatment

An aqueous solution of caustic soda having a caustic soda concentration of 26% by mass and an aluminum ion concentration of 6.5% by mass was sprayed onto the aluminum plate at a temperature of 70° C., thereby performing an etching treatment. The amount of dissolved aluminum within the surface to be subjected to the electrochemical roughening treatment later was 10 g/m$^2$.

(J-c) Desmutting Treatment Using Aqueous Acidic Solution

As an aqueous acidic solution, the waste liquid of nitric acid used in the following step, an electrochemical roughening treatment, at a liquid temperature of 35° C. was sprayed on the aluminum plate for 3 seconds. In this way, a desmutting treatment was performed.

(J-d) Electrochemical Roughening Treatment Using Aqueous Nitric Acid Solution

An electrochemical roughening treatment was continuously performed using alternating current voltage of 60 Hz. An electrolytic solution at a liquid temperature of 35° C. was used which was prepared by adding aluminum nitrate to 10.4 g/L aqueous nitric acid solution so that the aluminum ion concentration was adjusted to 4.5 g/L. By using an alternating current power source having the waveform shown in FIG. 6, alternating current having a trapezoidal rectangular waveform, and a carbon electrode as a counter electrode, an electrochemical roughening treatment was performed under the conditions of a time tp taken for the current value to reach the peak from zero of 0.8 msec and the duty ratio of 1:1. As an auxiliary anode, ferrite was used. The electrolytic cell shown in FIG. 7 was used. The current density was 30 A/dm$^2$ in terms of the peak value of current, and 5% of the current coming from the power source was allowed to flow into the auxiliary anode. The quantity of electricity (C/dm$^2$) was 185 C/dm$^2$, which is the total quantity of electricity used during the anodization of the aluminum plate.

(J-e) Alkaline Etching Treatment

An aqueous solution of caustic soda having a caustic soda concentration of 27% by mass and an aluminum ion concentration of 2.5% by mass was sprayed onto the aluminum plate at a temperature of 50° C., thereby performing an etching treatment. The amount of dissolved aluminum was 3.5 g/m$^2$.

(J-f) Desmutting Treatment Using Aqueous Acidic Solution

As an aqueous acidic solution, an aqueous solution at a liquid temperature of 30° C. having a sulfuric acid concentration of 170 g/L and an aluminum ion concentration of 5 g/L was sprayed on an aluminum plate for 3 seconds, thereby performing a desmutting treatment.

(J-g) Electrochemical Roughening Treatment Using Aqueous Hydrochloric Acid Solution An electrochemical roughening treatment was continuously performed using alternating current voltage of 60 Hz. An electrolytic solution at a liquid temperature of 35° C. was used which was prepared by adding aluminum chloride to 6.2 g/L aqueous hydrochloric acid solution so that the aluminum ion concentration was adjusted to 4.5 g/L. By using an alternating current power source having the waveform shown in FIG. 6, alternating current having a trapezoidal rectangular waveform, and a carbon electrode as a counter electrode, an electrochemical roughening treatment was performed under the conditions of a time tp taken for the current value to reach the peak from zero of 0.8 msec and the duty ratio of 1:1. As an auxiliary anode, ferrite was used. The electrolytic cell shown in FIG. 7 was used. The current density was 25 A/dm$^2$ in terms of the peak value of current, and the quantity of electricity (C/dm$^2$) during the hydrochloric acid electrolysis was 63 C/dm$^2$ which is the total quantity of electricity used during the anodization of the aluminum plate.

(J-h) Alkaline Etching Treatment

An aqueous solution of caustic soda having a caustic soda concentration of 5% by mass and an aluminum ion concentration of 0.5% by mass was sprayed onto the aluminum plate at a temperature of 60° C., thereby performing an etching treatment. The amount of dissolved aluminum was 0.2 g/m$^2$.

(J-i) Desmutting Treatment Using Aqueous Acidic Solution

As an aqueous acidic solution, an aqueous solution at a liquid temperature of 35° C. (sulfuric acid concentration 170 g/L and aluminum ion concentration 5 g/L) which was a waste liquid generated in the anodic oxidation treatment step was sprayed on an aluminum plate for 4 seconds, thereby performing a desmutting treatment.

(J-j) First-Stage Anodic Oxidation Treatment

By using the anodic oxidation device for direct current electrolysis having the structure shown in FIG. 9, a first-stage anodic oxidation treatment was performed. By using a 170 g/L aqueous sulfuric acid solution as an electrolytic solution, an anodic oxidation treatment was performed under the conditions of a liquid temperature of 50° C. and a current density of 30 A/dm$^2$, thereby forming an anodic oxide film having a film amount of 0.3 g/m$^2$.

(J-k) Pore Widening Treatment

The aluminum plate having undergone the anodic oxidation treatment was immersed in an aqueous solution of caustic soda having a caustic soda concentration of 5% by mass and an aluminum ion concentration of 0.5% by mass for 3 seconds at 40° C., thereby performing a pore widening treatment.

(J-l) Second-Stage Anodic Oxidation Treatment

By using the anodic oxidation device for direct current electrolysis having the structure shown in FIG. 9, a second-stage anodic oxidation treatment was performed. By using a 170 g/L aqueous sulfuric acid solution as an electrolytic solution, an anodic oxidation treatment was performed under the conditions of a liquid temperature of 50° C. and a current density of 13 A/dm$^2$, thereby forming an anodic oxide film having a film amount of 2.1 g/m$^2$.

(J-m) Hydrophilizing Treatment

In order to ensure the hydrophilicity of the non-image area, the aluminum plate was immersed in a 2.5% by mass No. 3 aqueous sodium silicate solution at 50° C. for 7 seconds, thereby performing a silicate treatment. The amount of Si adhered was 8.5 mg/m$^2$. The average diameter of the micropores was 30 nm.

The value of the brightness L* of the surface of the anodic oxide film of the support 1 was 72.3 in the L*a*b* color space.

<Formation of Undercoat Layer 1>

The support 1 was coated with coating solution (1) for an undercoat layer having the following composition so that the dry coating amount was 26 mg/m$^2$. In this way, an undercoat layer 1 was formed.

<<Coating Solution (1) for Undercoat Layer>>

- Compound (2) for undercoat layer (the following structure): 0.13 parts
- Hydroxyethyl iminodiacetic acid: 0.05 parts
- Tetrasodium ethylenediaminetetraacetate: 0.05 parts
- Polyoxyethylene lauryl ether: 0.03 parts
- Water: 61.39 parts tion, manufactured by SHIN-NAKAMURA CHEMICAL CO, LTD.): 0.2875 parts

- Color-developing substance precursor S-1 (the above compound): 0.020 parts
- Low-molecular-weight hydrophilic compound (1) (tris(2-hydroxyethyl) isocyanurate: 0.0287 parts
- Low-molecular-weight hydrophilic compound (2) (trimethylglycine): 0.0147 parts
- Anionic surfactant 1 30% by mass aqueous solution (the following structure): 0.25 parts
- Ultraviolet absorber (1) (TINUVIN405, manufactured by BASF SE) (the following structure): 0.04 parts

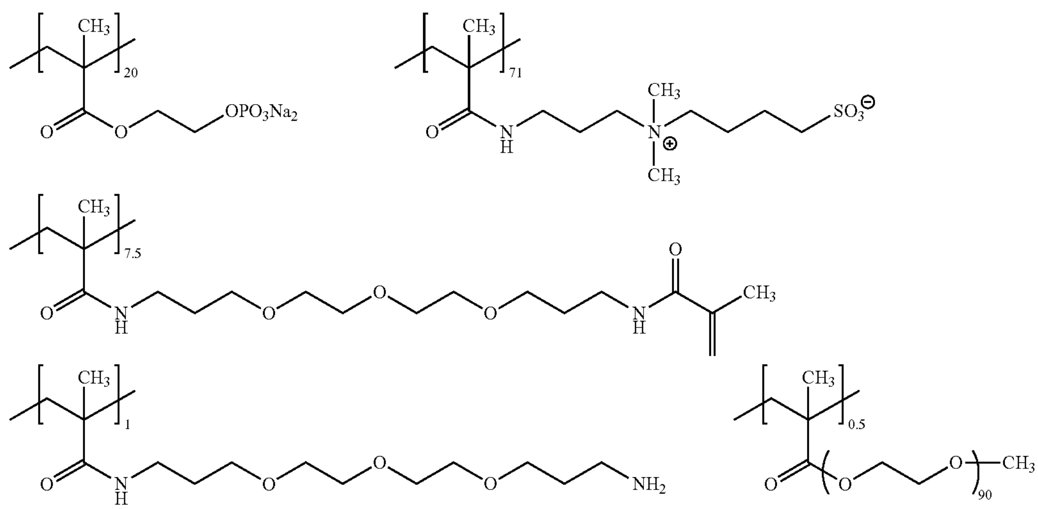

Compound 2 for undercoat layer

Mw 100,000

The numerical value at the right lower side of the parentheses of each constitutional unit in the compound (2) for an undercoat layer represents a mass ratio, and the numerical value at the right lower side of the parentheses of the ethyleneoxy unit represents the number of repeating units.

<Formation of Image-Recording Layer 1>

The undercoat layer was bar-coated with the coating solution (1) for an image-recording layer having the following composition and dried in an oven at 100° C. for 60 seconds, thereby forming an image-recording layer 1 having a thickness of 1.2 μm.

The coating solution (1) for an image-recording layer was obtained by mixing and stirring together the following photosensitive solution (1) and microgel solution (1) immediately before coating.

(Photosensitive Solution (1))

- Binder polymer (6) (P-1) 23% by mass 1-methoxy-2-propanol solution (the following structure): 0.2891 parts
- Binder polymer (7) (P-1) 23% by mass 1-methoxy-2-propanol solution (the following structure): 0.4574 parts
- Infrared absorber (1) (the following structure): 0.0278 parts
- Borate compound (1) (sodium tetraphenylborate): 0.015 parts
- Polymerization initiator (1) (the following structure): 0.2348 parts
- Polymerizable compound (1) (tris(acryloyloxyethyl)isocyanurate, NK ESTER A-9300 40% 2-butanone solu-

- Fluorine-based surfactant (1) (the following structure): 0.004 parts
- Phosphonium compound (1) (the following structure): 0.020 parts
- 2-Butanone: 5.346 parts
- 1-Methoxy-2-propanol: 3.128 parts
- Methanol: 0.964 parts
- Pure water: 0.036 parts Infrared absorber (1)

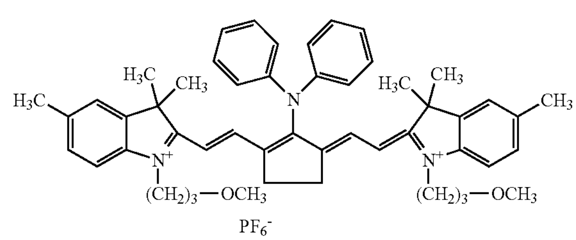

Polymerization initiator (1)

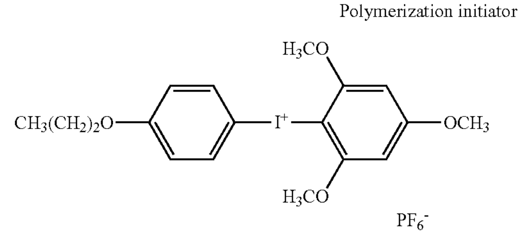

-continued

Fluorine-based surfactant (1)

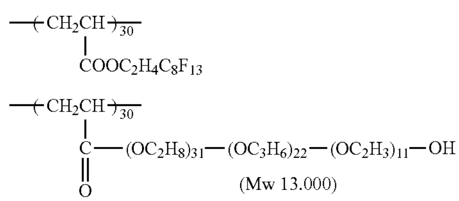

Phosphonium compound (1)

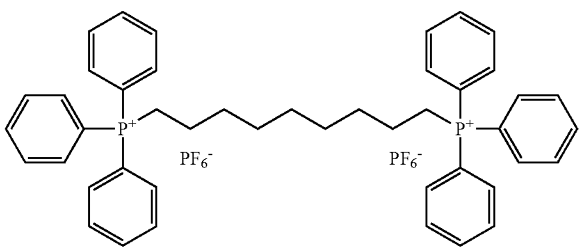

Infrared absorber (1)

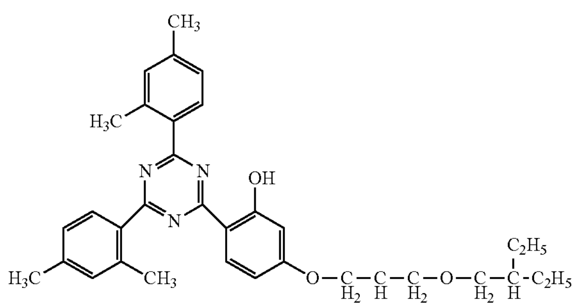

Anionic surfactant 1

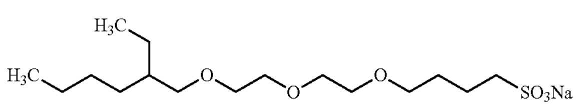

Low-molecular-weight hydrophilic compound (1)

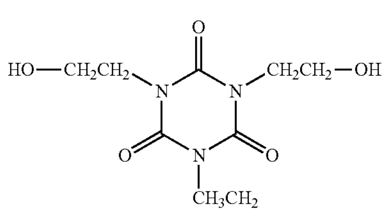

Low-molecular-weight hydrophilic compound (2)

$(CH_3)_3N^+CH_2COO^-$

Polymerizable compound (1)

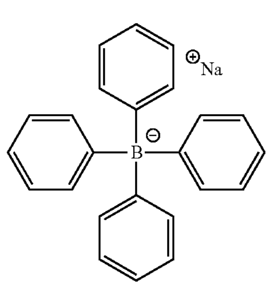

-continued

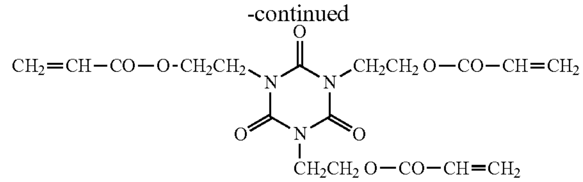

<<Microgel Solution (1)>>

Microgel (polymer particles) (concentration of solid contents: 21.8% by mass): 2.243 parts 1-Methoxy-2-propanol: 0.600 parts <Formation of Protective Layer 1>

The image-recording layer was bar-coated with a coating solution (1) for a protective layer having the following composition and dried in an oven at 120° C. for 60 seconds, thereby forming a protective layer 1 having a thickness of 0.18 μm.

<<Composition of Coating Solution (1) for Protective Layer>>

Inorganic lamellar compound dispersion (2) (described below): 2.212 parts

6% by mass aqueous solution of polyvinyl alcohol (GOSELANE L-3266 manufactured by NIHON GOSEI KAKO Co., Ltd., modified with sulfonic acid, saponification degree: 85 mol %): 1.440 parts Surfactant (PIONIN A-32-B (described below), manufactured by TAKEMOTO OIL & FAT Co., Ltd.) 40% by mass aqueous solution): 0.014 parts Surfactant (SURFYNOL 465 (described below), manufactured by Nissin Chemical Industry Co., Ltd.): 0.006 parts Pure water: 3.955 parts $C_nH_{2n+1}$—$SO_3Na$ (n = 10-16)

Pionin A-32-B

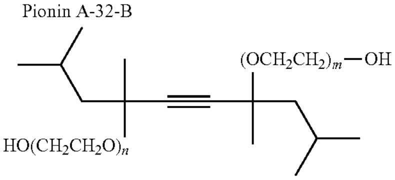

SURFYNOL 465

<<<Preparation of Inorganic Lamellar Compound Dispersion (2)>>>

Synthetic mica SOMASIF ME-100 (manufactured by Co-op Chemical Co., Ltd., 6.4 parts) was added to 193.6 parts of deionized water and was dispersed using a homogenizer until the volume average particle diameter (determined by a laser scattering method) reached 3 μm, thereby preparing an inorganic lamellar compound dispersion (2). The aspect ratio of the dispersed particles was 100 or more.

[Measurement of NC/NC0]

The obtained lithographic printing plate precursor was exposed using Luxel PLATESETTER T-6000III manufactured by FUJIFILM Corporation equipped with an infrared semiconductor laser having a wavelength of 830 nm, at an exposure amount of 110 mJ/cm². The exposure image included a solid image, a 50% halftone dot chart of a 20 μm dot FM screen, and a non-image area.

The obtained lithographic printing plate precursor having undergone exposure was mounted on a plate cylinder of a printer LITHRONE26 manufactured by KOMORI Corporation, without being subjected to a development treatment. A water supply roller for the plate cylinder was decelerated 5%, and then on-press development was performed using dampening water containing Ecolity-2 (manufactured by FUJIFILM Corporation)/tap water=2/98 (volume ratio) and a UV ink (T&K UV OFS K-HS black GE-M (manufactured by T&K TOKA CO., LTD.) by supplying the dampening water and the ink according to the standard automatic printing start method of LITHRONE26. Thereafter, printing was performed on 50,000 sheets of TOKUBISHI art paper (manufactured by MITSUBISHI PAPER MILLS LIMITED., ream weight: 76.5 kg) at a printing rate of 10,000 sheets/hour.

As the number of printed sheets increased, the image-recording layer gradually worn out, and the ink receiving properties deteriorated. As a result, the ink density on the printing paper decreased. The area ratio of the FM screen 3% halftone dots in the printed matter was measured using X-Rite (manufactured X-Rite, Incorporated.). When the measured area ratio was 5% lower than the area ratio measured after 100 sheets were printed, the number of prints at that point in time was adopted as the number of sheets of completely printed paper and used for evaluating UV printing durability.

Likewise, a plate that does not contain a color-developing substance precursor was prepared, and number of sheets printed from plate containing color-developing substance precursor/number of sheets printed from plate containing no color-developing substance precursor was calculated.

[Measurement of Loss of Ethylenically Unsaturated Bonds in Exposed Area and Non-Exposed Area in Image-Recording Layer]

By using a Fourier transform infrared spectrophotometer (FT-IR), a peak surface area (relative value) of stretching resulting from a C═C group at around 700 $cm^{-1}$ relative to a reference peak (peak that does not shift before and after exposure as appropriate, although it depends on the material of the plate) was determined.

For a solid exposed portion formed by exposure performed under the same conditions as those in the aforementioned NC/NC0 measurement method and a non-exposed portion, the aforementioned peak surface area was determined, the area of the exposed portion was subtracted from the area of the non-exposed portion, and the result was adopted as a loss of ethylenically unsaturated bonds.

[Measurement of Consumption of Polymerizable Compound in Exposed Area with Respect to Polymerizable Compound in Non-Exposed Area in Image-Recording Layer]

Exposure was performed under the same conditions as those in the NC/NC0 measurement method that will be described later, thereby obtaining a solid exposed portion and a non-exposed portion. The non-exposed portion and the exposed portion were cut, the obtained 50 $cm^2$ coating film was immersed in 1 mL of THF and irradiated with ultrasonic waves so that the polymerizable compound was eluted, and the area was measured by HPLC. The ratio of area of the polymerizable compound detected from the exposed portion/area of the polymerizable compound detected from the non-exposed portion was calculated and adopted as the consumption of the polymerizable compound.

[UV Printing Durability Evaluation]

In Luxel PLATESETTER T-6000III manufactured by FUJIFILM Corporation that was equipped with an infrared semiconductor laser, each of the obtained lithographic printing plate precursors was exposed under the conditions of an outer drum rotation speed of 1,000 rpm, a laser output of 70%, and resolution of 2,400 dpi (dot per inch, 1 inch=2.54 cm). The exposure image included a solid image, a 50% halftone dot chart of a 20 μm dot FM screen, and a non-image area.

The obtained lithographic printing plate precursor having undergone exposure was mounted on a plate cylinder of a printer LITHRONE26 manufactured by KOMORI Corporation, without being subjected to a development treatment. A water supply roller for the plate cylinder was decelerated 5%, and then on-press development was performed using dampening water containing Ecolity-2 (manufactured by FUJIFILM Corporation)/tap water=2/98 (volume ratio) and a UV ink (T&K UV OFS K-HS black GE-M (manufactured by T&K TOKA CO., LTD.) by supplying the dampening water and the ink according to the standard automatic printing start method of LITHRONE26. Thereafter, printing was performed on 150,000 sheets of TOKUBISHI art paper (manufactured by MITSUBISHI PAPER MILLS LIMITED., ream weight: 76.5 kg) at a printing rate of 10,000 sheets/hour.

As the number of printed sheets increased, the image-recording layer gradually worn out, and the ink receiving properties deteriorated. As a result, the ink density on the printing paper decreased. The condition was visually checked.

3: There is substantially no difference between the images printed on 10,000 sheets and the images printed on 150,000 sheets.
2: About 50% of the images printed on 10,000 sheets remain.
1: About 20% of the images printed on 10,000 sheets remain.
0: Substantially no ink remains.

[Visibility (Color Developability) Evaluation]

In Trendsetter 3244VX manufactured by Creo that was equipped with a water cooling-type 40 W infrared semiconductor laser, each of the obtained lithographic printing plate precursors was exposed under the conditions of an output of 11.5 W, an outer drum rotation speed of 220 rpm, and a resolution of 2,400 dpi (dot per inch, 1 inch=25.4 mm). The exposure was carried out in an environment of 25° C. and 50% RH.

Immediately after exposure, the color development of the lithographic printing plate precursor was measured. The measurement was performed by the specular component excluded (SCE) method by using a spectrocolorimeter CM2600d and operation software CM-S100W manufactured by Konica Minolt, Inc. The color developability was evaluated by a difference AL between an L* value of the exposed portion and an L* value of the non-exposed portion by using L* values (brightness) of the L*a*b* color space. It can be said that the higher the value of AL, the better the color developability.

[Evaluation of Condition of Coated Surface]

The surface condition of the prepared lithographic printing plate precursor and the condition of the coating solution forming the image-recording layer were visually checked.

3: There are no crystalline defects on the surface of the lithographic printing plate precursor.
2: A trace of crystalline defects are on the surface of the lithographic printing plate precursor.
1: There are many crystalline defects on the surface of the lithographic printing plate precursor.
0: The coating solution remains as it is, and precipitates are observed.

TABLE 3

| | | | Example | | | | | | | | | | | |
|---|---|---|---|---|---|---|---|---|---|---|---|---|---|---|
| | | | 1 | 2 | 3 | 4 | 5 | 6 | 7 | 8 | 9 | 10 | 11 | 12 |
| Support | | Type | S2 | S5 | S2 | S2 | S6 | S6 | S6 | S1 | S3 | S2 | S4 | S5 |
| Undercoat layer | | Type | 2 | 2 | 2 | 2 | — | — | — | 2 | 1 | 2 | 1 | 1 |
| Image-recording layer | Electron-accepting polymerization initiator | IA-1 | — | — | — | — | — | — | — | 104 | 104 | — | — | — |
| | | IA-2 | — | — | — | — | 109 | — | — | — | — | — | 250 | — |
| | | IA-3 | 109 | 109 | 109 | 109 | — | 109 | 109 | — | — | 109 | — | 110 |
| | Infrared absorber | IR-1 | — | — | — | — | — | — | — | 39 | — | — | — | 19 |
| | | IR—2 | — | — | — | — | — | — | — | — | 8 | — | 15 | — |
| | | IR—3 | 20 | 20 | 20 | 20 | — | — | — | — | — | — | — | — |
| | | IR-4 | — | — | — | — | — | — | — | — | — | 20 | — | — |
| | | IR-5 | — | — | — | — | 20 | 20 | 20 | — | — | — | — | — |
| | Electron-donating polymerization initiator | B-1 | 25 | 10 | 25 | 25 | — | — | — | — | — | 25 | — | 25 |
| | | B-2 | — | — | — | — | 25 | 25 | 25 | — | — | — | — | — |
| | | B-3 | — | — | — | — | — | — | — | — | — | — | — | — |
| | | B-4 | — | 15 | — | — | — | — | — | 20 | — | — | — | — |
| | | B-5 | — | — | — | — | — | — | — | — | 20 | — | — | — |
| | Polymerizable compound | M-1 | — | — | — | — | 242 | — | — | 20 | 240 | 200 | — | — |
| | | M-2 | — | — | — | — | — | — | — | 180 | — | — | 200 | — |
| | | M-3 | 242 | — | — | 242 | — | 242 | 242 | — | — | — | — | — |
| | | M-4 | — | 242 | — | — | — | — | — | — | — | — | — | — |
| | | M-5 | — | — | 242 | — | — | — | — | — | — | — | — | 270 |
| | Polymer particles | R-1 | — | — | — | 400 | — | — | — | — | — | — | 300 | 300 |
| | | R-2 | 400 | 400 | 400 | — | — | — | — | — | — | — | — | — |
| | | R-3 | — | — | — | — | 400 | — | — | 300 | 200 | — | — | — |
| | | R-4 | — | — | — | — | — | 400 | — | — | — | — | — | — |
| | | R-5 | — | — | — | — | — | — | 400 | — | — | 300 | — | — |
| | Binder polymer | P-1 | — | — | — | — | — | — | — | — | — | — | — | — |
| | | P-2 | — | — | — | — | — | — | — | — | — | — | — | — |
| | Color-developing substance precursor | Type | S-1 | S-5 | S-2 | S-1 | S-1 | S-3 | S-4 | S-3 | S-3 | S-3 | S-6 | S-7 |
| | | Added amount | 20 | 20 | 20 | 20 | 20 | 20 | 20 | 25 | 30 | 30 | 40 | 40 |
| | Oil-phase component | C-1 | — | — | — | — | — | — | — | — | — | — | — | — |
| | | C-2 | — | — | — | — | — | — | — | — | — | — | — | — |
| | | C-3 | — | — | — | — | — | — | — | — | — | — | — | — |
| | Anionic surfactant | | 26 | 4 | 4 | 26 | 4 | 4 | 4 | 4 | 4 | 26 | 4 | 4 |
| Protective layer | | Type | 2 | 1 | 2 | 2 | — | 3 | 3 | 3 | 3 | 2 | 1 | 2 |
| Evaluation | hydrogen abstraction enthalpy of color-developing substance precursor (kcal/mol) | | −1.5 | 0.6 | 20.3 | −1.5 | −1.5 | 20.3 | 6.4 | 20.3 | 20.3 | 20.3 | −6.0 | −3.9 |
| | Loss of ethylenically unsaturated bonds (%) | | 20 | 13 | 25 | 15 | 15 | 25 | 20 | 25 | 20 | 20 | 10 | 10 |
| | Consumption of polymerizable compound (%) | | 65 | 40 | 45 | 50 | 50 | 65 | 55 | 65 | 50 | 65 | 40 | 45 |
| | NC/NCO | | 0.90 | 0.70 | 0.60 | 0.95 | 0.90 | 1.00 | 0.95 | 0.95 | 0.85 | 0.90 | 0.70 | 0.95 |
| | UV printing durability | | 3 | 2 | 2 | 3 | 3 | 3 | 3 | 3 | 2 | 2 | 1 | 3 |
| | Visibility | | 13.0 | 12.5 | 10.1 | 11.5 | 12.2 | 9.9 | 12.0 | 10.5 | 11.0 | 14.0 | 3.0 | 6.2 |
| | Condition of coating surface | | 3 | 3 | 1 | 3 | 3 | 2 | 2 | 2 | 2 | 2 | 2 | 3 |

TABLE 4

| | | | Example | | | | | | | | | | | Comparative Example |
|---|---|---|---|---|---|---|---|---|---|---|---|---|---|---|
| | | | 13 | 14 | 15 | 16 | 17 | 18 | 19 | 20 | 21 | 22 | 23 | 24 | 1 |
| Support | | Type | S6 | S4 | S5 | S3 | S1 | S2 | S2 | S2 | S1 | S1 | | Litho-graphic printing plate precursor formed by the method described in Example 24 | S1 |
| Undercoat layer | | Type | 1 | 1 | 1 | 1 | 2 | 2 | 2 | 2 | 1 | 1 | 1 | | — |
| Image-recording layer | Electron-accepting polymerization initiator | IA-1 | 110 | 150 | 150 | 104 | 60 | — | — | — | — | 150 | — | | — |
| | | IA-2 | — | — | — | — | — | — | — | — | — | — | — | | — |
| | | IA-3 | — | — | — | — | 60 | 109 | 109 | 109 | — | — | 150 | | 109 |
| | | IA-4 | — | — | — | — | — | — | — | — | 90 | — | — | | — |
| | Infrared absorber | 1R-1 | — | 20 | 20 | — | 39 | — | — | — | — | — | — | | — |
| | | IR-2 | 30 | — | — | 8 | — | — | — | — | — | — | — | | — |
| | | IR-3 | — | — | — | — | — | 20 | 20 | 20 | — | — | — | | 20 |
| | | IR-4 | 5 | — | — | — | — | — | — | — | — | — | — | | — |
| | | IR-5 | — | — | — | — | — | — | — | — | — | — | — | | — |
| | | IR-6 | — | — | — | — | — | — | — | — | 20 | — | — | | — |
| | | 1R—7 | — | — | — | — | — | — | — | — | — | 30 | 30 | | — |
| | Electron-donating polymerization initiator | B-1 | 20 | — | — | — | — | — | — | 25 | 15 | — | — | | 25 |
| | | B-2 | — | 29 | — | — | — | — | — | — | — | — | — | | — |
| | | B-3 | — | — | 30 | — | — | — | — | — | — | — | — | | — |
| | | B-4 | — | — | — | — | — | — | — | — | — | — | — | | — |
| | | B-5 | — | — | — | 20 | — | — | — | — | — | — | — | | — |
| | Polymerizable compound | M-1 | — | 100 | 150 | 240 | — | — | — | — | — | — | — | | — |
| | | M-2 | — | — | — | — | 180 | — | — | — | — | — | — | | — |
| | | M-3 | — | — | — | — | 20 | 242 | 242 | 242 | — | — | — | | 242 |

TABLE 4-continued

| | | Example | | | | | | | | | | | | Comparative Example |
|---|---|---|---|---|---|---|---|---|---|---|---|---|---|---|
| | | 13 | 14 | 15 | 16 | 17 | 18 | 19 | 20 | 21 | 22 | 23 | 24 | 1 |
| Polymer particles | M-4 | — | — | — | — | — | — | — | — | — | — | — | | — |
| | M-5 | 140 | — | — | — | — | — | — | — | — | — | — | | — |
| | M-6 | — | — | — | — | — | — | — | — | 242 | — | 121 | | — |
| | M-7 | — | — | — | — | — | — | — | — | — | 242 | 121 | | — |
| | R-1 | — | — | — | — | — | 400 | 600 | 600 | — | — | — | | — |
| | R-2 | 400 | — | — | — | — | — | — | — | — | — | — | | 400 |
| | R-3 | — | — | 300 | 200 | 300 | — | — | — | 200 | 200 | 400 | | — |
| | R-4 | — | 550 | — | — | — | — | — | — | — | — | — | | — |
| | R-5 | — | — | — | — | — | — | — | — | — | — | — | | — |
| Binder polymer | P-1 | — | 100 | — | — | — | — | — | — | — | — | — | | — |
| | P-2 | — | — | 300 | — | — | — | — | — | — | — | — | | — |
| Color-developing substance precursor | Type | S-8 | S-9 | S-10 | S-11 | S-1 | S-4 | S-1 | S-1 | S-1 | S-1 | S-12 | | C-1 |
| | Added amount | 40 | 50 | 60 | 60 | 80 | 100 | 20 | 20 | 60 | 60 | 60 | | 20 |
| Oil sensitizing agent | C-1 | — | — | — | — | — | — | — | 20 | — | — | — | | — |
| | C-2 | — | — | — | — | — | — | 13 | 5 | — | — | — | | — |
| | C-3 | — | — | — | — | — | — | 30 | — | — | — | — | | — |
| Anionic surfactant | | 4 | 10 | 10 | 4 | 15 | 15 | 10 | 10 | 10 | 10 | 10 | | 26 |
| Protective layer | Type | 2 | 1 | 2 | — | 1 | 2 | 4 | 4 | 5 | 5 | 5 | | 3 |
| Evaluation | hydrogen abstraction enthalpy of color-developing substance precursor (kcal/mol) | −3.9 | −3.9 | −6.2 | −6.2 | −1.5 | 6.4 | −1.5 | −1.5 | −1.5 | −1.5 | 0.6 | −1.5 | −10.5 |
| | Loss of ethylenically unsaturated bonds (%) | 10 | 13 | 10 | 10 | 15 | 25 | 40 | 40 | 40 | 40 | 40 | 40 | 5 |
| | Consumption of polymerizable compound (%) | 40 | 45 | 40 | 40 | 55 | 60 | 70 | 70 | 95 | 95 | 95 | 65 | 35 |
| | NC/NCO | 0.75 | 0.80 | 0.70 | 0.70 | 0.90 | 0.95 | 1.00 | 1.00 | 0.60 | 0.60 | 0.60 | 1.00 | 0.30 |
| | UV printing durability | 1 | 2 | 1 | 1 | 3 | 3 | 3 | 3 | 1 | 1 | 1 | 3 | 0 |
| | Visibility | 7.2 | 4.2 | 7.2 | 6.5 | 16.2 | 18.5 | 12.2 | 12.7 | 9.5 | 12.0 | 11.2 | 11.1 | 3.0 |
| | Condition of coating surface | 3 | 3 | 2 | 2 | 3 | 2 | 3 | 3 | 3 | 3 | 3 | 3 | 3 |

As is evident from the results shown in Tables 3 and 4, unlike the lithographic printing plate precursors according to comparative examples, the lithographic printing plate precursors according to examples make it possible to obtain a lithographic printing plate having excellent UV printing durability. Furthermore, it has been revealed that the lithographic printing plate precursor according to the present disclosure makes it possible to obtain a lithographic printing plate having excellent visibility and excellent surface condition.

For the used color-developing substance precursors S-1 to S-12, ε, a ring-opening rate, and λmax were measured by the methods described above. The measurement results are shown in the following Table 5.

TABLE 5

| Color-developing substance precursor | ε | Ring-opening rate | λ (nm) |
|---|---|---|---|
| S-1 | 94,400 | 85 | 549 |
| S-2 | 85,400 | 62 | 550 |
| S-3 | 65,000 | 71 | 571 |
| S-4 | 61,000 | 80 | 552 |
| S-5 | 82,300 | 86 | 559 |
| S-6 | 36,000 | 52 | 533 |
| S-7 | 36,000 | 95 | 556 |
| S-8 | 36,000 | 95 | 556 |
| S-9 | 100,400 | 52 | 554 |
| S-10 | 36,200 | 91 | 568 |
| S-11 | 35,200 | 87 | 560 |
| S-12 | 82,300 | 86 | 559 |

EXAMPLES 25 to 32

<Formation of Lithographic Printing Plate Precursor>

The support described in Table 9 was coated with an undercoat solution B or C described in Table 9 having the following composition so that the dry coating amount reached 20 mg/m$^2$, and the support was dried in an oven at 100° C. for 30 seconds, thereby preparing a support having an undercoat layer.

The undercoat layer was bar-coated with the following coating solution (2) for an image-recording layer and dried in an oven at 100° C. for 60 seconds so that an image-recording layer having a dry coating amount described in Table 9 was formed. In this way, a lithographic printing plate precursor was obtained.

Thereafter, the image-recording layer was bar-coated with the coating solution (2) for a protective layer described in Table 9 having the following composition, and dried in an oven at 120° C. for 60 seconds so that a protective layer (overcoat layer) having a dry coating amount described in Table 9 was formed, thereby preparing an on-press development type lithographic printing plate precursor.

The obtained lithographic printing plate precursor was evaluated in the same manner as in Example 1. The evaluation results are shown in Table 9.

<Preparation of Support X>

<<Surface Treatment D>>:

[Support Having Large Diameter Portion and Small Diameter Portion]

(d-a) Alkaline Etching Treatment

From a spray tube, an aqueous solution of caustic soda having a caustic soda (sodium hydroxide) concentration of 26% by mass and an aluminum ion concentration of 6.5% by mass was sprayed onto the aluminum plate at a temperature of 70° C., thereby performing an etching treatment. Then, rinsing was performed by means of spraying. The amount of dissolved aluminum within the surface to be subjected to the electrochemical roughening treatment later was 1.0 g/m$^2$.

(D-b) Desmutting Treatment in Aqueous Acidic Solution (First Desmutting Treatment)

Next, a desmutting treatment was performed in an aqueous acidic solution. In the desmutting treatment, a 150 g/L aqueous sulfuric acid solution was used as the aqueous acidic solution. The liquid temperature was 30° C. The desmutting treatment was performed for 3 seconds by spraying the desmutting liquid. Then, a rinsing treatment was performed.

(D-c) Electrochemical Roughening Treatment in Aqueous Hydrochloric Acid Solution Next, an electrolytic roughening treatment was performed using alternating current and an electrolytic solution having a hydrochloric acid concentration of 14 g/L, an aluminum ion concentration of 13 g/L, and a sulfuric acid concentration of 3 g/L. The liquid temperature of the electrolytic solution was 30° C. The aluminum ion concentration was adjusted by adding aluminum chloride. The waveform of the alternating current was a sine wave in which positive and negative waveforms are symmetrical, the frequency was 50 Hz, the ratio of the anodic reaction time and the cathodic reaction time in one cycle of the alternating current was 1:1, and the current density was 75 A/dm$^2$ in terms of the peak current value of the alternating current waveform. In addition, the quantity of electricity was 450 C/dm$^2$ which is the total quantity of electricity used for the aluminum plate to have an anodic reaction, and the electrolysis treatment was performed 4 times by conducting electricity of 125 C/dm$^2$ for 4 seconds at each treatment session. A carbon electrode was used as the counter electrode of the aluminum plate. Then, a rinsing treatment was performed.

(D-d) Alkaline Etching Treatment

From a spray tube, an aqueous solution of caustic soda having a caustic soda concentration of 5% by mass and an aluminum ion concentration of 0.5% by mass was sprayed onto the aluminum plate having undergone the electrochemical roughening treatment at a temperature of 45° C., thereby performing an etching treatment. The amount of dissolved aluminum within the surface having undergone the electrochemical roughening treatment was 0.2 g/m$^2$. Then, a rinsing treatment was performed.

(D-e) Desmutting Treatment In Aqueous Acidic Solution

Next, a desmutting treatment was performed in an aqueous acidic solution. In the desmutting treatment, a waste liquid generated in the anodic oxidation treatment step (170 g/L aqueous sulfuric acid solution containing dissolved aluminum ions at 5.0 g/L) was used as an aqueous acidic solution. The liquid temperature was 30° C. The desmutting treatment was performed for 3 seconds by spraying the desmutting liquid.

(D-f) First-Stage Anodic Oxidation Treatment

By using the anodic oxidation device for direct current electrolysis having the structure shown in FIG. 9, a first-stage anodic oxidation treatment was performed. An anodic oxidation treatment was performed under the conditions shown in Table 6, thereby forming an anodic oxide film having a predetermined film thickness.

(D-g) Pore Widening Treatment

The aluminum plate having undergone the above anodic oxidation treatment was immersed in an aqueous solution of caustic soda at a temperature of 35° C. and having a caustic soda concentration of 5% by mass and an aluminum ion concentration of 0.5% by mass under the conditions shown in Table 6, thereby performing a pore widening treatment. Then, rinsing was performed by means of spraying.

(D-h) Second-Stage Anodic Oxidation Treatment

By using the anodic oxidation device for direct current electrolysis having the structure shown in FIG. 9, a second-stage anodic oxidation treatment was performed. An anodic oxidation treatment was performed under the conditions shown in Table 6, thereby forming an anodic oxide film having a predetermined film thickness.

By the above surface treatment D, the supports X shown in Tables 6 and 7 were obtained.

Table 7 shows the average diameter (nm) of the large diameter portion within the surface of the anodic oxide film having micropores obtained after the second anodic oxidation treatment step, the average diameter (nm) of the small diameter portion at a communication position, the depth (nm) of the large diameter portion and the small diameter portion, the pit density (micropore density, unit; number of micropores/μm$^2$), and the thickness (nm) of the anodic oxide film from the bottom portion of the small diameter portion to the surface of the aluminum plate.

The average diameter of the micropores (average diameter of the large diameter portion and the small diameter portion) is a value obtained by observing the surface of the large diameter portion and the surface of the small diameter portion with FE-SEM at a 150,000× magnification (N=4), and measuring the diameters of the micropores (large diameter portion and small diameter portion) in a range of 400 nm×600 nm in the obtained 4 images, and calculating the average thereof. In a case where the large diameter portion was deep, it was difficult to measure the diameter of the small diameter portion, and the diameter of an enlarged portion in the small diameter portion needed to be measured, the upper portion of the anodic oxide film was cut, and then various diameters were calculated.

The depth of the micropores (depth of the large diameter portion and the small diameter portion) is a value obtained by observing the cross section of the support (anodic oxide film) with FE-SEM (observation of the depth of the large diameter portion: 150,000× magnification, observation of depth of small diameter portion: 50,000× magnification), measuring the depths of 25 random micropores in the obtained image, and calculating the average thereof.

In Table 6, Film amount (AD) in the column of First anodic oxidation treatment and Film amount (AD) in the column of Second anodic oxidation treatment represent the amount of film obtained by each treatment. As electrolytic solutions, the aqueous solutions containing the components in Table 6 were used.

TABLE 6

| Support | Surface treatment | First anodic oxidation treatment: Liquid type | Liquid component | Component concentration | Temperature | Current density | Time | Film amount |
|---|---|---|---|---|---|---|---|---|
| Support X | D | Sulfuric acid | $H_2SO_4$/Al | 170/5 | 40 | 8 | 4 | 0.25 |

| Support | Pore widening treatment: Liquid component | Temperature | Time | Second anodic oxidation treatment: Liquid type | Liquid component | Component concentration | Temperature | Current density | Time | Film amount |
|---|---|---|---|---|---|---|---|---|---|---|
| Support X | NaOH5%/Al0.5% | 35 | 3 | Sulfuric acid | $H_2SO_4$/Al | 170/5 | 50 | 13 | 25 | 3.35 |

TABLE 7

| Support | Large diameter portion: Average diameter (nm) | Shape | Micropore density (number/μm$^2$) | Depth (nm) | Small diameter portion: Pore diameter at communication position (mu) | Shape | Depth (nm) | Thickness of anodic oxide film(nm) |
|---|---|---|---|---|---|---|---|---|
| Support X | 26 | Straight tubular | 1,080 | 100 | 10 | Straight tubular | 1,400 | 1,500 |

<Preparation of Support Y>

<<Treatment A>>

(A-a) Alkaline Etching Treatment

An aqueous solution of caustic soda having a caustic soda concentration of 26% by mass and an aluminum ion concentration of 6.5% by mass was sprayed onto the aluminum plate at a temperature of 70° C., thereby performing an etching treatment. Then, rinsing was performed by means of spraying. The amount of dissolved aluminum within the surface to be subjected to the electrochemical roughening treatment later was 5 g/m$^2$.

(A-b) Desmutting Treatment Using Aqueous Acidic Solution (First Desmutting Treatment)

Next, a desmutting treatment was performed using an aqueous acidic solution. In the desmutting treatment, a 150 g/L aqueous sulfuric acid solution was used as the aqueous acidic solution. The liquid temperature was 30° C. The desmutting treatment was performed for 3 seconds by spraying the aqueous acidic solution onto the aluminum plate. Then, a rinsing treatment was performed.

(A-c) Electrochemical Roughening Treatment

Next, an electrochemical roughening treatment was performed using alternating current and an electrolytic solution having a hydrochloric acid concentration of 14 g/L, an aluminum ion concentration of 13 g/L, and a sulfuric acid concentration of 3 g/L. The liquid temperature of the electrolytic solution was 30° C. The aluminum ion concentration was adjusted by adding aluminum chloride.

The waveform of the alternating current was a sine wave in which positive and negative waveforms are symmetrical, the frequency was 50 Hz, the ratio of the anodic reaction time and the cathodic reaction time in one cycle of the alternating current was 1:1, and the current density was 75 A/dm$^2$ in terms of the peak current value of the alternating current waveform. In addition, the quantity of electricity was 450 C/dm$^2$ which was the total quantity of electricity used for the aluminum plate to have an anodic reaction, and the electrolysis treatment was performed 4 times by conducting electricity of 112.5 C/dm$^2$ for 4 seconds at each treatment session. A carbon electrode was used as the counter electrode of the aluminum plate. Then, a rinsing treatment was performed.

(A-d) Alkaline Etching Treatment

An aqueous solution of caustic soda having a caustic soda concentration of 5% by mass and an aluminum ion concentration of 0.5% by mass was sprayed onto the aluminum plate having undergone the electrochemical roughening treatment at a temperature of 45° C., thereby performing an etching treatment. The amount of dissolved aluminum within the surface having undergone the electrochemical roughening treatment was 0.2 g/m$^2$. Then, a rinsing treatment was performed.

(A-e) Desmutting Treatment Using Aqueous Acidic Solution

Next, a desmutting treatment was performed using an aqueous acidic solution. Specifically, the desmutting treatment was performed for 3 seconds by spraying the aqueous acidic solution onto the aluminum plate. In the desmutting treatment, an aqueous solution having a sulfuric acid concentration of 170 g/L and an aluminum ion concentration of 5 g/L was used as aqueous acidic solution. The liquid temperature was 30° C.

(A-f) First-Stage Anodic Oxidation Treatment

By using the anodic oxidation device for direct current electrolysis having the structure shown in FIG. 9, a first-stage anodic oxidation treatment was performed. The anodic oxidation treatment was performed under the conditions described in the column of "First anodic oxidation treatment" shown in Table 8, thereby forming an anodic oxide film having a predetermined film amount.

(A-g) Pore Widening Treatment

The aluminum plate having undergone the above anodic oxidation treatment was immersed in an aqueous solution of caustic soda at a temperature of 40° C. and having a caustic soda concentration of 5% by mass and an aluminum ion concentration of 0.5% by mass under the time conditions shown in Table 8, thereby performing a pore widening treatment. Then, rinsing was performed by means of spraying.

(A-h) Second-Stage Anodic Oxidation Treatment

By using the anodic oxidation device for direct current electrolysis having the structure shown in FIG. 9, a second-stage anodic oxidation treatment was performed. The anodic oxidation treatment was performed under the conditions described in the column of "Second anodic oxidation treatment" shown in Table 8, thereby forming an anodic oxide film having a predetermined film amount.

TABLE 8

| | | First anodic oxidation treatment | | | | | Pore widening treatment | | |
|---|---|---|---|---|---|---|---|---|---|
| Liquid type | Liquid component | Component concentration (g/L) | Temperature (° C.) | Current density (Å/dm²) | Time (s) | Film amount (g/m²) | Liquid component | Temperature (° C.) | Time (s) |
| Phosphoric acid | $H_3PO_4$ | 15 | 35 | 4.5 | 12 | 1.0 | NaOH5%/ Al0.5% | 40 | 3 |
| | | Second anodic oxidation treatment | | | | | | | |
| Sulfuric acid | $H_2SO_4$/Al | 170/5 | 50 | 15 | 10.5 | 1.4 | | | |

—Composition of Coating Solution B for Undercoat Layer—

Polymer (U-1): 0.18 parts
Hydroxyethyl iminodiacetic acid: 0.10 parts
Water: 61.4 parts —Composition of Coating Solution C for Undercoat Layer—

Polymer (U-1): 0.14 parts
Chelest 400: 0.035 parts
Chelest 3EAF: 0.035 parts
Surfactant (EMALEX 710, manufactured by NIHON EMULSION Co., Ltd.): 0.0016 parts
Preservative (BIOHOPE L, manufactured by K-I Chemical Industry Co., LTD.): 0.0015 parts
Water: 3.29 parts (U-1)

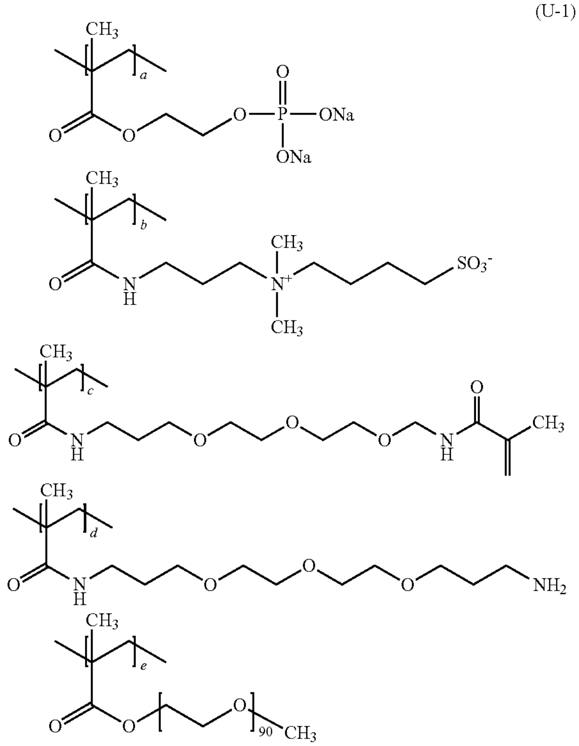

Weight-average molecular weight = 200,000 a/b/c/d/e = 14.2/71.8/8.9/0.1/5.0 (% by mass)
a/b/c/d/e = 19.0/72.8/7.7/0.1/0.4 (mol%)

—Synthesis of Polymer (U-1)—

<<Purification of Monomer M-1>>

LIGHT ESTER P-1M (2-methacryloyloxyethyl acid phosphate, manufactured by KYOEISHA CHEMICAL Co., LTD.) (420 parts), 1,050 parts of diethylene glycol dibutyl ether, and 1,050 parts of distilled water were added to a separatory funnel, vigorously stirred, and then left to stand. The upper layer was discarded, 1,050 parts of diethylene glycol dibutyl ether was then added thereto, the solution was vigorously stirred, and then left to stand. The upper layer was discarded, thereby obtaining 1,300 parts of an aqueous solution of a monomer M-1 (10.5% by mass in terms of solid contents).

<<Synthesis of Polymer (U-1)>>

Distilled water (53.73 parts) and 3.66 parts of the following monomer M-2 were added to a three-neck flask, and heated to 55° C. in a nitrogen atmosphere. Then, the following dripping liquid 1 was added dropwise thereto for 2 hours, the obtained solution was stirred for 30 minutes, and 0.386 parts of VA-046B (manufactured by FUJIFILM Wako Pure Chemical Corporation) was added thereto. The solution was heated to 80° C. and stirred for 1.5 hours. The reaction solution was returned to room temperature (25° C.), a 30% by mass aqueous sodium hydroxide solution was added thereto so that the pH was adjusted to 8.0, and then 0.005 parts of 4-hydroxy-2,2,6,6-tetramethylpiperidin-1-oxyl (4-OH-TEMPO) was added thereto. By the above operation, 180 parts of an aqueous solution of the polymer (U-1) was obtained. The weight-average molecular weight (Mw) thereof was 200,000 that was measured by gel permeation chromatography (GPC) and expressed in terms of polyethylene glycol.

Monomer M-2

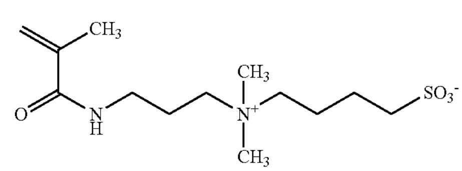

<<Composition of Dripping Liquid 1>>

Aqueous solution of the monomer M-1: 87.59 parts
The above monomer M-2: 14.63 parts
VA-046B (2,2'-azobis[2-(2-imidazolin-2-yl)propane] disulfate dihydrate, manufactured by FUJIFILM Wako Pure Chemical Corporation): 0.386 parts
Distilled water: 20.95 parts <Composition of Coating Solution (2) for Image-Recording Layer>

Infrared absorbers described in Table 9: amount described in Table 9

Color-developing substance precursor described in Table 9: amount described in Table 9

Electron-accepting polymerization initiator described in Table 9: amount described in Table 9

Borate compounds (electron-donating polymerization initiator) described in Table 9: amount described in Table 9

Binder polymers described in Table 9: amount described in Table 9

Polymerizable compound described in Table 9: amount described in Table 9

Oil sensitizing agent described in Table 9: amount described in Table 9

Anionic surfactant (A-1, the following compound): amount described in Table 9

Fluorine-based surfactant (W-1, the following compound): 4.16 parts

2-Butanone: 4,920 parts

1-Methoxy-2-propanol: 3,100 parts

Methanol: 2,790 parts

Polymer particles described in Table 9: amounts described in Table 9

<Composition of Coating Solution (2) for Protective Layer>

Water-soluble polymers described in Table 9: amount described in Table 9

Hydrophobic polymer particles described in Table 9: amount described in Table 9

Surfactant described in Table 9: amount described in Table 9

Color-developing substance precursor described in Table 9: amount described in Table 9

Water: 6.0 parts

TABLE 9

| | | | Example | | | | | | | |
|---|---|---|---|---|---|---|---|---|---|---|
| | | | 25 | 26 | 27 | 28 | 29 | 30 | 31 | 32 |
| | Support | Type | X | X | x | X | Y | Y | Y | X |
| | Undercoat layer | Type | C | C | C | C | B | B | B | C |
| Image-recording layer | Infrared absorber | D'-1 | 20 | 18 | 25 | — | — | — | — | 20 |
| | | D'-2 | — | — | — | 20 | — | — | — | — |
| | | D'-3 | — | — | — | — | 26 | 26 | 26 | — |
| | Electron-accepting polymerization initiator | R-1 | 109 | 109 | — | 109 | — | — | — | 109 |
| | | R-2 | — | 10 | 100 | — | 60 | 60 | 60 | — |
| | Color-developing substance precursor | S-1 | 25 | 25 | 25 | — | 25 | 25 | 25 | 25 |
| | | S-4 | — | 10 | — | 25 | — | — | — | — |
| | Electron-donating polymerization initiator | B'-1 | 25 | 50 | 25 | 25 | 50 | 50 | 50 | 25 |
| | Polymerizable compound | M'-1 | 175 | 175 | 250 | 175 | — | — | — | 175 |
| | | M'-2 | 100 | 100 | — | 100 | — | — | — | 100 |
| | | M'-3 | — | — | — | — | 250 | 200 | 400 | — |
| | | M'-4 | — | — | — | — | 250 | 200 | 100 | — |
| | Polymer particles | R'-1 | 400 | 400 | 300 | — | — | — | — | 400 |
| | | R'-2 | — | 100 | — | 500 | — | — | — | — |
| | Binder polymer | P'-1 | — | — | 50 | — | 150 | 300 | 100 | — |
| | Hydrophilic compound | T'-1 | 12 | 12 | 12 | 12 | — | — | — | 12 |
| | Additive | O'-1 | 40 | 40 | 40 | 40 | — | — | — | 40 |
| | Surfactant | U'-1 | 4 | 4 | 4 | 4 | — | — | — | — |
| | | U'-2 | — | — | 2 | — | — | — | — | 4 |
| | Dry coating amount (g/m$^2$) | | 0.91 | 1.05 | .83 | 1.01 | 0.81 | 0.86 | 0.76 | 0.91 |
| Protective layer | Water-soluble polymer | WP'-1 | 50 | 50 | 50 | 50 | — | — | — | 50 |
| | | WP-2 | — | 100 | — | — | 280 | 100 | 200 | — |
| | | WP'-3 | — | — | 250 | — | 20 | 100 | 200 | — |
| | Hydrophobic polymer particles | WR-1 | 17 | 17 | 17 | 17 | — | — | — | 17 |
| | | WR'-2 | — | — | — | — | 200 | 200 | 200 | — |
| | Surfactant | V'-1 | 3.5 | 3.5 | 3.5 | 3.5 | — | — | — | 3.5 |
| | Color-developing substance precursor | wIR'-1 | — | — | — | — | 20 | 20 | 20 | — |
| | Dry coating amount (g/m$^2$) | | 0.07 | 0.17 | 0.32 | 0.07 | 0.70 | 0.42 | 0.62 | 0.07 |
| Evaluation | hydrogen abstraction enthalpy of color-developing substance precursor (kcal/mol) | | −1.5 | −1.5 | −1.5 | 6.4 | −1.5 | −1.5 | −1.5 | −1.5 |
| | Loss of ethylenically unsaturated bonds (%) | | 20 | 25 | 23 | 21 | 20 | 22 | 21 | 20 |
| | Consumption of polymerizable compound (%) | | 65 | 70 | 68 | 60 | 63 | 65 | 70 | 65 |
| | NC/NCO | | 0.95 | 0.98 | 0.95 | 0.90 | 0.90 | 0.91 | 0.97 | 0.95 |
| | UV printing durability | | 3 | 3 | 3 | 3 | 3 | 3 | 3 | 3 |
| | Visibility | | 12.8 | 12.4 | 11.5 | 11.5 | 13.0 | 12.0 | 11.8 | 12.7 |
| | Shape of coating surface | | 3 | 3 | 3 | 2 | 3 | 3 | 3 | 3 |

The abbreviations described in Table 9 other than the above ones specifically mean the following.

In the following description, TsO⁻ represents a tosylate anion.

<Infrared Absorber>

D'-1 to D'-3: The following compounds

D'-1

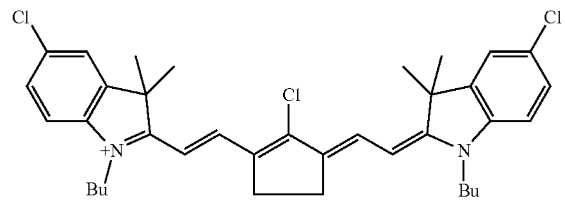

D'-2

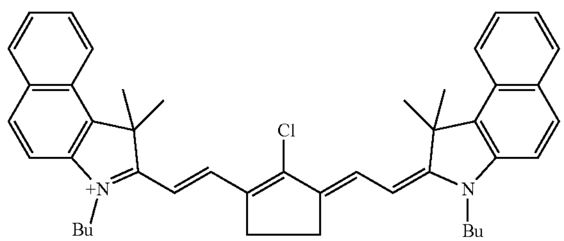

<Electron-Accepting Polymerization Initiator>

I'-1 and I'-2: The following compounds

I'-1

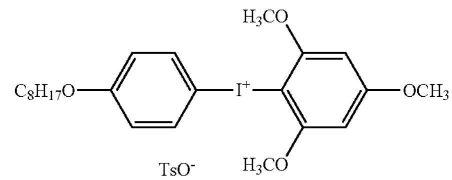

I'-2

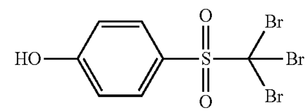

<Electron-Donating Polymerization Initiator>

B'-1: Sodium tetraphenylborate

<Polymerizable Compounds>

M'-1: Urethane acrylate synthesized according to the following synthesis example M'-2: Ethoxylated isocyanuric acid triacrylate, A-9300 manufactured by SHIN-NAKAMURA CHEMICAL CO, LTD.

M'-3: The following compound

M'-4: The following compound

M'-3

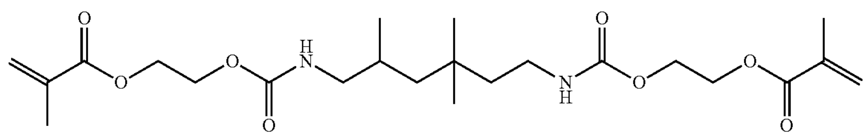

M'-4

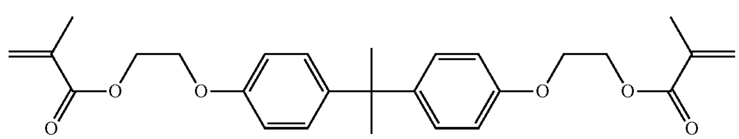

-continued

D'-3

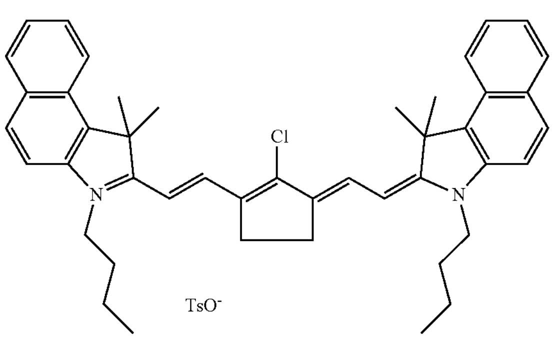

<Synthesis of M'-1>

A mixed solution of TAKENATE D-160N (polyisocyanate, manufactured by Mitsui Chemicals, Inc., 4.7 parts by mass), ARONIX M-403 (hydroxyl group-containing polyfunctional acrylate, manufactured by TOAGOSEI CO., LTD.) in such an amount that the ratio of the NC0 value of TAKENATE D-160N to the hydroxyl number of ARONIX M-403 is 1:1, 0.02 parts by mass of t-butylbenzoquinone, and 11.5 parts by mass of methyl ethyl ketone was heated at 65° C. NEOSTANN U-600 (bismuth-based polycondensation catalyst, manufactured by NITTO KASEI CO., LTD., 0.11 parts by mass) was added to the reaction solution, and the reaction solution was heated at the same temperature for 4 hours. The reaction solution was cooled to room temperature (25° C.), and methyl ethyl ketone was added thereto, thereby synthesizing a urethane acrylate solution having a solid content of 50% by mass.

Subsequently, by using recycling GPC (instrument: LC908-C60, column: JAIGEL-1H-40 and 2H-40 (manufactured by Japan Analytical Industry Co., Ltd.) and tetrahydrofuran (THF) as an eluent, molecular weight fractionation of the urethane acrylate solution was performed, thereby obtaining urethane acrylate M'-1.

<Polymer Particles>

R'-1 and R'-2: Polymer particles prepared as follows

<Preparation of Polymer Particles R'-1>

Microgel (polymer particles R'-1): 2.640 parts

Distilled water: 2.425 parts

The microgel was prepared by the following method.

—Preparation of Polyvalent Isocyanate Compound—

Bismuth tris(2-ethylhexanoate) (NEOSTAN U-600, manufactured by NITTO KASEI CO., LTD., 0.043 parts) was added to an ethyl acetate (25.31 g) suspension solution of 17.78 parts (80 molar equivalents) of isophorone diisocyanate and 7.35 parts (20 molar equivalents) of the following polyhydric phenol compound (1), and the obtained solution was stirred. The reaction temperature was set to 50° C. at a point in time when heat release subsided, and the solution was stirred for 3 hours, thereby obtaining an ethyl acetate solution of the polyvalent isocyanate compound (1) (50% by mass).

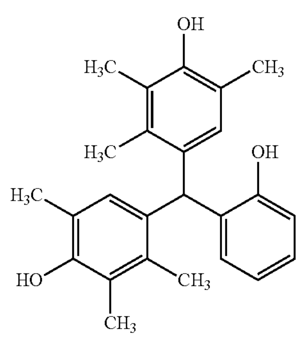 [SMILES: Cc1cc(C(c2ccccc2O)c2cc(C)c(O)c(C)c2C)c(C)c(C)c1O]

—Preparation of Microgel—

The following oil-phase components and water-phase components were mixed together and emulsified at 12,000 rpm for 10 minutes by using a homogenizer. The obtained emulsion was stirred at 45° C. for 4 hours, a 10% by mass aqueous solution of 5.20 g of 1,8-diazabicyclo[5.4.0]undec-7-ene-octylate (U-CAT SA102, manufactured by San-Apro Ltd.) was added thereto, and the solution was stirred at room temperature for 30 minutes and left to stand at 45° C. for 24 hours. Distilled water was added thereto so that the concentration of solid contents was adjusted to 20% by mass, thereby obtaining an aqueous dispersion of microgel. The average particle diameter thereof measured by a light scattering method was 0.20 μm.

~Oil-Phase Components~

(Component 1) ethyl acetate: 12.0 parts (Component 2) an adduct obtained by addition of trimethylolpropane (6 molar equivalent), xylene diisocyanate (18 molar equivalents), and polyoxyethylene having one methylated terminal (1 molar equivalent, the number of repeating oxyethylene units: 90) (50% by mass ethyl acetate solution, manufactured by Mitsui Chemicals, Inc.): 3.76 g (Component 3) polyvalent isocyanate compound (1) (as 50% by mass ethyl acetate solution): 15.0 parts (Component 4) 65% by mass ethyl acetate solution of dipentaerythritol pentaacrylate (SR-399, manufactured by Sartomer Company Inc.): 11.54 parts (Component 5) 10% ethyl acetate solution of sulfonate type surfactant (PIONINE A-41-C, manufactured by TAKEMOTO OIL & FAT Co., Ltd.): 4.42 parts ~Water-Phase Component~

Distilled water: 46.87 parts

<Preparation of Polymer Particles R'-2>

—Preparation of Oil-Phase Component—

WANNATE (registered trademark) PM-200 (polyfunctional isocyanate compound: manufactured by Wanhua Chemical Group Co., Ltd.): 6.66 g, a 50% by mass ethyl acetate solution of TAKENATE (registered trademark) D-116N (adduct of trimethylolpropane (TMP), m-xylylene diisocyanate (XDI), and polyethylene glycol monomethyl ether (E090) (following structure)" manufactured by Mitsui Chemicals, Inc.: 5.46 g, a 65% by mass ethyl acetate solution of SR399 (dipentaerythritol pentaacrylate, manufactured by Sartomer Company Inc.): 11.24 g, ethyl acetate: 14.47 g, and PIONIN (registered trademark) A-41-C (manufactured by TAKEMOTO OIL & FAT Co., Ltd.): 0.45 g mixed together and stirred at room temperature (25° C.) for 15 minutes, thereby obtaining an oil-phase component.

D-116N

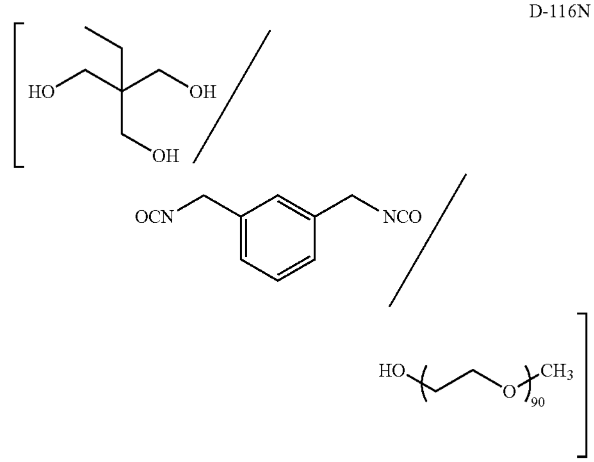

—Preparation of Water-Phase Component—

As a water-phase component, 47.2 g of distilled water was prepared.

—Microcapsule Forming Step—

The oil-phase component and the water-phase component were mixed together, and the obtained mixture was emulsified at 12,000 rpm for 16 minutes by using a homogenizer, thereby obtaining an emulsion.

Distilled water (16.8 g) was added to the obtained emulsion, and the obtained liquid was stirred at room temperature for 180 minutes.

After stirring, the liquid was heated at 45° C., and stirred for 5 hours in a state of being kept at 45° C. so that ethyl acetate was distilled away from the liquid. Distilled water was added thereto so that the concentration of solid contents was adjusted to 20% by mass, thereby obtaining an aqueous dispersion of polymer particles R'-2. R'-2 had a volume average particle diameter of 165 nm that was measured using a laser diffraction/scattering-type particle diameter distribution analyzer LA-920 (manufactured by HORIBA, Ltd.).

<Binder Polymer>

P'-1: Partially acetylated polyvinyl butyral, S-LEC BL10 manufactured by SEKISUI CHEMICAL CO., LTD.

<Hydrophilic Compound>

T'-1: The following compound

<Additive>

O'-1: The following compound

T'-1

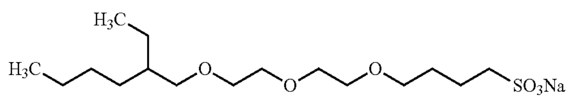

O'-1

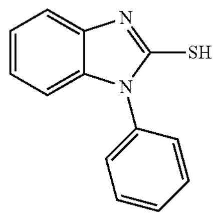

<Surfactant>

U'-1 and U'-2: The following compounds

U¢-1

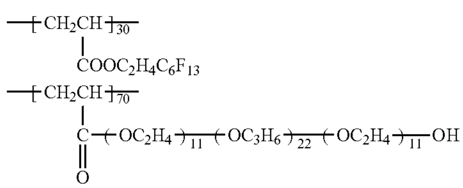

(Mw = 13,000)

U¢-2

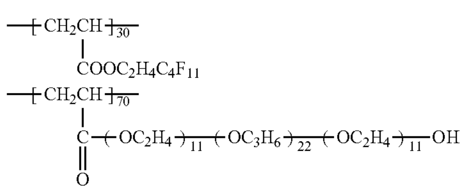

(Mw = 13,000)

<Water-Soluble Polymer>

WP'-1: Polyvinyl alcohol, GOHSENOL L-3266 manufactured by Mitsubishi Chemical Corporation., saponification degree of 86% to 89% or higher WP'-2: Mowiol 4-88 (polyvinyl alcohol (PVA), manufactured by Sigma-Aldrich Co. LLC.)

WP'-3: Mowiol 8-88 (polyvinyl alcohol (PVA), manufactured by Sigma-Aldrich Co. LLC.)

<Hydrophobic Polymer Particles>

WR'-1: FS-102, styrene-acrylic resin, manufactured by Nipponpaint Industrial Coatings Co., LTD., Tg=103° C.

WR'-2: aqueous polyvinylidene chloride dispersion, Diofan (registered trademark) A50 manufactured by Solvin S.A.

<Surfactant>

V'-1: Surfactant, EMALEX 710, manufactured by NIHON EMULSION Co., Ltd.

<Color-Developing Substance Precursor> wIR'-1: The following compound wIR'-1

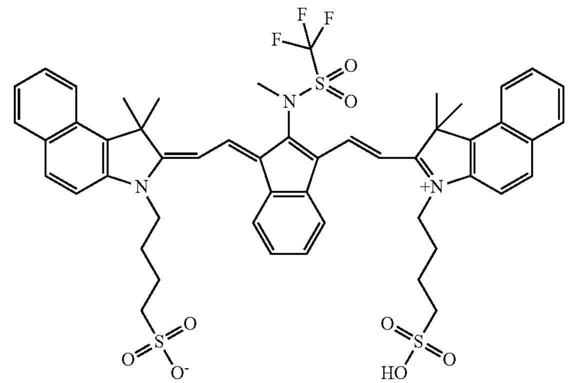

As is evident from the results shown in Table 9, unlike the lithographic printing plate precursors according to comparative examples, the lithographic printing plate precursors according to examples make it possible to obtain a lithographic printing plate having excellent UV printing durability. Furthermore, it has been revealed that the lithographic printing plate precursor according to the present disclosure makes it possible to obtain a lithographic printing plate having excellent visibility and excellent surface condition.

The entirety of the disclosure of Japanese Patent Application No. 2019-122479 filed on Jun. 28, 2019, disclosure of Japanese Patent Application No. 2019-158812 filed on Aug. 30, 2019, disclosure of Japanese Patent Application No. 2019-169808 filed on Sep. 18, 2019, disclosure of Japanese Patent Application No. 2019-180573 filed on Sep. 30, 2019, and disclosure of Japanese Patent Application No. 2020-015681 filed on Jan. 31, 2020 is incorporated into the present specification by reference.

All of documents, patent applications, and technical standards described in the present specification are incorporated into the present specification by reference to approximately the same extent as a case where it is specifically and respectively described that the respective documents, patent applications, and technical standards are incorporated by reference.

EXPLANATION OF REFERENCES

10: lithographic printing plate precursor
12: aluminum support
16: image-recording layer
14: undercoat layer
18: aluminum plate
20: anodic oxide film
24: large diameter portion
26: small diameter portion
31: aluminum plate
32*a*, 32*b*, 32*c*: anodic oxide film of aluminum
33*a*, 33*b*, 33*c*: micropores
50: main electrolytic cell
52: radial drum roller
51: alternating current power source
53*a*, 53*b*: main pole
55: electrolytic solution
54: electrolytic solution supply port

56: slit
57: electrolytic solution path
60: auxiliary anode tank
58: auxiliary anode
Ex: electrolytic solution outlet
S: supply of liquid
W: aluminum plate
1: aluminum plate
2, 4: roller-shaped brush
3: polishing slurry liquid
5, 6, 7, 8: support rollers
610: anodic oxidation treatment device
612: power supply tank
614: electrolytic treatment tank
616: aluminum plate
618: electrolytic solution
620: power supply electrode
622: roller
624: nip roller
626: electrolytic solution
628: roller
630: electrolysis electrode
632: partition
634: direct current power source
A: depth
W: aluminum plate
X1, X3: thickness of anodic oxide film
X2, X4: depth of micropore 22
Y1, Y3: average diameter of micropores 22 within surface of anodic oxide film
Y2, Y4: average diameter of bottom portion of micropores 22
ta: anodic reaction time
tc: cathodic reaction time
tp: time taken for current to reach peak from 0
Ia: peak current on anodic cycle side
Ic: peak current on cathodic cycle side
AA: current of anodic reaction of aluminum plate
CA: current of cathodic reaction of aluminum plate

What is claimed is:

1. An on-press development type lithographic printing plate precursor, comprising:

a support; and an image-recording layer on the support, wherein the image-recording layer contains an infrared absorber, a polymerization initiator, a polymerizable compound, and a color-developing substance precursor, wherein the polymerizable compound includes a compound having an ethylenically unsaturated bond valence of 5.0 mmol/g or more, and in a case where the image-recording layer is exposed to an infrared laser having a wavelength of 830 nm at an energy density of 110 mJ/cm$^2$, a loss of ethylenically unsaturated bonds in an exposed area in the image-recording layer is 10% to 40% of ethylenically unsaturated bonds in a non-exposed area in the image-recording layer, wherein the color-developing substance precursor does not have a structure in which a hydrogen atom is directly bonded to a nitrogen atom, and wherein the color-developing substance precursor is a compound represented by any of Formula (Le-1) to Formula (Le-3), (Le-1)

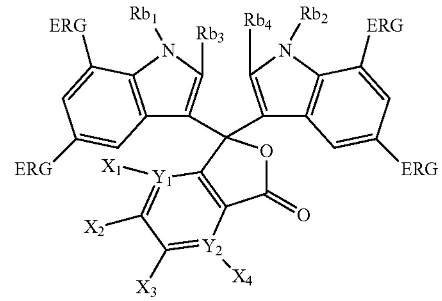

(Le-2)

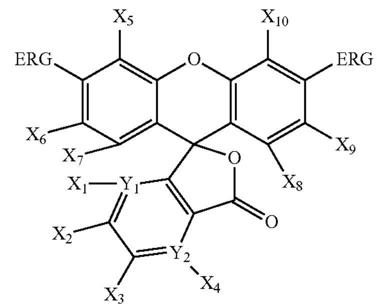

(Le-3)

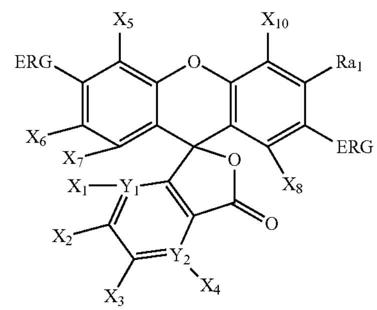

in Formula (Le-1) to Formula (Le-3), ERG each independently represents an electron donating group, $X_1$ to $X_4$ each independently represent a hydrogen atom, a halogen atom, or a dialkylanilino group, $X_5$ to $X_{10}$ each independently represent a hydrogen atom, a halogen atom, or a monovalent organic group, $Y_1$ and $Y_2$ each independently represent C or N, $X_1$ does not exist in a case where $Y_1$ is N, $X_4$ does not exist in a case where $Y_2$ is N, $Ra_1$ represents a hydrogen atom, an alkyl group, or an alkoxy group, and $Rb_1$ to $Rb_4$ each independently represent an alkyl group or an aryl group.

2. An on-press development type lithographic printing plate precursor, comprising:

a support; and an image-recording layer on the support, wherein the image-recording layer contains an infrared absorber, a polymerization initiator, a polymerizable compound, and a color-developing substance precursor, and in a case where the image-recording layer is exposed to an infrared laser having a wavelength of 830 nm at an energy density of 110 mJ/cm$^2$, a consumption of the polymerizable compound in an exposed area in the image-recording layer is 40% to 95% of the polymerizable compound in a non-exposed area in the image-recording layer, wherein the color-developing substance precursor does not have a structure in which a hydrogen atom is directly bonded to a nitrogen atom, and wherein the color-developing substance precursor is a compound represented by any of Formula (Le-1) to Formula (Le-3), (Le-1)

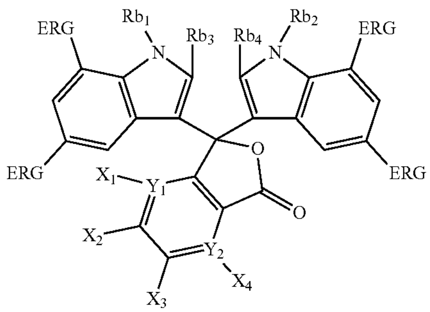

(Le-2)

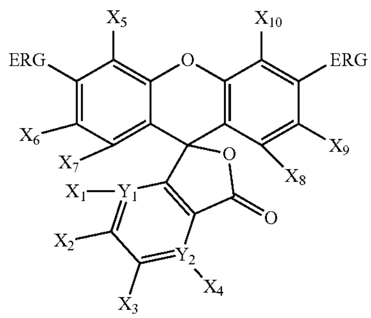

(Le-3)

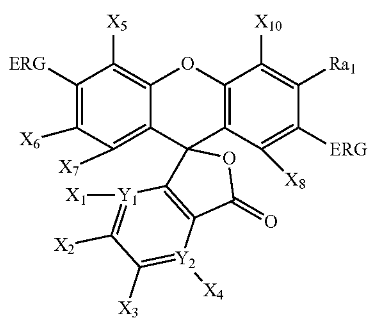

in Formula (Le-1) to Formula (Le-3), ERG each independently represents an electron donating group, $X_1$ to $X_4$ each independently represent a hydrogen atom, a halogen atom, or a dialkylanilino group, $X_5$ to $X_{10}$ each independently represent a hydrogen atom, a halogen atom, or a monovalent organic group, $Y_1$ and $Y_2$ each independently represent C or N, $X_1$ does not exist in a case where $Y_1$ is N, $X_4$ does not exist in a case where $Y_2$ is N, $Ra_1$ represents a hydrogen atom, an alkyl group, or an alkoxy group, and $Rb_1$ to $Rb_4$ each independently represent an alkyl group or an aryl group.

3. An on-press development type lithographic printing plate precursor, comprising:

a support; and an image-recording layer on the support, wherein the image-recording layer contains an infrared absorber, a polymerization initiator, a polymerizable compound, and a color-developing substance precursor, and satisfies Expression N, $$0.6 \leq NC/NC0 \leq 1.0 \quad \text{Expression N}$$

in Expression N, NC represents the number of prints at a point in time when an area ratio of FM screen 3% halftone dots in a printed matter is 5% lower than an area ratio measured after 100 sheets are printed in a case when the prints are obtained by printing paper with a printing plate which is prepared by on-press development of the lithographic printing plate precursor, and NC0 represents the number of prints at a point in time when an area ratio of FM screen 3% halftone dots in a printed matter is 5% lower than an area ratio measured after 100 sheets are printed in a case when the prints are obtained by printing paper with a printing plate which is prepared by on-press development of the same lithographic printing plate precursor except that the color-developing substance precursor is not included in the image-recording layer, wherein the color-developing substance precursor does not have a structure in which a hydrogen atom is directly bonded to a nitrogen atom, and wherein the color-developing substance precursor is a compound represented by any of Formula (Le-1) to Formula (Le-3)

(Le-1)

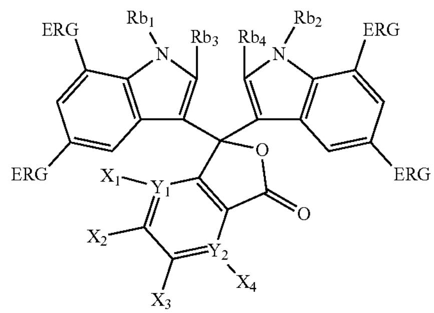

(Le-2)

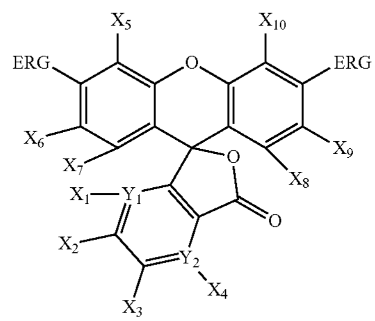

(Le-3)

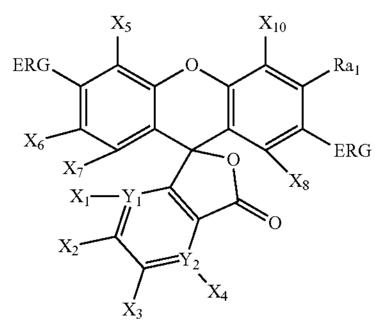

in Formula (Le-1) to Formula (Le-3), ERG each independently represents an electron donating group, $X_1$ to $X_4$ each independently represent a hydrogen atom, a halogen atom, or a dialkylanilino group, $X_5$ to $X_{10}$ each independently represent a hydrogen atom, a halogen atom, or a monovalent organic group, $Y_1$ and $Y_2$ each independently represent C or N, $X_1$ does not exist in a case where $Y_1$ is N, $X_4$ does not exist in a case where $Y_2$ is N, $Ra_1$ represents a hydrogen atom, an alkyl group, or an alkoxy group, and $Rb_1$ to $Rb_4$ each independently represent an alkyl group or an aryl group.

4. The on-press development type lithographic printing plate precursor according to claim 1, wherein a hydrogen abstraction enthalpy of all hydrogen atoms present in a molecule of the color-developing substance precursor is-6.5 kcal/mol or more.

5. The on-press development type lithographic printing plate precursor according to claim 1, wherein the color-developing substance precursor is an acid color-developing agent.

6. The on-press development type lithographic printing plate precursor according to claim 1, wherein the polymerization initiator includes an electron-donating polymerization initiator and an electron-accepting polymerization initiator, and HOMO of the infrared absorber-HOMO of the electron-donating polymerization initiator is 0.70 eV or less.

7. The on-press development type lithographic printing plate precursor according to claim 1, wherein the polymerizable compound includes a polymerizable compound having 7 or more functional groups.

8. The on-press development type lithographic printing plate precursor according to claim 1, wherein the compound having an ethylenically unsaturated bond valence of 5.0 mmol/g or more has at least one kind of structure selected from the group consisting of an adduct structure, a biuret structure, and an isocyanurate structure.

9. The on-press development type lithographic printing plate precursor according to claim 1, wherein the polymerizable compound includes a compound having 1 or 2 ethylenically unsaturated groups.

10. The on-press development type lithographic printing plate precursor according to claim 1, wherein the image-recording layer further contains addition polymerization resin particles having a dispersible group, and the dispersible group includes a group represented by Formula Z, $$*\text{-Q-W—Y} \qquad \text{Formula Z}$$

in Formula Z, Q represents a divalent linking group, W represents a divalent group having a hydrophilic structure or a divalent group having a hydrophobic structure, Y represents a monovalent group having a hydrophilic structure or a monovalent group having a hydrophobic structure, either W or Y has a hydrophilic structure, and * represents a binding site with other structures.

11. The on-press development type lithographic printing plate precursor according to claim 1, wherein the image-recording layer further contains a polymer having a constitutional unit formed of an aromatic vinyl compound, and the infrared absorber includes an infrared absorber that decomposes by exposure to infrared.

12. The on-press development type lithographic printing plate precursor according to claim 1, wherein the image-recording layer further contains thermoplastic resin particles.

13. The on-press development type lithographic printing plate precursor according to claim 1, wherein the color-developing substance precursor includes a compound represented by Formula (Le-A), (Le-A)

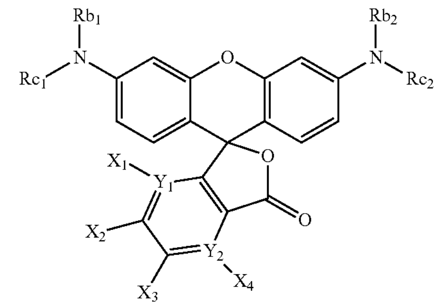

in Formula (Le-A), $X_1$ to $X_4$ each independently represent a hydrogen atom, a halogen atom, or a dialkylanilino group, $Y_1$ and $Y_2$ each independently represent C or N, $X_1$ does not exist in a case where $Y_1$ is N, $X_4$ does not exist in a case where $Y_2$ is N, $Rb_1$ and $Rb_2$ each independently represent an alkyl group or an aryl group, and $Rc_1$ and $Rc_2$ each independently represent an alkyl group.

14. The on-press development type lithographic printing plate precursor according to claim 1, wherein the polymerization initiator includes an electron-accepting polymerization initiator, and the electron-accepting polymerization initiator includes a compound represented by Formula (II), (II)

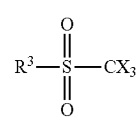

in Formula (II), X represents a halogen atom, and $R^3$ represents an aryl group.

15. The on-press development type lithographic printing plate precursor according to claim 1, wherein the image-recording layer further contains polyvinyl acetal as a binder polymer.

16. The on-press development type lithographic printing plate precursor according to claim 1, further comprising:

an overcoat layer on the image-recording layer, wherein the overcoat layer contains a hydrophobic polymer.

17. The on-press development type lithographic printing plate precursor according to claim 1, further comprising:

an overcoat layer on the image-recording layer, wherein the overcoat layer contains a color-developing substance precursor.

18. The on-press development type lithographic printing plate precursor according to claim 1, wherein a molar absorption coefficient ε of a color-developing substance generated from the color-developing substance precursor is 35,000 to 200,000.

19. The on-press development type lithographic printing plate precursor according to claim 1, wherein the color-developing substance precursor includes an acid color-developing agent, and the acid color-developing agent has a partial skeleton which rapidly opens the ring or is cleaved when coming into contact with an electron accepting compound, and wherein a ring-opening rate of the color-developing substance precursor calculated by the following expression is 40 mol % to 99 mol %, Ring-opening rate=molar absorption coefficient of the color-developing substance precursor to which 1 molar equivalent of acid is added/molar absorption coefficient ε of the color-developing substance precursor×100.

20. The on-press development type lithographic printing plate precursor according to claim 1, wherein a color-developing substance generated from the color-developing substance precursor has a maximum absorption wavelength of 500 nm to 650 nm in a wavelength region of 380 nm to 750 nm.

21. A method for preparing a lithographic printing plate, comprising:

exposing the on-press development type lithographic printing plate precursor according to claim 1 in the shape of an image; and supplying at least one material selected from the group consisting of a printing ink and dampening water on a printer so as to remove the image-recording layer in a non-image area.

22. A lithographic printing method, comprising:

exposing the on-press development type lithographic printing plate precursor according to claim 1 in the shape of an image;

supplying at least one material selected from the group consisting of a printing ink and dampening water so as to remove the image-recording layer in a non-image area on a printer and to prepare a lithographic printing plate; and performing printing by using the obtained lithographic printing plate.

* * * * *